(12) United States Patent  
Suehiro et al.

(10) Patent No.: US 6,953,265 B2  
(45) Date of Patent: Oct. 11, 2005

(54) LIGHT SOURCE DEVICE

(75) Inventors: Yoshinobu Suehiro, Nishikasugai-gun (JP); Yuji Takahashi, Nishikasugai-gun (JP); Takemasa Yasukawa, Nishikasugai-gun (JP); Hideaki Kato, Nishikasugai-gun (JP); Hideki Omoya, Nishikasugai-gun (JP); Hideyuki Nakano, Nishikasugai-gun (JP); Hisao Yamaguchi, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/422,809

(22) Filed: Apr. 25, 2003

(65) Prior Publication Data

US 2003/0202349 A1 Oct. 30, 2003

Related U.S. Application Data

(62) Division of application No. 09/805,141, filed on Mar. 14, 2001.

(30) Foreign Application Priority Data

| Mar. 14, 2000 | (JP) | P.2000-69800 |
| Mar. 30, 2000 | (JP) | P.2000-93333 |
| May 9, 2000 | (JP) | P.2000-135529 |
| Jul. 26, 2000 | (JP) | P.2000-225572 |
| Sep. 27, 2000 | (JP) | P.2000-294264 |
| Sep. 27, 2000 | (JP) | P.2000-294893 |
| Sep. 28, 2000 | (JP) | P.2000-296052 |
| Sep. 28, 2000 | (JP) | P.2000-296053 |
| Oct. 11, 2000 | (JP) | P.2000-310634 |

(51) Int. Cl.$^7$ ............................. F21V 1/00; F21V 11/00
(52) U.S. Cl. ............... 362/241; 362/240; 362/247; 362/800; 362/343; 362/347; 362/303
(58) Field of Search ................. 362/241, 235, 362/240, 247, 248, 341, 347, 800, 303, 343; 313/500

(56) References Cited

U.S. PATENT DOCUMENTS

| 1,278,026 A | | 9/1918 | Salto | |
| 3,247,367 A | * | 4/1966 | Rayces | 362/241 |
| 4,228,490 A | * | 10/1980 | Thillays | 362/311 |

(Continued)

FOREIGN PATENT DOCUMENTS

| EP | 0 450 560 A | 10/1991 | |
| EP | 0 801 369 A | 10/1997 | |
| EP | 0 950 847 A | 10/1999 | |
| FR | 1 416 993 A | 11/1965 | |
| FR | 2 613 858 A | 10/1988 | |
| JP | 54131365 A * | 3/1978 | H05B/35/00 |
| WO | WO 99/08144 A | 2/1999 | |
| WO | WO 99/50596 | 10/1999 | |

Primary Examiner—Sandra O'Shea  
Assistant Examiner—Sharon Payne  
(74) Attorney, Agent, or Firm—McGinn & Gibb, PLLC

(57) ABSTRACT

A light source device has a light shielding member having an aperture, a light source arranged on one side of the light shielding member, and a converging member arranged relatively with respect to the light source and the light source to thereby converge light emitted from the light source in the aperture or in a vicinity of the aperture. Another type of light source device has a single light source, and a converging member for converging light from the light source to thereby distribute the light to at least two points. Still another type of light source device has a light source, and a reflecting mirror arranged to enclose a side of a light emission direction of the light source, the reflecting mirror reflecting light emitted from the light source in a direction except the light source so that the light is radiated outside.

42 Claims, 63 Drawing Sheets

U.S. PATENT DOCUMENTS

| | | | |
|---|---|---|---|
| 4,425,608 A | | 1/1984 | Hecker et al. |
| 4,450,513 A | * | 5/1984 | Guggemos ............... 362/299 |
| 4,733,335 A | * | 3/1988 | Serizawa et al. ........... 362/503 |
| 4,816,694 A | | 3/1989 | Kuppenheimer, Jr. et al. |
| 5,124,891 A | | 6/1992 | Blusseau |
| 5,167,556 A | | 12/1992 | Stein |
| 5,289,082 A | * | 2/1994 | Komoto ............... 313/500 |
| 5,475,571 A | * | 12/1995 | Dassanayake ............... 362/560 |
| 5,695,277 A | | 12/1997 | Kim |
| 5,782,555 A | | 7/1998 | Hochstein |
| 5,921,666 A | | 7/1999 | Preston et al. |
| 5,924,785 A | * | 7/1999 | Zhang et al. ............... 313/500 |
| 6,076,948 A | | 6/2000 | Bukosky et al. |
| 6,123,436 A | | 9/2000 | Hough et al. |
| 6,283,613 B1 | * | 9/2001 | Schaffer ............... 362/245 |

\* cited by examiner

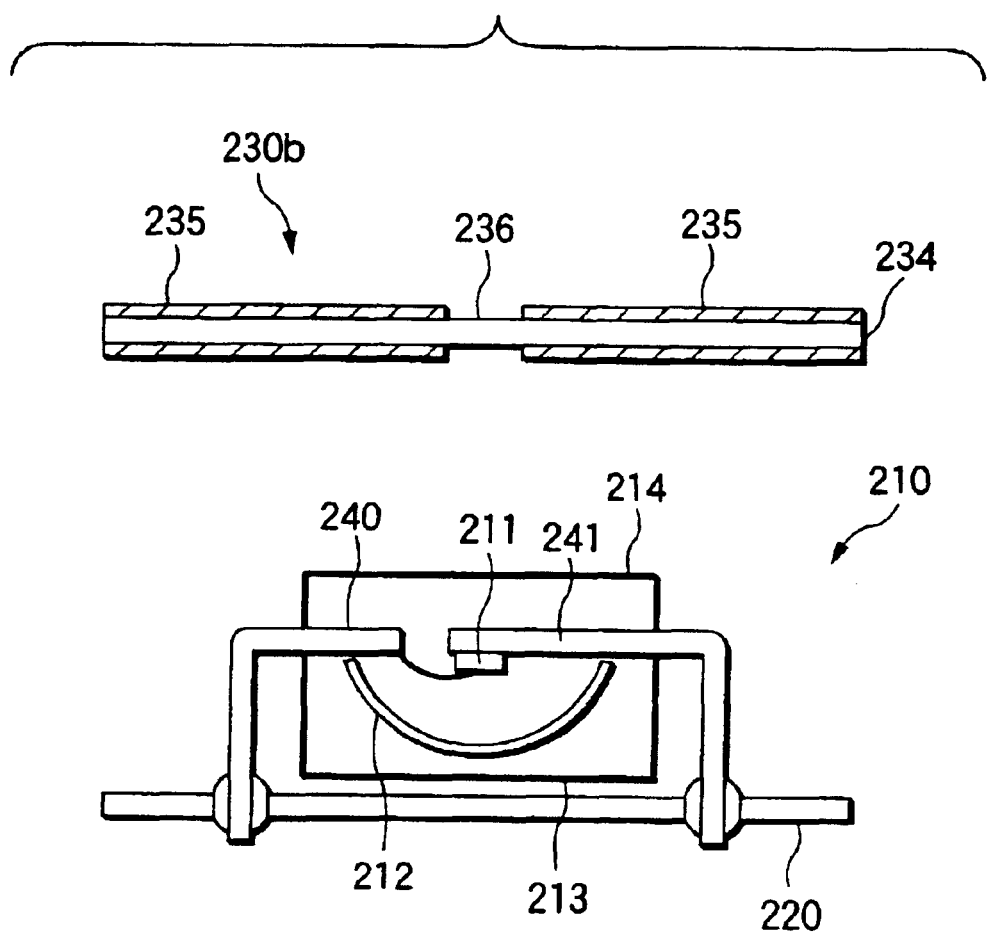

LIGHT SOURCE DEVICE

The present Application is a Divisional Application of U.S. patent application Ser. No. 09/805,141, filed on Mar. 14, 2001.

BACKGROUND OF THE INVENTION

1. Field of the Invention

The present invention relates to a light source device. The present invention also relates to a signal light utilizing a light source device and a light emitting device for a display and others.

The present application is based on the following Japanese Patent Applications, which are incorporated herein by reference: 2000-69800, 2000-93333, 2000-135529, 2000-225572, 2000-294264, 2000-294893, 2000-296052, 2000-296053, and 2000-310634

2. Description of the Related Art

Heretofore, for a light source device used for a signal light, a light source device that has a light bulb as a light source and emits light from a light source via a filter pigmented in each target color such as red and cyan as desired mono chromatic light is generally used. A light source device in which plural lens-type light emitting diodes (LEDs) that emit light of desired color are densely arranged on a board is also known. A light source device having LED as a light source has an advantage that no pseudo-lightening is caused and labor for maintenance can be greatly reduced. In addition, as LED itself emits monochromatic light, external radiation efficiency can be enhanced more than that in a method of using a light bulb that most of emitted light is cut via a filter. Also, in case a filter is used, the color of the filter is displayed by light incident from the outside and may be recognized as if a light source device was turned on, however, in case LED is used for a light source, no filter is required and such pseudo-lightening is not caused. Further, LED is not burn out as a light bulb and has high reliability.

However, as a signal light which has known and has LED as a light source uses lens-type LED as described above, the external radiation efficiency is not enough. The reason is that in lens-type LED, as the directivity is enhanced, loss increases in radiated light and the external radiation efficiency is deteriorated.

Also, to secure sufficient luminous intensity and eliminate the unevenness of emission so that a signal light has satisfactory visibility, LEDs are densely mounted, however, it is troublesome and in addition, as great deal of heat is caused and outgoing radiation is not efficiently performed, LEDs have high temperature. As emission is deteriorated and a life characteristic is deteriorated when LEDs are operated in a state of high temperature, it is not desirable that LEDs are operated in a state of high temperature. Even if the number of LEDs arranged in a fixed area can be reduced by enhancing the output of a light emitting element in future, a problem of the unevenness of emission caused because the mounting number of density of LEDs is reduced, that is, a problem that a signal light does not produce satisfactory visibility is not solved.

Though optics (silver plate on the surface of a lead frame and others) provided to enhance the external radiation efficiency of LED reflects external light and pigmented pseudo-lightening is not caused, it may cause the deterioration of contrast between when LEDs are turned on and when they are turned off.

Reflection-type LED different from lens-type LED is also generally known. As reflection-type LED can utilize light emitted laterally from a light emitting element by reflecting the light on its reflecting surface as external emitted light, it has high external radiation efficiency. As lens-type LED has light distribution characteristics higher in directivity, the external radiation efficiency is greatly deteriorated, however, the external radiation efficiency of reflection-type LED does not depend upon light distribution characteristics. As described above, reflection-type LED is provided with a characteristic that light of high luminance can be radiated at a wide light distribution angle. It is considered that reflection-type LED is installed outdoors and in other place and is suitably used for a display for which high visibility is demanded and others respectively because of such a characteristic.

FIGS. 77 and 78 show a light source device 1200 using conventional type reflection-type LED. FIG. 78 is a plan viewing the light source device 1200 from the side on which light is radiated outside (from the top in FIG. 77). In the light source device 1200, after light from a light emitting element 1110 is once reflected by a reflecting mirror 1120, it is radiated outside from a radiation surface 1140. A reference number 1130 denotes an encapsulating member, 1400 and 1410 denote a lead and 1210 denotes LED.

On a display installed outdoors and in other place, when external light is taken in on the side of LED and is reflected, light (dark noise) which looks emitted from the side of LED is also observe when LED is turned off and as a result, a problem that contrast between when LED is turned on and when LED is turned off is deteriorated occurs. Then, to inhibit such dark noise and reduce the deterioration of contrast, a part except the radiation surface of LED is covered with a black or other color of member so that taking in external light on the side of LED is inhibited as much as possible. To take the light source device 1200 as an example, external light is prevented from being taken in from a place except the radiation surface 1140 by a light shielding plate 1300.

However, as shown in FIGS. 77 and 78, as the radiation surface 1140 having large area of LED 1210 is exposed to external light, the deterioration of contrast between when LED is turned on and when it is turned off due to dark noise is still left as a large problem. Such a problem occurs not only in case reflection-type LED is used but in case lens-type LED is used.

Next, a light source device 2005 using another conventional type lens-type LED is shown in FIGS. 79 and 80. FIGS. 79A and 79B show an optical path of the light source device 2005. FIG. 80 is a plan view in which the light source device 2005 is viewed from the side of external radiation of light (from the top in FIG. 79). In the light source device 2005, LED 2100 is arranged in a state that it is fitted into a through hole 2310 provided to a light shielding plate 2300. Light from a light emitting element (not shown) is radiated outside as light having a desired angle range a from the surface of the lens 2120 of an encapsulating member 2110. A reference number 2200 denotes a board on which LED 2100 is mounted.

On a display installed outdoors and in other place, when external light is taken in on the side of LED and is reflected, light (dark noise) which looks emitted from the side of LED is also observed when LED is turned off and as a result, a problem that contrast between when LED is turned on and when LED is turned off is deteriorated occurs. To inhibit such dark noise and reduce the deterioration of contrast, a part except the radiation surface of LED is covered with a black or other color of member so that taking in external light on the side of LED is inhibited as much as possible. To take the light source device 2005 as an example, external light is prevented from being taken in on the side of LED by the light shielding plate 2300.

However, the effect of external light has many problems to be improved. That is, as the surface of the lens 2120 of LED 2100 is exposed to external light, much external light is taken inside LED 2100 via the lens surface 2120. The taken external light is reflected by optics (silver plate and other on a lead frame) provided to enhance the external radiation efficiency of LED 2100 and is observed as reflected light. As a result, contrast between when LED is turned on and when LED is turned off is deteriorated.

Also, in a shop of the service industry such as a discotheque, a conventional type light emitting device is used for various projectors that emit light for gorgeously decorating the inside intentionally darkened of the shop. For one type of such a projector, there is a light pattern projector that projects a predetermined geometrical pattern on a screen and a wall.

In this type of conventional type light pattern projector, for example, a light bulb which functions as a light source is arranged in the center, a spherical light shielding curved surface is provided in a position apart from the central light source by predetermined distance R1 and a slit having a predetermined geometrical pattern is formed on the light shielding curved surface. That is, the conventional type projector is provided as a ball including a light bulb and having the radius of R1 or a semi-spherical object having a slit on the surface. Only light that passes the slit out of light emitted from the light bulb is radiated outside the projector and a light pattern corresponding to a geometrical pattern of the slit is projected on a screen which functions as a projected plane as a predetermined virtual plane installed in a position apart from the light source by predetermined distance R2 (R1<R2).

However, the conventional type light pattern projector has the following disadvantages.

Only light which is actually radiated outside and passes a slit contributes to the formation of a light pattern on a projected plane out of light emitted from a light bulb as a light source. Light which cannot pass the slit is reflected in vain inside a light shielding curved surface or absorbed, is converted to heat energy and is not effectively utilized for its proper purpose. Therefore, only a part of the quantity of light from the light source is effectively utilized and energy loss is large.

There is a limit to project the edge of a shadow by a slit. That is, when distance (R2 to R1) from the slit to a projected plane is excessively increased, compared with distance R1 from a light source to the slit, a light pattern imaged on the projected plane becomes dim. Therefore, to keep the geometrical pattern of a light pattern on the projected plane vivid to some extent, the ratio (R2/R1) of the distance R2 from the light source to the projected plane to the distance R1 from the light source to the slit is required to be kept within a predetermined range. Therefore, the fixed upper limit exists. As the distance R2 is an environmental condition of installed space itself, it is required to set the distance R1 (that is, the radius of a light pattern projector) according to the distance R2. However, in most cases, the increase of the diameter (the large-sizing) of the light pattern projector cannot be avoided.

In the conventional type light pattern projector, as a light pattern projected on a projected plane and the geometrical pattern of a slit formed on a light shielding curved surface are completely coincident, the form of a light pattern can be easily understood from the geometrical pattern of the slit before a light source is lit. When relationship between the projector and a light pattern can be extremely easily guessed as described above, an audience does not feel unexpectedness and is not interested.

Further, for an example using a conventional type light emitting device, a signal can be given. For a signal light for this type of signal, as shown in FIGS. 81 and 82A, a light bulb 3072 which is a single light source is arranged in the center of the concave surface 3071 of a reflecting mirror and a pigmented transparent filter 3073 is arranged in front of these.

As for such a signal light, a problem of pseudo-lightening is pointed out. Pseudo-lightening means a phenomenon that the light bulb looks as if it was lit by external light incident inside the signal via the pigmented transparent filter 3073 and reflected on the concave surface 3071 of the reflecting mirror though the light bulb 3072 is not lit and the phenomenon is often seen in case a signal installed with it facing west for example is exposed to the afternoon sun.

Therefore, the signal light having the light bulb 3072 as a light source is being replaced with a signal light having a lens-type light emitting diode (LED) 3075 shown in FIGS. 81 and 82B in which a light emitting element is encapsulated in a resin lens as the unit of a light source. In this signal light, plural lens-type LEDs 3075 are mounted densely in all directions on a board 3074 pigmented in black to prevent external light from being reflected. A light source in which such lens-type LEDs are densely mounted on the board is adopted not only in a signal light but in a display that displays a predetermined pattern by the emission of each LED. This LED type display has a merit that not only pseudo-lightening is solved according to it but the life is longer, compared with a display using a light bulb and the external radiation efficiency is also improved.

However, the display in which lens-type LEDs are densely mounted as described above has at least the following defects.

For the form of a lens of lens-type LED, optical design in which most of light emitted from a light emitting element can be directed in the axial direction of the lens is adopted. However, as a lens has an optical limit such as a critical angle, light to which the axial direction of the lens cannot be directed and which is not radiated outside is partially necessarily caused and all the quantity of light emitted by LED cannot be effectively utilized.

To compensate quantity emitted by individual lens-type LED, secure luminance enough for the whole display when it is turned on and secure satisfactory visibility by mounting without space, LEDs are densely mounted. However, when the mounting number of density of LEDs is enhanced, heat is confined in the display, the heat deteriorates the emission of individual LED and reduces the life of LED itself.

In a lens made of resin of lens-type LED, a small reflecting mirror (a small silver concave mirror) arranged at the back of a light emitting element is normally encapsulated together in addition to the light emitting element. Therefore, particularly in a signal light, it cannot be avoided that a part of external light incident on individual lens-type LED from the outside is reflected by the small reflecting mirror (see FIG. 82B). Therefore, when LEDs are turned off, multiple silver small spots look floating in a black board and the background color of the signal light when LEDs are turned off looks not black but grayish (this phenomenon is called dark noise). Hereby, a defect is pointed out such that the contrast of displayed color is not vivid between when LEDs are turned on and when they are turned off.

In the meantime, for a light source device, reflection-type LED where a lead on which a light emitting element is mounted is encapsulated with resin, a reflecting surface is formed on the emitting side of the light emitting element and a radiation surface is formed on the back side of the light emitting element is proposed. In this LED, a reflecting mirror is formed by depositing metal on the surface of resin formed in the shape of the reflecting surface. In LED having such structure, as substantially all the quantity of light emitted by the light emitting element can be optically controlled by the reflecting mirror, high external radiation efficiency can be realized. In case the radiation surface is formed in the shape of a convex lens, the effect of convergence can be acquired thereby.

However, it is very difficult to actually manufacture LED having such structure, it can hardly be realized or it is very troublesome and such LED is not suitable for mass production. Referring to FIGS. 83 and 84, these problems will be described below.

That is, it is very difficult to actually manufacture integrated reflection-type LED 4101 integrated in encapsulating with resin as shown in FIG. 83. The reason is that as a reflecting surface and a radiation surface are required to be respectively formed on the emitting side and on the back side of a light emitting element 4102 on the surface of encapsulating resin 4106, leads 4103a on which the light emitting element 4102 is mounted and 4103b are put between upper and lower encapsulating molds, space between the molds is filled with resin and is hardened. At this time, as a residual bubble 4107 is caused in the upper mold, a satisfactory convex form cannot be formed. As the viscosity of resin used for encapsulating LED is low even if the elimination of the residual bubble 4107 is tried by applying high pressure in filling with resin, the resin leaks from a surface joining the molds when high pressure is applied.

The LED 4111 shown in FIG. 84 according to a method of integrating after forming a convex lens 4117 separately has a problem that it takes time to align the convex lens 4117 and a light emitting part 4116 encapsulating a light emitting element 4112 with resin, it takes time to manufacture the LED and the mass production is impossible.

Further, in LED having such structure, a part of light reflected by a reflecting mirror is shielded by the light emitting element and a lead and is not radiated outside. Therefore, as the size of the light emitting element and the lead is unchanged in case LED is miniaturized, there is a problem that the ratio of shielded area to radiated area greatly increases and external radiation efficiency is greatly deteriorated. For the problem, reflection-type LED 5101 shown in FIG. 85 is proposed (in Unexamined Japanese Patent Publication No. Hei. 6-350140). This reflection-type LED 5101 is provided with a paraboloid of revolution focused on a light emitting element 5102 for the reflecting surface of a reflecting mirror 5105 except under the light emitting element 5102 and has a convex cone form 5105a only under the light emitting element 5012 so as to also radiate light radiated downward from the light emitting element 5102.

However, in the reflecting mirror 5105 having such a form, as a discontinuous sharp edge 5105b is made, the light distribution characteristics of reflected light are also discontinuous and continuous smooth radiated light cannot be acquired. There is a problem that a void is apt to be formed when such a reflecting mirror 5105 is formed with a resin mold and as the reflecting mirror has an extreme inflection point when the formation is tried by pressing a metallic plate, a non-defective product is seldom acquired and the surface roughness is also deteriorated.

In the meantime, a signal light where plural lens-type LEDs the light emitting element of each of which is encapsulated with a round-type lens are densely arranged on a board and are housed in a case is known. The signal light using LEDs for a light source has a merit that it has higher radiation efficiency, compared with that of a signal light having a light bulb generally widely used at present for a light source for emitting monochromatic light via a filter, no pseudo-lightening is caused and maintenance can be greatly reduced.

That is, in the signal light using LEDs for a light source, as LED itself emits monochromatic light, the signal light can have much higher external radiation efficiency, compared with a signal light using a light bulb that cuts most of emitted white light by a filter. In the signal light using a light bulb, when light such as the light of the afternoon sun is incident, the color of the filter is reflected, pseudo-lightening is caused, however, as no filter is required in the signal light using LED for a light source, such a problem is not caused. Further, as LED is never burnt out as a light bulb and the life is long, the frequency of maintenance can be also greatly reduced.

However, the light signal using the conventional type LED for a light source has a problem that it uses lens-type LED and the external radiation efficiency is deteriorated when the directivity of the lens-type LED is enhanced. Also, dense mounting is performed because sufficient luminous intensity and satisfactory visibility are required, however, great deal of heat is caused due to the dense mounting and LED has high temperature. It is undesirable because the output is deteriorated and the life characteristic is deteriorated that LED is turned on when it has high temperature. As optics (silver plate of a lead frame and others) for enhancing the external radiation efficiency of LED reflects external light, contrast between when LED is turned on and when it is turned off is deteriorated though no color pseudo-lightening is caused. Further, a signal light is required to save energy and has a problem that it is difficult to keep satisfactory visibility though the enhancement of the output of a light emitting element is realized in future and the number of LEDs used in a predetermined area can be reduced.

Further, a light source device in which multiple light emitting diodes (LEDs) are arranged on a board is used for illumination, a display or a signal. For LED for such a light source device, lens-type LED the diameter of which is 5 mm is widely used because sufficient light distribution characteristics are acquired. This lens-type LED is designed so that light emitted by a semiconductor light emitting element is converged by a lens and is radiated outside with directivity to some extent. Therefore, optical characteristics for approximately a multiple of the number of mounted LEDs, compared with the characteristic of single LED can be theoretically expected by arranging plural LEDs that enable external radiation on the board.

However, it is actually difficult to realize optical characteristics as in a theory. The reason is that first, there is a problem that the axial precision of individual lens-type LED is low. Particularly, in lens-type LED produced by a potting mold, the problem of the axial precision cannot be avoided.

Second, when plural lens-type LEDs are mounted on a board, there is a problem that it is not necessarily easy to precisely unify the direction and the height of each LED. Particularly in the case of discrete mounting, to direct the axis of radiated light from each LED to the same direction, work for individual adjustment is often required.

Such circumstances will be concretely described below using a case that lens-type LED is applied to various light sources as an example. For example, as shown in FIG. 86, a light source device using conventional type lens-type LED is formed by inserting a lead 6074 of the lens-type LED 6073 into a hole 6072 formed beforehand through a single mounting board 6071 and soldering each, lead 6074 with the board 6071.

In such a light source, the enhancement of the mounting number of density per unit area is demanded to secure sufficient luminance and some hundred LEDs 6073 may be mounted on one mounting board 6071 in the case of a light source device for a signal light. In a light source device used in photography by a CCD camera for example, the mounting number of density of LEDs 6073 per unit area is further enhanced, compared with the light source device for a signal light. In this light source device, each LED 6073 is mounted on the mounting board 6071 in a state that looks as if the respective were in contact.

The lens-type LED 6073 shown in FIG. 86 is generally manufactured using a potting mold. Potting means a method of mounting a semiconductor light emitting element 6075 at the end as shown in FIG. 87, arranging a pair of leads 6074 conducted via the semiconductor light emitting element 6075 and bonding wire 6076 in a resin forming case (a pot) 6077 and manufacturing LED encapsulating the semiconductor light emitting element 6075 inside a lens 6078 shown in FIG. 86 and made of transparent resin by pouring liquid resin into the resin forming case for thermosetting. The outline of the potting molding is disclosed in Japanese published unexamined patent application No. Hei 7-183440 for example. In lens-type LED 6073 manufactured using the potting mold, a pair of leads 6074 is extended in parallel with the axial direction of the lens 6078 from the lens 6078 made of resin.

For the conventional type LED light source, the following defects are pointed out. First, in discrete mounting, in case the mounting number of density is extremely high as in the light source device used in photography by a CCD camera, automatic dense mounting using an automechanism (or a robot) is difficult. Therefore, extremely dense discrete mounting may be required to depend upon manual labor. Manual work generally takes much time for mounting work. It is difficult to unify the height and the mounting angle of lens-type LED mounted on a board and the height and the mounting angle of LED are apt to be uneven. Therefore, the aggregate of LEDs may be unable to fully emit (because the light distribution characteristics become unstable). There is a problem that it takes further much time to adjust the light distribution characteristics.

As also pointed out in Unexamined Japanese Patent Publication No. Hei. 7-183440, generally in potting molding, the leads 6074 (and its frame) are apt to tilt for the pot 6077 when resin is cast and in completed individual. LED 6073, dislocation is apt to be caused between the central axis of the lens 6078 and the optical axis of light radiated from the light emitting element 6075. That is, it is difficult to enhance the axial precision of the lens-type LED 6073 itself which is an attachment.

As described above, it need scarcely be said that it takes much manual labor when lens-type LEDs 6073 are discretely mounted on the board 6071, after mounting, work for individual adjustment such as the mounting angle of individual LED 6073 is manually finely controlled is also essential to unify the radiation direction of light from each LED 6073 and the low productivity comes into a question.

For a method of manufacturing LED, securing the high positional precision of a lens for a light emitting element, the application of a transfer mold is heretofore proposed. In transfer molding, liquid resin is poured into a cavity of the molds in a state that a lead frame is fixed between a pair of molds when a light emitting element is encapsulated with resin so as to form a lens.

However, for LED manufacturing according to transfer molding, to acquire sufficient light distribution effect, a lens is also required to be formed so that it has the diameter of 5 mm or more. LED manufactured according to transfer molding requires more quantity of encapsulating resin, compared with LED 6073 manufactured according to the potting molding and provided with the lens 6078 of approximately the same size. Therefore, in mounting LED, encapsulating resin is greatly thermally deformed by heat history in thermosetting processing using cream solder for fixing the leads of LED on a board and a problem such as the disconnection of bonding wire may occur.

SUMMARY OF THE INVENTION

The invention is made to solve at least one of the problems and has a first object to provide a light source device having new configuration. The configuration of the invention is as follows.

A light source device according to the invention is provided with a light shielding member having an optical aperture, a light source arranged on one side of the light shielding member and a reflecting surface opposite to the light source and installed so that the side of the light emission direction of the light source is enclosed, and is characterized in that after light from the light source is converged by being reflected on the reflecting surface, it is radiated from the optical aperture of the light shielding member.

According to such configuration, after light from the light source is once reflected on the reflecting surface, it is radiated outside, however, as the reflecting surface is installed so that the surface encloses the side of the light emission direction of the light source, much of light from the light source is reflected on the reflecting surface and can be utilized for external radiation light. This simultaneously means that in case plural light sources are used to acquire predetermined quantity of light, the number of light sources arranged in a fixed area can be reduced. As a result, the calorific value of the whole light sources is reduced, outgoing radiation from each light source is facilitated, and the output and the life of the light source can be effectively prevented from being deteriorated due to the heat of the light sources. Light from the light source is converged on the direction of the light shielding member by being reflected on the reflecting surface and is radiated outside via the optical aperture provided to the light shielding member. That is, light from the light source reflected on the reflecting surface is efficiently radiated outside via the optical aperture of the light shielding member, preventing light from being taken on the side of the reflecting surface owing to the light shielding member. Therefore, light can be prevented from being taken on the side of the reflecting surface without deteriorating external radiation efficiency. As a result, pseudo-lightening when the light source is turned off can be effectively prevented and the light source device having high contrast between when the light source is turned on and when it is turned off is provided.

For the light shielding member, a plate the plan of which is substantially circular, a substantially oval plate, a substantially rectangular plate and a plate in a shape in which these are arbitrarily combined can be used. The material of the light shielding member is also not particularly limited if it is suitable for light shielding and for example, resin pigmented in black which has high light shielding effect can be used. The whole light shielding member is not required to be formed by light shielding material and for example, black coating may be also applied only to the outside surface (the surface on the side radiated by external light) to apply a light shielding property. In case LED is used for a light source, a board for mounting in a predetermined shape can be used for a light shielding member. In this case, the board is also formed by material having a light shielding property or black coating and others are also applied to the board so as to apply a light shielding property to the board.

The optical aperture is provided to the light shielding member. The optical aperture means a part which can transmit light inside the light shielding member and for example, is formed by providing a through hole in a part of the light shielding member. In this case, the through hole can be filled with transparent resin and others. According to such configuration, dust and others can be prevented from entering the inside of the light source device through the through hole from the outside. In case black coating is applied to apply a light shielding property as described above, an uncoated part is partially provided and this can be also made to function as the optical aperture.

The number of the optical apertures is determined corresponding to the number of reflecting surfaces and it is desirable that the optical apertures of the same number as that of the reflecting surfaces are provided. Plural optical apertures are provided to one reflecting surface and light reflected on one reflecting surface may be also radiated outside via plural optical apertures.

For the form of the optical aperture, various shapes can be adopted. For example, a circle when viewed from the top, an oval and a rectangle can be given. The size of the optical aperture is designed in consideration of the light shielding property of the light shielding member and the radiation efficiency of light reflected on the reflecting surface. That is, it is desirable that the optical aperture is reduced as much as possible in an extent that light of sufficient quantity can be radiated and hereby, high external radiation efficiency is acquired, reducing taking external light via the optical aperture. It is preferable that the optical aperture has the size that the whole of light reflected on the reflecting surface and converged can be substantially radiated.

The light source is arranged on the side reverse to the side on which external light is radiated of the light shielding member. It is desirable that the light source is attached to the surface of the light shielding member directly or via an attachment.

The light source is required to be arranged at least so that the main radiation direction of the light source is different from a direction from the light source to the light shielding member.

For the light source, a light bulb and a light emitting diode (LED) can be used. It is desirable from the viewpoints of miniaturization, emission efficiency, power saving and the increase of the life that LED is used.

In case LED is used for a light source, the type of LED is not particularly limited, and round-type (lens-type) LED and chip-type LED can be used. According to the purpose, desired emitted color of LED such as a red, green and blue can be used. RGB-type LED can be also used.

A light source device that has the wavelength of emission from LED (a light emitting element) in a range of 380 to 500 nm and radiates white light by including fluorescent material excited by light having the wavelength for emitting fluorescence in the encapsulating member can be provided. Further, a dispersing agent may be also included in the encapsulating member.

In this case, it is desirable that LED having the wavelength of emission in a range of 420 to 490 nm is used. It is preferable that LED having the wavelength of emission in a range of 450 to 475 nm is used. For such LED, LED made of group III nitride compound semiconductor is suitably used.

For fluorescent material, one or more fluorescent materials selected out of ZnS: Cu, Au, Al, ZnS: Cu, Al, ZnS: Cu, ZnS: Mn, ZnS: Eu, $YVO_4$: Eu, $YVO_4$: Ce, $Y_2O_2S$: Eu, $Y_2O_2S$: Ce are used. ZnS: Cu, Au, Al means ZnS photoluminescent fluorescent material in which Cu, Au and Al are added to ZnS, and ZnS: Cu, Al, ZnS: Cu, ZnS: Mn and ZnS: Eu respectively mean photoluminescent fluorescent material in which Cu and Al, Cu, Mn and Eu are similarly respectively added to ZnS. Similarly, $YVO_4$: Eu and $YVO_4$: Ce are respectively fluorescent material in which Eu and Ce are respectively added to $YVO_4$, and $Y_2O_2S$: Eu and $Y_2O_2S$: Ce are respectively fluorescent material in which Eu and Ce are respectively added to $Y_2O_2$. These fluorescent materials have an absorption spectrum for light in a range of blue to green and emit light having a longer wavelength than an excited wavelength.

As the emission wavelength of ZnS: Eu, $YVO_4$: Ce and $Y_2O_2S$: Ce out of the fluorescent materials for blue to green excited light is longer, compared with that of the other fluorescent material, that is, as an emission from these fluorescent materials is red, light acquired by mixing light emitted from these fluorescent materials and light from the light emitting diode has color closer to white. As described above, to acquire luminescent color closer to white, it is desirable that one or more selected out of ZnS: Eu, $YVO_4$: Ce and $Y_2O_2S$: Ce are selected as fluorescent material.

The reflecting surface is installed in a position opposite to the light source. The reflecting surface is provided to reflect and converge light from the light source and is designed according to a relation to the optical aperture provided to the light shielding member. That is, the reflecting surface is required to be designed so that light reflected on the reflecting surface and converged passes the optical aperture and is radiated outside. For example, a part of an ellipsoid of revolution having a focal point in the light source and the optical aperture of the light shielding member or in the vicinity is used for the reflecting surface. For the reflecting surface having such configuration, light from the light source is reflected on the reflecting surface and converged, and the focal point of the converged light is located in the optical aperture of the light shielding member or in the vicinity. As a result, light can be converged in a small range of the optical aperture or the vicinity and light can be radiated outside with the small optical aperture. That is, as the optical aperture can be made small, pseudo-lightening is effectively prevented as described above. It is preferable that the reflecting surface is designed so that the focal point of light reflected on the reflecting surface and converged is located in the optical aperture of the light shielding member.

According to such configuration, as converged light can be radiated outside via the smaller optical aperture, pseudo-lightening preventing effect is more enhanced. The reflecting surface is provided so that it enclose the side of the light emission direction of the light source. The reason is that the substantial whole of light from the light source is reflected on the reflecting surface, is utilized for external radiation light and the external radiation efficiency is enhanced.

Plural reflecting surfaces may be provided. In this case, plural optical apertures are formed in the light shielding member as described above and light reflected on each reflecting surface and converged is radiated outside via an optical aperture corresponding to the corresponding reflecting surface. According to such configuration, light from one light source is radiated via the plural optical apertures. In other words, as apparent emission points are increased for the number of the light sources, the similar effect to effect when plural light sources are arranged, that is, the effect that the number of emission points per area is increased, the unevenness of emission is reduced and satisfactory visibility is produced is acquired.

In this case, it is also desirable that each reflecting surface is a part of an ellipsoid of revolution having a focal point in an optical aperture or in the vicinity corresponding to the corresponding reflecting surface in the light source and the light shielding member. Light respectively converged by each reflecting surface can be radiated outside via the small optical aperture and pseudo-lightening can be effectively prevented, keeping the external radiation efficiency high. It is preferable that each reflecting surface is designed so that the focal point of light respectively converged by being reflected on each reflecting surface is located in an optical aperture corresponding to the corresponding reflecting surface of the light shielding member.

The reflecting surface can be formed by forming resin in a predetermined shape or by pressing a metallic plate. In case a resin molded component is used, a light reflection property is applied to the surface by depositing metal on the surface or plating the surface or by applying metal and others to the surface. It is desirable that a metallic plate made of material having high reflectance is used, however, processing for enhancing the reflection efficiency of the surface can be also executed after press working.

The invention is made to solve the problems and has a second object to provide a light source device wherein external radiation efficiency is high, dark noise is small and the deterioration of contrast between when a light source is turned on and when it is turned off can be effectively prevented. The configuration is as follows.

A light source device according to the invention is provided with LED that reflects light from a light emitting element on a reflecting surface and emits it and a light shielding member installed in a light emission direction from the LED and provided with an optical aperture having smaller aperture area than the area of the reflecting surface viewed from the top of the light emission direction, and is characterized in that after light emitted from the LED is converged, it is radiated outside via the optical aperture of the light shielding member.

According to such configuration, external light is prevented from being taken into the side of LED owing to the light shielding member, however, as the aperture area of the optical aperture provided to the light shielding member is small, external light taken into the side of LED via the optical aperture can be reduced. That is, external light can be effectively prevented from being taken in the side of LED and high light shielding effect is acquired. As light from LED is radiated outside via the optical aperture of the light shielding member after it is converged, external radiation efficiency is prevented from being deteriorated by providing the light shielding member. That is, light from LED can be efficiently radiated outside, effectively preventing external light from being taken. Therefore, the light source device which emits light of high luminance and in which contrast between when LED is turned on and when it is turned off is effectively prevented from being deteriorated due to dark noise is provided.

A light emitting element and a reflecting surface are provided to LED and after at least a part of light from the light emitting element is once reflected on the reflecting surface, it is radiated.

The element structure of the light emitting element is not limited and well-known element structure can be arbitrarily selected and used. The emission color of the light emitting element is suitably selected according to a purpose. The emission color is selected according to desired emission color such as blue, red and green for example. Plural light emitting elements can be also used. In that case, the same type of light emitting elements may be also combined and in addition, different types of plural light emitting elements may be also combined. For example, light emitting elements having the emission colors of red, green and blue which are three primary colors of light are combined. According to such configuration, LED that can emit arbitrary color is acquired.

For a blue light emitting element, a light emitting element made of group III nitride compound semiconductor for example can be adopted.

The optical aperture has smaller aperture area than the area in case the reflecting surface is viewed from the top of the light emission direction. That is, the optical aperture is smaller, compared with the reflecting surface. Taking external light into the side of LED is effectively inhibited by forming the optical aperture so that it is small.

The aperture area of the optical aperture can be substantially equalized to area in which light from LED is converged in the optical aperture. According to such configuration, light of substantially all quantity can be radiated outside and the effect of light shielding by the light shielding member can be increased possibly.

The number of optical apertures is determined corresponding to the number of LEDs and it is desirable that optical apertures of the same number as that of LED are provided. In case plural LEDs and plural optical apertures are provided, light from each LED is respectively radiated outside via the corresponding optical aperture.

Plural optical apertures are provided to one LED and light from one LED can be also radiated outside via the plural optical apertures.

The reflecting surface is arranged in a position in which light from the light emitting element is reflected. For example, the back side of the light emitting element is arranged on the side of the light shielding member and the reflecting surface is arranged on the side of the emission surface of the light emitting element. The side of the emission surface of the light emitting element is arranged on the side of the light shielding member and the reflecting surface is arranged in a direction of the side of the emission surface of the light emitting element. In this case, the aperture of the reflecting surface shall be located on the side of the light shielding member.

The form of the reflecting surface shall be able to converge by reflecting light from the light emitting element for example. In case the light emitting element is encapsulated with an encapsulating member made of light transmissive material such as epoxy resin and glass, light from the light emitting element is emitted after the light is transmitted in the encapsulating member and is refracted on the surface (the light emission surface) after the light is reflected on the reflecting surface, a reflecting surface such as light emitted from the surface (the light emission surface) of the encapsulating member is converged is adopted. In this case, the light emission surface of the encapsulating member can be made a flat form.

A reflecting surface having a form such as light reflected on the reflecting surface becomes a parallel ray can be adopted and for example, a reflecting surface substantially in the shape of a paraboloid of revolution having the light emitting element as a focal point can be adopted. In this case, the light emission surface of the encapsulating member is made a telecentric form. Hereby, LED is provided with a telecentric optical system and a parallel ray emitted from the light emitting element and reflected on the reflecting surface is converged by the light emission surface of the encapsulating member.

As described above, light emitted from LED is converged by the reflecting surface or the reflecting surface and the light emission surface of the encapsulating member, however, it is desirable that converged light is converged and in that case, it is desirable that the optical aperture of the light shielding member is located in the converged position. According to such configuration, light from LED can be converged in a small range of the optical aperture and can be radiated outside via a smaller optical aperture. As the optical aperture can be reduced, external light taken into the side of LED via the optical aperture can be reduced.

Further, it is desirable that light emitted from LED is converged in the optical aperture of the light shielding member. According to such configuration, as light emitted from LED can be radiated outside via the smaller optical aperture, the generation of dark noise and the deterioration of contrast respectively due to taking external light can be more effectively prevented.

The invention is made to solve the problems and has a third object to provide a light source device wherein external radiation efficiency is high, dark noise is small and contrast between when a light source is turned on and when it is turned off is effectively prevented from being deteriorated. The configuration is as follows.

The light source device according to the invention is provided with LED including a light emitting element and an encapsulating member made of light transmissive material for encapsulating the light emitting element and forming a lens surface, a light shielding member installed in the light emission direction of the LED and having an optical aperture of smaller aperture area than the area of the lens surface of the LED viewed from the top of the light emission direction and an inner lens arranged between the LED and the light shielding member, and is characterized in that light emitted from the lens surface of the LED is radiated outside via the optical aperture of the light shielding member after the light is converged by the inner lens.

According to such configuration, as light emitted from LED is radiated outside after the light is converged by the inner lens, the convergence degree of LED itself is not required to be particularly enhanced and a problem in case lens-type LED is used that external radiation efficiency is deteriorated as the convergence degree is enhanced can be avoided. Therefore, light can be radiated from LED to the inner lens at high efficiency. As light emitted from LED is converged in a small range by the inner lens, it can be radiated outside via the small optical aperture. Therefore, the deterioration of external radiation efficiency is not caused by forming the optical aperture of the light shielding member so that it is smaller.

In the meantime, as the optical aperture provided to the light shielding member is smaller than the area of the lens surface of LED viewed from the top of light emission direction, external light incident on the side of LED via the optical aperture is reduced. As a result, the generation of reflected light by an optical system provided to LED can be reduced.

As described above, according to the configuration of the invention, high external radiation efficiency can be maintained and reflected light (dark noise) by external light can be reduced. Therefore, the light source device having high contrast between when LED is turned on and when it is turned off is provided.

The encapsulating member is made of light transmissive material, encapsulates the light emitting element and forms a lens surface. Light from the light emitting element is radiated outside from the lens surface. Light transmissive material is not particularly limited and epoxy resin and glass can be used. It is desirable that the form of the lens surface is designed in view of the emission efficiency of LED and in consideration of relation to the inner lens. That is, in view of the emission efficiency, it is undesirable that as the emission efficiency of LED is deteriorated as the lens surface has a form higher in convergence, the form of the lens surface very high in convergence is adopted. For relation to the inner lens, it is desirable that the lens surface has a form that much of light emitted from LED can be incident on the inner lens.

The aperture area of the optical aperture shall be smaller than the area of the lens surface of LED in case the LED is viewed from the top of the light emission direction. According to such configuration, taking external light into the side of LED is effectively inhibited. In other words, the quantity of external light taken into LED via the optical aperture can be reduced and therefore, the generation of reflected light by the optical system in LED can be greatly avoided. Therefore, in case in LED, there are optics such as silver plate applied to a lead frame to enhance emission efficiency, the generation of reflected light by them and the deterioration of contrast can be also possibly prevented and the light source device provided with both high luminance and high contrast can be formed.

Also, the aperture area of the optical aperture can be substantially equalized to the area of a converged area of light from LED in the optical aperture. According to such configuration, substantially all quantity of light can be radiated outside and the light shielding effect of the light shielding member can be increased as much as possible.

The number of optical apertures is determined corresponding to the number of LEDs and it is desirable that optical apertures of the same number as the number of LEDs are provided. In case plural LEDs and plural optical apertures are provided, light from each LED is radiated outside via the corresponding optical aperture.

Plural optical apertures are provided to one LED and light from one LED can be also radiated outside via the plural optical apertures.

The inner lens is arranged between LED and the light shielding member. The inner lens converges light radiated from LED and is provided to efficiently radiate light emitted from the light emitting element outside via the optical aperture of the light shielding member.

The inner lens can be formed by light transmissive material such as glass, acrylic resin and polycarbonate.

As described above, light radiated from LED is converged by the inner lens, however, it is desirable that converged light is converged and in this case, it is desirable that the optical aperture of the light shielding member is located in the converged position. According to such configuration, light from LED can be converged in a small range of the optical aperture and can be radiated outside via a smaller optical aperture. As the optical aperture can be formed so that it is smaller, external light taken into the side of LED via the optical aperture can be reduced.

Further, it is desirable that light emitted from LED has a focal point in the optical aperture of the light shielding member. According to such configuration, as light emitted from LED can be radiated outside via the smaller optical aperture, the generation of dark noise and the deterioration of contrast respectively due to taking external light can be more effectively prevented.

A fourth object of the invention is to provide a light emitting device wherein the quantity of light from a light source can be effectively utilized to the utmost. Further, the fourth object is to provide a light emitting device that can be miniaturized, securing the visibility of a light pattern reflected on a virtual plane. In addition, the fourth object is to provide a light emitting device wherein it is difficult to guess a light pattern projected on a projected plane by a projector based upon the structure of the device observable from the outside.

The invention relates to the light emitting device that projects light, the light emitting device according to the invention is provided with a light source installed so that light is radiated mainly on the side reverse to a direction in which light is projected and a reflecting member installed in front of the light source and having plural reflecting surfaces that reflect light from the light source in the direction of projection, and is characterized in that each of the plural reflecting surfaces has a concave form such as most of light reflected by each is converged in a light converged area set every reflecting surface in the position of the light source or in a further rear position, light reflected on each reflecting surface and converged in the corresponding light converged area diverges after the light passes the light converged area and reflected light from the plural reflecting surfaces forms overlapped light.

According to the light emitting device, light emitted from the light source is reflected on each concave reflecting surface provided to the reflecting member in front of the light source. Reflected light by each reflecting surface is once converged in the corresponding light converged area and after the light passes the area, it diverges. The sectional form of each reflected light reflects the front form of each reflecting surface. Because of the setting of an optical path that light is once converged in a light converged area, the sectional form of light produced by one reflecting surface is equivalent to the inverted front form of the reflecting surface. Further, reflected light from the respective plural reflecting surfaces diverges with them mutually overlapped. As described above, this device has no internal structure that shields light emitted from the light source in vain, most of light emitted from the light source is reflected on each reflecting surface and is efficiently radiated outside (that is, the external reflection efficiency of light is high).

In the light emitting device, after light passes the light converged area, a light pattern by the overlapped light of reflected light from the plural reflecting surfaces can be formed on a predetermined virtual plane.

According to this light emitting device, a light pattern imaged on the virtual plane is equivalent to the overlapped inverted form of each reflected light. This device has no internal structure that shields light emitted from the light source in vain, most of light emitted from the light source is reflected on each reflecting surface, reaches the virtual plane, is effectively utilized for forming a light pattern and contributes to securing the visibility of the light pattern.

As the form of a light pattern on the virtual plane is determined by the overlap of reflected light from the plural reflecting surfaces, it is normally extremely difficult to guess causal relation between the internal structure and the form of the light pattern even if the device is merely observed from the outside.

In the light emitting device, the center of the reflecting member is located on the central axis of the light source, the plural reflecting surfaces are arranged so that they enclose the central axis and may be also provided as a concave surface of the same form partitioned by plural virtual parting lines extended in a radiational direction at an interval of an equal angle from the central axis.

According to this configuration, any of the plural reflecting concave surfaces has the same form and is arranged symmetrically based upon the central axis of the light source. Therefore, each reflecting concave surface can assign the identity of the sectional form and the symmetry property of the arrangement to each of light projected outside. As a result, each reflecting concave surface can assign a geometrical symmetry property and regularity to the sectional form of light acquired because reflected light from each reflecting surface is overlapped.

In the light emitting device, the reflecting member has six reflecting surfaces, the six reflecting surfaces are arranged so that they enclose the central axis and may be also provided as a concave surface of the same form partitioned by six virtual parting lines extended in a radiational direction at an interval of an equal angle from the central axis.

For the six reflecting concave surfaces, three reflecting concave surfaces arranged at phase difference of 120° form one group, reflected light projected by three reflecting concave surfaces of each group is substantially overlapped and one light having a substantially triangular section is produced. As there is a phase shift of 60° between two groups each of which includes three reflecting concave surfaces, light having a substantially-triangular section and produced by each group is also overlapped with the phase shift of 60° and as a result, one light the section of which is in the shape of a star shown in FIG. 26 is produced. It will be extremely difficult to guess the emersion of such light the section of which is in the shape of the star based upon the knowledge of the form and the arrangement of the individual reflecting concave surface.

In the light emitting device, each of plural light converged areas corresponding to the plural reflecting surfaces is set to a small area of an extent that each can be regarded as one focal point, these light converged areas are located at the back of the light source by the same distance, are arranged opposite to the respective corresponding reflecting surface in a position apart by equal distance from the central axis and each of the plural reflecting surfaces may be also provided as a concave surface substantially equivalent to an ellipsoid having the light source as one focal point and having the corresponding light converged area as another focal point.

According to this configuration, it is facilitated to actually set plural light converged areas, relating them to plural reflecting surfaces. Also, it is facilitated to design the concave form of each reflecting surface utilizing well-known optical technique.

In the light emitting device, in a position in which the light converged area is set, a light shielding plate having an optical window that can include the light converged area can be arranged.

It is inhibited by the arrangement of such a light shielding plate that external light is incident inside the device and it is avoided that such external light disturbs the visibility of light projected from this device. Also, the inside of the device cannot be viewed from the outside by the existence of the light shielding plate with the optical window without preventing light from each reflecting surface from being projected outside via the optical window. Therefore, an audience cannot guess the form of light projected by the light emitting device beforehand and unexpectedness when the section of light is projected is increased.

The invention is made in view of the circumstances described above and has a fifth object to provide a projector unit wherein the quantity of light emitted by a light emitting element can be fully effectively utilized and satisfactory visibility can be acquired. The invention also has the fifth object to provide a projector unit wherein contrast between when the light emitting element is turned on and when it is turned off can be enhanced.

The projector unit according to the invention is provided with a light emitting element arranged on one axis, a reflecting surface opposite to the emission surface of the light emitting element and a front member which shields external light and in a predetermined position of which an optical aperture is provided, and is characterized in that the reflecting surface has a form that light from the light emitting element is converged in at least one annular area and the optical aperture is provided corresponding to the annular area.

According to this configuration, most of the quantity of light emitted from the light emitting element is received by the reflecting surface, reflected light by the reflecting surface is converged in the annular area corresponding to the optical aperture of the front member and is projected outside via the annular area and the optical aperture. If the annular area is located apart by predetermined distance from one axis on which the light emitting element is arranged, the light emitting element never captures light reflected on the reflecting surface and internal structure that shields light hardly exists on an optical path until light emitted from the light emitting element is projected outside. As described above, as substantially all the quantity of light emitted from the light emitting element is effectively utilized and is projected outside, the external radiation efficiency of light is extremely high.

As light emitted from the light emitting element is projected outside via the annular area and the optical aperture corresponding to the annular area after the light is reflected on the reflecting surface, the light looks not a light spot but a substantially annular light band having fixed area from the front side of the projector unit. In other words, a band of light having fixed area is produced by one light emitting element. Therefore, in case plural projector units are arranged closely, a band of light can account for the considerable ratio of area on the front side of the group of projector units and the similar visual effect to that in case conventional type lens-type LEDs are densely mounted when the projector units are turned on is produced. As sufficient space is secured around the light emitting element owing to the structure of this projector unit though the visual effect is similar as described above, fixed distance is kept between the respective light emitting elements even if two projector units are adjacently arranged. Therefore, there is no possibility that heat is confined, compared with the dense mounting of the conventional type lens-type LEDs, and the deterioration of the output of the light emitting element and the reduction of the life respectively caused due to confined heat are avoided beforehand.

Further, this projector unit has structure designed on the assumption of an optical path that light emitted from the light emitting element is reflected on the reflecting surface and reaches the optical aperture (and the annular area) Therefore, even if external light incident on the optical aperture from the outside is transmitted in the reverse direction of the optical path and enters the projector unit when the light emitting element is turned off, the light emitting element located on the axis is irradiated by the external light reflected on the reflecting surface and the external light is absorbed or irregularly reflected. Hereby, much of light that repeats irregular reflection in the unit cannot be transmitted again on the optical path leading to the outside via the optical aperture and is shielded by the front member. Therefore, probability that external light that enters the unit is transmitted again on the optical path leading to the outside via the optical aperture is extremely low. That is, when the light emitting element is turned off, ratio at which the reflecting surface reflects a ray based upon external light toward the optical aperture is extremely low and the reflecting surface does not actually cause dark noise. Therefore, according to this projector unit, dark noise is effectively avoided.

In addition, a band having fixed area of multiplex light is produced from one light emitting element by designing the reflecting surface so that it has a form that light from the light emitting element is converged in plural annular areas and providing the optical aperture so that it corresponds to the annular areas. Therefore, even if occupied area per light emitting element is increased and the radius of the band of light is increased, it can be inhibited that the center looks as if it was a void and images on a screen can be kept vivid.

The reflecting surface can have a rotary form on one axis on which the light emitting element is arranged.

The reflecting surface according to the configuration can more securely converge light from the light emitting element in the annular area.

The reflecting surface may also have a solid angle in a range of 1.0 to 2.5 π (strad) with the light emitting element.

For a signal light, it is generally required that light from a light emitting element is converged in a range of ±30° or less with a central axis and is radiated outside. In case this range of convergence is adopted in lens-type LED and the realization by the outside direct radiation of light from a light emitting element is tried, the lens surface of the LED can have only a solid angle of 1 π (strad) or less because a critical angle exists. In other words, in case lens-type LED is used, only light in a range of a solid angle of 1 π (strad) out of light emitted from the emission surface of LED is effectively radiated outside.

In the meantime, the reflecting surface can receive light from the light emitting element in a wider range of a solid angle and external radiation efficiency in the projector unit can be more securely kept high. In addition, as light reflected on the reflecting surface is once converged in the annular area, the convergence degree can be enhanced, compared with a case of direct outside radiation from lens-type LED.

The reflecting surface may be also formed substantially along a curved surface acquired by revolving an elliptic arc having the light emitting element and one point in the annular area as a focal point on one axis on a plane including one axis on which the light emitting element is arranged.

A reflecting surface according to this configuration is provided as a curved surface close to an ellipsoid acquired by revolving the elliptic arc having the light emitting element on one axis and the annular area apart by predetermined distance from one axis in a direction of the diameter as both focal points on one axis. According to this configuration, light reflected on the reflecting surface of light emitted from the light emitting element is converged in the annular area located in a focal position of the elliptic arc and the quantity and the luminance of a luminous flux that passes the annular area can be enhanced. It is desirable that one axis is equivalent to the central axis of the projector unit and in that case, the symmetry of the internal structure of the unit is secured and the distribution of light projected outside is unified.

The reflecting surface may also be a concave surface formed on abase arranged substantially in parallel to the front member and apart by predetermined distance.

According to this configuration, the reflecting surface is not exposed to the outside of the projector unit and can be prevented from being damaged carelessly. In the manufacturing process, no unpredicable stress is applied to the reflecting surface and the optical performance of the reflecting surface can be kept high.

Further, a projector unit according to the invention is provided with a light emitting element and a reflecting surface opposite to the emission surface of the light emitting element, the reflecting surface has a form that light from the light emitting element is converged in at least one annular area and an annular emission pattern is visible corresponding to the annular area.

This configuration is equivalent to the projector unit from which the front member is removed. Therefore, according to this configuration, the similar action and effect to those of the projector unit are acquired. That is, the external radiation efficiency of light is enhanced. A band having fixed area of light is produced from one light emitting element, the similar visual effect to that in case conventional type lens-type LEDs are densely mounted can be produced, there is hardly fear that heat is confined, compared with that in the case of the dense mounting of the conventional type lens-type LEDs, and the deterioration of the output of the light emitting element and the reduction of the life respectively caused due to heat reserve are avoided. However, as no front member is provided, the configuration does not function as an effective countermeasure for dark noise.

Further, the invention has a sixth object to embody reflection-type LED provided with a radiation surface in an practical arbitrary shape in which mass production is enabled.

A reflection-type light emitting diode according to the invention is provided with a light emitting element, a lead for supplying power to the light emitting element, a reflecting mirror provided opposite to the emission surface of the light emitting element, a radiation surface on the back side of the light emitting element and light transmissive material, and is characterized in that the reflecting mirror is formed by a member in the shape of a cup, the light emitting element, a part of the lead and the reflecting mirror are encapsulated with the light transmissive material and an optical control surface is formed on the radiation surface.

According to the reflection-type LED having such configuration, as light emitted from the emission surface of the light emitting element is reflected on the reflecting mirror formed by the member in the shape of a cup, the optical control surface is required to be formed only on the radiation surface on the back side of the light emitting element in encapsulating with resin. Therefore, light distribution control by the form of the optical control surface is applied to light reflected on the reflecting mirror by forming the optical control surfaces respectively having various forms on the radiation surface and is radiated from the radiation surface. As described above, the reflection-type LED provided with the radiation surface in a practical arbitrary shape in which mass production is enabled is embodied by using the reflecting mirror formed by the member in the shape of a cup.

In the reflection-type light emitting diode, the radiation surface is formed in a lower mold of an encapsulating mold. As described above, according to the reflection-type LED according to the invention, it is only on the radiation surface on the back side of the light emitting element that the optical control surface is required to be formed in encapsulating with resin. Therefore, if the form of the side of the radiation surface is carved in the lower mold of the encapsulating mold, the lead and the reflecting mirror are put between the upper and lower molds and molding is performed with the side of the radiation surface in the lower mold, the problem of residual bubbles is solved. As the optical characteristics of the upper side are determined by the reflecting mirror, the optical control surface is not required to be formed on the upper side, and particularly strict form and state of the surface are not required. Therefore, the reflection-type light emitting diode is not necessarily required to depend upon a forming method such as transfer molding and can be encapsulated with resin using a potting mold.

As described above, the radiation surface can be also integrated at an optical level using a resin mold by using the reflecting mirror formed by the member in the shape of a cup and the reflection-type LED provided with the radiation surface in the practical arbitrary form in which mass product on is enabled is embodied.

In the reflection-type light emitting diode according to the invention, the radiation surface can have a convex form. As reflection-type LED provided with the radiation surface having an arbitrary form according to the configuration is embodied, the radiation surface can also have a convex form. Hereby, light emitted by the reflection-type LED is converged by the action such as action acquired by a convex lens of the convex radiation surface. As described above, the reflection-type LED having the action of convergence can be realized.

In the reflection-type light emitting diode according to the invention, the reflecting mirror is formed by a metallic plate worked in a concave shape or by plating the metallic plate. Therefore, as the reflecting mirror has resistance to the change of temperature and a function as a reflecting mirror is not lost by a crinkle caused due to the change of temperature as in a reflecting mirror on the resin surface of which metal is deposited, a reflow furnace for surface mounting can be used. Hereby, as the reflection-type light emitting diode can be used for a surface mounting component without a limit, it is suitable for reflection-type LEDs mounted in great deal.

The reflecting mirror reflects light emitted from the light emitting element in a direction except the circumference of the light emitting element so that the light is radiated outside.

Therefore, as light reflected on the reflecting mirror does not reach a light shielding portion and is radiated outside even if the reflection-type LED is miniaturized and the area ratio of the light shielding portion (the light emitting element) to the radiation surface is increased, the reflection-type light emitting diode becomes reflection-type LED wherein external radiation efficiency can be kept high though the LED is miniaturized.

Light can be annularly converged by the reflecting mirror and the light radiation surface can be formed in the shape of a ring having the concave center.

Therefore, light reflected by the reflecting mirror is converged annularly except the circumference of the light emitting element and is not shielded by the light emitting element. As the light radiation surface is in the shape of a ring having the concave center, light annularly converged is radiated outside as it is from the ring-shaped portion of the light radiation surface and high external radiation efficiency can be acquired. As reflected light is converged annularly except the circumference of the light emitting element even if the reflection-type LED is miniaturized and the area ratio of the light shielding portion (the light emitting element) to the radiation surface is increased, the reflection-type light emitting diode becomes reflection-type LED wherein external radiation efficiency can be kept high though the LED is miniaturized.

Further, the invention has a seventh object to provide practical reflection-type LED wherein external radiation efficiency can be kept at a high level though the LED is miniaturized and radiated light having smooth and continuous light distribution characteristics is acquired.

A reflection-type light emitting diode according to the invention is provided with a light emitting element, a lead for supplying power to the light emitting element, a reflecting mirror provided opposite to the emission surface of the light emitting element and having a substantially continuous surface which is smooth except the center for radiating light emitted from the light emitting element outside after the light is reflected in a direction except the circumference of the light emitting element and a radiation part on the back side of the light emitting element. The radiation part may be a radiation surface which is a phase boundary of light transmissive materials and may be a hollow open part.

"The substantially continuous surface which is smooth except the center" means a central axis symmetrical form acquired by revolving a part (including lines 765*a*, 765*b*, 765*c*, 765*d*, 765*e*, 765*f*, 765*g* and 765*h*) of a polygon shown in FIG. 58A on the central axis and a combination shown in FIG. 58B of a central axis symmetrical form 775*a* acquired by revolving a part of an ellipse having the light emitting element 772 and one point outside resin 776 as a focal point on the central axis and a form of a paraboloid of revolution 775*b* having the light emitting element 772 as a focal point. These are a discontinuous surface in strict meaning, however, there is no rapid change of the form of the surface such as a sharp edge is made and these are a surface which can be regarded as substantially continuous and smooth except a convex portion in the center.

Therefore, as light reflected by the reflecting mirror does not reach the circumference of the light emitting element and is radiated outside even if the reflection-type LED is miniaturized and the area ratio of the light emitting element of the light shield portion (the light emitting element and the lead) to the area of the radiation part is increased, light is not shielded by the light emitting element and the reflection-type LED becomes reflection-type LED wherein external radiation efficiency can be kept high though it is miniaturized.

Further, radiated light having smooth and continuous light distribution characteristics is acquired, and in case the reflecting mirror is formed using a resin mold and in case it is formed by pressing a metallic plate, practical reflection-type LED provided with a reflecting mirror excellent in precision and in surface roughness is acquired.

In the reflection-type light emitting diode according to the invention, the light emitting element and a part of the lead are encapsulated and light transmissive material may be also filled between the light emitting element and the reflecting mirror. Therefore, The reflection-type light emitting diode is relieved from the deterioration due to humidity by encapsulating the light emitting element. Also, wire bonding is protected from the outside by encapsulating a part of the lead and reliable electric connection is acquired. Further, the refractive index is enhanced more than that in a hollow case by filling light transmissive material between the light emitting element and the reflecting mirror and the radiation efficiency of light is enhanced. As described above, reflection-type LED wherein the reliability of the light emitting element and the wire bonding is enhanced and external radiation efficiency is higher is acquired.

The reflecting mirror may also converge light from the light emitting element annularly on a plane including the lead. For a method of converging light annularly, there is a method of having a central axis symmetrical form acquired by revolving a part of an ellipse having the light emitting element and another point as two focal points on the central axis of reflection-type LED for the form of the reflecting mirror. As described above, light can be converged in the circumference of the light emitting element except the light emitting element by annularly converging reflected light on a plane including the lead. Therefore, as light is shielded only in two locations of the lead and substantially all the other light is radiated from the radiation part, high external radiation efficiency can be acquired.

The reflecting mirror may also converge light from the light emitting element at multiple points on a plane including the lead. For a method of converging at multiple points, there is a method of having a form acquired by collecting a part of an ellipsoid of revolution acquired by revolving an ellipse having the light emitting element and another point as two focal points for example by plural pieces for the form of the reflecting mirror. As described above, reflected light can be converged except not only the light emitting element but the lead by converging reflected light at multiple points on a plane including the lead. Therefore, substantially all the quantity of light emitted from the light emitting element can be radiated outside and higher external radiation efficiency can be acquired.

It is desirable that the reflecting mirror has the diameter of 5 mm or less. Generally, the size of the light emitting element is approximately 0.3×0.3 mm and the size of the end of the lead for mounting it is approximately 0.5×0.5 mm. Therefore, in reflection-type LED the diameter of a reflecting mirror of which exceeds 5 mm, as light is not shielded by a light emitting element, such LED requires no device in the invention. Conversely, an effect of light shielding by a light emitting element becomes manifest when the diameter of a reflecting mirror is 5 mm or less and the miniaturization of reflection-type LED comes into a question. Therefore, in the reflection-type LED the diameter of the reflecting mirror of which is 5 mm or less, the effect of light shielding by the light emitting element is required to be avoided by radiating light emitted from the light emitting element outside after the light is reflected in a direction except the circumference of the light emitting element. As described above, in the small-sized reflection-type LED the diameter of the reflecting mirror of which is 5 mm or less and which has an effect of light shielding by the light emitting element, high external radiation efficiency can be also maintained.

Fluorescent material that receives light from the light emitting element and emits fluorescence may be also provided around the light emitting element. To arrange the fluorescent material around the light emitting element, there is a method of forming the end of one lead in the shape of a cup, mounting the light emitting element in the center and filling the circumference of the light emitting element in the cup with fluorescent material. When such structure is adopted, the area ratio of a light emitting portion is increased by the cup filled with fluorescent material even if the reflection-type LED itself is not miniaturized. However, according to the reflection-type LED according to the invention, as light reflected by the reflecting mirror does not reach the circumference of the light emitting element and is radiated outside from the radiation part, light shielding is not caused by the cup filled with fluorescent material and reflection-type LED the external radiation efficiency of which can be kept high even if the fluorescent material is provided is acquired.

Plural light emitting elements may be also provided. To mount plural light emitting elements, there is a method of forming the end of one lead in the shape of a cup, mounting plural light emitting elements at the bottom and filling the circumference in the cup with a dispersing agent. When such structure is adopted, the area ratio of a light shielding portion is increased by the cup for mounting the plural light emitting elements even if reflection-type LED itself is not miniaturized. However, according to the reflection-type LED according to the invention, as light reflected by the reflecting mirror does not reach the circumference of the light emitting element and is radiated outside, reflection-type LED wherein light shielding is not caused by a cup for mounting plural light emitting elements and external radiation efficiency can be kept high even if the plural light emitting elements are provided is acquired.

The reflecting mirror may be also formed by molding it out of light transmissive material and applying mirror finish to the surface. For a method of mirror finish, there is a method of depositing metal on the surface of light transmissive material. According to such a method, the mass production of reflection-type LED is enabled and the cost can be reduced.

The reflecting mirror may be also formed by working a metallic plate in a concave shape or plating a concave surface of the metallic plate. Therefore, as the reflecting mirror has resistance to the change of temperature and a function as a reflecting mirror is not lost by a crinkle caused due to the change of temperature as in a reflecting mirror on the resin surface of which metal is deposited, a reflow furnace for surface mounting can be used. Hereby, as the reflecting mirror can be used without a limit as a surface mounting component, the practical reflection-type LED is suitable for reflection-type LEDs mounted in great deal. Particularly, as a demand for small-sized reflection-type LED as a surface mounting component is large, the practical reflection-type LED becomes more practical reflection-type LED in case it is miniaturized. Further, the invention has an eighth object to provide light shielding reflection-type LED wherein external radiation efficiency is high, LED does not have high temperature, contrast between when a light emitting element is turned on and when it is turned off is high and in addition, a signal light having satisfactory visibility can be configured thereby.

The light shielding reflection-type light emitting diode according to the invention is provided with a light source which is encapsulated with light transmissive material and in which an optical control surface is formed, a reflecting mirror which is provided opposite to the light source and which converges light from the light source in at least two locations and a light shielding member having an optical aperture for passing light converged by the reflecting mirror.

The optical control surface means a surface such as a lens for controlling the light distribution characteristics of light emitted from the light emitting element, the optical aperture means an aperture that can transmit light and may be also a through hole or may be also a hole filled with light transmissive material.

In the light shielding reflection-type LED having such structure, light from the light source converged by the optical control surface is converged in at least two locations by the reflecting mirror and the converged light is radiated via the optical aperture of the light shielding member. Therefore, as substantially all of light emitted from the light source is radiated via the optical aperture, high external radiation efficiency is acquired. Hereby, as at least two light generations are acquired from one light source, the number of light sources can be reduced by the quantity and an interval between the light sources can be widened, the rise of temperature by heat can be inhibited. Also, as external light is reflected toward the light source by the reflecting mirror, is absorbed by the light shielding member and is not returned outside even if the external light is incident via the optical aperture, contrast between when the light emitting element is turned on and when it is turned off is increased. Further, radiated light does not scatter and is visibly radiated by radiating at least two light generations via the optical aperture.

As described above, the light shielding reflection-type LED wherein external radiation efficiency is high, LED does not have high temperature, contrast between when the light emitting element is turned on and when it is turned off is high and a signal light having satisfactory visibility can be configured thereby is provided.

The light shielding member is provided with plural optical apertures and the reflecting surface of the reflecting mirror may be also the aggregate of a part of plural ellipsoids of revolution having the light source and the plural optical apertures as each focal point.

Therefore, as light emitted from the light source and reflected on the reflecting surface equivalent to the aggregate of a part of each ellipsoid of revolution is radiated via the optical aperture corresponding to the respective, high external radiation efficiency is acquired. Hereby, as light radiated via the plural optical apertures is acquired from one light source, the number of light sources can be reduced and as an interval between the light sources can be widened, the rise of temperature by heat can be inhibited. As external light is reflected toward the light source by the reflecting mirror, is absorbed by the light shielding member and is not returned outside even if the external light is incident via the optical aperture, contrast between when the light emitting element is turned on and when it is turned off is increased. Further, as the plural optical apertures are arranged so that they are located at each vertex of a polygon having the light source in the center, the visibility is more enhanced.

As described above, the light shielding reflection-type LED wherein external radiation efficiency is high, LED does not have high temperature, contrast between when the light emitting element is turned on and when it is turned off is high and in addition, a signal light having more satisfactory visibility can be configured thereby is provided.

The light shielding member is provided with the substantially annular optical aperture and the reflecting surface of the reflecting mirror may be also have a form acquired by revolving a part of an ellipse having the light source and the optical aperture as a focal point on a central axis.

Light from the light source reflected by the reflecting mirror having such a reflecting surface is annularly converged along the substantially annular optical aperture. Therefore, light emitted from the light shielding reflection-type LED becomes annular and becomes further visible.

The optical control surface made of the light transmissive material may also have a form for annularly converging light from the light source.

In the case of the light shielding reflection-type LED, as the optical aperture provided to the light shielding member is required to transmit reflected light, the degree of the freedom of light distribution control is restricted. For example, in the case of light shielding reflection-type LED according to a second aspect of the invention, as the reflecting mirror is formed by the aggregate of a part of plural ellipsoids of revolution, a pattern of radiated light in the shape of a star having the ends by the number of the ellipsoids of revolution.

The pattern of radiated light means a form of light projected on a light shielding plate when the light shielding plate is placed in a direction in which light is radiated from the light shielding reflection-type LED. A radiated light pattern in the shape of a star in which light diverges up to the end is not desirable in the case of an emitter for converging as much light as possible on the center. The end of the star-shaped pattern includes light reflected on the center of the reflecting mirror.

Therefore, in case the optical control surface made of light transmissive material annularly converges light from the light source, the end of the star-shaped pattern becomes dark because no light reaches the center of the reflecting mirror and a desired radiated light pattern in which light is converged in the center is acquired.

As described above, a desired radiated light pattern can be acquired in the light shielding reflection-type LED having a restriction in the degree of the freedom of light distribution control by forming the optical control surface made of light transmissive material so that the surface annularly converges light from the light source.

A ninth object of the invention is to provide a light source device wherein the productivity can be enhanced, compared with that of a conventional type, enhancing or stabilizing light distribution characteristics as a whole. The ninth object is also to provide a method of manufacturing such a light source device.

The light source device according to the invention is provided with plural light emitting diodes having each light emitting element encapsulated with light transmissive material and one or plural boards on the surface of which the plural light emitting diodes are mounted, and is characterized in that plural-optical means are integrated with the respective light emitting diodes in a direction in which light is radiated from the light emitting diode.

First, surface mounting means a method of mounting for directly fixing the light emitting diode on the surface of the board without forming a hole and a concave portion for inserting a lead extended from the light emitting diode on the board and does not include at least a concept of discrete mounting. According to the light source device, as each light emitting diode is mounted on the surface of the board, automatic mounting using an automechanism is facilitated, enhancing the mounting number of density per unit area, and the mounting height and the mounting angle of the light emitting diode can be easily substantially unified.

In addition, the optical means is provided corresponding to the respective of the plural light emitting diodes on the board. Therefore, light distribution control in the light source is not required to be performed by only a lens integrated with the light emitting element. Therefore, the lens integrated with the light emitting diode can be miniaturized and positional precision between the light emitting element and the lens is not required to be strictly controlled. In configuration that automatic mounting was difficult heretofore because dense mounting was required, an interval between the light emitting diodes adjacently arranged can be also widened without reducing the number of the light emitting diodes and automatic mounting is also enabled.

In addition, each optical means is integrated with each other as a group of optical means. That is, relative positional relation among individual optical means provided in one group of optical means is determined every group of optical means and the sufficient light distribution control of light emitted from each light emitting element can be realized only by aligning the groups of optical means. Therefore, the distribution of light emitted from each light emitting diode can be controlled by the corresponding optical means as substantially desired and optical characteristics as the whole light source device can be brought close to theoretical characteristics.

As described above, the light source device excellent in light distribution characteristics can be efficiently massively produced by the synergistic effect of mounting the light emitting diodes on the surface of the board and integrating each optical means with each light emitting diode.

The optical means may be also formed by a lens.

According to this configuration, in the light source device provided with a lens as the optical means, satisfactory light distribution characteristics can be realized.

The optical means may be also formed by a reflecting surface for controlling the reflection of incident light.

According to this configuration, in the light source device provided with a reflecting surface as the optical means, satisfactory light distribution characteristics can be realized.

The optical means may also have at least quadruple plane area of the area of the radiation surface of the corresponding light emitting diode.

The reflecting surface is a substantially annular reflecting concave surface that surrounds the central axis of the corresponding light emitting diode and may be also formed in the shape of such a concave surface as reflected light of light from the light emitting diode is converged in an annular light converged area with the central axis in the center.

According to this configuration, substantially all of the quantity of light emitted from each light emitting diode is received by the corresponding reflecting concave surface, light reflected on the reflecting concave surface is converged in the annular light converged area, passes the light converged area and is projected outside. As the annular light converged area exists apart by predetermined distance from the central axis, the light emitting diode located on the central axis does not capture the light reflected on the reflecting concave surface. Internal structure that shields light hardly exists on the optical path until light emitted from the light emitting diode is projected outside. As described above, as substantially all of the quantity of light emitted by the light emitting diode is effectively projected outside, the external radiation efficiency of light is extremely high.

As light emitted from each light emitting diode is projected outside via the annular light converged area after the light is reflected on the reflecting concave surface, a band of light annular or in the shape of an arc having fixed area is produced from one light emitting diode when viewed from the front side of the light source device. As the light source device is provided with the plural light emitting diodes and the plural reflecting concave surfaces corresponding to the plural light emitting diodes, visual effect as if the whole front side was filled with uniform light is produced as the whole light source device. This enables that the whole emission surface (the whole front of the light source device) has uniform natural appearance without excessively enhancing the mounting number of density of the light emitting diode.

The reflecting concave surface may also have a form acquired by revolving an elliptic arc having an intermediate point in a direction of the diameter of the light converged area as one focal point and having the light emitting diode as another focal point on the central axis.

The reflecting concave surface according to this configuration is provided as a concave surface close to an ellipsoid acquired by revolving an elliptic arc having the light emitting diode and the light converged area apart by predetermined distance in the direction of the diameter from the central axis as both focal points on the central axis. According to this configuration, light reflected on the reflecting concave surface of light emitted from the light emitting diode is converged in the light converged area located in the focal position of the elliptic arc, and the quantity of light and the luminance of a luminous flux that passes the light converged area can be enhanced.

Plural optical apertures along an arc with each central axis in the center every light emitting diode mounted on the board are provided to the board, the annular light converged area is set with the area substantially overlapped with each optical aperture and further, apart except the optical aperture on the board may be also a light shielding portion.

This light source device is designed so that the light source device has structure having an optical path that light emitted from each light emitting diode is reflected on the reflecting concave surface corresponding to each light emitting diode and reaches the optical aperture and the light converged area. Therefore, even if external light incident on the optical aperture from the outside enters the light source device in a direction reverse to the optical path when the light emitting diode is turned off, the external light reflected on the reflecting concave surface is radiated on the light emitting diode and is absorbed or irregularly reflected there. Much of light that repeats irregular reflection in the device is shielded by the light shielding portion of the board and cannot be transmitted on the optical path leading to the outside via the optical aperture again. Therefore, probability that external light that enters the light source device is radiated outside again via the optical aperture on the optical path is extremely low. That is, ratio that the reflecting concave surface reflects external light toward the optical aperture when the light emitting diode is turned off is extremely low and the reflecting concave surface does not actually cause so-called dark noise. Therefore, according to this light source device, dark noise that comes into a question in a signal light and others can be effectively avoided.

In consideration of the overview on the above technical concepts, the following three kinds of light source devices having basic constructions are provided according to the present invention.

A light source device from the first aspect is constituted of a light shielding member, a light source, and a converging member. The light shielding member has at least one aperture such as optical aperture, through holes, transmission hole, optical opening or the like, not limited to these. The light shielding member may be constituted of a light shielding plate, a mounting board which serves also as a light shielding member, or the like, not limited to these. The light source is arranged on one side of the light shielding member. The light source may be light emitting element, light emitting device, LED, any other devices having filament, discharge tube or the like, not limited to these. The converging member is arranged relatively with respect to the light shielding member and the light source to thereby converge light emitted from the light source in the aperture or in a vicinity of the aperture. The converging member may be composed of one of or combination of a reflecting member, a reflecting mirror, a reflecting surface, an inner lens, a light radiation surface, an optical control surface, or the like, not limited to these.

A light source device from the second aspect is constituted of a single light source, and a converging member for converging light from the light source to thereby distribute the light to at least two points. As a result of collection of points, the light may be converged on a line in any types of shape. For example, the light may be converged on a linear line, an annular line or the like.

A light source device from the third aspect is constituted of a light source, and a reflecting mirror arranged to enclose a side of a light emission direction of the light source. The reflecting mirror reflects light emitted from the light source in a direction except the light source so that the light is radiated outside.

The aforementioned any kinds of members may be used as the light source and the converging member also for the light source device from the second and third aspect.

Features and advantages of the invention will be evident from the following detailed description of the preferred embodiments described in conjunction with the attached drawings.

BRIEF DESCRIPTION OF THE DRAWINGS

In the accompanying drawings:

FIG. 12 is a view showing a light source device which is a fourth embodiment of the invention;

DETAILED DESCRIPTION OF THE PREFERRED EMBODIMENTS

Figure 1:
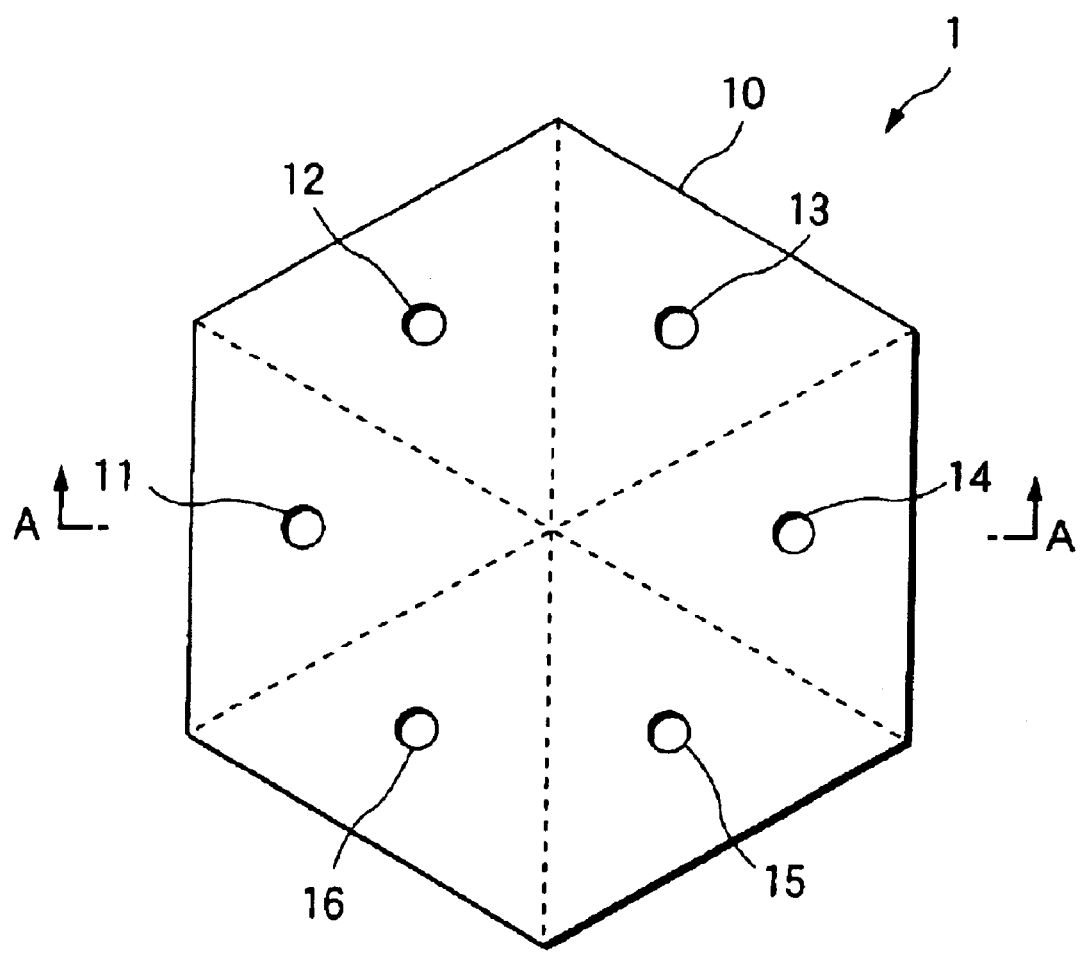
FIG. 1 is a plan view showing a light source device which is a first embodiment of the present invention.
Figure 2:
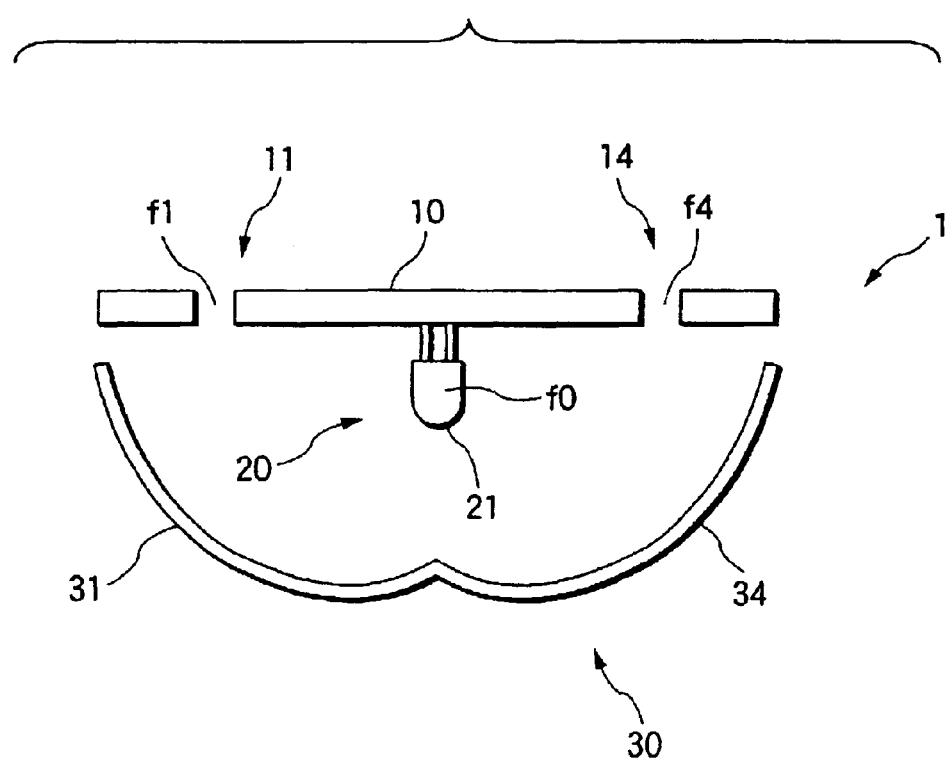
FIG. 2 is a cross sectional view taken along line A—A in FIG. 1.
Figure 3:
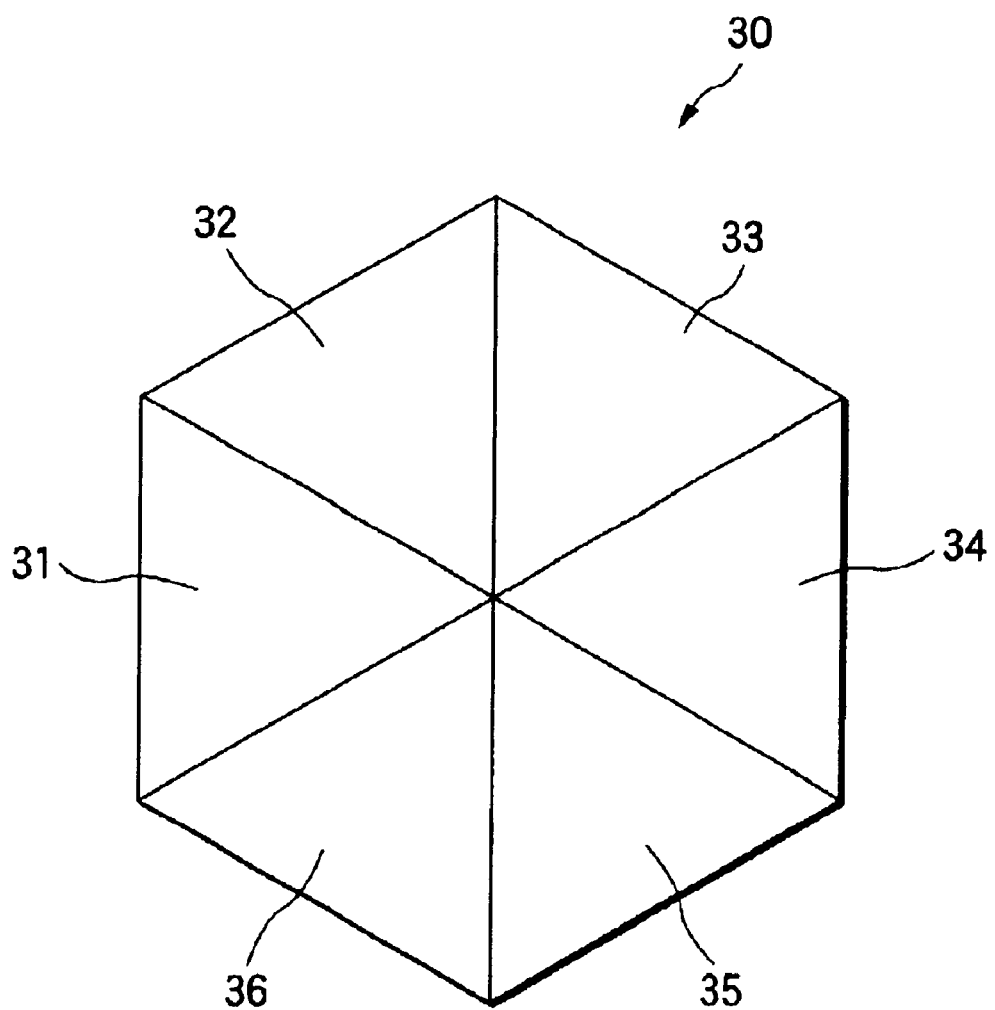
FIG. 3 is a plan view showing a reflecting mirror used in the light source device.

A light source device 1 which is a first embodiment of the present invention will be described with reference to FIGS. 1 through 3. FIG. 1 is a plan view showing a light source device 1 when viewed from the external radiation side thereof. FIG. 2 is a cross sectional view taken along line A—A in FIG. 1. FIG. 3 is a plan view showing a reflecting mirror 30 alone as viewed from the external radiation side. The light source device 1 is generally made up of a light shielding plate 10, an LED 20 as a light source, and a reflecting mirror 30. The light shielding plate 10 is a LED mounting plate. An external radiation surface (surface viewed in FIG. 1) of the light shielding plate is coated black to have a light shielding function. In the embodiment, the light shielding plate 10 is regular hexagonal in shape. Through holes 11 to 16 are formed in the light shielding plate at gravity positions of regular triangles each defined by the lines which connect two adjacent vertices of the regular hexagon to the center F of the same.

As shown in FIG. 2, the LED 20 is mounted on a surface of the light shielding plate 10 which is closer to the reflecting mirror 30, in a state that it is separated from the light shielding plate by a predetermined distance. In the embodiment, the LED 20 includes a light emitting element made of group III nitride compound semiconductor. Accordingly, the light source device emits blue light. It is evident that an LED capable of emitting light of any color may be used for the LED 20, and the light source device may be formed so as to emit light of a desired color. A light source device which is capable of emitting light of any desired color may be formed by using an LED of the RGB type, which includes the combination of red, green and blue light emitting elements.

The LED 20 is constructed such that a light emitting element is mounted on one of lead frames of the LED, and the other lead frame and the light emitting element are electrically connected by a wire, and the resultant structure is sealed with transparent epoxy resin. The top end of the LED as viewed in the light emitting direction is formed as a lens face 21. The lens face 21 is spherically configured with an origin being a position f0 of the light emitting element.

The reflecting mirror 30 is made of thermoset resin containing light reflecting agent, and consists of reflecting surfaces 31 to 36. The reflecting surfaces 31 to 36 are formed such that a surface of a resin product is processed to have mirror surfaces by metal deposition. For those reflecting surfaces, the surfaces 31 and 34 will typically be described with reference to FIG. 2, which shows a cross section of those reflecting surfaces. The reflecting surface 31 is configured as a part of an ellipsoid of revolution whose focal points are the position f0 of the light emitting element of the LED 20, and a position f1 of the through hole 11. Similarly, the reflecting surface 34 is configured as a part of an ellipsoid of revolution whose focal points are the position f0 of the light emitting element, and a position f1 of the through hole 14. The same thing is true for the remaining reflecting surfaces. That is those reflecting surfaces are defined, in design, by positions of the associated through holes of the light shielding plate 10 and the position f0 of the light emitting element. Further, the reflecting mirror 30 is disposed such that the LED 20 is enclosed with those reflecting surfaces.

Figure 4:
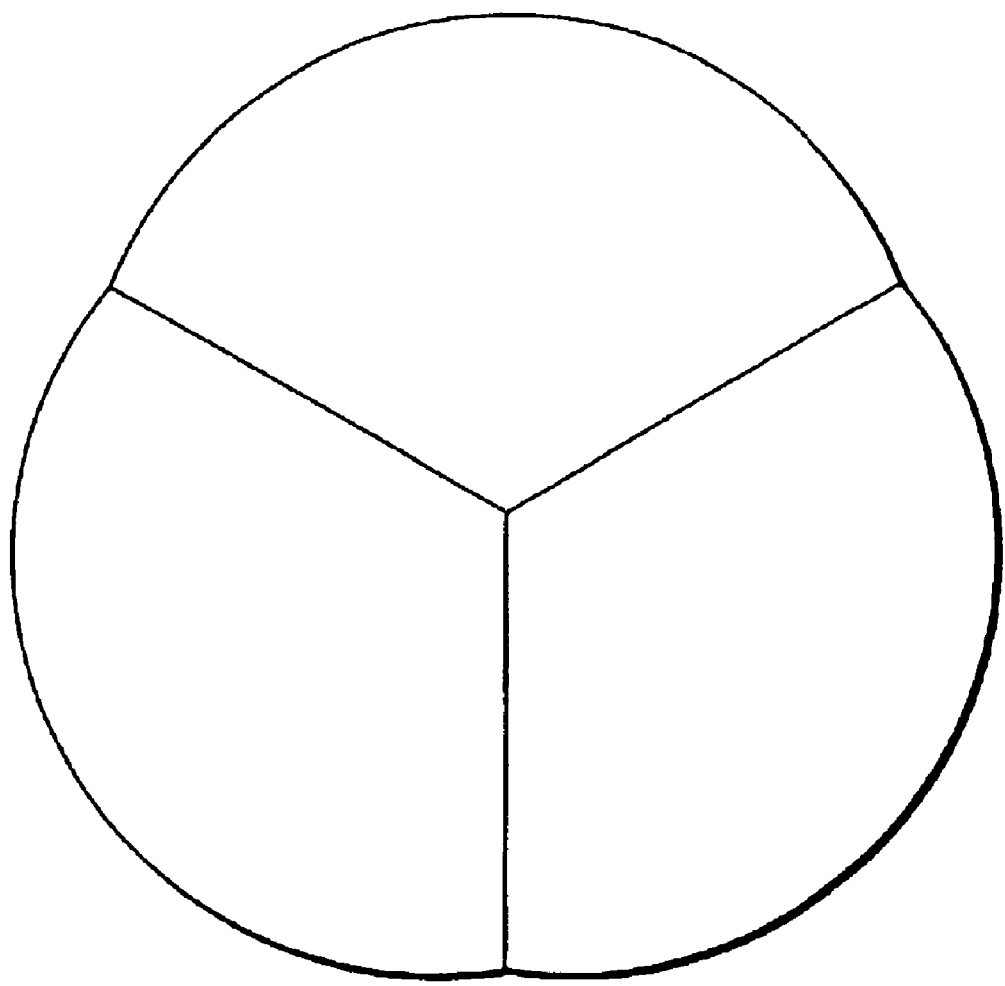
FIG. 4 is a view showing another reflecting mirror.
Figure 5:
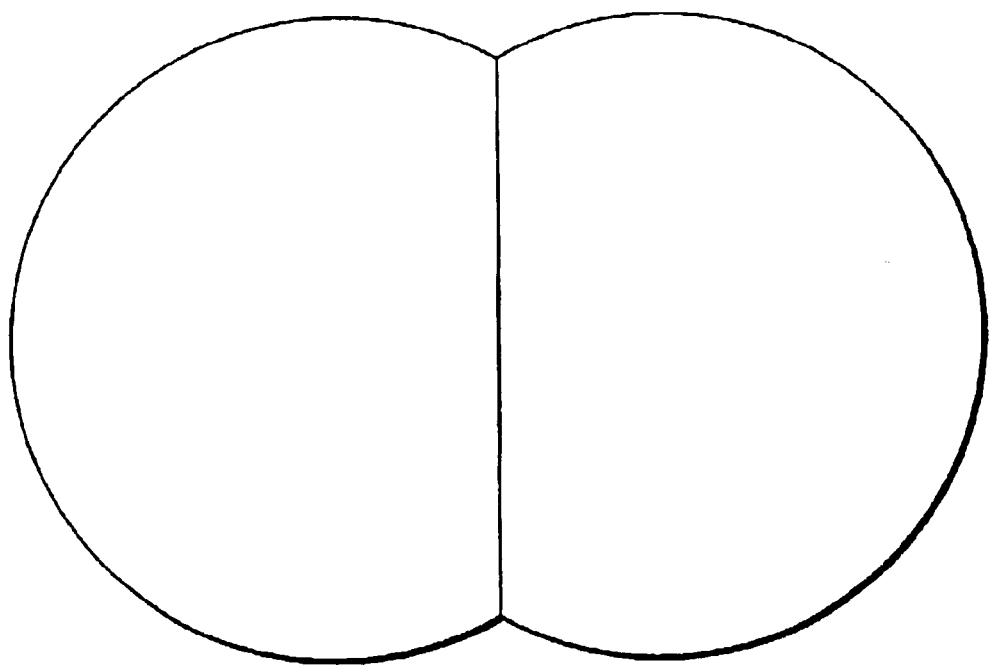
FIG. 5 is a view showing still another reflecting mirror.
Figure 6:
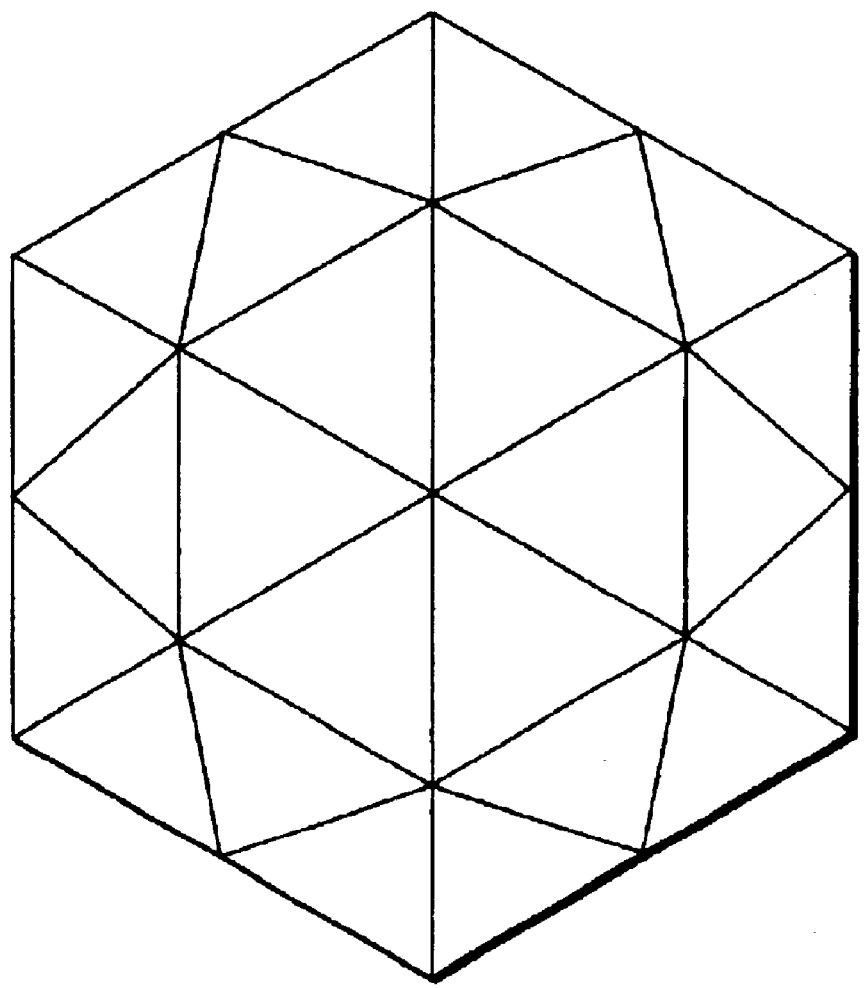
FIG. 6 is a view showing yet another reflecting mirror.
Figure 7:
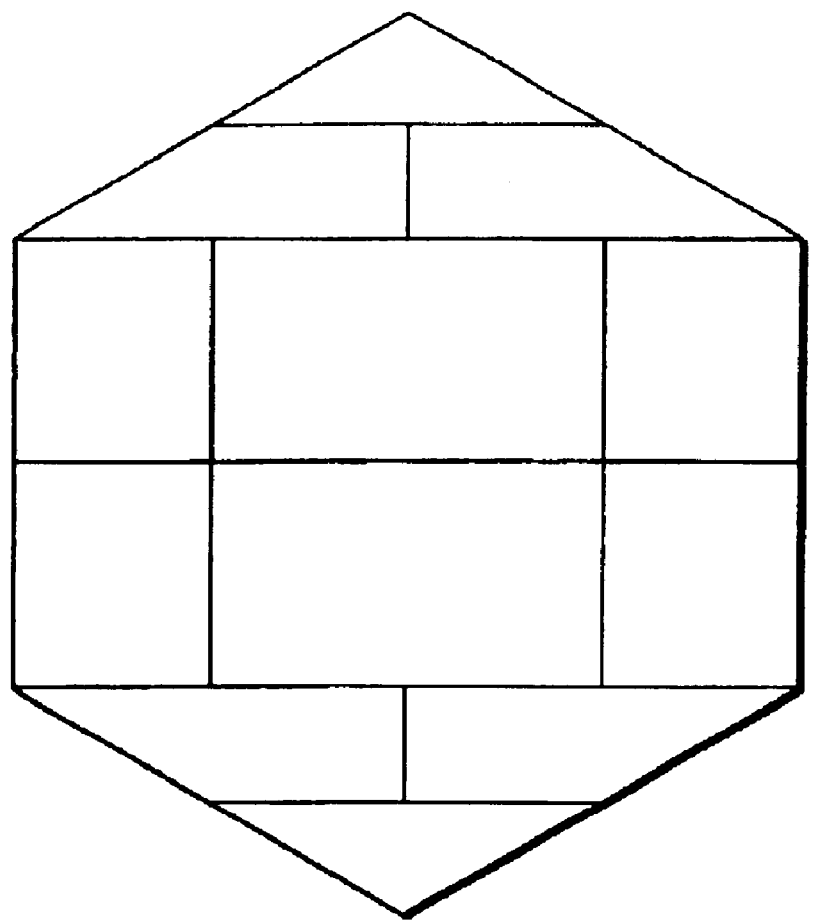
FIG. 7 is a view showing another reflecting mirror.

The reflecting surface of the reflecting mirror 30 may take any of other various forms than the above mentioned one. Some examples of them are shown in FIGS. 4 to 6. The reflecting mirror of FIG. 4 uses three segmental reflecting surfaces. In this case, through holes (optical apertures) are formed in the light shielding plate 10 at positions corresponding to those reflecting surfaces. Each reflecting surface is configured in connection with the associated through hole position and the position f0 of the light emitting element. In the case of FIG. 4, each reflecting surface is configured as a part of a spheroid whose focal positions are a position of the associated through hole and a position f0. A reflecting mirror of FIG. 5 includes two segmental reflecting surfaces. Those reflecting surfaces are configured as in the FIG. 4 reflecting mirror. A reflecting mirror of FIG. 6 includes 24 segmental reflecting surfaces. The reflecting mirror is also configured as in the FIG. 4 one. Each reflecting surface is configured as a part of a spheroid whose focal positions are a position of the associated through hole and a position f0. In the FIG. 6 reflecting mirror, each reflecting surface is configured as a triangle in plan view. A reflecting mirror shown in FIG. 7 consists of the combination of reflecting surfaces being rectangular in plan view and reflecting surfaces being triangular in plan view. Each reflecting surface is also configured as in the FIG. 6 one.

In the light source device 1 thus constructed, the substantially entire quantity of light emitted from the light emitting element of the LED 20 is radiated while being not refracted by the interface of the lens face 21. Then, the radiated one reaches the reflecting surfaces 31 and 34. The light reaching each reflecting surface is reflected on the reflecting surface and converged on a focal point which is the associated through hole of the light shielding plate. The converged light passes through the through hole and radiated to exterior.

Thus, the light reflected by each reflecting surface is converged on the through hole of the associated through hole associated as the focal point, and then radiated outside. Accordingly, each through hole may be designed to be small. With this arrangement, the quantity of external light which passes through and is incident on the reflecting mirror 30 is lessened. The external light, which passes through each through hole, comes near to the reflecting mirror 30 and in turn hits the reflecting mirror. The reflecting light from both the reflecting mirrors is converged on the position f0 of the light emitting element, and finally is absorbed by the reflecting surface of the light shielding plate 10 since each reflecting surface is a part of the spheroid whose focal points are the through hole of the associated reflecting surface and the position f0 of the light emitting element. Thus, even if external light passes through the through hole and proceeds to the reflecting surfaces, there is no fear that the external light having entered the light source device is returned to outside in the form of reflecting light.

Thus, the light source device 1 has a good shielding effect against the external light, and is capable of effectively preventing the formation of a pseudo-lightening. Therefore, a contrast of the LED 20 between its on- and off-states is high.

It is noted that the reflecting mirror 30 is disposed enclosing the LED 20. Because of this feature, the reflecting mirror 30 reflects most of light radiated from the LED and radiates it externally from the light source device. Accordingly, the resultant light source device has a high external radiation efficiency.

A radiation angle of the external radiation light is equal to an angular range, which is defined between each reflecting surface and the through hole associated with it. Accordingly, where the reflecting surfaces constructed according to the invention are used, the light source device radiates outside light at a predetermined directivity, highly efficiently.

Further, six through holes for external radiation of light are included in one LED. Those holes serve as light emitting points. Accordingly, radiated light looks nice with less non-uniformity of light emission and as if light is emitted from six light sources.

The light source device 1 may be provided additionally with an outer lens on the external radiation side. The outer lens controls radiation light from the light source device 1 to give a desired directivity the light radiated. Specifically, a lens made of light transmission resin is mounted on the external radiation side of each through hole of the light shielding plate 10. By so doing, light externally radiated through each through hole has a desired directivity. It is not essential that the outer lens is directly mounted on the light shielding plate. If required, the outer lens may be mounted while being separated from the light shielding plate by a predetermined distance.

A light emitting device, such as a signal or a display device may be formed by using a plurality of light source devices. Some type of the light emitting device may be formed by using a single light source device 1. An example of the light emitting device using light source devices 1 will be described hereunder.

Figure 8:
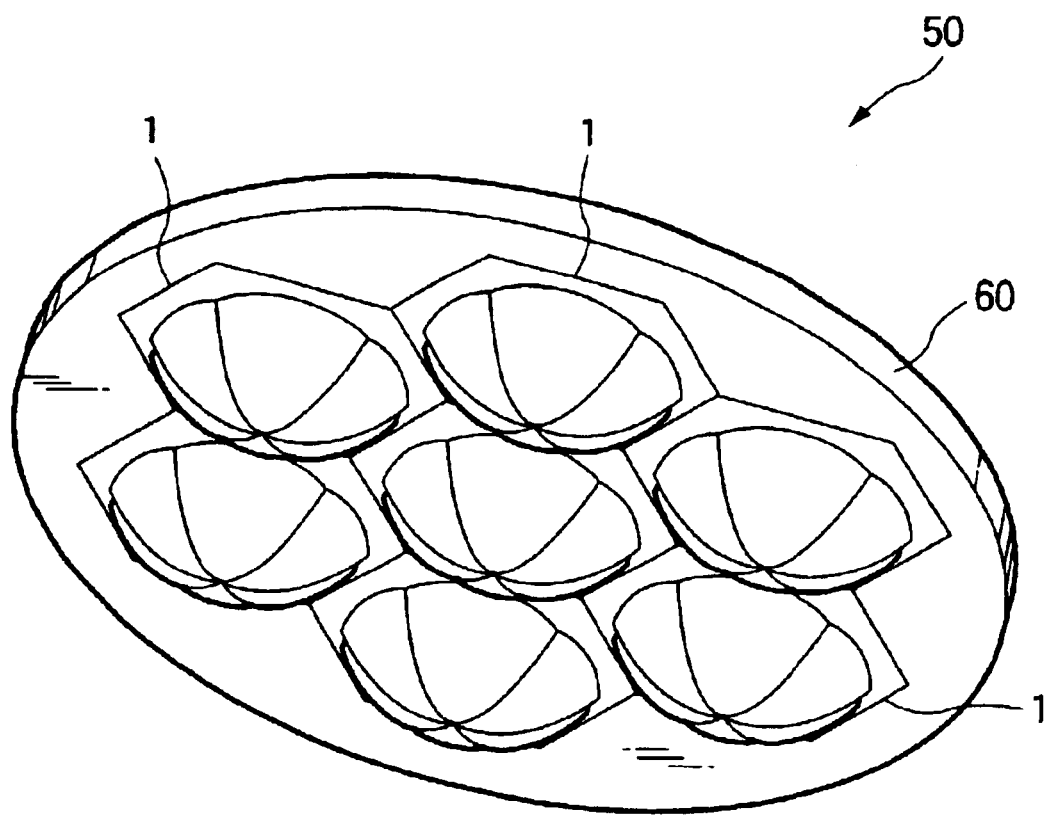
FIG. 8 is a light emitting device using the light source devices each constructed as the first embodiment.

FIG. 8 is a view showing a light emitting device 50 used for a signal. The light emitting device 50 includes the combination of seven light source devices 1. The light shielding plate of each light source device 1 is regular hexagonal in shape as described above. Accordingly, the plurality of light source devices 1 may be arrayed relatively densely.

Those light source devices 1 are mounted on a fixing plate 60 made of light transmission material. In the LEDs 20, which are contained in each light source device 1 of the light emitting device 50, those LEDs are arrayed while being relatively widely spaced. Accordingly, heat is efficiently radiated from the LEDs. The total number of LEDs used for the light emitting device 50 is small, so that the total amount of heat generated from them is small. The amount of heat generated from the whole light emitting device 50 is small, and the heat is efficiently radiated. The light emitting device thus constructed is free from degradation of the light emission characteristic which occurs when the LED is driven in high temperature condition, and hence is reliable.

Further, while the number of the LEDs used is small, light is efficiently radiated from each LED as described above. In each light source device 1, the number of the virtual light emitting points is six and those six LEDs are densely arrayed. Therefore, the external radiation efficiency of the light emitting device 50 is high, and the external radiation light looks nice with less non-uniformity of light emission.

Also when the light emitting element capable of producing a high output power will be realized in future, the light source device of the invention will produce external radiation light looking attractive with less non-uniformity of light emission since the number of LEDs arrayed within a predetermined area is reduced.

In the light source device of the embodiment, a light bulb may be used for the light source. In this case, the light source device capable of emitting light of a desired color may be provided if the surface of the light bulb is colored or coated with a colored film or filter. Light of a desired color may be radiated with such an arrangement as to allow light emitted through the through hole of the light shielding plate to pass through a colored filter. Even in the case where light bulb is used, the light shielding plate blocks external light from entering the device inside. Therefore, no pseudo-lightening is produced, and accordingly, the light source device is provided in which a contrast of the light source between its on- and off-states is high. The virtual light emitting points is increased in number when comparing with the real light sources. This results in providing the radiated light having good appearance and less non-uniformity of light emission.

Figure 9A:
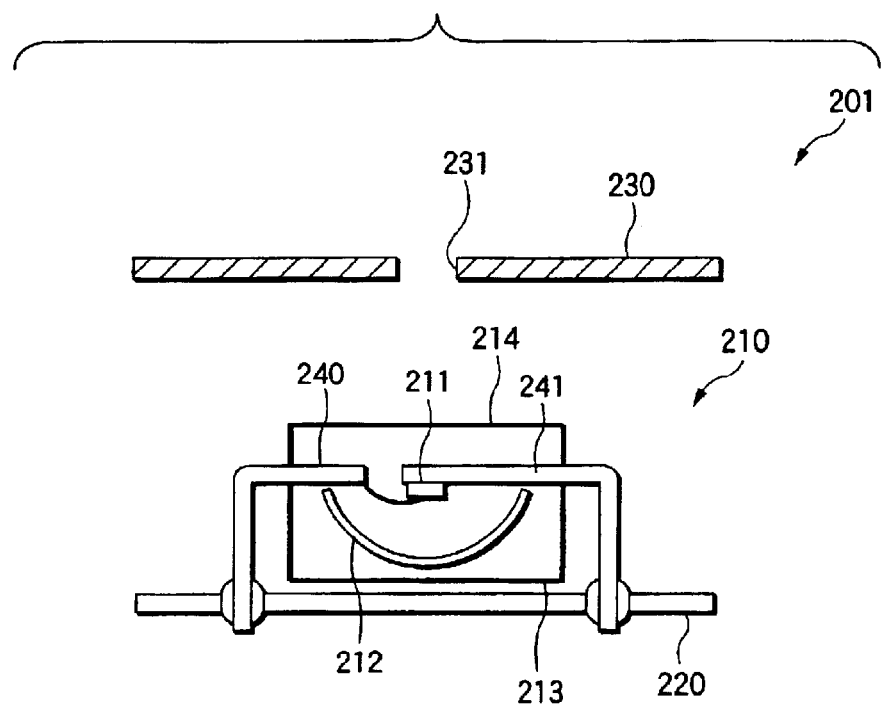
FIG. 9A is a view showing a light source device which is a second embodiment of the invention.
Figure 9B:
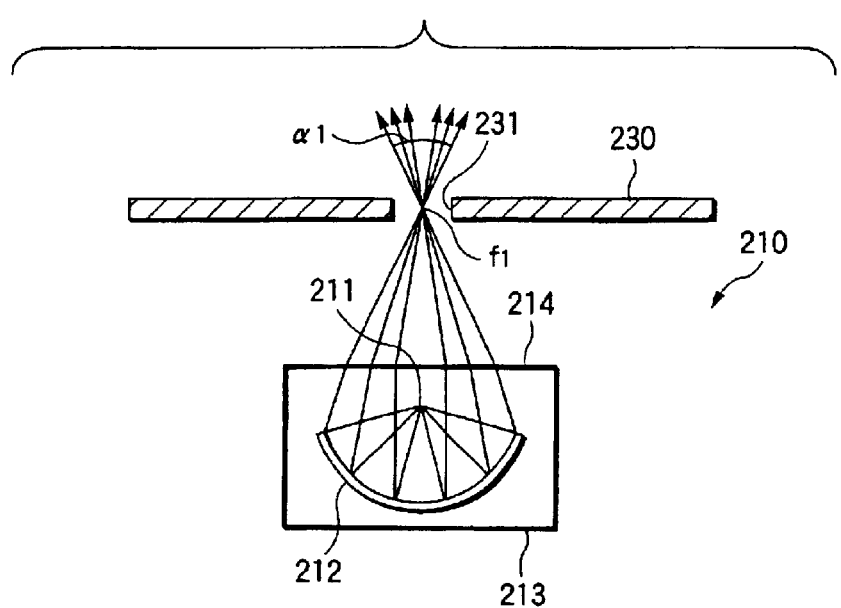
FIG. 9B is a view for explaining an optical path in the light source device of FIG. 9A.
Figure 10:
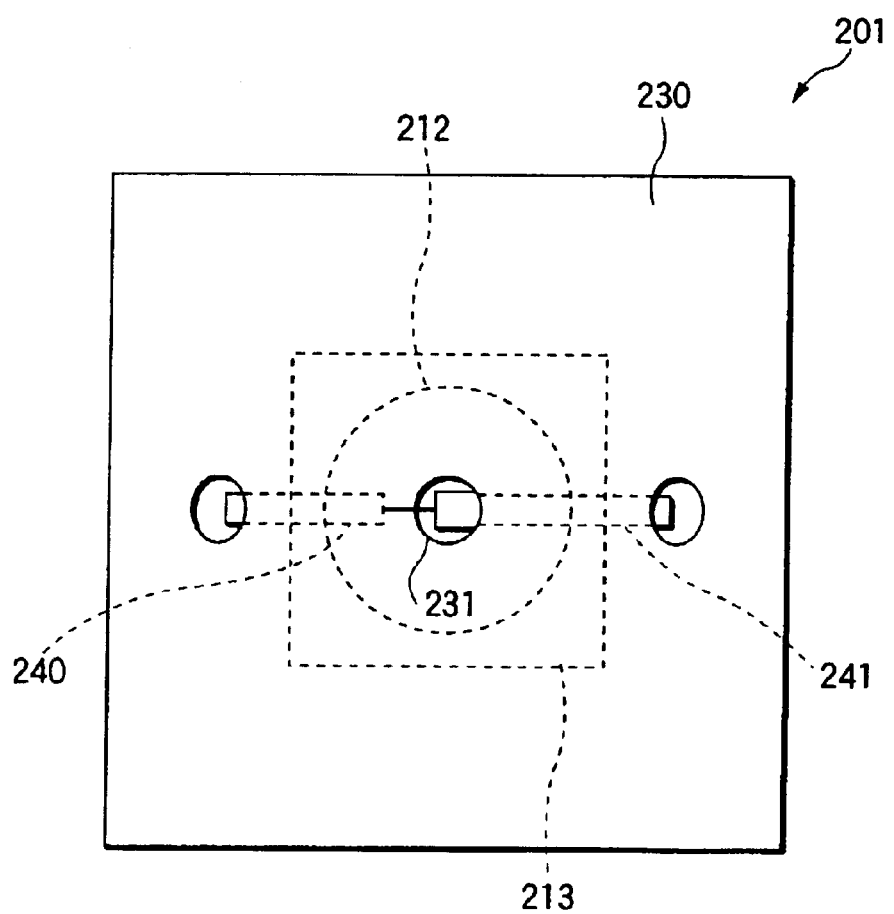
FIG. 10 is a view showing the light source device when viewed from the external light radiation side (from top in FIG. 10A)

FIG. 9A is a view showing a light source device 201 which is a second embodiment of the invention. FIG. 9B is a view for explaining an optical path in the light source device 201. The light source device 201 is generally made up of an LED 210, a mounting plate 220, and a light shielding plate 230. The light source device may be utilized for a light source of a signal, a display device or the like. FIG. 10 is a view showing the light source device when viewed from the external light radiation side (from top in FIG. 10A). The light source device 201 of the embodiment will be described with reference to those figures.

The LED 210, which is of the reflection-type, is formed with a light emitting element 211, a lead 240 connected to the light emitting element 211 by a wire, a lead 241 with the light emitting element 211 mounted thereon, a reflecting mirror 212, and an encapsulating member 213. In the embodiment, the light emitting element 211 is made of group III nitride compound semiconductor. Accordingly, the light source device that is formed using the light emitting element emits blue light. It is evident that an LED capable of emitting light of any color may be used for the LED, and the light source device may be formed so as to emit light of a desired color. A light source device which is capable of emitting light of any desired color may be formed by using an LED of the RGB type, which includes the combination of red, green and blue light emitting elements.

The reflecting mirror 212 is formed by pressing a metal plate so as to have a desired shape. The reflecting mirror is configured such that light emitted from the light emitting element 211 is reflected by the reflecting mirror 212, refracted by a light radiation surface 214, and its rays are converged on a point f1 (see FIG. 9B). Ag or the like is vapor deposited on the surface of the reflecting mirror in order to increase its reflectance.

The light shielding plate 230 is a black plate having a light shielding function. A through hole (optical aperture) 231 is formed at the central part of the light shielding plate 230. Light emitted from the LED 210 passes through the through hole to exterior.

The LED 210 is mounted on a general board. The light shielding plate 230 is disposed such that a focal point f1 on which rays of light emitted from the LED 210 are converged is positioned at the through hole 231 (see FIG. 9B). The through hole 231 has a size defined by the smallest value of the dimensional values representative of a converging diameter at the focal point f1, which is added with a certain margin while allowing for a mounting accuracy.

Where the dark noise reduction takes priority over the external radiation efficiency, the through hole 231 of the light shielding plate 230 may be more reduced in size.

A radiation of light in the light source device 201 will be described with reference to FIG. 9B.

Figure 78:
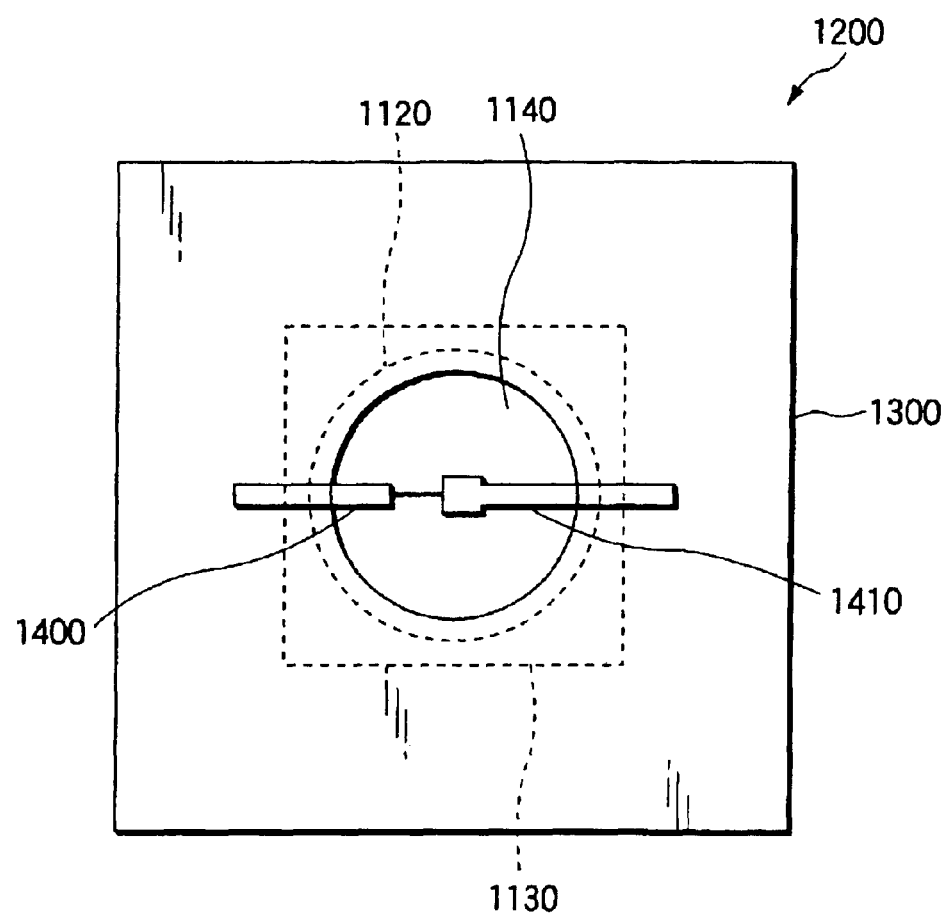
FIG. 78 is a view showing the light source device of FIG. 77 when viewed from the external radiation side.
Figure 79A:
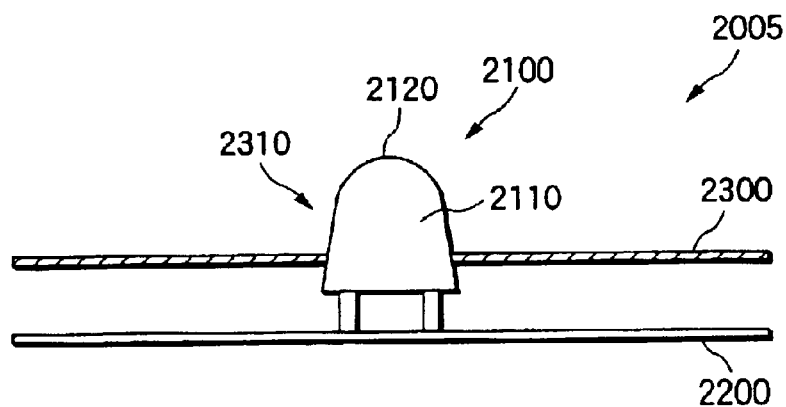
FIG. 79A is a diagram showing a conventional light source device using a lens-type LED.
Figure 79B:
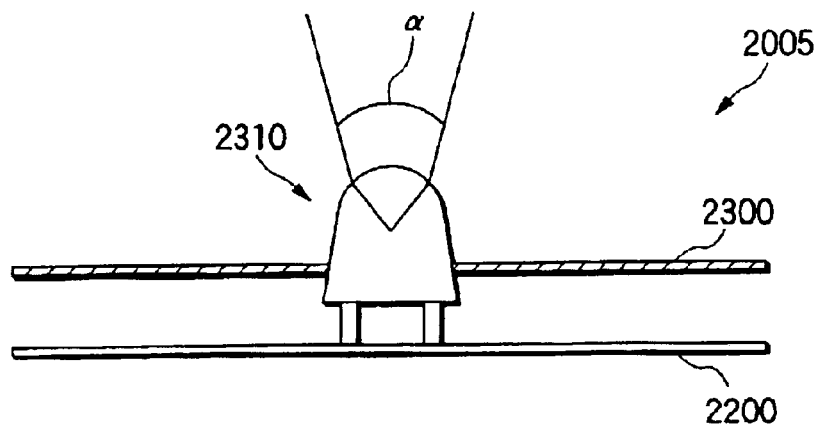
FIG. 79B is a diagram for explaining a light path in the light source device of FIG. 79A.

In the thus constructed light source device 201 of the embodiment, the substantially entire quantity of light emitted from the light emitting element 211 is reflected by the reflecting mirror 212, and reaches the light radiation surface 214 of the encapsulating member 213. After being refracted at the light radiation surface 214, the light is converged on the through hole 231 of the light shielding plate 230, and passes therethrough without any interruption by the light shielding plate 230, and is radiated to exterior within an angular range α1, which is equal to the converging angle. External light reaches the light shielding plate 230 including the through hole 231; however, the most amount of the external light is absorbed in an area of the light shielding plate 230 except the through hole 231, which is nearly equal to the entire area of the same. A slight amount of the external light passes through the through hole 231 and proceeds to the LED 210, however. The amount of light that passed through the through hole and proceeds toward the LED 210 is proportional to its incident area (i.e., the area of the through hole 231). It is noted that the area of the through hole 231 in the embodiment is considerably smaller than that of the convention ones (FIGS. 78 and 79). Accordingly, the amount of light passing through the through hole 231 is reduced. In other words, the amount of the external light to be incident on the LED is extremely reduced when comparing with that in the conventional light source device. Most of the light having passed through the through hole 231 and proceeds toward the LED 210 is absorbed by the surface of the light shielding plate 230, which is closer to the LED 210, and the like. For this reason, a reflectivity of the external light entering the light source device 201 is extremely small.

As described above, in the light source device 201 thus constructed, light emitted from the light emitting element 211 is reflected by the reflecting mirror 212, highly efficiently radiated therefrom and converged, and radiated to exterior without any interruption by the light shielding plate 230. Accordingly, the light source device has performances of high external radiation efficiency and high luminance. Further, the shielding effect of the light source device for the external light may be increased with the high external radiation efficiency and high luminance, both remaining intact. Thus, in the light source device, the luminance is high when the LED is in an on state, and the dark noise is extremely low. Accordingly, the light source device is provided in which a contrast of the LED between its on- and off-states is high, and its visibility is good.

Figure 11:
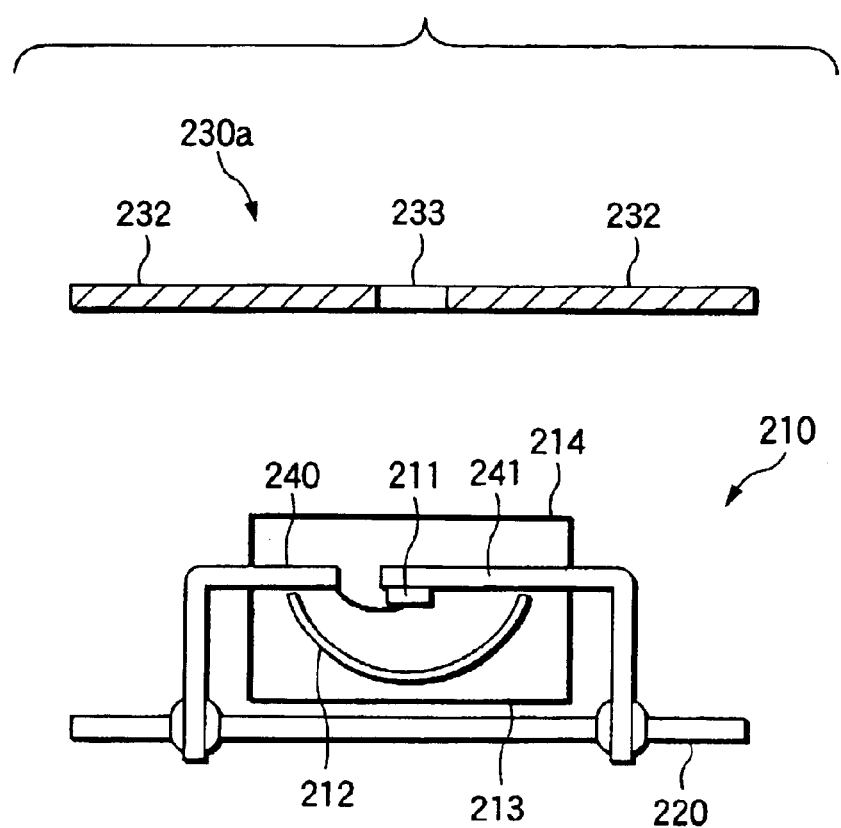
FIG. 11 is a view showing a light source device which is a third embodiment of the invention.

The structure of the light shielding plate 230 is not limited to the above-mentioned one, but the light shielding plate may take a structure as shown in FIG. 11 or 12 (third or fourth embodiment). A light shielding plate 230a of FIG. 11 includes a light shielding portion 232 made of black resin, and a light transmission portion 233 made of light transmission resin. The light shielding plate 230a may be manufactured in a manner that the black resin and the light transmission resin are molded into it by one-piece molding process. Where the light shielding plate thus structured is used, light emitted from the LED 210 passes through the light transmission portion 233 and is radiated to exterior.

A light shielding plate 230b of FIG. 12 is constructed such that the outer face of a glass plate 234, except a part of it, is printed black, whereby a light transmission portion. (not printed) 236 and a light shielding portion (printed) 235 are formed. In the light shielding plate thus structured, light emitted from the LED 210 is externally radiated after passing through the light transmission portion 236. Transparent resin may be used in place of glass.

The light source device using the light shielding plate of FIG. 11 or 12 is excellent in dust-proof and water-proof.

The light source device 201 may be provided additionally with an outer lens on the external radiation side. The outer lens controls radiation light from the light source device 201 to give a desired directivity the light radiated. Specifically, a lens made of light transmission resin is mounted on the external radiation side of the through hole 231 of the light shielding plate 230. By so doing, light externally radiated through the through hole 231 has a desired directivity. It is not essential that the outer lens is directly mounted on the light shielding plate 230. If required, the outer lens may be mounted while being separated from the light shielding plate by a predetermined distance.

Figure 13A:
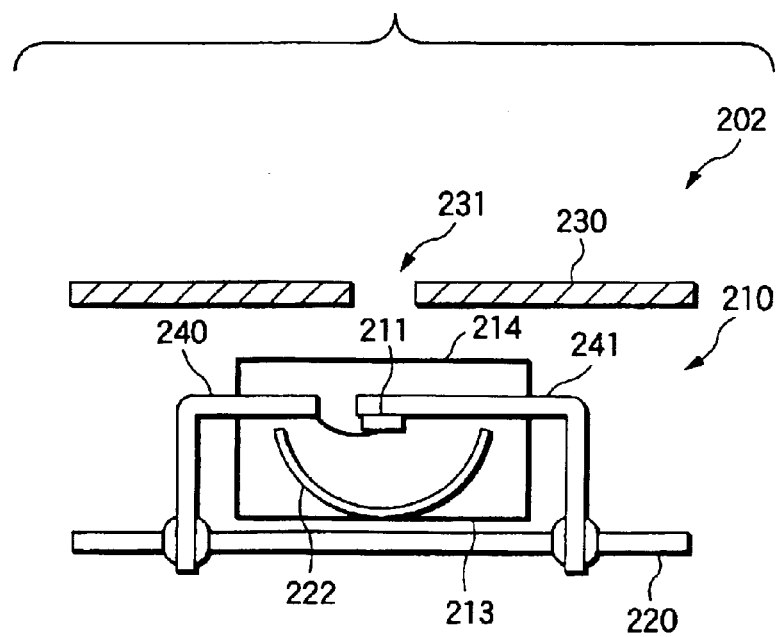
FIG. 13A is a view showing a light source device which is a fifth embodiment of the invention.
Figure 13B:
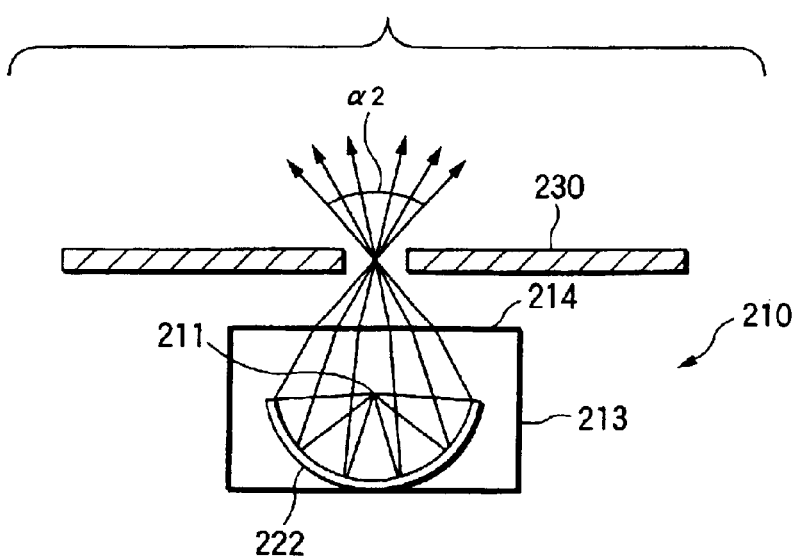
FIG. 13B is a cross sectional view for explaining an optical path in the FIG. 13A device.

A fifth embodiment of a light source device according to the invention is shown in FIGS. 13A and 13B. In the embodiment, a reflecting mirror is reshaped to have a reduced focal distance. Accordingly, a light distribution angle denoted as α2 (FIG. 13B) is wide. In this embodiment, a distance between the LED 210 and the light shielding plate 230 is reduced. Conversely, by increasing the focal length to be longer than that in the case of FIG. 1, the light distribution angle is narrow. In this case, the distance between the LED 210 and the light shielding plate 230 is increased. As known, the converging diameter at the focal position increases with increase of the focal length. In this respect, it is preferable to select the size of the through hole 231 in accordance with the converging diameter.

Figure 14A:
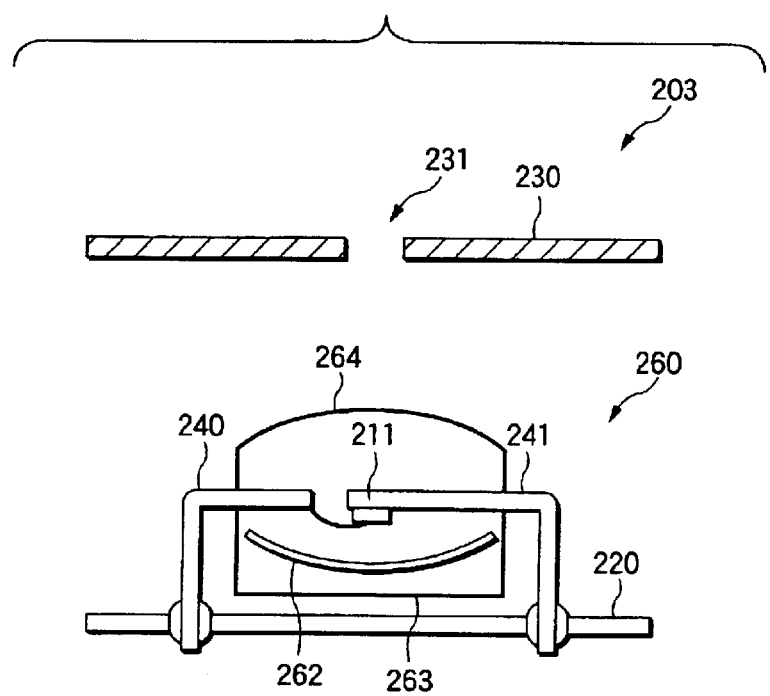
FIG. 14A is a view showing a light source device which is a sixth embodiment of the invention.
Figure 14B:
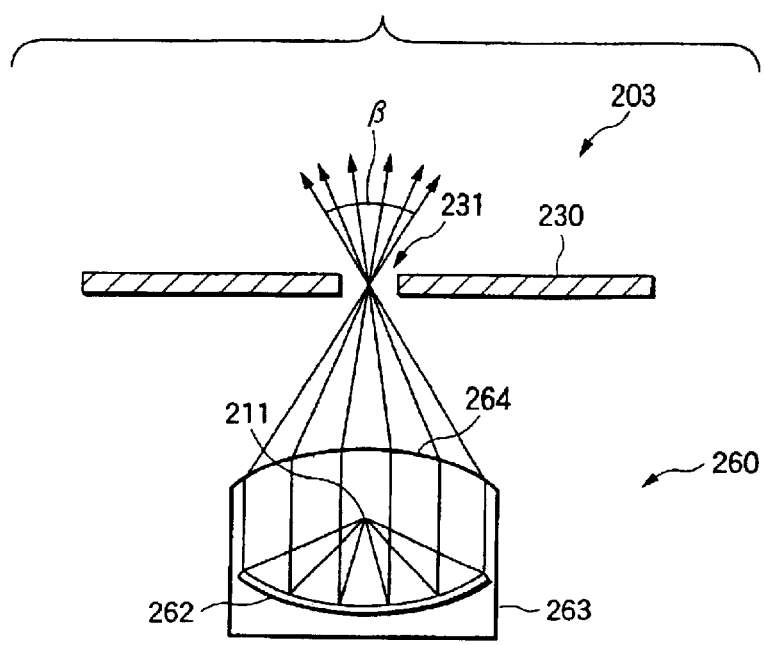
FIG. 14B is a cross sectional view for explaining an optical path in the FIG. 14A device.

A sixth embodiment of a light source device 203 according to the invention is shown in FIGS. 14A and 14B. Like reference numerals are used for designating like or equivalent portions of the light source device 201 of the fifth embodiment.

An LED 260 in the light source device 203 uses an encapsulating member 263 having a light radiation surface 264 as configured like that of the telecentric lens. A reflecting mirror 262 has a surface configured as a paraboloid of revolution whose focal point is located at a light emitting element 262 (see FIG. 14B). Light having reached the light radiation surface 264 is converged on the through hole 231 of the light shielding plate 230 by the telecentric lens surface, and in turn is radiated outside. Thus, in the light source device 203, light emitted from the light emitting element 211 advances as parallel light within the encapsulating member 263, and then is radiated from the encapsulating member 263 and converged. When the light from the light emitting element 211 proceeds within the encapsulating member 263, part of it is lost by leads 240 and 241. However, the light loss by those leads is small for the following reason in the embodiment. In the construction of the embodiment, the diameter of an optical path at the height at which the leads are located is substantially equal to the diameter of the reflecting surface when it is vertically viewed from the light radiation side, while it is smaller than the diameter of the reflecting mirror in the light source device 201. Therefore, the area of the leads 240 and 241 is smaller than an area of the light beam which passes through a plane at the lead height, whereby the light loss is reduced. This embodiment is effective in particular when a light source device which needs a large external radiation angular range β (see FIG. 14B) must be designed. The reason for this is that the angular range β may be varied without a ratio of the area of the light beam which passes through a plane at the lead height and the lead area.

The LED 260 may employ such a telecentric optical system that a lens is used in place of the encapsulating member 263, and light reflected by the light emitting element 262 is converged by the lens. In this case, it is allowed that the light emitting element 211 of the LED 260 is encapsulated with the encapsulating member 263 or not encapsulated.

Figure 15:
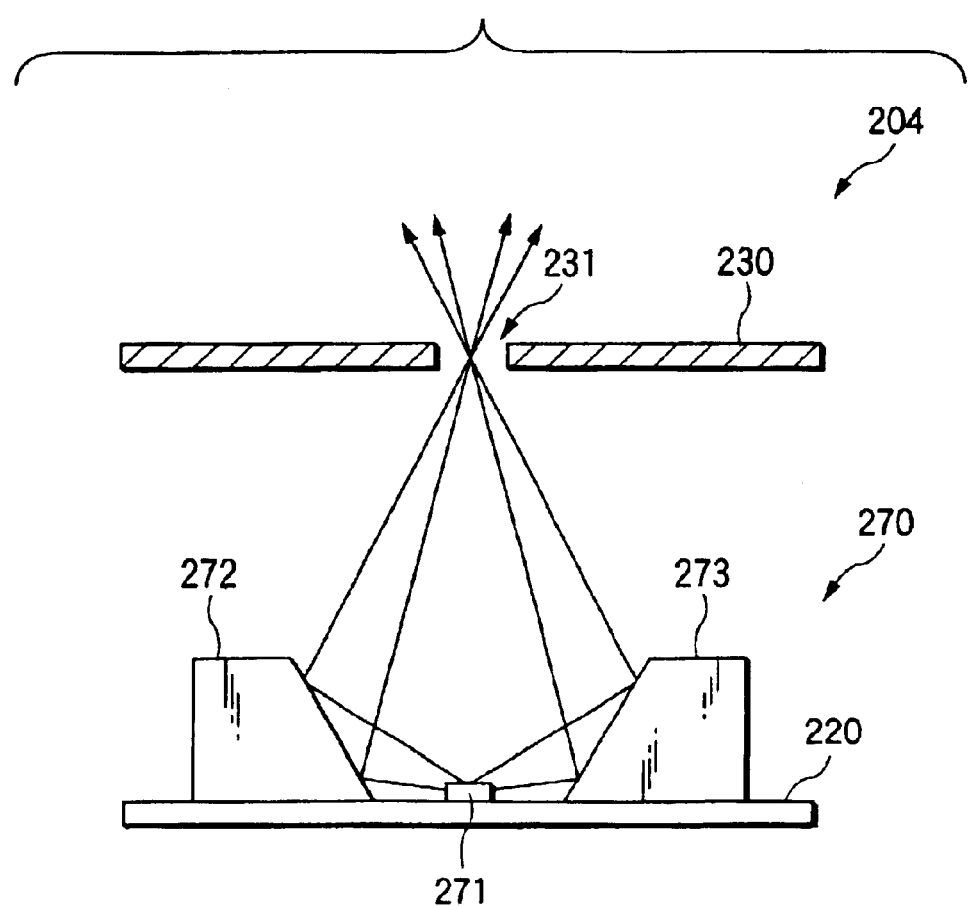
FIG. 15 is a view showing a light source device which is a seventh embodiment of the invention.

The light source device of the invention is not limited to the above-mentioned one, but may be constructed as shown in FIG. 15. The light source device shown, which is designated by reflecting 204, will be handled as a seventh embodiment of the invention. In the light source device 204, a light emitting element 271 is directly mounted on a board 220. Reflecting members 272 and 273 having reflecting surfaces are disposed around the light emitting element 271. The light source device thus constructed is inferior, in the external radiation efficiency, to the above-mentioned embodiment. However, the light source device is not dependent on the directivity, and the external radiation efficiency of about 50% will be secured. Further, the manufacturing of it is easy.

In the case of the lens-type LED, when the directivity is set high, the external radiation efficiency is reduced. It is reduced by 30% when the LED is designed so as to extract parallel light. Further, if the LED whose convergence degree is increased is applied to the light source device of the invention, the external radiation efficiency is further deteriorated. For this reason, if the light source device of the invention is constructed using the lens-type LED, the dark noise is reduced but the external light radiation amount and the luminance are considerably reduced and lowered. Accordingly, it is impossible to secure a high contrast of the LED between the on- and the off-states. From this, it is seen that the LED structure most suitable for the invention is of the reflection-type.

Figure 16:
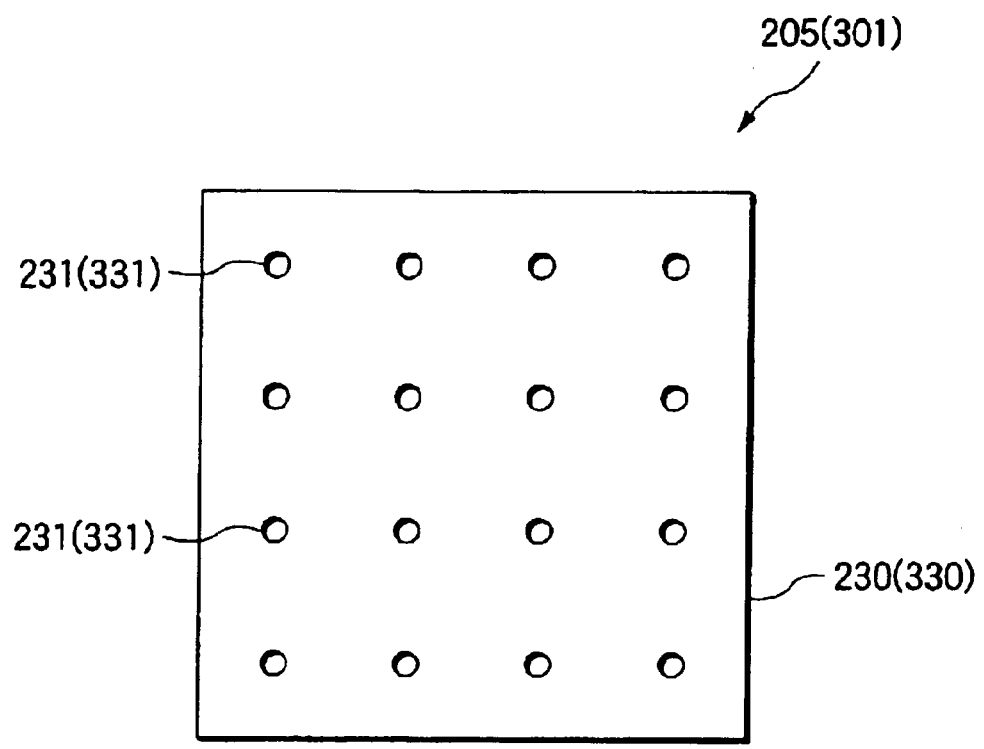
FIG. 16 is a view showing a light source device in which a plurality of LEDs are used for one light shielding plate.
Figure 17:
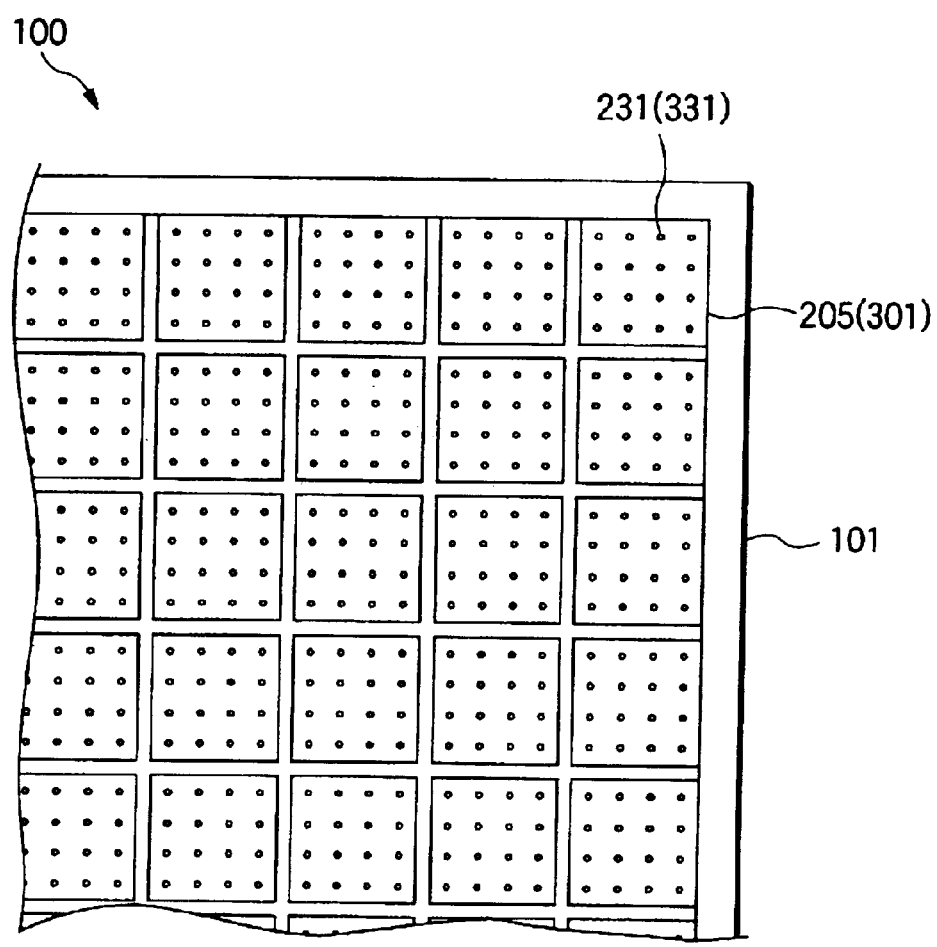
FIG. 17 is a partial, enlarged view showing a full color display device in which light source devices are arrayed in a matrix fashion.

The light source device of each embodiment mentioned above is formed with one light shielding plate, one LED and one board. In an alternative, a plurality of LEDs maybe used for one light shielding plate. A light source device 205 in which 16 number of LEDs (not shown) of RGB type are used for one light shielding plate 230 is shown in FIG. 16. FIG. 17 is a plan view showing the light source device 205 when viewed from the external radiation side.

In the light source device 205, through holes 231 whose number is equal to that of the LEDs are provided. Light emitted from each LED is converged and radiated to exterior from the through hole associated therewith. Where the plurality of LEDs are used, it is preferable that those LEDs are mounted on a single board; however, those may be mounted on a plurality of boards.

Thus, a light emitting device, such as a display device or a signal, may be constructed using a plurality of light source devices 201 or 205. Some light emitting device may be constructed using a single light source device. A full color display device 100 in which a plurality of light source devices 205 are arrayed on a housing 101 is shown in FIG. 17. As described above, the light source device of the invention has a high luminance, and is capable of effectively preventing external light from entering the device. Therefore, the resultant display device 100 is high in luminance and contrast.

Where any of the light source devices 201 to 203 is used for the light source devices of the display device, the resultant display device is especially high in luminance and contrast. Such a display device is preferably used for the display device which is viewed from a distant place in the outdoor or the like. The manufacturing of the light source device 204 is easy. In this respect, the light source device 204 may suitably be used especially for the display devices using a number of light source devices. In the manufacturing of the display device, the use of the light source device accrues to an advantage that the dot pitches may be narrowed.

The light source device of the embodiment may also be used in the following manner: part of light emitted from the light emitting element is irradiated on a fluorescent material which is excited at the wave-length of the light to emit fluorescent light, whereby its wave-length is converted to another, and a combination of the original light and the wave-length converted light is emitted.

Figure 18A:
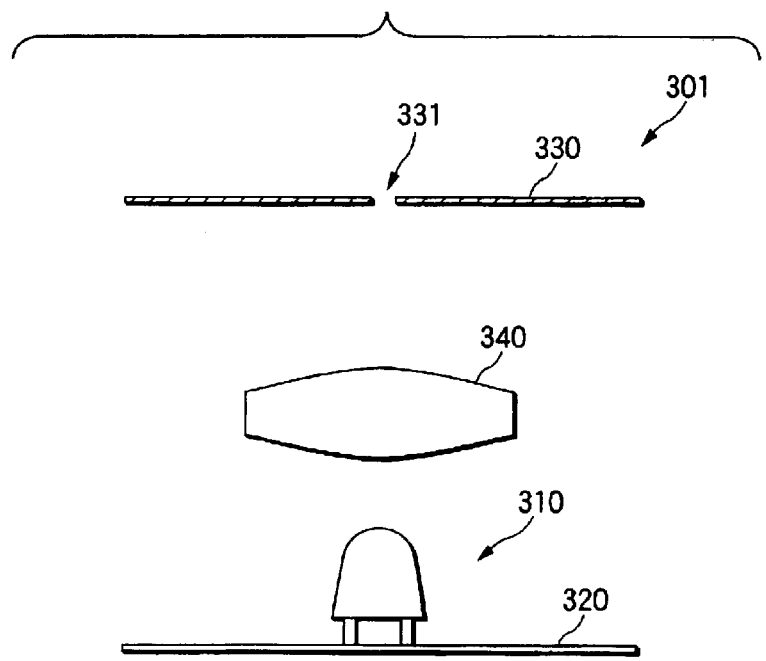
FIG. 18A is a view showing a light source device which is an eighth embodiment of the invention.
Figure 19:
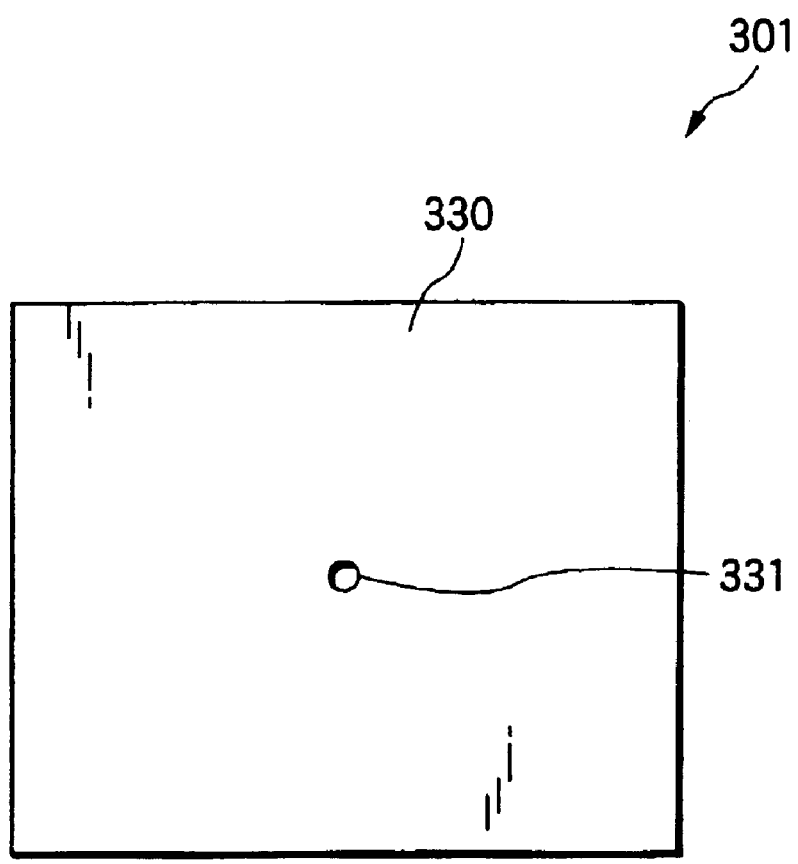
FIG. 19 is a plan view showing the light source device when viewed from the external radiation side.
Figure 20:
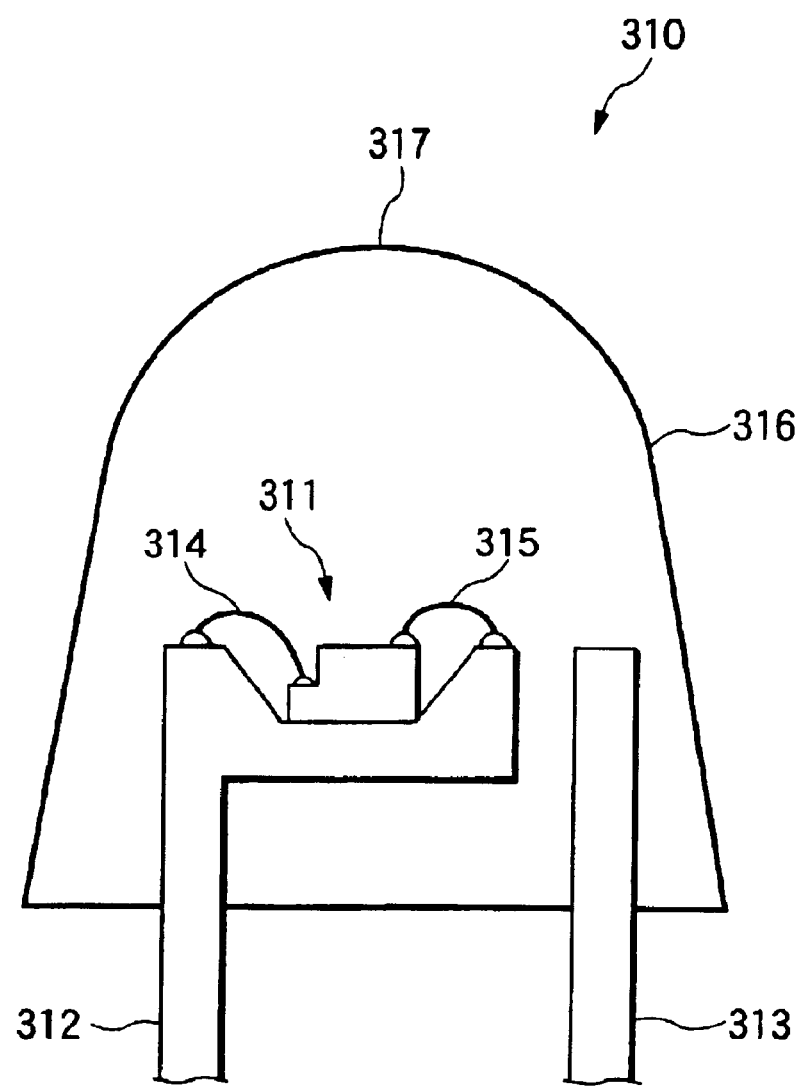
FIG. 20 is a view showing a construction of the LED.

FIG. 18A shows a mechanical arrangement of a light source device 301 of an eighth embodiment of the invention. The light source device 301 is generally made up of a LED 310, a mounting board 320, a light shielding plate 330, and an inner lens 340. The light source device 301 may be utilized for a light source for a display device, a signal or the like. FIG. 19 is a plan view showing the light source device 301 when viewed from the external radiation side (from top in FIG. 18A). FIG. 20 is a view showing a construction of the LED 310. The arrangement of the light source device 301 will be described with reference to those figures.

The LED 310 is of the lens-type. The LED includes a light emitting element 311, leads 312 and 313, and an encapsulating member 316 made of light transmission material, which encapsulates them.

In the embodiment, the light emitting element 311 is made of group III nitride compound semiconductor. Accordingly, the light source device emits blue light. It is evident that an LED capable of emitting light of any color may be used for the LED, and the light source device may be formed so as to emit light of a desired color. A light source device which is capable of emitting light of any desired color may be formed by using an LED of the RGB type, which includes the combination of red, green and blue light emitting elements. The light emitting element 311 is mounted on a cap portion of the lead 312. The electrodes (n and p electrodes) of the light emitting element 311 are connected to the leads 312 and 313 by means of wires 314 and 315, respectively.

The encapsulating member 316 has a lens surface 317. The lens surface is configured so as to have a convergence of light being not so high in degree. That is, it is configured so as to have such a degree of the light convergence that most of light that is emitted from the light emitting element 311 and transmitted through the lens surface is incident on the inner lens 340 to be given later.

The LED 310 is mounted on the mounting board 320. The mounting board is of the general type.

The light shielding plate 330 is a black plate-like member having a light shielding function. The light shielding plate 330 is mounted at a high place on which light from the LED 310 converges. The light shielding plate 330 has a through hole (optical aperture) 331, which is formed at a position on which light from the LED 310 converges. The through hole 331 has a size defined by the smallest value of the dimensional values representative of a converging diameter at the focal point f1 for the light from LED 310, which is added with a certain margin while allowing for a mounting accuracy. Where the dark noise reduction takes priority over the external radiation efficiency, the through hole. 331 of the light shielding plate 330 may be more reduced in size.

The inner lens 340 is located between the LED 310 and the light shielding plate 330. The inner lens 340 converges light from the LED 310 on the through hole 331 of the light shielding plate 330.

Figure 18B:
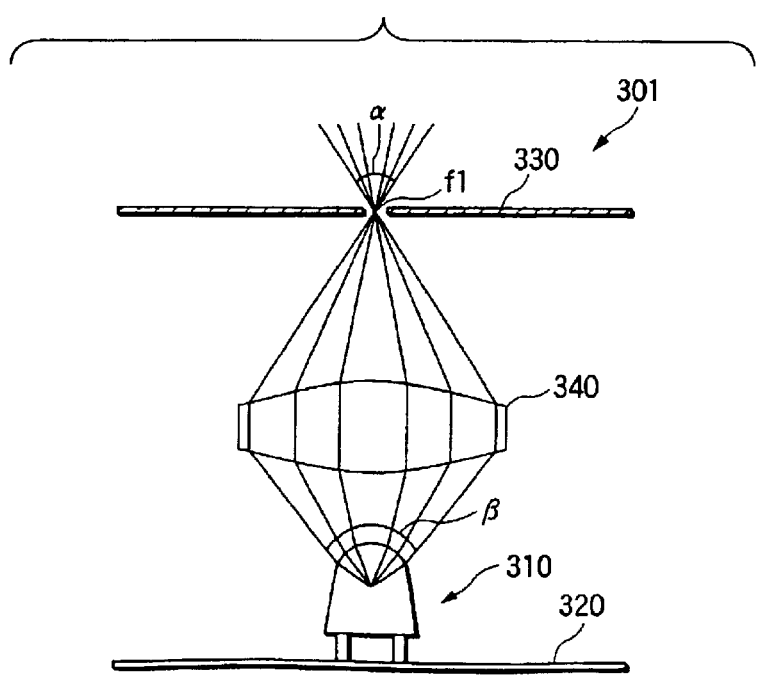
FIG. 18B is a cross sectional view for explaining an optical path in the FIG. 18A device.

A radiation of light in the light source device 301 will be described with reference to FIG. 18B. In the thus constructed light source device. 301, light is emitted from the LED 310 and radiated within a range of an angle β from the lens surface 317 of the encapsulating member 316. The light emanating from the lens surface is radiated to and converged by the inner lens 340, and the converged one passes through the through hole 331 of the light shielding plate 330, which is as a focal point, and radiated outside. A radiation angle of the external radiation light is equal to an angular range a, which is defined between the reflecting surface of the inner lens 340 and the through hole 331 for external radiation. Thus, the light radiated within the angle β from the LED 310 is radiated onto the inner lens 340, and then radiated outside as the rays of light confined within the angular range α, from the inner lens 340. In this case, a directivity characteristic of the external radiation light may be adjusted by the inner lens 340. Therefore, the angular range β of the light emitted from the LED 310 may be set to be relatively large. This fact indicates that the radiation efficiency reduction, which is caused by the decrease of the radiation angle when the lens-type LED is used, is avoidable. Thus, the light source device 301 highly efficiently radiates light emitted from the LED 310 to the inner lens 340, and then radiates it as the rays of light confined within the predetermined angle α. Accordingly, the light source device 301 is constructed which is able to radiate light to exterior at high efficiency and the predetermined directivity.

Figure 80:
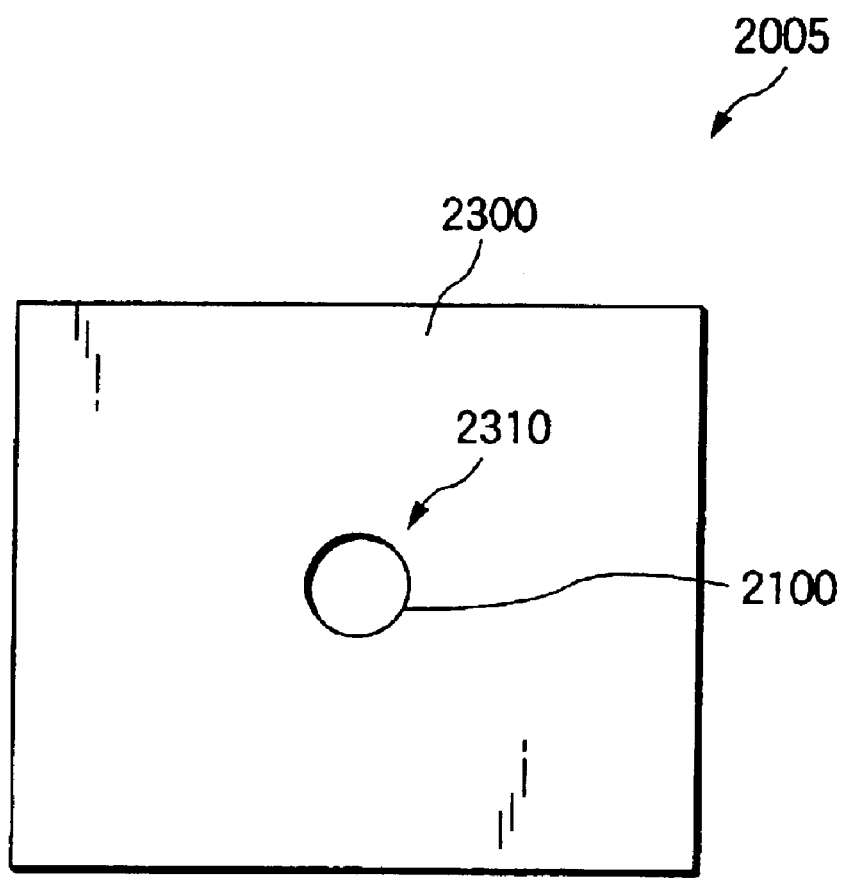
FIG. 80 is a top view in which the light source device is viewed from the side of external radiation of light.
Figure 81:
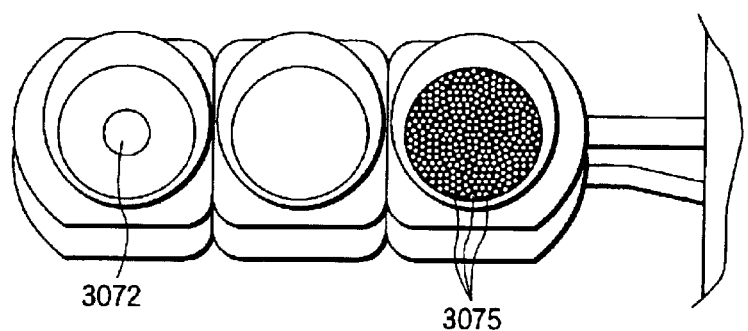
FIG. 81 is a front view showing a conventional signal.
Figure 82A:
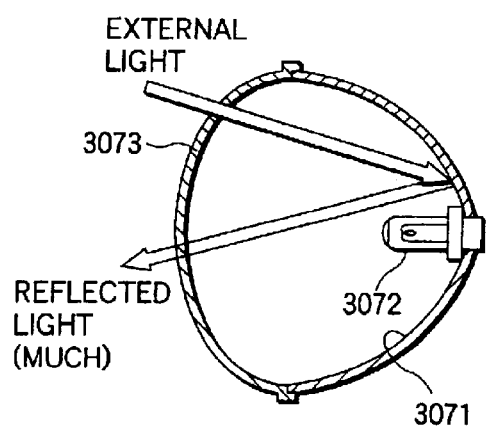
FIG. 82A and FIG. 82B are cross sectional views each showing a signal light to be arranged in the conventional signal.
Figure 82B:
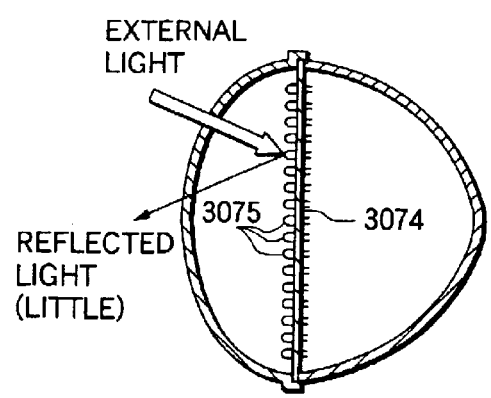
Figure 83:
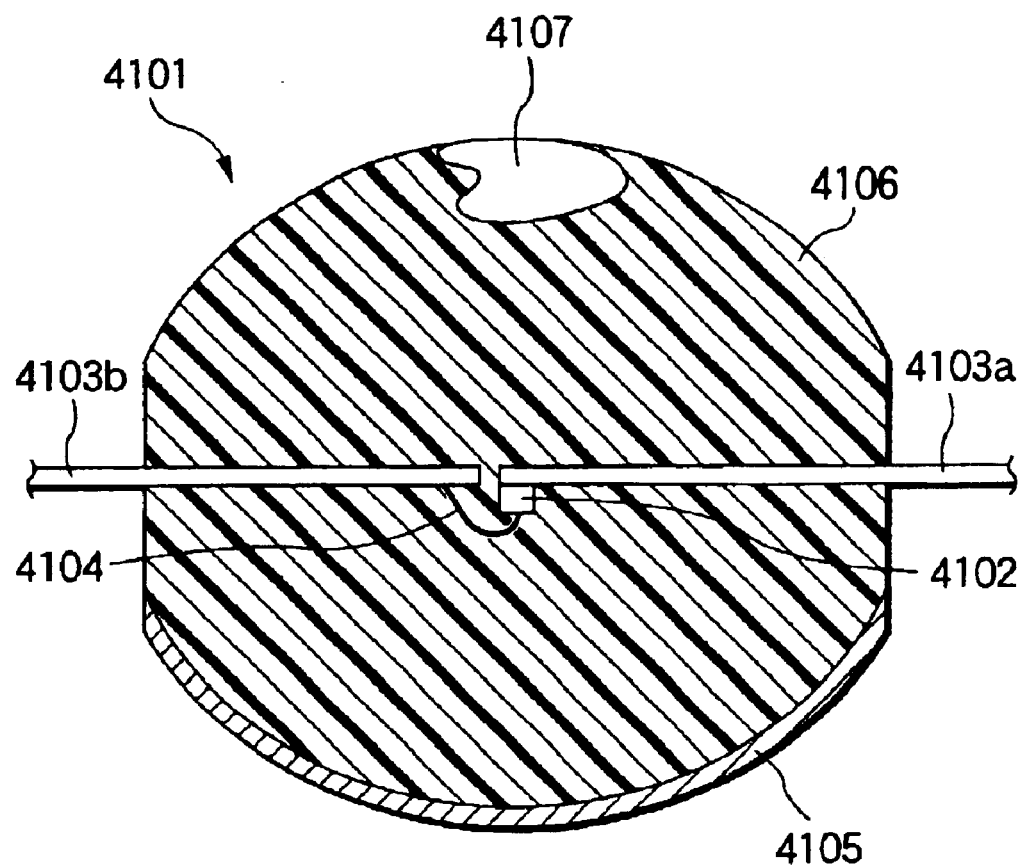
FIG. 83 is a cross sectional view showing an overall construction of a conventional reflection-type light emitting diode.
Figure 84:
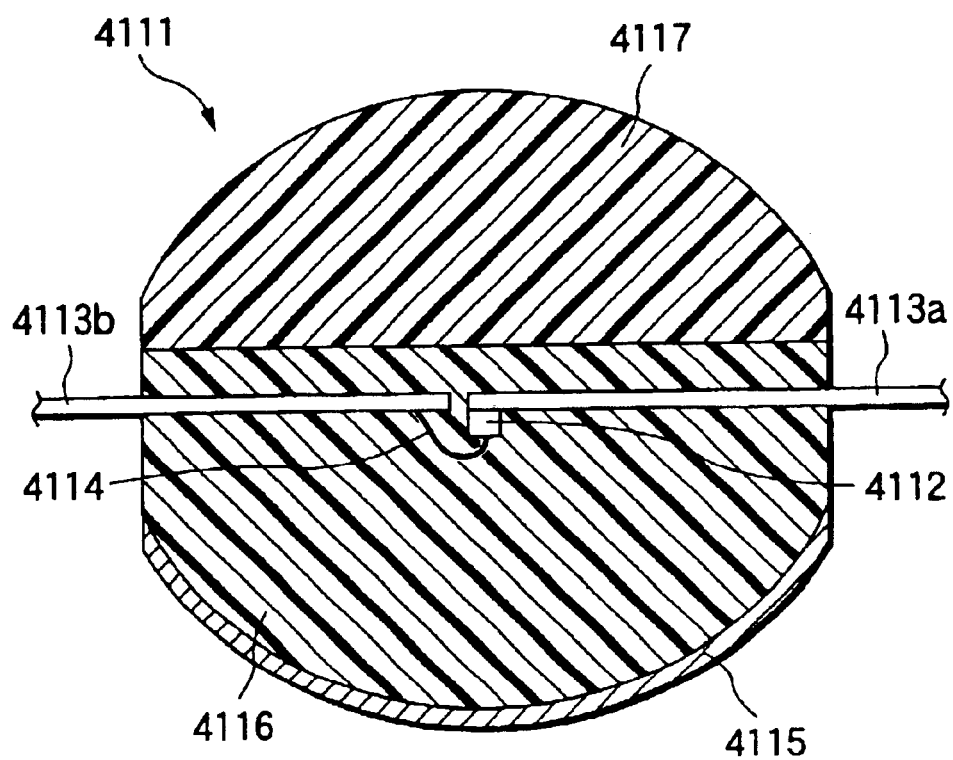
FIG. 84 is a cross sectional view showing an overall construction of another conventional reflection-type light emitting diode.
Figure 85:
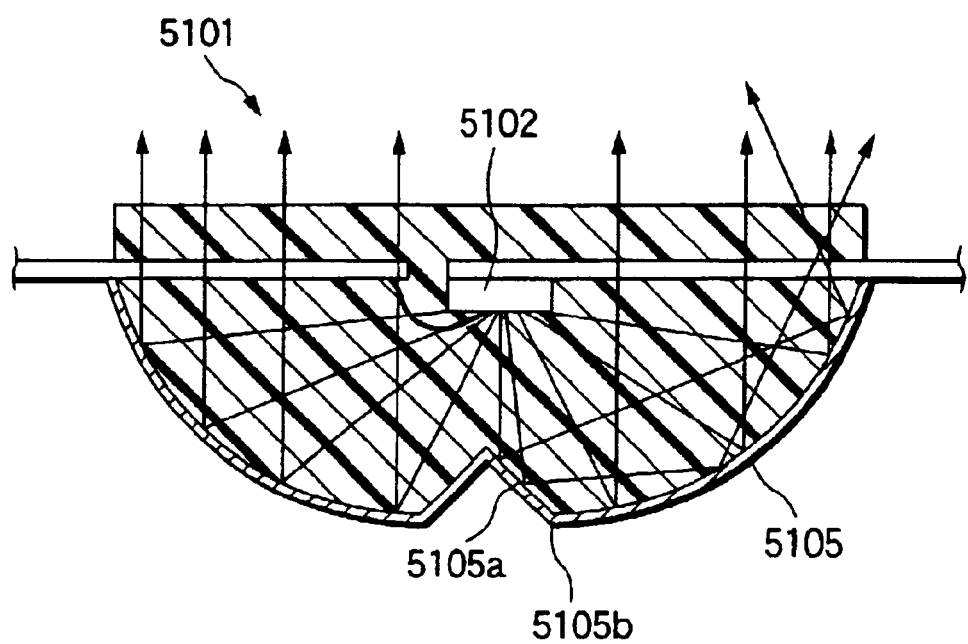
FIG. 85 is a cross sectional view showing an overall construction of still another conventional reflection-type light emitting diode.
Figure 86:
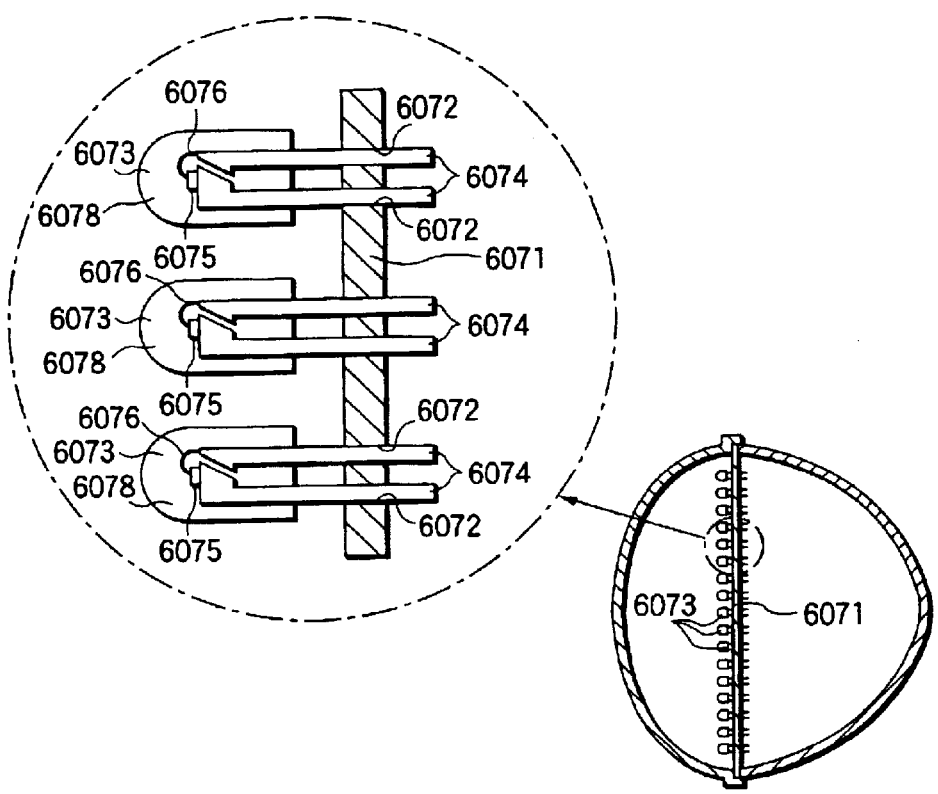
FIG. 86 is a cross sectional view showing a conventional light source device and its partial segment.
Figure 87:
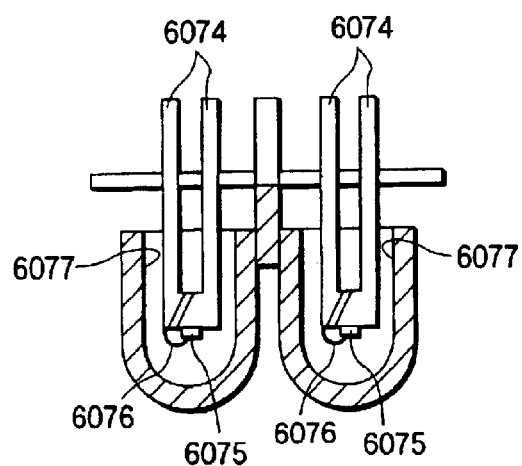
FIG. 87 is a cross sectional view showing for explaining a method for manufacturing a lens-type LED by potting molding process.

External light reaches the light shielding plate 330 including the through hole 331; however, the most amount of the external light is absorbed in an area of the light shielding plate 330 except the through hole 331, which is nearly equal to the entire area of the same. A slight amount of the external light passes through the through hole 331 and proceeds to the LED 310, however. The amount of light that passed through the through hole and proceeds toward the LED 310 is proportional to its incident area (i.e., the area of the through hole 331) It is noted that the area of the through hole 331 in the embodiment is considerably smaller than that of the convention one (FIGS. 80 and 81). Accordingly, the amount of light passing through the through hole 331 is reduced. In other words, the amount of the external light to be incident on the LED is extremely reduced when comparing with that in the conventional light source device. Most of the light having passed through the through hole 331 and proceeds toward the LED 310 is absorbed by the surface of the light shielding plate 330, which is closer to the LED 310, and the like. For this reason, a reflectivity of the external light entering the light source device 301 is extremely small.

As described above, in the light source device 301 thus constructed, light that is emitted from the LED 310 at high efficiency is converged by the inner lens, and radiated outside without any interruption by the light shielding plate 330. The light source device 301 is high in external radiation efficiency and luminance. Further, the shielding effect of the light source device for the external light may be increased with the high external radiation efficiency and high luminance, both remaining intact. Thus, in the light source device, the luminance is high when the LED is in an on state, and the dark noise is extremely low. Accordingly, the light source device is provided in which a contrast of the LED between the on- and off-states, and the visibility is good.

The radiation angle of the external radiation light may be set at a desired value by appropriately varying the configurations and sizes of the lens surface 317 of the LED 310 and the inner lens 340. The radiation angle of the external radiation light may be increased in value when such a lens surface as to lower a degree of light convergence is used, the LED emits light in great expanse, and the inner lens having a large lens area corresponding to the great expanse of light is used.

The degree of light convergence of the LED 310 and the configuration of the inner lens 340 are not limited to the above-mentioned ones, if the following condition is satisfied: the contrast can be improved by reducing the dark noise even if the external radiation efficiency is inferior to that by the conventional technique.

Where light is converged by the LED 310 alone, viz., not using the inner lens 340, the useful effect of the invention is not produced, however. That is, in the case of the lens-type LED, the external radiation efficiency decreases with increase of the convergence degree. It is reduced by 30% when the LED is designed so as to extract parallel light. If the convergence degree is further increased, the external radiation efficiency is further decreased. For this reason, when light is converged by the LED 310 alone, viz., not using the inner lens 340, the reduction of the dark noise is secured, but the amount of external radiation light and the luminance considerably reduce. Accordingly, it is impossible to secure a high contrast of the LED between the on-state and the off-state.

Figure 21:
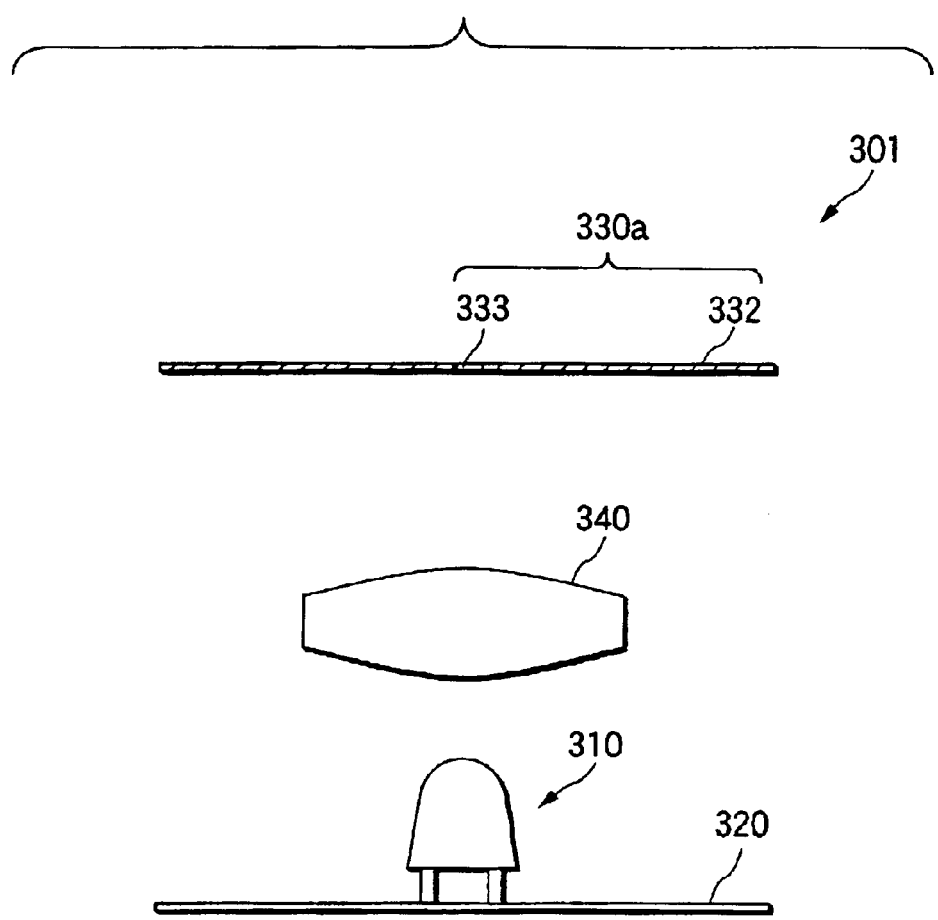
FIG. 21 is a diagram showing a light source device which is a ninth embodiment of the invention.
Figure 22:
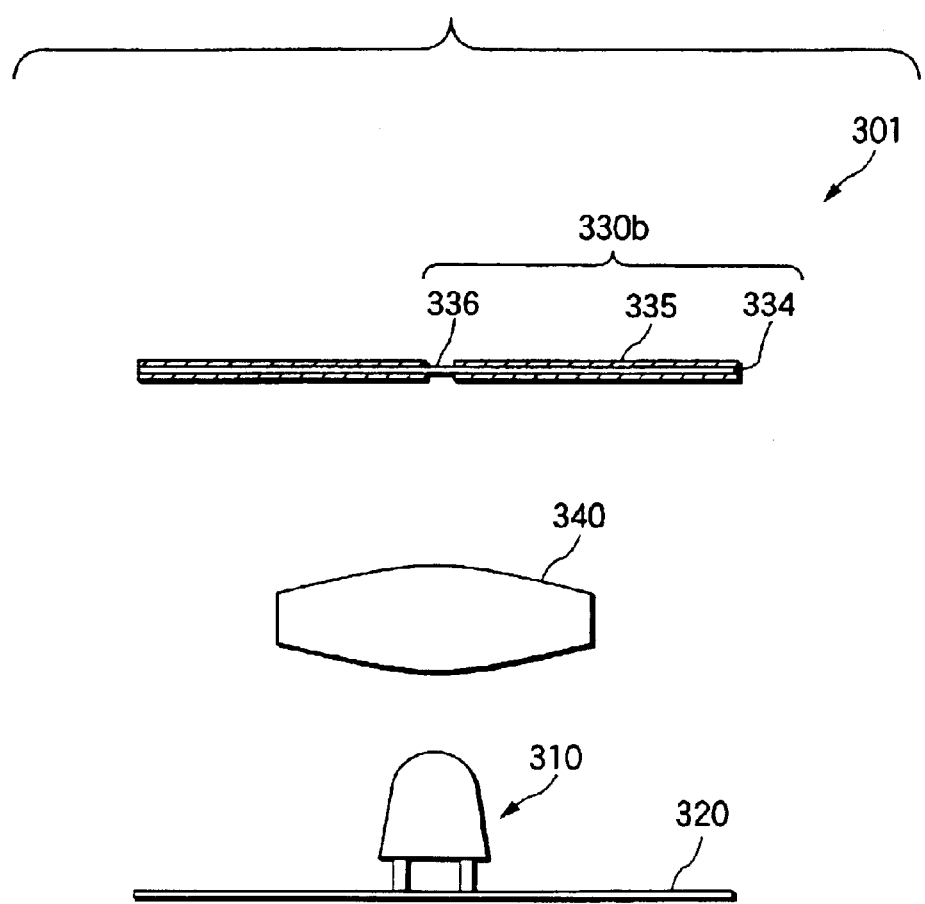
FIG. 22 is a diagram showing a light source device which is a tenth embodiment of the invention.

The structure of the light shielding plate 330 is not limited to the above-mentioned one, but may be as shown in FIGS. 21 and 22 (showing ninth and tenth embodiments of the invention) A light shielding plate 330a shown in FIG. 21 includes a light shielding portion 332 made of black colored resin, and a light transmission portion 333 made of transparent resin. A light shielding plate 330b of FIG. 22 is constructed such that the outer face of a glass plate 334, except a part of it, is printed black, whereby a light transmission portion (not printed) 336 and a light shielding portion (printed) 335 are formed. In the light shielding plate thus structured, light emitted from the LED 310 is externally radiated after passing through the light transmission portion 336. Transparent resin may be used in place of glass.

The light source device using the light shielding plate of FIG. 21 or 22 is excellent in dust-proof and water-proof.

The light source device 301 may be used for the construction as shown in FIGS. 16 and 17.

An 11th embodiment of the present invention will be described with reference to FIGS. 23 through 27.

Figure 23A:
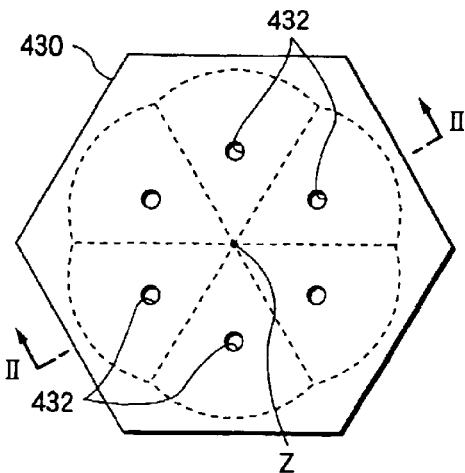
FIG. 23A is a plan view showing a light shielding plate used in a light pattern projector which is a 11th embodiment of the invention.
Figure 23B:
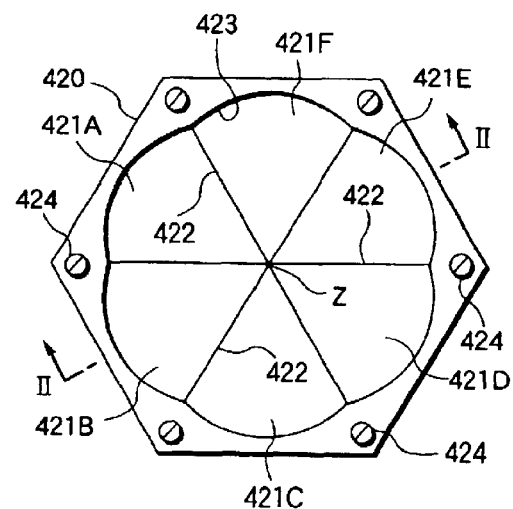
FIG. 23B is a plan view showing a base used in the light source device of the 11th embodiment.
Figure 24:
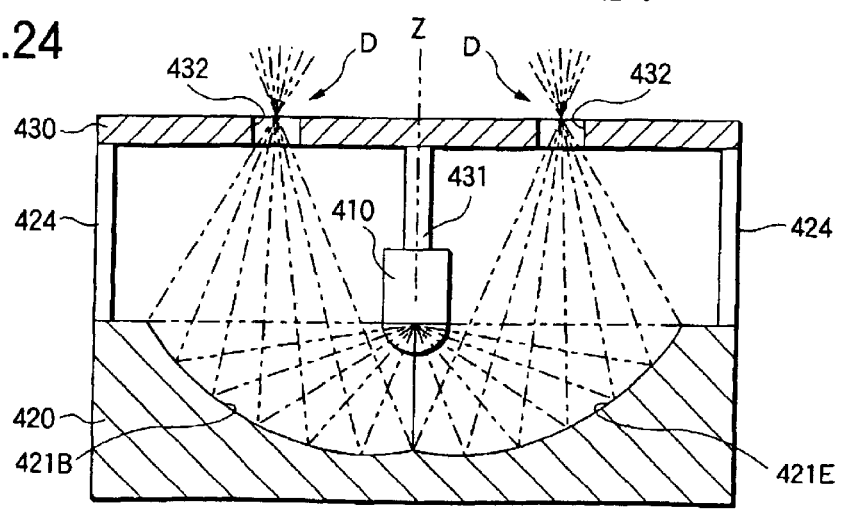
FIG. 24 is a cross sectional view taken line II—II in FIGS. 23A and 23B.

As shown in FIGS. 23 and 24, a light pattern projector as a light emitting device which is the 11th embodiment of the invention comprises a light source 410, abase 420 as a reflecting table located on the front side (the lower side in FIG. 24) of the light source as viewed in the axial direction of the light source, and a light shielding plate 430 located on the rear side (the upper side in FIG. 24) of the light source as viewed in its axial direction. As best illustrated, the base 420 and the light shielding plate 430 are hexagonal when vied in plan view, and the areas of them are substantially equal to each other. The base 420 and the light shielding plate 430 are coupled with each other by means of six support poles 424, which stand erect at six corners of the hexagonal configuration, while being spaced from each other in the axial direction of the projector (coincident with the axial line Z of the light source 410) by a predetermined distance. The light source 410 is held at a mid-position between the base 420 and the light shielding plate 430 by means of a support bar 431 extending from the center of the light shielding plate 430 in the axial direction.

As shown in FIGS. 23B and 24, a plurality of reflecting concave surfaces 421A to 421F (six concave surfaces in this embodiment) are formed in the upper surface (opposed to the light source) of the base 420. Those six reflecting concave surfaces are disposed around the axial line Z, and demarcated by six edge lines 422 (corresponding to phantom dividing lines), which radially extend from the axial line Z while being equiangularly spaced from one another (angular space interval=60° in this embodiment).

Those six reflecting concave surfaces 421A to 421F are each shaped like a fan when it is vertically viewed from the light source 410 side. The pivots of the fans of those reflecting concave surfaces are all located at the axial line Z in a state that those surfaces adjoin each other, and the edge line 422 extends on and along the boundary line between the adjacent reflecting concave surfaces. Since the reflecting concave surfaces 421A to 421F thus arranged are formed in the base 420, a jelly-cup shaped concave portion 423, which is opened upward with its inner wall surface defined by those reflecting concave surfaces, is formed in the upper surface of the base 420. As shown in FIG. 24, the light source 410 is disposed in a state that its front light emitting surface is located within the jelly-cup shaped concave portion 423.

Figure 27:
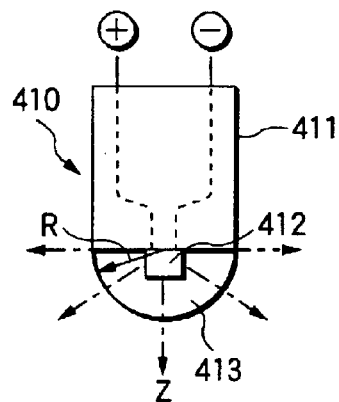
FIG. 27 is a front view showing a light source.

In this embodiment, the light source 410 consists of a light emission diode (LED). A specific construction of the light source is illustrated in FIG. 27. As shown, the light source 410 includes a cylindrical support 411, a semiconductor light emitting element 412 fixed to the underside (front side) of the cylindrical support, and a transparent resin body 413 taking the form of a half-sphere with the radius R, which encapsulates the light emitting element. Current is fed to the semiconductor light emitting element 412, through current feeding wires (indicated by broken lines) provided within the cylindrical support 411.

The transparent resin body 413 covers the entire exposed surface of the light emitting element 412 to isolate it from its contact with air and to support the underside of the cylindrical support 411. In the embodiment, the light emitting element 412 is located at the center of a perfect half-spherical body, and light rays emitted from the light emitting element 412 are incident on the surface of the half-spherical body at right angles. Therefore, the light is not refracted where it is radiated outside from the spherical surface. Thus, there is no case that the transparent resin body 413 functions as a deflection lens. Accordingly, the rays of light emitted from the light emitting element 412 are radiated from the spherical surface uniformly in every radial direction. The transparent resin body 413 that is formed protruding downward from the lower end of the cylindrical support 411 is locate completely within the concave portion 423. Accordingly, most of light emitted from the light emitting element 412 reaches the reflecting concave surfaces 421A to 421F and are reflected by the same.

Figure 25:
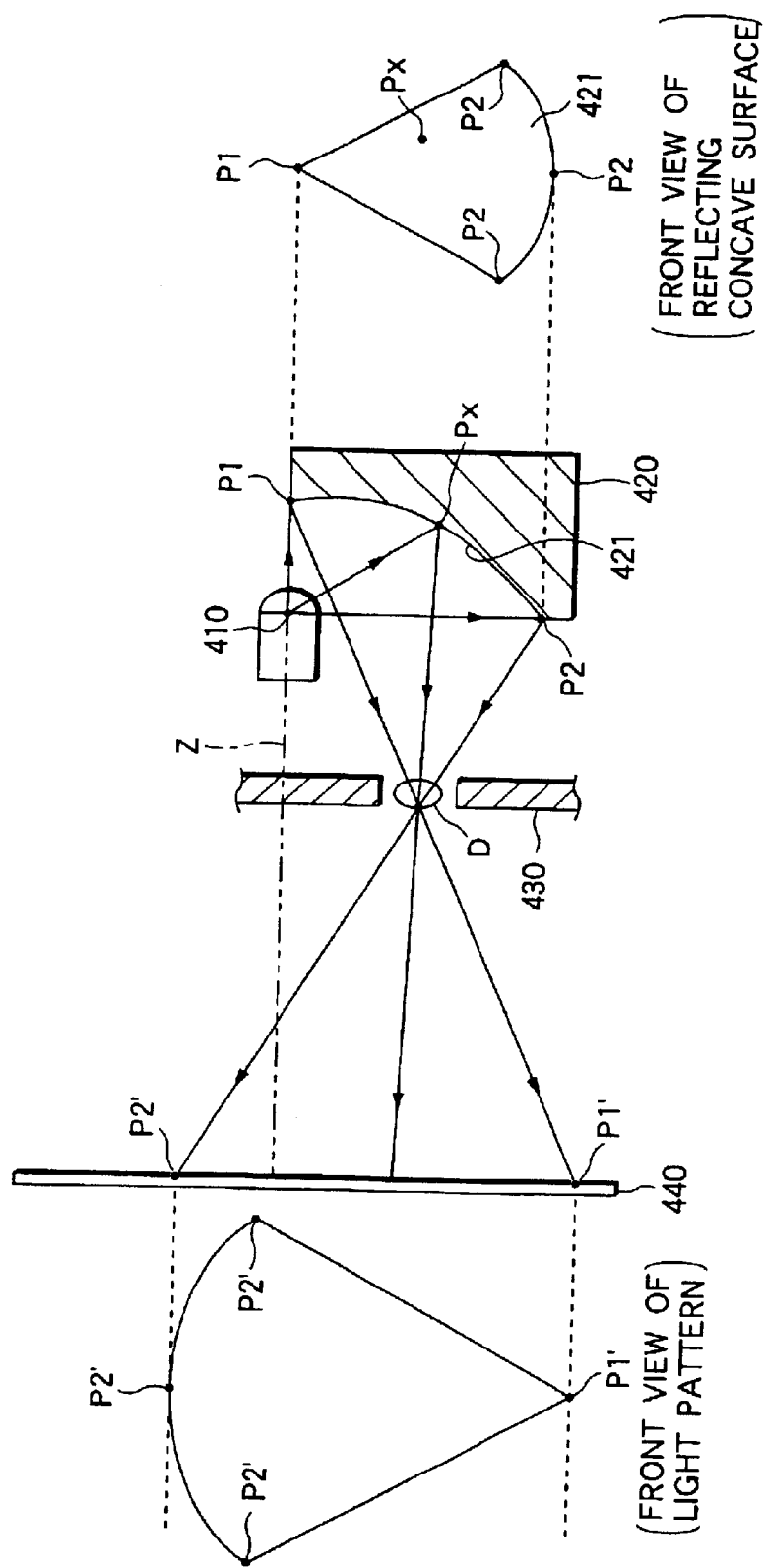
FIG. 25 is a diagram useful in explaining the principle of forming a light pattern by one reflecting concave surface in the light pattern projector.

The reflecting concave surfaces have metallic luster surfaces, which are formed in a manner that metallic surfaces are mirror finished or metal films are formed by physical or chemical vapor deposition. A curved line or a curved surface which constitutes each reflecting concave surface is featured through geometrical calculations. FIG. 25 shows a cross sectional view of the light pattern projector, which is depicted typically on one reflecting concave surface 421 thereof, the view taken on the axial line Z in one radiation direction, and a front view showing a light pattern and the reflecting concave surface.

As seen from FIG. 25, a reflecting point Px exists in an area of the reflecting concave surface 421, which is defined between a vertex P1 as the pivot of the fan shape to outer edge points P2 forming the peripheral arc of the fan shape. The concave surface of the reflecting concave surface 421 is configured such that all rays of light reflected at the reflecting point Px are converged on a specific converging area D. The converging area D is located at a position which is on the rear side of the light source 410 and spaced from the axial line Z by a predetermined distance in the radiation direction.

The area of the converging area D is extremely small to such an extent that it may be considered to be one converging point. The reflecting concave surface 421 is configured so as to satisfy L1+L2=constant at every reflecting point Px on the reflecting concave surface 421, where L1 is an optical path length from the center of the light source 410 to the reflecting point Px, and L2 is an optical path length from the reflecting point Px to the converging area D. In other words, the concave surface of the reflecting concave surface 421 is formed along a spheroidal surface developed by revolving an ellipse, which has a first focal point being at the center of the light source 410 and a second focal point being at the converging area D, about the axial line Z.

In the embodiment, six light converging areas (or converging points) D corresponding to the six reflecting concave surfaces 421A to 421F are located at a position on the rear side of the light source 410 such that those converging areas are equiangularly (every 60° in the embodiment) disposed around and equally spaced from the axial line Z. Each reflecting concave surface 421 is configured as defined by the spheroidal surface as mentioned above, and reflects all the rays of light received from the light source 410 toward the converging area D associated therewith. As shown in FIG. 25, the light converged on the converging area D passes therethrough and diverges, and reaches a given projected plane 440 (e.g., a screen or a wall) as a virtual plane, which is set at a position spaced from the light pattern projector by a given distance.

As shown in FIGS. 23A and 24, a plurality of transmission holes (optical apertures or through holes) 432 as optical windows are formed in the light shielding plate 430 while passing therethrough (the transmission holes correspond in number to the reflecting concave surfaces, six (6) in the embodiment). The transmission holes 432 are provided in association with the six converging areas D, and each converging area D is completely placed within the inside space of each transmission hole. Thus, the light shielding plate 430 is disposed at the positions at which the converging areas D are located, and such that the six transmission holes 432 are formed at such positions as not to interrupt the light converged on the converging areas D. An area of each transmission hole 432 is determined by an area of the converging area D and a thickness of the light shielding plate 430. If the light shielding plate 430 is extremely thin and the converging area D is extremely small to such an extent that it may be considered as a converting point, the transmission hole 432 may be reduced in size till it is considered as a point.

When basically considering the functions of the light pattern projector, it is seen that the light shielding plate 430 is not a component essential to the projector. However, provision of the light shielding plate 430 in the projector will produce secondary effects. The light shielding plate restricts the light rays (deranging light) coming from a place or places other than the light source 410, which proceed to the reflecting concave surfaces of the base 420. As a result, the control of the light rays contributing to the formation of a light pattern is reliable.

Formation of light patterns by the light pattern projector thus constructed will now be described.

As shown in FIG. 25, light emitted from the light source 410 is reflected by the reflecting concave surfaces, is converged on the converging areas D and diverges, and reaches the projected plane 440. In FIG. 25 depicting light flows on one reflecting concave surface 241, a ray of light that is reflected at the vertex P1 of the fan shape of the reflecting concave surface 241 traces an optical path extending downward to the left, passes through the converging area D, and reaches a point P1' located in the lower half of the projected plane 440. A ray of light that is reflected at an outer edge point P2 forming the peripheral arc of the reflecting concave surface 421 traces an optical path extending upward to the left, passes through the converging area D, and reaches a point P2' in the upper half of the projected plane 440.

As a result, a light patter is projected on the projected plane 440. The light pattern corresponds to the enlarged inversion of the fan shape of the reflecting concave surface 421 when it is vertically viewed. The light pattern is analogous to the shape of the reflecting concave surface 421 when it is vertically viewed. An enlargement percentage of the light pattern varies with a distance between the converging area D and the projected plane 440.

Figure 26:
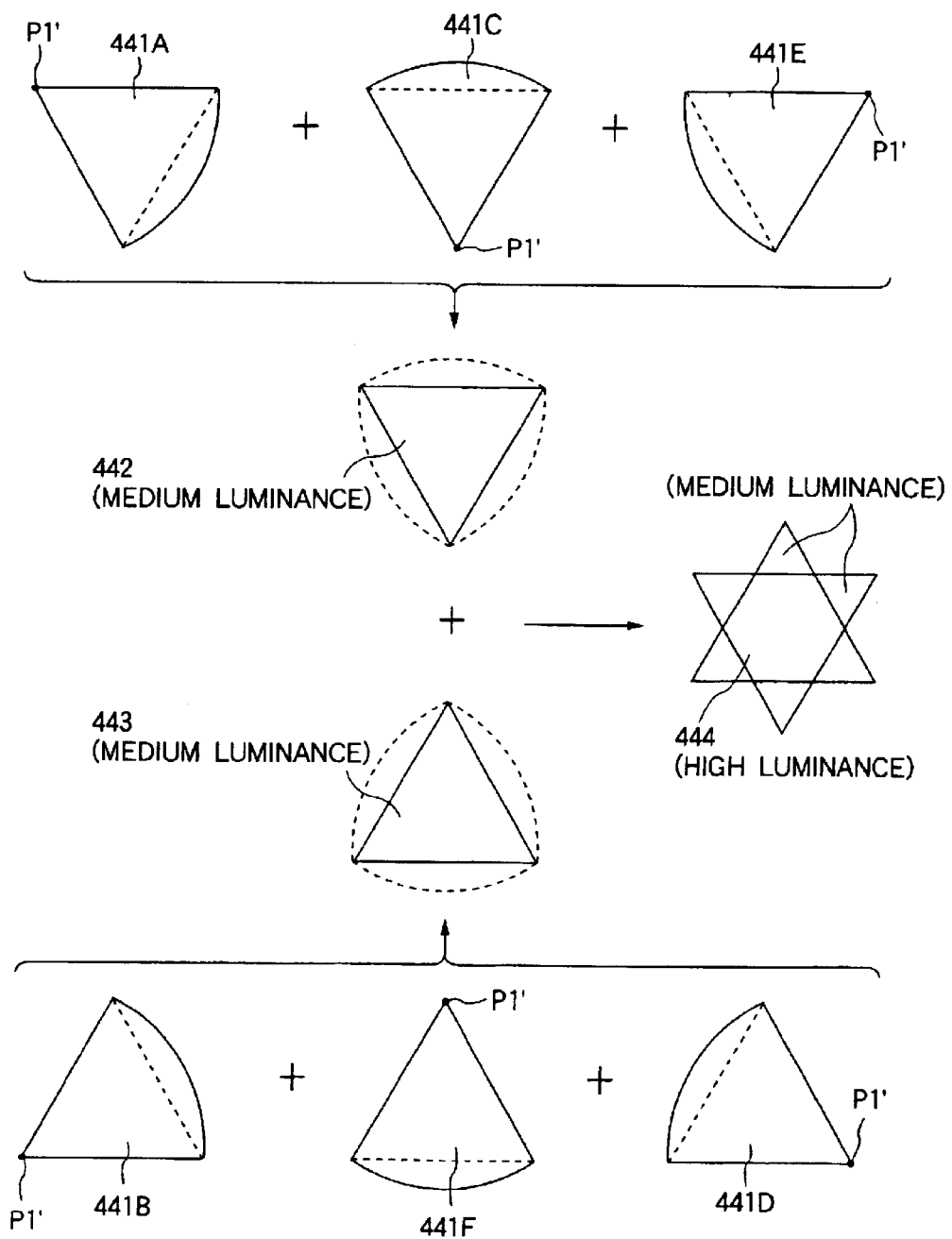
FIG. 26 is a diagram useful in explaining the principle how to compose light patterns by a plurality of reflecting concave surfaces into one light pattern.

As described above, the light pattern projector of the embodiment includes the six reflecting concave surfaces 421A to 421F, and forms light patterns which corresponds to the inverted and enlarged light patterns of the fan shapes of the reflecting concave surfaces 421A to 421F by the utilization of the reflecting concave surfaces. Those six fan-shaped light patterns overlap to form one geometrical pattern. FIG. 26 is a diagram schematically showing individual fan-shaped light patterns formed by the reflecting concave surfaces 421A to 421F and how to compose those light patterns into one light pattern.

Three figures 441A, 441C and 441E in the upper part of FIG. 26 are fan-shaped light patterns, which are formed by the reflecting concave surfaces 421A, 421C and 421E, respectively. The three vertices of the fan-shaped light patterns 441A, 441C and 441E are located at substantially the same point on the projected plane 440 when the following three conditions are satisfied: 1) those three fan-shaped light patterns 441A, 441C and 441E are presented on a screen while keeping such a positional relationship among them that the centers of gravity of those figures are substantially coincident with one another; 2) those reflecting concave surfaces 421A, 421C and 421E are disposed around the axial line Z in a state that those are angularly spaced at angular spatial intervals of 120°; and 3) an angle of each of the reflecting concave surfaces 421A, 421C and 421E is 60° at the vertex P1. When those figures are thus located, a light pattern as represented by a figure 442 appears on the projected plane.

The fan-shaped light patterns 441A, 441C and 441E overlap with one another, so that a regular triangle figure 442 (an inverted regular triangle in FIG. 26) appears on the light shielding plate. Within the area within the regular triangle, reflecting light from the three reflecting concave surfaces are superimposed, so that the luminance in the area is in a medium level, relatively high in luminance level. Three arcuate areas (indicated by broken lines) whose chords are the sides of the regular triangle are in a low luminance level, which is lower than the medium luminance level.

Three figures 441B, 441D and 441F in the lower part of FIG. 26 are fan-shaped light patterns, which are formed by the reflecting concave surfaces 421B, 421D and 421F, respectively. The three vertices of the fan-shaped light patterns 441B, 441D and 441F are located at substantially the same point on the projected plane 440 when the following three conditions are satisfied: 1) those three fan-shaped light patterns 441B, 441D and 441F are presented on a screen while keeping such a positional relationship among them that the centers of gravity of those figures are substantially coincident with one another; 2) those reflecting concave surfaces 421B, 421D and 421F are disposed around the axial line Z in a state that those are angularly spaced at angular spatial intervals of 120°; and 3) an angle of each of the reflecting concave surfaces 421B, 421D and 421F is 60° at the vertex P1. When those figures are thus located, a light pattern as represented by a figure 443 appears on the projected plane.

The three fan-shaped light patterns 441B, 441D and 441F overlap with one another, so that a regular triangle figure 443 (an erect regular triangle in FIG. 26) appears on the light shielding plate. Within the area within the regular triangle, reflecting light from the three reflecting concave surfaces are superimposed, so that the luminance in the area is in a medium level, relatively high in luminance level. Three arcuate areas (indicated by broken lines) whose chords are the sides of the regular triangle are in a low luminance level, which is lower than the medium luminance level.

Additionally, in the embodiment, the fan-shaped light patterns 441A to 441F are shown on the projected plane 440 while keeping such a positional relationship among them that the centers of gravity of those figures are substantially coincident with one another. Further, a group of the three reflecting concave surfaces 421A, 421C and 421E and another group of the three reflecting concave surfaces 421B, 421D and 421F are disposed around the axial line Z in a state that those reflecting concave surfaces are angularly spaced at angular spatial intervals of 60°. Therefore, the gravity centers of the figures 442 and 443 are substantially coincident with each other, and are angularly shifted by 60°. Those figures thus positionally related are superimposed one on the other, so that a figure 444, which is a light pattern shaped like a six-aristae star.

As shown, the figure 444 consists of a regular hexagon area and six small triangle areas respectively adjoining the sides of the regular hexagon area. The small triangle areas, like the figure 442 or 443, are in the medium luminance level. The regular hexagon area of the figure 444 is in a high luminance level, which is higher than that of the small triangle areas (medium luminance areas). If the low luminance level of the figure 442 or 443 is 1, the medium luminance level is about 3, and the high luminance level is about 6. In the figure 444, it is difficult to visually perceive the low luminance area with presence of the medium and high luminance areas. Accordingly, the light pattern 444 shaped like a six-aristae star shown in FIG. 26 stands out sharply against the projected plane 440.

The embodiment thus far described have the following effects:

1) The whole light pattern projector may be reduced in size since the light source 410 is a small light source, e.g., an LED, which is small such that it may be regarded as a point light source.

2) Most of light emitted from the light source 410 is reflected by the six reflecting concave surfaces 421A to 421F, and reaches the projected plane 440 without any interruption during its traveling course. That is, light is little interrupted within the light pattern projector, and the light emitted from the light source 410 is certainly radiated outside. In other words, light energy loss by the light interruption is extremely small within the projector, and the external light radiation efficiency is high.

Generally, where the semiconductor light emitting element 412, such as an LED, is used, the small quantity of light emitted by it is frequently problematic. However, in the light pattern projector of the invention, there is less chance that the small light quantity of the LED light source is problematic since the external radiation efficiency is high. In other words, the light pattern projector of the invention is fairly excellent in that it enables a small light source which emits a small quantity of light to be utilized.

3) In the embodiment, the fan-shaped light patterns 441A to 441F that the six reflecting concave surfaces 421A to 421F depict are composed into one composite light pattern 444. It is not easy to estimate in advance a geometrical pattern of the composite light pattern 444 on the basis of the configuration of each of the reflecting concave surfaces and the array of them. At least in this embodiment, it is impossible to ascertain the configuration of each of the reflecting concave surfaces and the array of them by using the light shielding plate 430 which has only small transmission holes 432. For this reason, the viewer cannot estimate in advance a light pattern 444 that the light pattern projector will project on the projected plane 440 when the light source 410 is turned on. The light pattern 444 appearing when the light source 410 is turned comes as a surprise to the viewer, and it is very diverting.

4) In the invention, the fan-shaped light patterns 441A to 441F are composed into one light pattern 444 as mentioned above. Even when each of the fan-shaped light patterns 441A to 441F is low in luminance, the luminance of the composed light pattern 444 is extremely high. Accordingly, blur of the geometrical pattern on the projected plane 440 is lessened satisfactorily. This feature is advantageous for the case utilizing small light source whose emitting light quantity is small. With the use of the composed light pattern, the projector size is reduced, and a limit value of a distance from the projector to the projected plane 440 is increased to be larger than the conventional one (limit value=a maximum value of the distance which allows the viewer to visually perceive the light pattern 444 in a legible degree).

5) The light shielding plate 430 is not a component essential to the projector. However, the light shielding plate, when used, restricts the light rays (deranging light) coming from a place or places other than the light source 410, which proceed to the reflecting concave surfaces of the base 420. As a result, the control of the light rays contributing to the formation of a light pattern is reliable. Further, since the light shielding plate 430 blocks the external light, even when the light pattern projector is installed outdoors, the resin forming the LED and the like is not directly exposed to sunlight all day long. As a result, resin deterioration is impeded, and hence the lifetime of it is increased. Additionally, when a desired pattern is printed on the surface of the light shielding plate 430 in advance, the light shielding plate 430 may be used as a dress plate.

Modifications of the above-mentioned embodiment will be described hereunder.

<Modification 1>

Figure 28A:
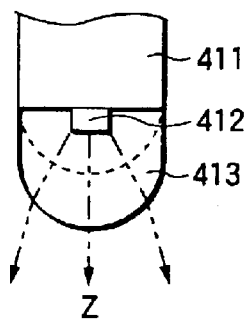
FIG. 28 is a diagram showing a first modification of the light source and a light pattern formed by the light source.

In the above-mentioned embodiment, the transparent resin body 413 forming the LED as the light source 410 takes the form of a half-sphere with the radius R. If required, the half-sphere may be reshaped to be elongated outward (viz., a solid figure whose cross section is ellipsoidal with its major axis being coincident with the axial line Z of the LED) (FIG. 28A). By so doing, when rays of light emitted from the light emitting element 412 proceed outward through the curved surface of the transparent resin body 413, the rays are refracted toward the axial line Z. That is, the transparent resin body 413 serves as a deflection lens for converging light rays in the forward direction (vertically downward direction in the figure) rather than the peripheral direction (horizontal direction in the figure) of the light source 410.

Figure 28B:
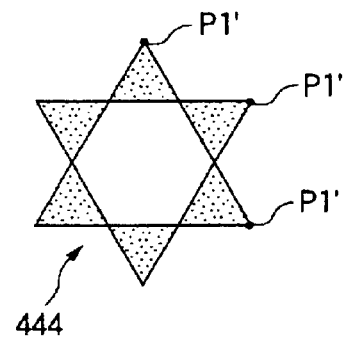

In this case, a quantity of light at the vertex P1 of the reflecting concave surface 421 is increased to be larger than that at the outer edge points P2 defining the outer peripheral arc of the surface. Accordingly, in the light pattern 444 shaped like a six-aristae star, a luminance of each triangle area (shaded by dots in FIG. 28B), which is closer to the vertex P1', is larger than that in the embodiment (FIGS. 23 through 27). This implies that a luminance distribution of the light pattern 444 may be adjusted by varying the configuration of the transparent resin body 413 of the light source 410.

<Modification 2>

Figure 29A:
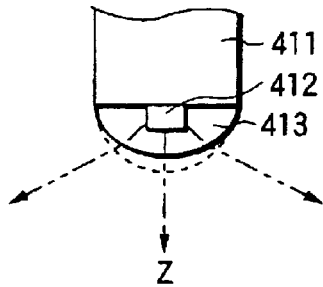
FIG. 29 is a diagram showing a second modification of the light source and a light pattern formed by the light source.
Figure 29B:
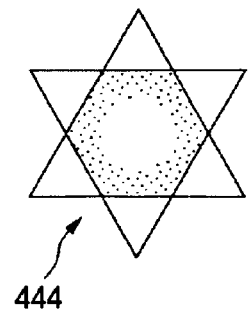

In a modification 2, in contrast with the modification 1, the transparent resin body 413 forming the LED as the light source 410 is reshaped such that, as shown in FIG. 29A, the half-sphere with the radius R (indicated by a dotted line in the figure) is deformed inward (into a solid figure having an elliptical cross section whose major axis is perpendicular to the axial line Z of the LED). By so doing, when rays of light emitted from the light emitting element 412 proceed outward through the curved surface of the transparent resin body 413, the rays are refracted away from the axial line Z. That is, the transparent resin body 413 serves as a deflection lens for converging light rays in the peripheral direction (horizontal direction in the figure) of the light source 410 rather than the forward direction (vertically downward direction in the figure).

In this case, a quantity of light at the outer edge points P2 defining the outer peripheral arc of the surface 421 is increased to be larger than that at the vertex P1 of the reflecting concave surface. Accordingly, in the light pattern 444 shaped like a six-aristae star, a luminance of the hexagonal area (shaded by dots in the figure), which is close to the outer edge points P2', is larger than that in the embodiment (FIGS. 23 through 27). Accordingly, a luminance distribution of the light pattern 444 may be adjusted by varying the configuration of the transparent resin body 413 of the light source 410.

<Modification 3>

In the modification 3, the light source 410 of each of the embodiment (FIGS. 23 through 27) and the modifications 1 and 2 is modified such that the semiconductor light emitting element 412 is used in an uncovered state, viz., it is not covered with the transparent resin serving as a lens. The light emitting element used emits ultraviolet rays. The projected plane 440 is coated with a fluorescent material, e.g., luminous paint. In the modification, the ultraviolet rays emitted from the light emitting element 412 are reflected by the reflecting concave surfaces without any loss of its energy quantity, and are irradiated on the fluorescent material on the projected plane 440. In turn, only those portion on the projected plane which are irradiated with the ultraviolet rays, fluoresce, and a given geometrical pattern sharply stands out against the projected plane.

<Modification 4>

Figure 30A:
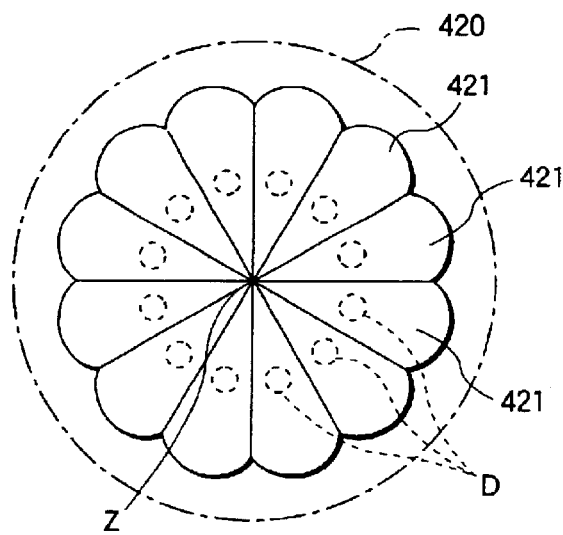
FIG. 30 is a diagram showing a modification of the reflecting concave surfaces and a light pattern formed by the modified reflecting concave surface.
Figure 30B:
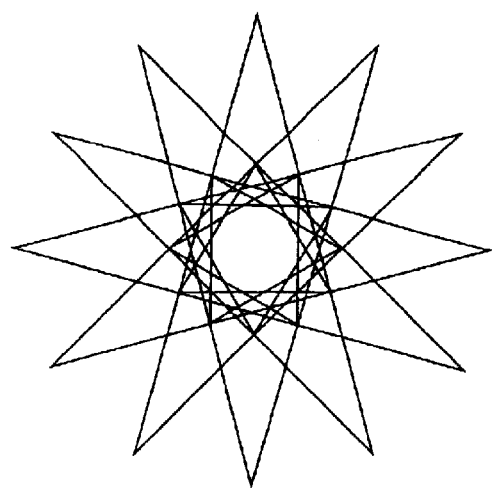

While in the embodiment mentioned above, the number of the reflecting concave surface formed in the base 420 is six, twelve number of reflecting concave surfaces may be formed in the base, as shown in FIG. 30A. In this modification, the reflecting concave surfaces are angularly disposed around the axial line Z at the angular spatial intervals of 30°, and twelve number of converging areas D (indicated by broken lines in the figure) are set in the reflecting concave surfaces 421, respectively. Each reflecting concave surface 421 is configured to be spheroidal as in the above-mentioned embodiment. In the modification where the twelve reflecting concave surfaces 421, as shown in FIG. 30A, are used in place of the six reflecting concave surfaces, a light pattern as shown in FIG. 30B is projected onto the projected plane 440. In the light pattern projected, twelve aristae (or thorns) appear at the vertices of the twelve reflecting concave surfaces 421, respectively. As seen when comparing the illustrations of FIGS. 30A and 30B, also in this case, it is not easy to estimate in advance a geometrical pattern of the composite light pattern on the basis of the configuration of each of the reflecting concave surfaces and the array of them. The light pattern will come as a surprise to the viewer.

<Modification 5>

The light source 410 is not limited to the light source using the semiconductor light emitting element, such as an LED. For example, an incandescent light bulb or a miniature bulb type cold or hot cathode bulb may be used for the light source instead. To obtain a clear light pattern on the projected plane 440 or to avoid the blurring of the outline of the light pattern, it is preferable that the light source is close in shape to a dot. In this sense, the LED will be the best light source of those ones commercially available.

<Modification 6>

As described above, in the embodiment, the six reflecting concave surfaces, which are the same in shape, are equiangularly disposed around the axial line Z. That is, those reflecting concave surfaces are equivalently seen when those surfaces are viewed from the axial line Z (viz., those are axially symmetrically arranged). Within the scope of the invention, there is no need of using a plurality of reflecting concave surfaces which are the same in shape, and further of disposing equiangularly those faces around the axial line Z.

Figure 31:
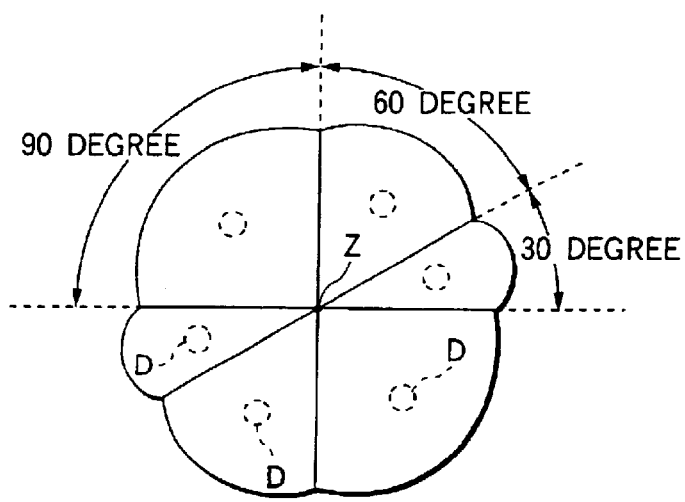
FIG. 31 is a diagram showing another modification of the reflecting concave surfaces and a light pattern formed by the modified reflecting concave surface.

A total of six concave surfaces may be arranged as shown in FIG. 31. Specifically, three types of reflecting concave surfaces whose internal angles are 30°, 60° and 90° at the vertices are used. Three couples of those surfaces are arranged in a state that the reflecting concave surfaces of each couple are opposed with respect to the axial line Z. A light pattern produced by the reflecting concave surfaces thus arranged is a complicated geometrical pattern, not a simple symmetrical pattern.

<Modification 7>

Figure 32:
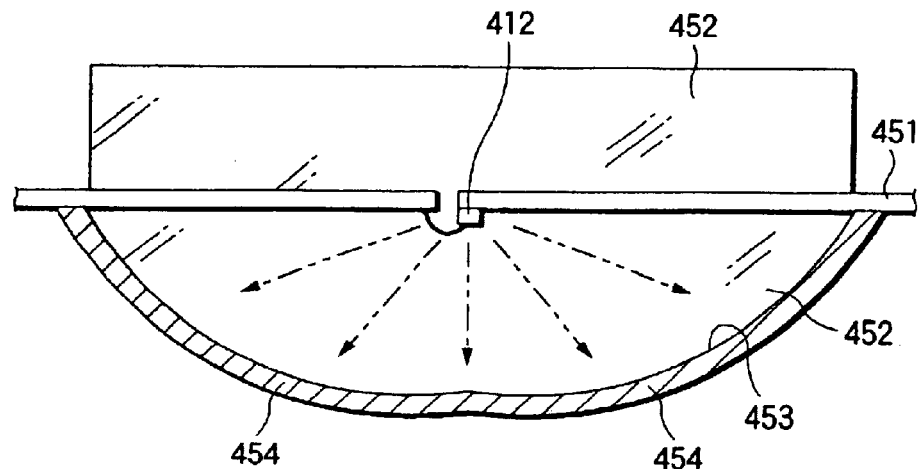
FIG. 32 is a cross sectional view showing a modification of the light pattern projector.

While in the above-mentioned embodiment, the light source 410 and the base 420 are separated, those may be formed in an integral form. Specifically, as shown in FIG. 32, a thin and long lead frame 451 is horizontally extended, and a semiconductor light emitting element 412 is fastened to the center of the lead frame. Current is fed to the light emitting element 412 by use of current feeding wires extended on and along the lead frame. Transparent resin (e.g., transparent epoxy resin) 452 is molded into a large transparent lens body in a state that the lead frame 451 and the light emitting element 412 are encapsulated in the resin.

In this case, the inner wall of a mold (of the shaped type) which is used in molding the transparent resin 452 is configured have concave surfaces corresponding to the plurality of the reflecting concave surfaces 421 already stated. By so doing, after the process of molding the transparent resin is completed, the bottom of the transparent lens body is configured to have a plurality of convex surfaces 453 corresponding to the spheroidal surface of the reflecting concave surfaces 421. Metal (e.g., silver) is deposited over the convex surfaces 453 by physical or chemical vapor deposition process, to form a reflecting film 454 on the convex surface 453. The inner side of the reflecting film 454 serves as reflecting concave surfaces for reflecting light coming from the light emitting element 412. Also in a case where the resin mold product with the reflecting film in FIG. 32 is used in place of the combination of the light source 410 and the base 420 shown in FIG. 24, the useful effects of the above-mentioned embodiment are also produced.

<Modification 8>

Figure 33:
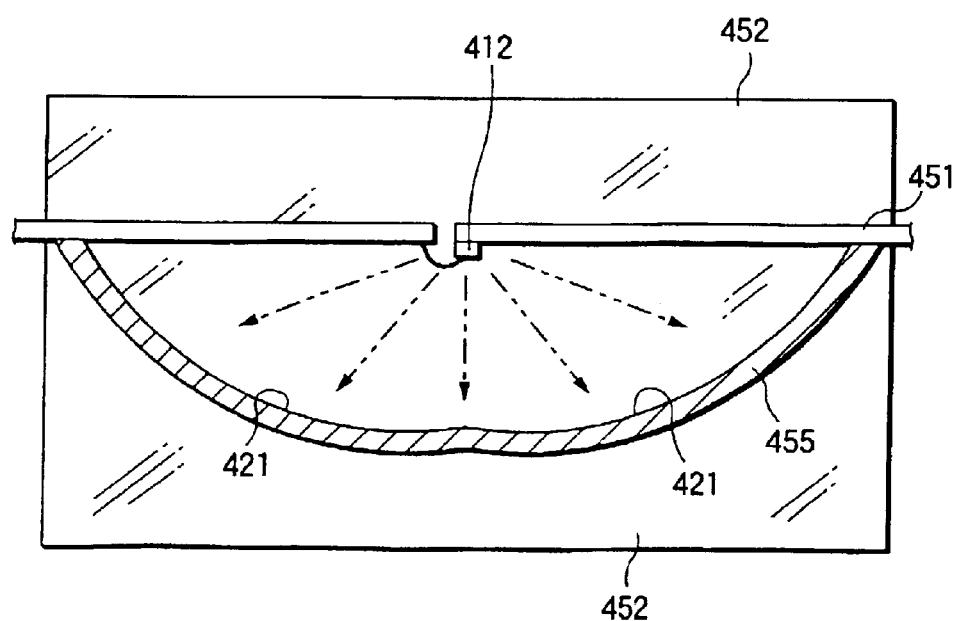
FIG. 33 is a cross sectional view showing another modification of the light pattern projector.

The light source 410 and the base 420 may be formed in an integral form by not using the vapor deposition process of forming the reflecting film 454, which is employed in the modification 7. An example of this is shown in FIG. 33. As shown, a metallic reflecting member 455, shaped like a flat jelly cap, which has a plurality of reflecting concave surfaces 421 formed therein, is prepared in advance. A transparent resin 452 (e.g., transparent epoxy resin) is molded into a resin mold product as shown in FIG. 33 in a state that the metallic reflecting member 455, together with the lead frame 451 and the light emitting element 412, is contained in the transparent resin. Also in a case where the resin mold product is used, the useful effects of the above-mentioned embodiment are also produced.

The transparent resin 452 used in the modifications 7 and 8 may be substituted by a transparent glass material. In other words, the material 452 used in the modifications 7 and 8 may be any insulating, transparent material.

<Modification 9>

In the above-mentioned embodiment, the optical windows are formed by forming the transmission holes 432 in the light shielding plate 430. In this case, the transmission holes 432 may be filled with transparent material.

<Modification 10>

In the above-mentioned embodiment and modifications, the concave surfaces of the reflecting concave surfaces are smooth and continuous. However, it is not essential that each surface is smooth so long as the surface is capable of converging rays of light on a specific converging area D. A great number of minute planar surfaces which are minutely slanted may be arrayed to as to form reflecting concave surfaces optically equivalent to those mentioned above. It should be understood that such reflecting concave surfaces fall within the meaning of "reflecting concave surfaces" used in the present specification.

<Modification 11>

In the above-mentioned embodiment and modifications, the light pattern projector projects light onto the projected plane 440 to form a light pattern thereon. If required, the light pattern projector projects light onto the projected plane 440, through a medium (such a gaseous body as air, such a liquid body as water, or the like) in which fine particles (e.g., smoke, fine floating particles or the like) float therein. As a result, a figure of light contours stand out against the projected plane. If the light pattern projector of each of the above-mentioned embodiment and modifications is viewed from the projected plane 440 side, it may be used as a light source of a signal or the like.

Further features of the technical ideas on which present the above-mentioned embodiment and modifications are typically given below.

The light emitting surface of the light source may be located within the concave portion (specifically, within a jelly cup) consisting of the plurality of the reflecting concave surfaces, which are formed in the reflecting member.

The light source and the reflecting member may be formed in a unit form.

As seen from the foregoing description, the light emitting device of the invention, a quantity of light emitted from a light source may effectively be utilized.

Further, the invention reduces the device size while keeping a definition of a light pattern shown on the virtual plane. When the viewer views a light pattern projected on a virtual plane, it is difficult for the viewer to estimate the light pattern. The projected light pattern comes as a surprise to the viewer.

The cross section of light beam may be configured to have geometrical symmetry and regularity. Such a light beam, when visualized, presents a beautiful geometrical pattern.

Next, some embodiments of the present invention in which the invention is implemented into projection units will be described with reference to the accompanying drawings.

FIGS. 34 through 38 show a 12th embodiment of the invention.

Figure 34A:
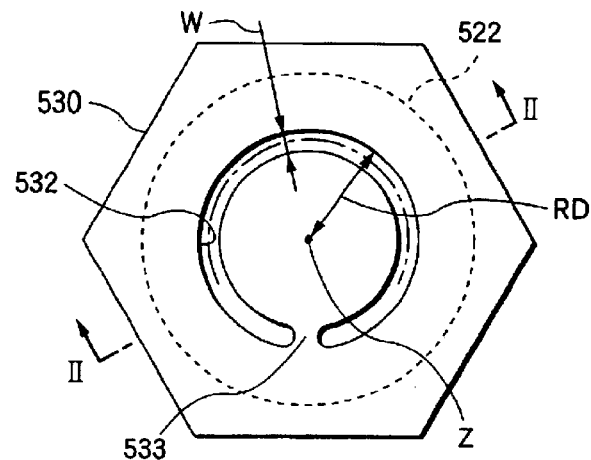
FIG. 34A is a plan view showing a light shielding plate used in a projection unit which constitutes a 12th embodiment of the invention.
Figure 34B:
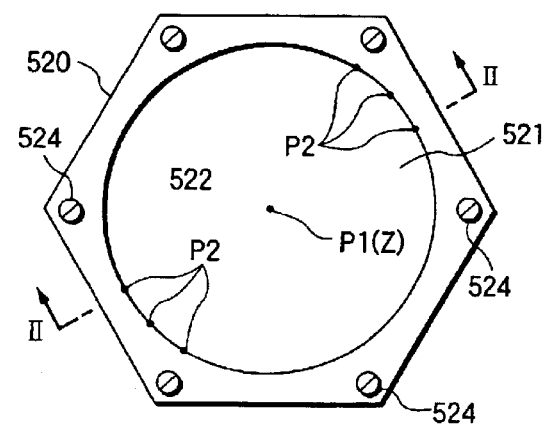
FIG. 34B is a plan view showing a base used in the FIG. 34A projection unit.
Figure 35:
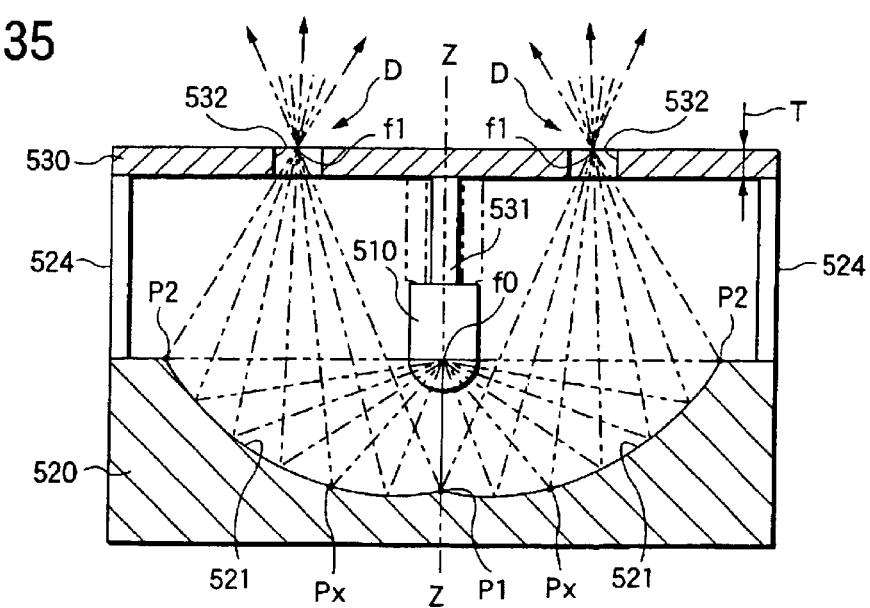
FIG. 35 is a cross sectional view taken along line II—II in FIGS. 34A and 34B.
Figure 36:
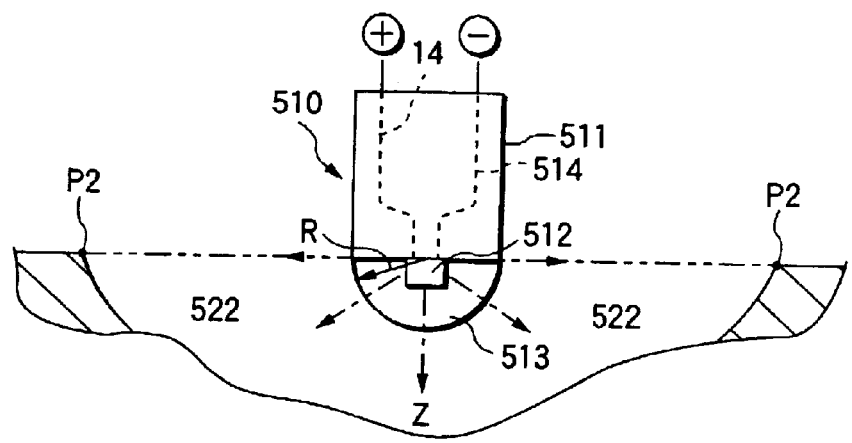
FIG. 36 is a view showing a light source.

As shown in FIGS. 34 and 35, the projection unit is made up of a light source 510 located on the axial line Z of the projection unit as one axial line, a base 520 located on the front side (the lower side in FIG. 35) of the axial line Z, and a light shielding plate 530 as a front member located on the rear side (the upper side in FIG. 35) of the axial line Z.

As shown in FIGS. 34A and 34B, the base 520 and the light shielding plate 530 are hexagonal when viewed in plan view, and the areas of them are substantially equal to each other. The base 520 and the light shielding plate 530 are coupled with each other by means of six support poles 524, which stand erect at six corresponding corners of those hexagonal members, while being spaced from each other in the axial line Z direction of the projection unit by a predetermined distance. The light source 510 is held such that its light emitting face is located at a mid-position between the base 520 and the light shielding plate 530 by means of a support bar 531 extending from the center of the light shielding plate 530 in the axial direction.

As shown in FIGS. 34B and 35, a reflecting concave surface 521 is formed in the upper surface (opposed to the light source) of the base 520, while surrounding the axial line Z. The reflecting concave surface 521 is a metallic luster surface, which is formed in a manner that a metallic surface is mirror finished or a metal film is formed by physical or chemical vapor deposition. The reflecting concave surface 521 is configured so as to have a solid angle of about $2\pi$ (strad) with respect to the light source 510.

The reflecting concave surface 521 takes a three dimensional form (curved surface), which is developed when an elliptical arc of which a first focal point f0 is the center of the light source 510 in a cross section as viewed in one radial direction of the axial line Z and second focal points f1 are points on the converging areas D shaped like an annular area existing in the cross section, is revolved about the axial line Z. In other words, a field of sets of reflecting curves around the axial line Z, the reflecting curves ranging from a center point P1 of the reflecting concave surface 521 on the axial line Z to outer edge points P2, forms one three dimensional reflecting concave surface 521.

As shown in FIG. 35, the light source 510 is disposed such that its front light emitting face is within a concave portion 522 whose inner wall is defined by the reflecting concave surface 521. In the embodiment, the light source 510 is a lens-type light emitting diode (LED). As best illustrated, the light source 510 is made up of a cylindrical support 511, a semiconductor light emitting element 512 fastened to the underside (front face) of the cylindrical support 511, and a transparent resin body 513 shaped like a half-sphere with the radius R, which encapsulates the light emitting element 512. The light emitting element 512 receives current from exterior through current feed wires 514 (indicated by broken lines) within the support 511. The transparent resin body 513 covers the entire exposed surface of the light emitting element 512 to isolate it from its contact with air and to support the underside of the cylindrical support 511.

In the embodiment, the light emitting element 512 is located at the center of a perfect half-spherical body, and light rays emitted from the light emitting element 512 are incident on the surface of the half-spherical body at right angles. Therefore, the light is not refracted where it is radiated outside from the half-spherical surface. The rays of light emitted from the light emitting element 512 are emitted therefrom outward in every radial direction. The spherical transparent resin body 513 that is formed protruding downward from the lower end of the cylindrical support 511 is located completely within the concave portion 523. Accordingly, most of light emitted from the light emitting element 512 reaches the reflecting concave surface 521 and are reflected by the same.

As described above, the reflecting concave surface 521 takes a three dimensional configuration, which is developed when an elliptical arc of which a first focal point f0 is the center of the light source 510 in a cross section as viewed in one radial direction of the axial line Z and second focal points f1 are points on the converging areas D, is revolved about the axial line Z. Accordingly, as shown in FIG. 35, reflecting light from the reflecting concave surface 521 is converged on the converging area D shaped like an annular ring even if it is reflected at a reflecting point Px on the reflecting curve ranging from the center point P1 to the outer edge point P2.

As shown in FIGS. 34A and 35, an optical opening (aperture) 532 is formed in the light shielding plate 530, while passing therethrough. The optical opening 532 of the width W is formed along an arc (radius Rd) depicted around the axial line Z. The radius, which is used as a reference in forming the optical opening 532, is equal to the radius Rd of the annular converging area D. A height (separating length) of the light shielding plate 530 relative to the base 520 is selected such that the annular converging area D is within the optical opening 532. That is, the optical opening 532 is selected so that it and the annular converging area D substantially overlap.

A cross sectional area (as viewed in the radial direction) of the optical opening 532 (with the width W), which is formed in the light shielding plate 530 (having a thickness T) shown in FIGS. 34 and 35, is sufficiently larger than the cross sectional area (approximately zero) of the annular converging area D as viewed in the radial direction. The light converged on the annular converging area D is projected outside while diverging without any interruption of it by the inner wall or the like of the optical opening 532. To make the best use of the function (to be described later) of the light shielding plate 530, the width W of the optical opening 532 is selected preferably to be as narrow as possible unless the narrowness interrupts the light projection to exterior.

The annular optical opening 532 is not perfect in its annularity. That is, the optical opening 532 includes a coupling part 533 which couples a portion of the light shielding plate which is located on the inner side of the optical opening 532 with another portion of the shielding plate which is located on the outer side of the optical opening. The coupling part 533 serves as a support member for supporting the inner portion of the light shielding plate on the outer portion thereof. The rear side of the coupling part 533 provides a wire path for the current feed wires 514 for electrically connecting the light source 510 to the power supply. Both sides of the light shielding plate 530 are coated black. Therefore, light incident on those black sides of the light shielding plate 530 is absorbed there or greatly attenuated and scatter reflected thereon.

Figure 37:
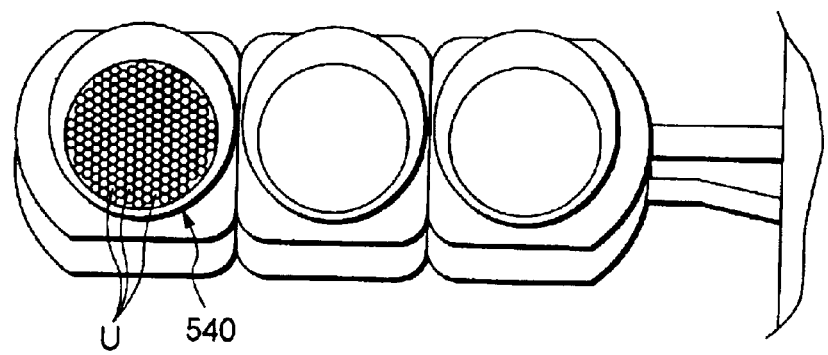
FIG. 37 is a front view showing a signal.
Figure 38:
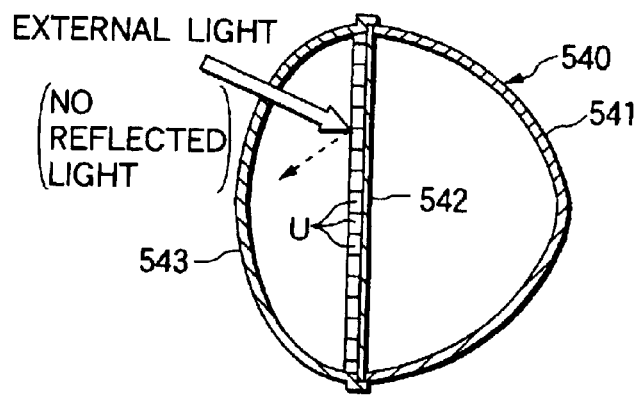
FIG. 38 is a cross sectional view showing a signal light to be assembled into a signal.

The projection unit thus constructed is utilized for a signal consisting of three signal lights combined, as shown in FIG. 37. As shown in FIGS. 37 and 38, each signal light 540 is made up of a cup-like base 541, a flat support plate 542 which is vertically disposed on the front of the base, and a transparent cover lens 543, arcuate in cross section, which is provided in front of the base for the protection against weather. A number of projection units U are arrayed in the flat support plate 542. Those projection units U are arrayed such that the side walls of the adjacent projection units U, each shaped like a hexagonal prism, adjoin each other (FIG. 37). The front side of the support plate 542 is filled with a great number of the projection units U with no gaps there among. The surface (black) of the light shielding plate 530 of each projection unit U is confronted with the transparent cover lens 543, as a matter of course.

In an on state of the signal light 540, most of light that is emitted from the light emitting element 512 upon current feeding to the projection units U is received by the reflecting concave surface 521. The light reflected by the reflecting concave surface 521 is converged on the annular converging area D, which is set within the optical opening 532 of the light shielding plate 530. The light that is converged on the converging area D passes therethrough at high efficiency, and is projected outside while diverging in the direction along each optical path. At this time, the whole arcuate optical opening 532 which is provided in the reflecting mirror 30 in each projection unit U is bright in the form of a stripe of color light emitted from the light emitting element 512. When the signal light 540 is observed from a position sufficiently distanced from it, the whole cover lens 543 is seen as a circle of the same light color as the color of light emitted from the light emitting element 512, the light intensity of the circle being uniform over its entire area.

In an off state of the signal light 540, the signal light is seen not emitting light, as a matter of course. Further, the whole of the cover lens 543 is seen distinctly black. The reason for this is that external light passes through the cover lens 543 and is irradiated on the surface of each of the projection units U, but most of the external light is absorbed or attenuated by the black light shielding plate 530.

Even if part of the external light which has passed through the cover lens 543 passes through the optical opening 532 of the light shielding plate 530 and is incident on the reflecting concave surface 521 in each projection unit U, the incident light is reflected thereon toward the light source 510, and further scatter reflected thereon. Most of the incident light progressively repeats its reflection within the projection unit U and reaches the reverse side, colored black, of the light shielding plate 530 where it is absorbed or greatly attenuated. There is extremely less chance that external light having entered the projection unit U goes out of the projection unit U through the optical opening 532, while keeping its energy when it entered there. In the signal light 540 of the embodiment, dark noise is not actualized even in its off-state. Accordingly, a contrast of the signal light between the on- and off-states is high. In this sense, the black colored reverse side of the light shielding plate 530 constitutes a light attenuating means which absorbs or greatly attenuates and scatter reflects light.

The 12th embodiment has the following effects.
1) With the disposing of the light source 510 and the configuration of the reflecting concave surface 521, most of light emitted from the light source 510 is received and reflected by the reflecting concave surface 521. The reflecting light, while little interrupted, is projected outside through the converging area D and the optical opening 532. Thus, most of the light emitted from the light source 510 is effectively utilized and hence the external radiation efficiency is extremely high. Particularly, the reflecting concave surface 521 is configured so as to have a solid angle of 2 π (strad) with respect to the light source 510. Accordingly, the external radiation efficiency is maximized while securing an optical accuracy and a freedom in configuring the whole projection unit U.

Generally, where the semiconductor light emitting element 512, such as an LED, is used, the small quantity of light emitted by it is frequently problematic. In this connection, the external radiation efficiency of the projection unit U is extremely high or high enough to compensate for the light quantity being small. Further, the number of required light emitting elements 512 may be reduced.
2) The projection units U, in an on-state, secures high external radiation efficiency, and the whole arcuate optical opening 532 of the light shielding plate 530 is bright in the form of a stripe of light. Therefore, the number of the light emitting element 512 used (mounting number of density) may be reduced, and if so done, an apparent light emitting area may be increased. Accordingly, when the signal light 540 is seen at a position sufficiently distanced from it, there is no case that the individual projection units U are seen in the form of separate light spots, but one sees the signal light as if its whole display surface is bright. The display surface consists of a great number of arcuate unit patterns. When the display surface is seen at a position distanced from it by about 10 m, the display surface is accented by brightness, so that its visibility is increased when comparing with the display surface being uniformly bright. Therefore, the display surface using the projection units U is attractive.

The number of the light emitting element 512 used (or mounting number of density) is small. In the signal light 540 using a great number of projection units U, accumulation of heat within the signal light is avoided, thereby preventing the output and the lifetime of the individual light emitting elements from being reduced.
3) The reflecting concave surface 521 is formed in the base 520, and its surface is covered with the light shielding plate 530. Accordingly, the reflecting concave surface 521 is not bared to the outside of the projection unit U, and hence there is no chance that the reflecting concave surface 521 is accidentally broken. During the process of manufacturing the projection unit U or in other situations, stress that cannot be estimated is not generated in the reflecting concave surface 521. As a result, the high optical performances of the reflecting concave surface 521 can be maintained.
4) Although each projection unit U forming the signal light 540 contains the reflecting concave surface 521, the reflecting concave surface 521 is configured and both sides of the light shielding plate 530 are colored black as described above. Accordingly, a contrast of the projection unit U between its on- and off-states is improved, and the dark noise may be suppressed or reduced effectively.
5) The light source 510 is located on the rear side of the light shielding plate 530, which is on the front of the projection unit U. Accordingly, the light source 510 is not exposed to sunlight, so that the transparent resin body 513 forming the light source 510 is impeded in its deterioration progress, and a long lifetime of the light source 510 is ensured.

Figure 39A:
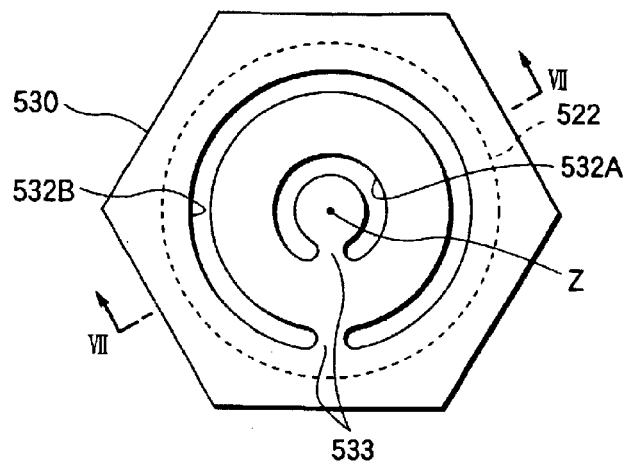
FIG. 39A is a plan view showing a light shielding plate used in a projection unit which constitutes a 13th embodiment of the invention.

In the 12th embodiment, one reflecting concave surface 521 is formed in the base 520 as the reflecting member, and one arcuate optical opening 532 is correspondingly formed in the light shielding plate 530. However, in the invention, it is not essential hat each of those components is the single circular one. If required, each of those may be configured in a multi-ring form with respect to the axial line Z. This technical idea may be implemented into a 13th embodiment shown in FIGS. 39 and 40. The 13th embodiment will be described placing emphasis on the portions different from the 12th embodiment, for simplicity. Therefore, it may be understood that those portions that will not be mentioned are substantially the same as the corresponding portions in the 12th embodiment.

Figure 39B:
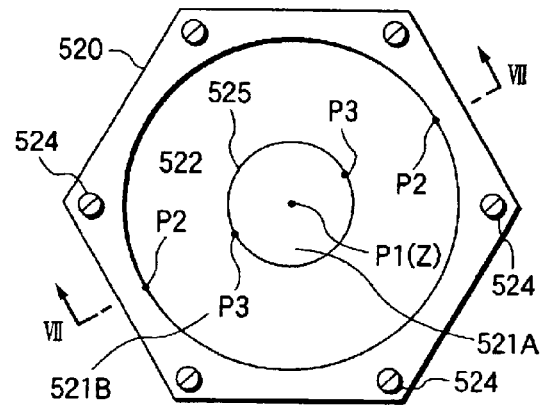
FIG. 39B is a plan view showing a base used in the 13th embodiment.
Figure 40:
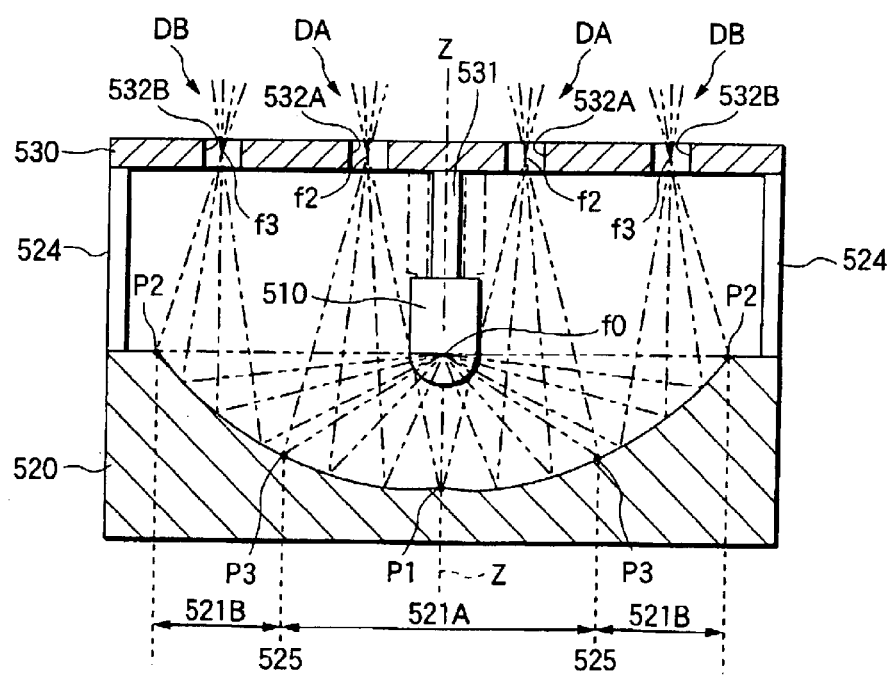
FIG. 40 is a cross sectional view taken along line VII—VII in FIGS. 39A and 39B.

As shown in FIGS. 39B and 40, an edge line 525 is annularly present between the center point P1 of the reflecting concave surface of the base 520 and a circular outer edge of the reflecting concave surface (a continuous field of sets of outer edge points P2). The reflecting concave surface contains an inner reflecting concave surface 521A and an outer reflecting concave surface 521B, which are continuous to each other while being demarcated by the edge line 525. The inner reflecting concave surface 521A is located within the edge line 525 and the outer reflecting concave surface 521B is outside the edge line.

The vertices forming the edge line 525 will be referred to as an edge point P3. The inner reflecting concave surface 521A takes a three dimensional form (curved surface), which is developed when an elliptical arc of which a first focal point f0 is the center point of the light source 510 between the center point P1 and the edge point P3 in a cross section as viewed in the radial direction and third focal points f2 are points on the inner converging areas DA as annular areas existing in the cross section, is revolved about the axial line. The outer reflecting concave surface 521B takes a three dimensional form (curved surface), which is developed when an elliptical arc of which a first focal point f0 is the center of the light source 510 between the edge point P3 and the outer edge points P2 in a cross section as viewed in the radial direction and fourth focal points f3 are points on the outer converging areas DB as annular areas existing in the cross section, is revolved about the axial line. When the two reflecting concave surfaces 521A and 521B are combined, the resultant one has a solid angle $2\pi$ (strad) with respect to the light source 510.

Of light emitted from the light source 510, the light having reached the inner reflecting concave surface 521A is reflected by the inner reflecting concave surface 521A itself, and converged on the annular inner converging areas DA. The light is then radiated outside through an optical opening 532A, which is formed passing through the light shielding plate 530 while corresponding to the inner converging areas DA. Of light emitted from the light source 510, the light having reached the outer reflecting concave surface 521B is reflected by the outer reflecting concave surface 521B itself, and converged on the annular outer converging areas DB. The light is then radiated outside through an optical opening 532B, which is formed passing through the light shielding plate 530 while corresponding to the outer converging areas DB.

Thus, most of light emitted from the light source 510 is received by the inner reflecting concave surface 521A or the outer reflecting concave surface 521B. The received light is then converged on the inner converging areas DA or the outer converging areas DB, and radiated outside through the optical opening 532A or the optical opening 532B. Therefore, when the projection unit is in an on-state, the double arcuate optical openings 532A and a 53B, which are formed in the light shielding plate 530, are bright as a whole in the form of double stripes of the color light whose color is the same as of the light emitted from the light emitting element 512. The 13th embodiment is improved over the 12th embodiment in preventing such an undesired situation that when the optical opening 532B is increased in diameter, the annular pattern is seen as if the center of it is removed.

In case where the projection unit of the 13th embodiment is applied to the signal light 540 as shown in FIGS. 37 and 38, the display surface is kept attractive even when a light emitting element 512 capable of emitting a large amount of light is used and an area occupied by one light source 510 is increased to be large. Other construction, features and effects of the 13th embodiment is substantially the same as of the 12th embodiment.

The above-mentioned embodiments may be modified as described hereunder.

<Modification 1>

Figure 41A:
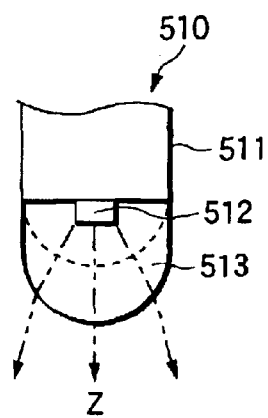
FIG. 41 is a diagram showing two modifications of the projection unit.

In the 12th and 13th embodiments, the transparent resin body 513 forming the light source 510 is shaped to be half-spherical with the radius R. If required, the half-sphere may be reshaped to be elongated outward (viz., a solid figure whose cross section is ellipsoidal with its major axis being coincident with the axial line Z of the LED) (FIG. 41A). By so doing, when rays of light emitted from the light emitting element 512 proceed outward through the curved surface of the transparent resin body 513, the rays are refracted toward the axial line Z. That is, the transparent resin body 513 serves as a deflection lens for converging light rays in the forward direction (vertically downward direction in the figure) rather than the peripheral direction (horizontal direction in the figure) of the light source 510.

When the lens-type LED light source is applied to the 12th embodiment, a quantity of light in an area closer to the center point P1 than the outer edge points P2 increases. When it is applied to the 13th embodiment, a quantity of light per unit area for the inner reflecting concave surface 521A rather than the outer reflecting concave surface 521B increases.

<Modification 2>

Figure 41B:
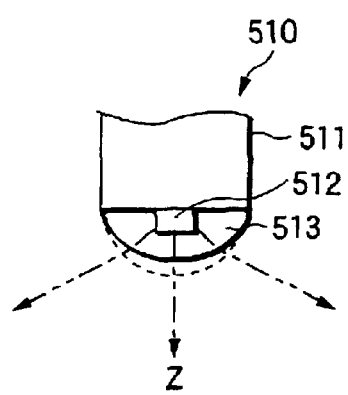

In a modification 2, in contrast with the modification 1, the transparent resin body 513 forming the LED as the light source 510 is reshaped such that, as shown in FIG. 41B, the half-sphere with the radius R (indicated by a dotted line in the figure) is deformed inward (into a solid figure having an elliptical cross section whose major axis is perpendicular to the axial line Z of the LED). By so doing, when rays of light emitted from the light emitting element 512 proceed outward through the curved surface of the transparent resin body 513, the rays are refracted away from the axial line Z. That is, the transparent resin body 513 serves as a deflection lens for converging light rays in the peripheral direction (horizontal direction in the figure) of the light source 510 rather than the forward direction (vertically downward direction in the figure).

When the lens-type LED light source is applied to the 12th embodiment, a quantity of light in an area closer to the outer edge points P2 than the center point P1 increases. When it is applied to the 13th embodiment, a quantity of light per unit area for the outer reflecting concave surface 521B rather than the inner reflecting concave surface 521A increases.

<Modification 3>

Figure 42:
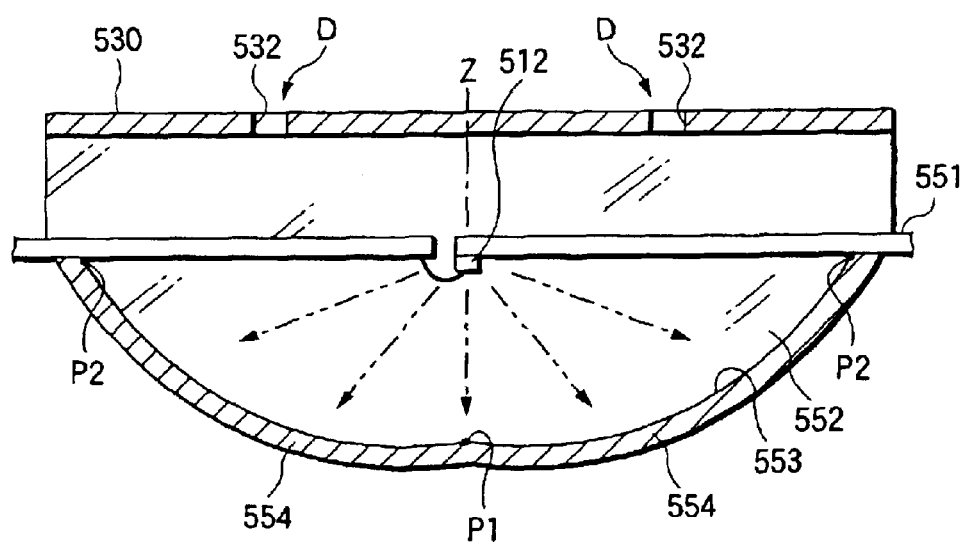
FIG. 42 is across sectional view showing to a modification of the projection unit.

While in the 12th embodiment, the light source 510 and the base 520 are separated, those may be formed in an integral form. Specifically, as shown in FIG. 42, a thin and long lead frame 551 is horizontally extended, and a semiconductor light emitting element 512 is fastened to the center of the lead frame. Current is fed to the light emitting element 512 by use of current feeding wires extended on and along the lead frame. The lead frame 551 having the light emitting element 512 mounted thereon is encapsulated with a transparent resin 552.(e.g., epoxy resin).

In this case, the inner wall of a mold (of the shaped type), which is used in encapsulating the lead frame with the transparent resin 552, is configured have concave surfaces corresponding to the reflecting concave surface 521. By so doing, after the encapsulating process is completed, the bottom of the transparent lens body is configured to have a convex surface 553 corresponding to the reflecting concave surface 521. Metal (e.g., silver) is deposited over the convex surface 553 by physical or chemical vapor deposition process, to form a reflecting film 554 on the convex surface. The inner side of the reflecting film 554 serves as reflecting concave surfaces for reflecting light coming from the light emitting element 512. A light shielding plate 530, which is opposed to the reflecting film 554, is attached to the upper side of the resin mold product, a projection unit of one unit is completed. The projection unit has the effect similar to that of the 12th embodiment. This technical idea may be applied to the multi-ring arrangement of the 13th embodiment.

<Modification 4>

Figure 43:
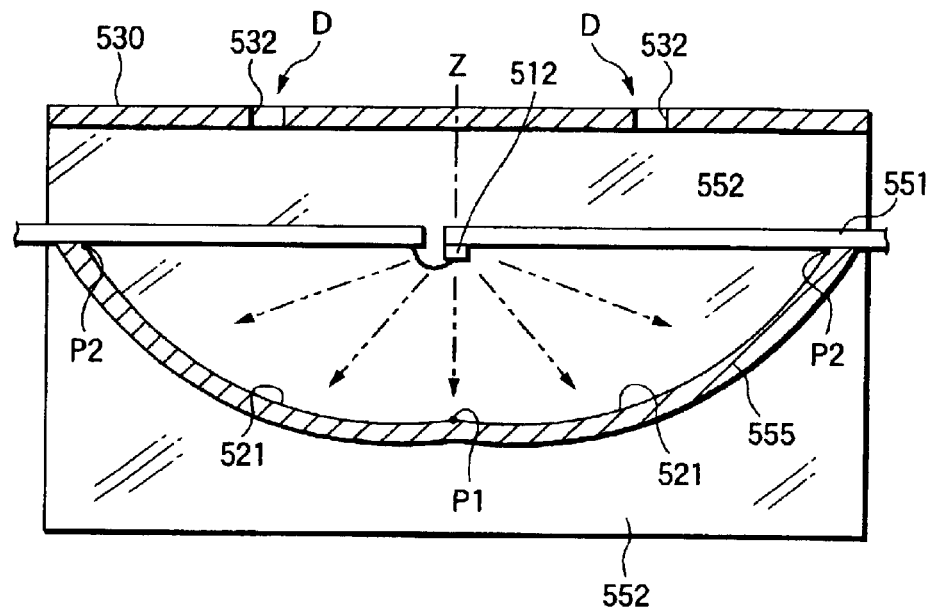
FIG. 43 is a cross sectional view showing another modification of the projection unit.
Figure 44:
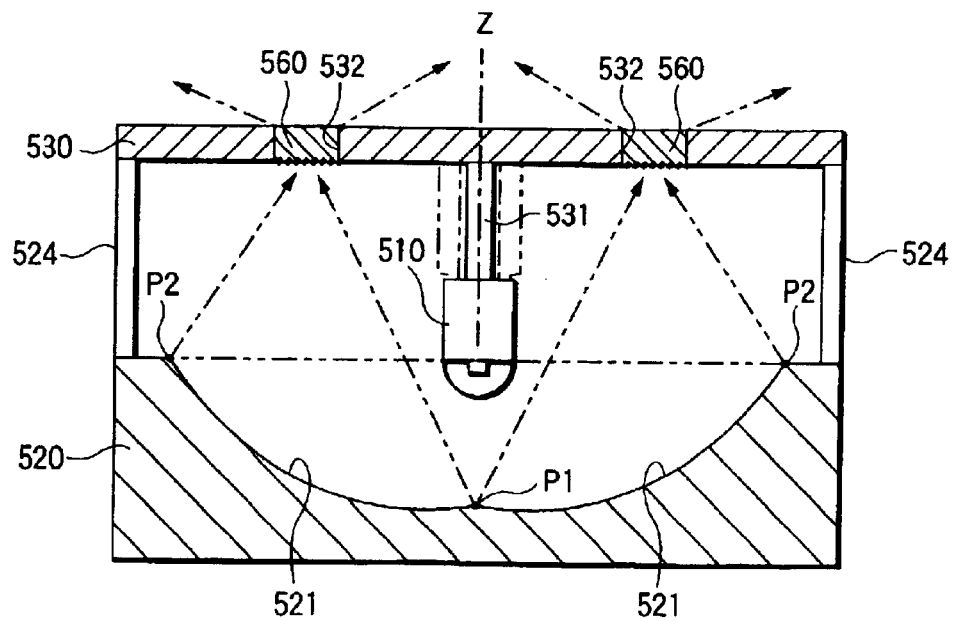
FIG. 44 is a cross sectional view showing yet another modification of the projection unit.
Figure 45:
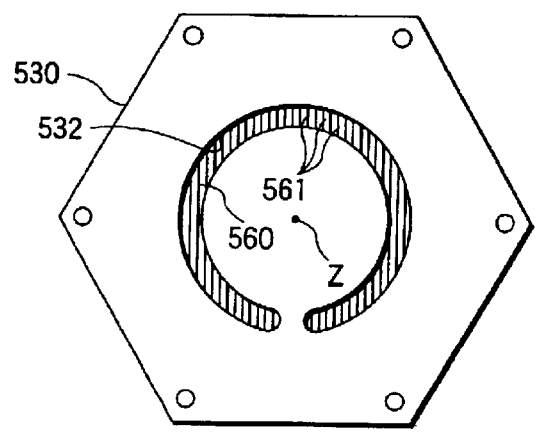
FIG. 45 is a view showing the reverse side (bottom) of a light shielding plate in the FIG. 44 modification.

The light source and the base maybe formed in an integral form by not using the vapor deposition process of forming the reflecting film 554, which is employed in the modification 3. An example of this is shown in FIG. 43. As shown, a metallic reflecting member 555, shaped like a flat jelly cap, which has an annular reflecting concave surface 521 formed therein, is prepared in advance. The metallic reflecting member 555 and a lead frame 551 with a light emitting element 512 mounted thereon are encapsulated with transparent resin 552 (e.g., transparent epoxy resin), whereby a resin mold product as shown in FIG. 43 may be formed at a stroke. Then, a light shielding plate 530, which is opposed to the reflecting film 554, is attached to the upper side of the resin mold product, a projection unit of one unit is completed. The projection unit has the effect similar to that of the 12th embodiment. This technical idea may be applied to the multi-ring arrangement of the 13th embodiment.

The transparent resin 552 used in the modifications 3 and 4 may be substituted by a transparent glass material. In other words, the material 552 used in the modifications 3 and 4 may be any insulating, transparent material.

While in the modifications 3 and 4, the light shielding plate 530 is attached to the upper side of the resin mold product, a depression or concave portion may be formed in the corresponding location during the molding process. After the molding process, black fluid is poured into the depression or concave portion, and hardened, whereby a member corresponding to the light shielding plate 530 may be formed in an ex post facto manner.

<Modification 5>

In the above-mentioned embodiment and modifications, the concave surfaces of the reflecting concave surfaces are smooth and continuous. However, it is not essential that each surface is smooth so long as the surface is capable of converging rays of light on a specific converging area D, DA or DB. A great number of minute planar surfaces which are minutely slanted maybe arrayed to as to form reflecting concave surface optically equivalent to those reflecting concave surface 521, 521A or 521B. It should be understood that such reflecting concave surface fall within the meaning of "reflecting concave surface" used in the present specification.

<Modification 6>

In the above-mentioned embodiment and modifications, the reflecting concave surfaces 521, 521A and 521B are each configured to have a solid angle of about 2 π as a whole with respect to the light source 510. If required, those concave reflecting concave surfaces 521, 521A and 521B may be each configured to have a solid angle of about 1 π to 2.5 π (strad), as a whole with respect to the light source 510, more preferably 1.5 π to 2.35 π (strad).

By so selected, when the projection unit is applied to the signal light, light emitted from the light emitting element may be received by the reflecting concave surface 521, 521A or 521B at a larger solid angle, when comparing with a case where the lens-type LED is used and light is directly radiated out-side. Therefore, the external radiation efficiency in the projection unit may be maintained more reliably and at high level.

If the solid angle of the concave reflecting concave surface 521, 521A or 521B is 1.5 π (strad) or larger with respect to the light source 510, most of the light emitted from the light source 510 is received and controlled. Where the solid angle is excessively large, a freedom of optical control and configuring the whole projection unit is reduced in level. In this respect, it is preferable to set the solid angle at 2.5 π (strad) or smaller.

<Modification 7>

In the embodiments and modifications, the reflecting concave surfaces 521, 521A and 521B, and the convex surface 553 are each formed along an elliptical surface developed when an elliptical arc of which the focal points are the light source 510 and the converging area D, DA or DB is revolved about the axial line Z. If required, the reflecting concave surfaces 521, 521A and 521B, and the convex surface 553 may be formed along a spherical surface developed when an arc resembling in shape the elliptical arc is revolved about the axial line Z. In this case, the width of the converging area D, DA or DB is wider than that in the case where the reflecting concave surfaces 521, 521A and 521B, and the convex surface 553 are each formed along the elliptical surface; however, the reflecting concave surfaces 521, 521A and 521B, and the convex surface 553 are simple in configuration. This makes it easy to manufacture the projection unit U.

For the reflecting concave surfaces 521, 521A and 521B, and the convex surface 553, any curved surface may be used if it is developed by a curve resembling the elliptical arc about the axial line Z. Those concave and convex surfaces may be each formed along a curved surface, which is developed by revolving about the axial line Z a curve resembling the elliptical arc, such as an elliptical line, cycloidal line, or a spiral line.

<Modification 8>

In the 12th and 13th embodiments, the light source 510 may be a bared chip (light emitting element 512), viz., not encapsulated with the transparent resin body 513.

<Modification 9>

In the 12th and 13th embodiments, the optical openings 532, 532A and 532B are formed passing through the light shielding plate 530. If required, those openings may be filled with transparent glass or resin. By so doing, the projection unit U has dust and water proof functions. When it is applied to the signal light 540, the cover lens 543 may be omitted.

<Modification 10>

Figure 46:
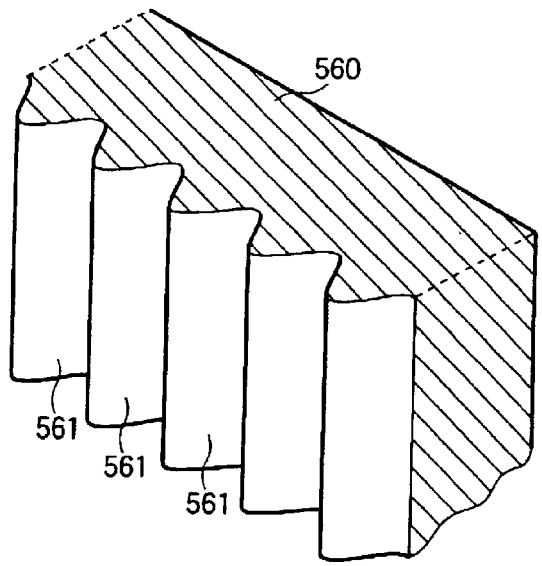
FIG. 46 is a perspective view showing a prism portion in the FIG. 44 modification.

In this modification, the optical opening 532 of the light shielding plate 530 in the projection unit constructed according to the 12th embodiment is filled with transparent material 560 (e.g., glass, transparent epoxy resin or the like) A plurality of grooves 561 extending in a specific direction are formed in the rear side (opposed to the reflecting concave surface 521) of the transparent material 560. As enlargedly and perspectively shown in FIG. 46, those grooves 561 extend parallel to one another and are each shaped like V.

As a result, the reverse side of the transparent material 560 is corrugated as if a plurality of prisms are formed thereon. The prism portion is useful in controlling a distribution of light rays when the reflecting light from the reflecting concave surface 521 is projected outside. Specifically, light coming from the reflecting concave surface 521 is refracted mainly by planes of the prism portion, which are substantially perpendicular to the grooves 561. Light radiated in the direction substantially perpendicular to the grooves 561 is more diverged than in the extending direction of the grooves 561, and radiated outside from the optical opening 532.

Thus, the distribution of light projected outside may be controlled by forming the grooves 561 in the reverse side of the transparent material 560. Thus, the transparent material 560 severs as a role of an optical member to optically control the light. Accordingly, a field angle of the projection unit may be adjusted as desired. This technical idea may be applied to the 13th embodiment.

<Modification 11>

Figure 47:
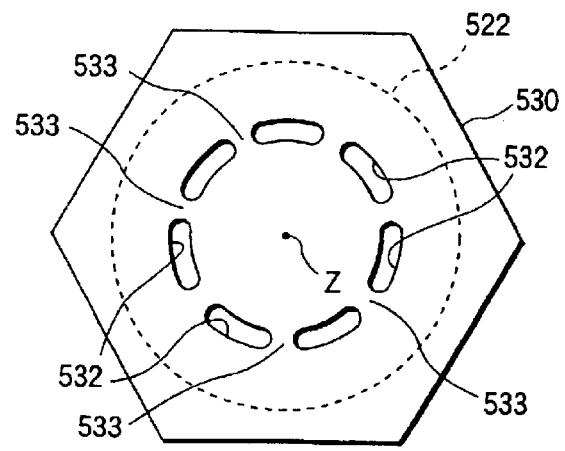
FIG. 47 is a plan view showing an additional modification of the projection unit.

In the embodiments and modifications, the annular optical opening 532 of the light shielding plate 530 is not perfect in its annularity since it includes the coupling part 533 located at the converging area D. If required, the optical opening 532 may be divided into a plurality of segments, annularly arrayed, which are separated by a plurality of coupling parts 533, as shown in FIG. 47. Where such divided optical opening 532 is used, a slight amount of light loss occurs, but the display surface looks nice and its visibility is improved.

<Modification 12>

In the embodiments and modifications, the light shielding plate 530 is colored black. Any other color may be used in place of black color, if it interrupts external light directed to the reflecting concave surface 521, 521A and 521B.

<Modification 13>

The embodiments and modifications may be each modified such that the light shielding plate 530 is omitted. In this case, the dark noise reduction based on the external light shielding effect is lessened, but the external radiation efficiency is increased and an apparent light emitting area is increased. Further, the display surface is accented by brightness, so that its visibility is increased when comparing with the display surface being uniformly bright. Therefore, the projection unit U of this modification is suitable for the display in a place free from external light, viz., indoor or half-indoor use.

The technical ideas contained in the above-mentioned embodiments and modifications are typically given below.

A cross sectional area at the annular converging area through which light passes is reduced to be smaller than the total area of the reflecting surface.

The light emitting element and the reflecting surface maybe formed in a unitary form by use of electrically insulating, transparent material.

A prism portion for controlling a distribution of passing light may be provided at or near the optical opening of the light shielding plate.

A light attenuating means which absorbs or greatly attenuates and scatter reflects light may be provided on the reverse side of the front member opposed to the reflecting surface.

A concave portion defining the inner wall of the reflecting surface may be formed in the reflecting member. The light emitting element is located within the concave portion.

A plurality of projection units constructed according to the invention are closely arrayed to form a signal light.

A plurality of projection units constructed according to the invention are closely arrayed to form a display device.

As seen from the foregoing description, the projection unit of the invention makes the best use of light emitted from the light emitting element, and provides a good visibility. With improvement of the light emitting efficiency, a good visibility is secured even if the number of required light emitting elements is reduced. Reduction of the output and the lifetime of the light emitting element, which is due to the accumulation of heat within the device, is minimized. Additionally, a contrast of the projection unit between its on- and off-states is remarkably improved.

Figure 48:
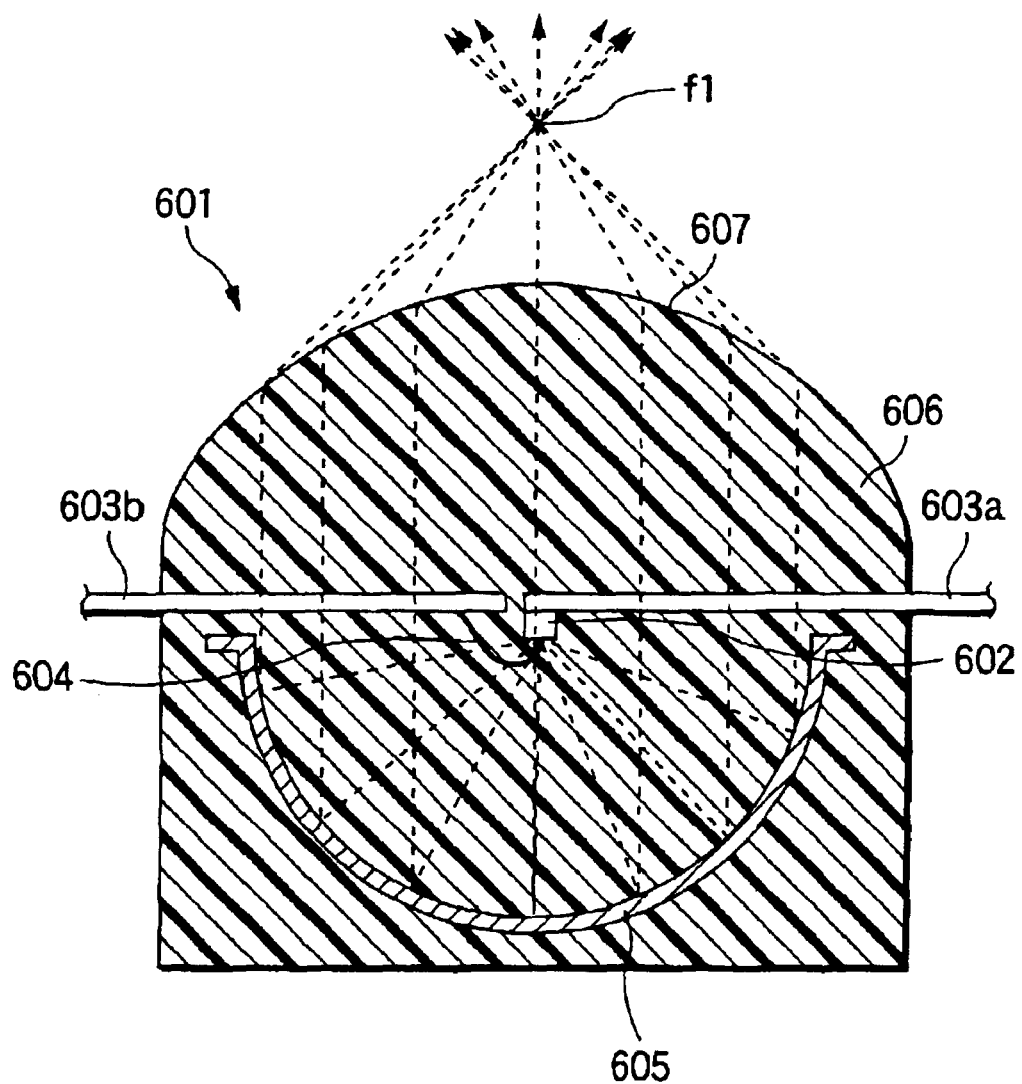
FIG. 48 is a cross sectional view showing an overall construction of a reflection-type light emitting diode which constitutes a 14th embodiment of the invention.

FIG. 48 shows a reflection-type light emitting diode 601 which constitutes a 14th embodiment of the invention. As shown, in the reflection-type light emitting diode 601, electric power is supplied to a light emitting element 602 by way of leads 603*a* and 603*b*. The light emitting element 602 is mounted on the lead 603*a* of those leads. The other lead 603*b* and the light emitting element 602 are electrically connected by a wire 604 in a wire bonding manner. A reflecting mirror 605 is mounted on a lead portion constructed as last mentioned. The reflecting mirror 605 is formed by concaving a metal plate by pressing. The resultant structure is encapsulated with transparent epoxy resin 606 by molding, and by the molding, a surface of the molded product, which is closer to the rear side of the light emitting element 602, is shaped to have a radiation surface 607.

The reflecting mirror 605 is formed in a manner that a brass plate is concaved by pressing, and a concave surface formed is plated with silver. It is configured like a paraboloid of revolution. The light emitting element 602 is located at the focal point of the paraboloid of revolution. Light emitted from the light emitting element 602 is reflected by the reflecting mirror 605. At this time, the rays of light reflected by the mirror are parallel to the axis of the paraboloid of revolution, and radiated from the radiation surface 607 located on the rear side of the light emitting element 602.

The radiation surface 607 is configured like a convex lens with a focal point f1, and takes the form of an ellipsoid of revolution. Accordingly, rays of light emitted from the light emitting element 602 are incident on and reflected by the reflecting mirror 605, and the reflected rays of light as parallel rays are converged on the focal point f1 by the radiation surface 607. The reflection-type light emitting diode (LED) 601 having such a converging characteristic is molded by one-piece molding process.

A diameter of a flux of the parallel rays of light is substantially equal to that of the reflecting mirror 605, and at a height of the leads 603*a* and 603*b* is larger than that of the light flux, which is formed by a reflecting mirror having another surface configuration in the transparent epoxy resin 606. As a result, reduction of a quantity of radiated light, which is due to the light shielding in the light emitting element 602 and the leads 603*a* and 603*b*, is lessened. Accordingly, even in a case where the reflection-type light emitting diode 601 is reduced in size, a high external radiation efficiency is secured.

A method of manufacturing the reflection-type light emitting diode 601 will now be described. In the reflection-type light emitting diode 601, light emitted from the light emitting surface of the light emitting element 602 is reflected by the reflecting mirror 605 formed with a brass plate. Accordingly, a portion at which an optical surface must be formed in the resin encapsulating process is only the radiation surface 607 located on the rear side of the light emitting element. Therefore, the lower mold element of a sealing mold is shaped like a convex lens of the radiation surface 607, and the leads 603*a* and 603*b* and the reflecting mirror 605 are all nipped between the upper and lower mold elements of the mold. In this state, resin is molded with the radiation surface 607 engraved in the lower mold element. By so done, the residual bubble problem will be solved. No residual bubbles are not produced if resin is attached to the reflecting mirror 605 in advance. Since the optical characteristic of the upper mold element is determined by the reflecting mirror 605, there is no need of forming an optical surface for the upper mold element. And specially strict configuration and surface state are not required for it. Therefore, the resin sealing can be carried out by potting molding process, not using such molding process as the transfer molding particularly.

In the 14th embodiment, the reflecting mirror 605 which is formed by shaping a brass plate concave by pressing and plating it with silver, is used. Accordingly, one-piece molding including the radiation surface 607 can be carried out in an optical level, by using resin. As a result, the reflection-type LED 601 having a radiation surface configured as desired, which is practical and can be manufactured on the mass production basis, is provided.

In the 14th embodiment, the reflecting mirror 605 is formed by plating a concaved brass plate with silver. Therefore, it is resistive to a temperature variation. Because of this, it never happens that the reflecting mirror is creased by temperature change, so that the mirror loses its function, although such a problem often arises in the reflecting mirror formed by vapor depositing metallic material on the resin surface. Therefore, it may be applied to a reflow furnace for surface mounting. Accordingly, it may be used as one of surface mounting parts without any restriction, so that it is suitable for such an application that a number of reflection-type LEDs are mounted.

Figure 49:
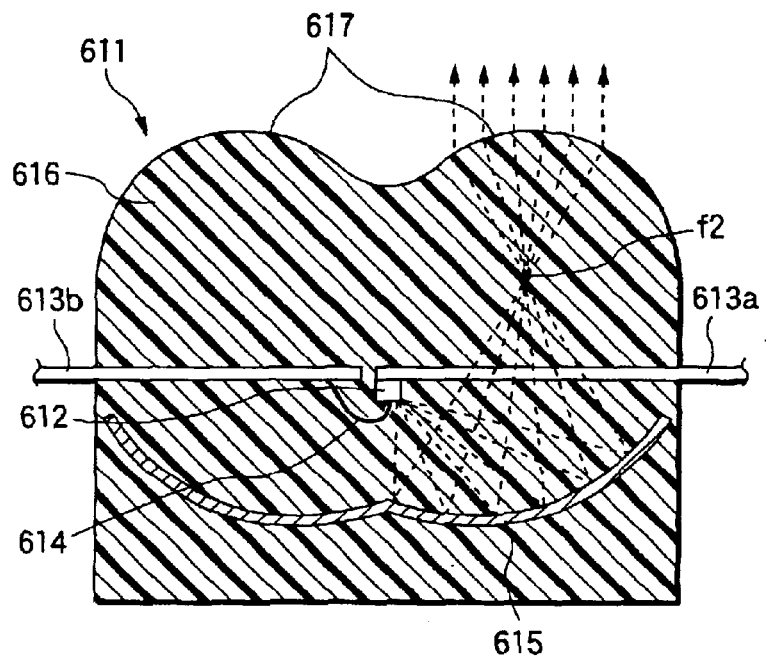
FIG. 49 is a cross sectional view showing an overall construction of a reflection-type light emitting diode which constitutes a 15th embodiment of the invention.

A 15th embodiment of the invention will be described with reference to FIG. 49. As shown, in a reflection-type light emitting diode 611 of the 15th embodiment, electric power is supplied to a light emitting element 612 by way of leads 613a and 613b. The light emitting element 612 is mounted on the lead 613a of those leads. The other lead 613b and the light emitting element 612 are electrically connected by a wire 614 in a wire bonding manner. A reflecting mirror 615 is mounted on a lead portion constructed as last mentioned. The reflecting mirror 615 is formed by concaving a metal plate by pressing. The resultant structure is encapsulated by transparent epoxy resin 616 by molding. By the molding, a surface of the molded product, which is closer to the rear side of the light emitting element 612 is shaped to have a radiation surface 617.

The reflecting mirror 615 is formed in a manner that an aluminum plate is concaved by pressing, and is configured like an axially symmetrical shape developed when an elliptical line whose first focal point is a position of the light emitting element 612 and second focal point is a point f2 within the transparent epoxy resin 616, is revolved about the axial line of the reflection-type LED 611. Light emitted from the light emitting element 612 is reflected by the reflecting mirror 615. At this time, the rays of light reflected by the mirror are converged on a point in a circle generated by revolving the point f2 about the axial line of the reflection-type LED 611. And the light is radiated from the radiation surface 617 located on the rear side of the light emitting element 612. The radiation surface 617 is shaped like a ring when viewed from top, with a depression formed in the central portion.

The light that is reflected by the reflecting mirror 615 passes through the point f2 and is converged on a circle located above and depicted around the light emitting element 612, and is radiated outside while not directing the light to the periphery of the light emitting element 612. Accordingly, if the reflection-type LED 611 is reduced in size and an area ratio of the light shielding portion (light emitting element 612) to the radiation surface 617 is increased, the external radiation efficiency can be kept at a high level.

With regard to a method of manufacturing the reflection-type LED 611, as in the 14th embodiment, the radiation surface 617 of an optically satisfactory accuracy is formed in a manner that the radiation surface 617 is engraved in the lower mold element of a sealing mold.

Figure 50:
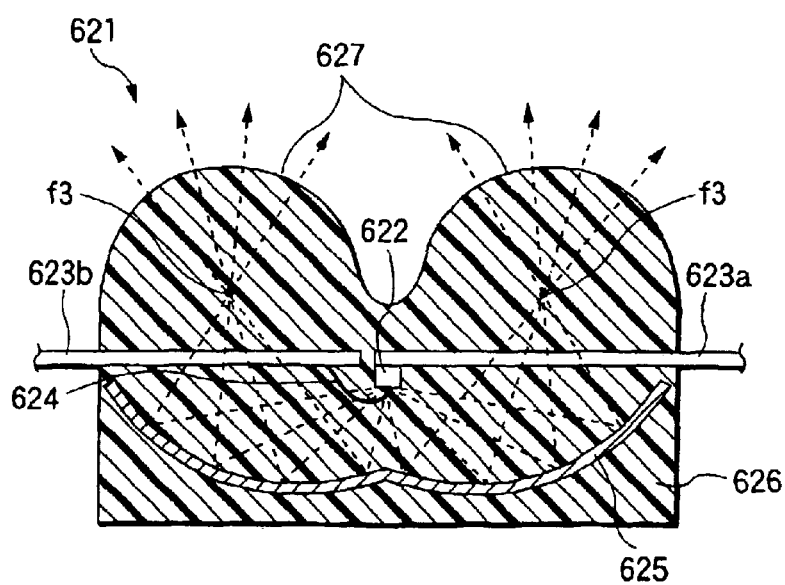
FIG. 50 is a cross sectional view showing an overall construction of a reflection-type light emitting diode which constitutes a 16th embodiment of the invention.

A 16th embodiment of the invention will be described with reference to FIG. 50. As shown, in a reflection-type light emitting diode 621 of the 16th embodiment, electric power is supplied to a light emitting element 622 by way of leads 623a and 623b. The light emitting element 622 is mounted on the lead 623a of those leads. The other lead 623b and the light emitting element 622 are electrically connected by a wire 624 in a wire bonding manner. A reflecting mirror 625 is mounted on a lead portion constructed as last mentioned. The reflecting mirror 625 is formed by concaving a metal plate by pressing. The resultant structure is encapsulated by transparent epoxy resin 626 by molding. By the molding, a surface of the molded product, which is closer to the rear side of the light emitting element 622 is shaped into a radiation surface 627.

The reflecting mirror 625 is formed in a manner that a aluminum plate is concaved by pressing, and is configured like an axially symmetrical shape developed when an elliptical line whose first focal point is a position of the light emitting element 622 and second focal point is points f3 within the transparent epoxy resin 626, is revolved about the axial line of the reflection-type LED 621. The points f3 is set at positions lower than the point f2, and the reflecting mirror 625 is more flat than the reflecting mirror 615 in the 15th embodiment.

The light that is emitted from the light emitting element 622 and reflected by the reflecting mirror 625 is converged on a point of a circle developed by revolving the point f3 about the axial line of the reflection-type LED 621, and is radiated from the radiation surface 627 located on the rear side of the light emitting element 622. A cross section of the radiation surface 627 forms a part of a circle formed around the point f3. Accordingly, the rays of the LED light that are reflected by the reflecting mirror 625 and pass through the point f3 are incident on the radiation surface 627 at right angles, and are radiated outside without changing their directions.

The light that is reflected by the reflecting mirror 625 passes through the point f3 and is converged on a circle located above and depicted around the light emitting element 622, and is radiated outside while not directing the light to the periphery of the light emitting element 622. Accordingly, if the reflection-type LED 621 is reduced in size and an area ratio of the light shielding portion (light emitting element 622) to the radiation surface 627 is increased, the external radiation efficiency can be kept at a high level.

Thus, in the embodiment, the points f3 are set at lower positions, the reflecting mirror 625 is more flat in configuration, and the cross sectional area of the radiation surface 627 forms a part of a circle depicted around the point f3. As a result, the reflection-type LED 621 is reduced in height as a whole, and hence thin reflection-type LEDs are provided.

With regard to a method of manufacturing the reflection-type LED 621, as in the 14th and 15th embodiments, the radiation surface 627 having an optically satisfactory accuracy is formed by molding the radiation surface 627 in the lower mold element of a sealing mold.

Figure 51:
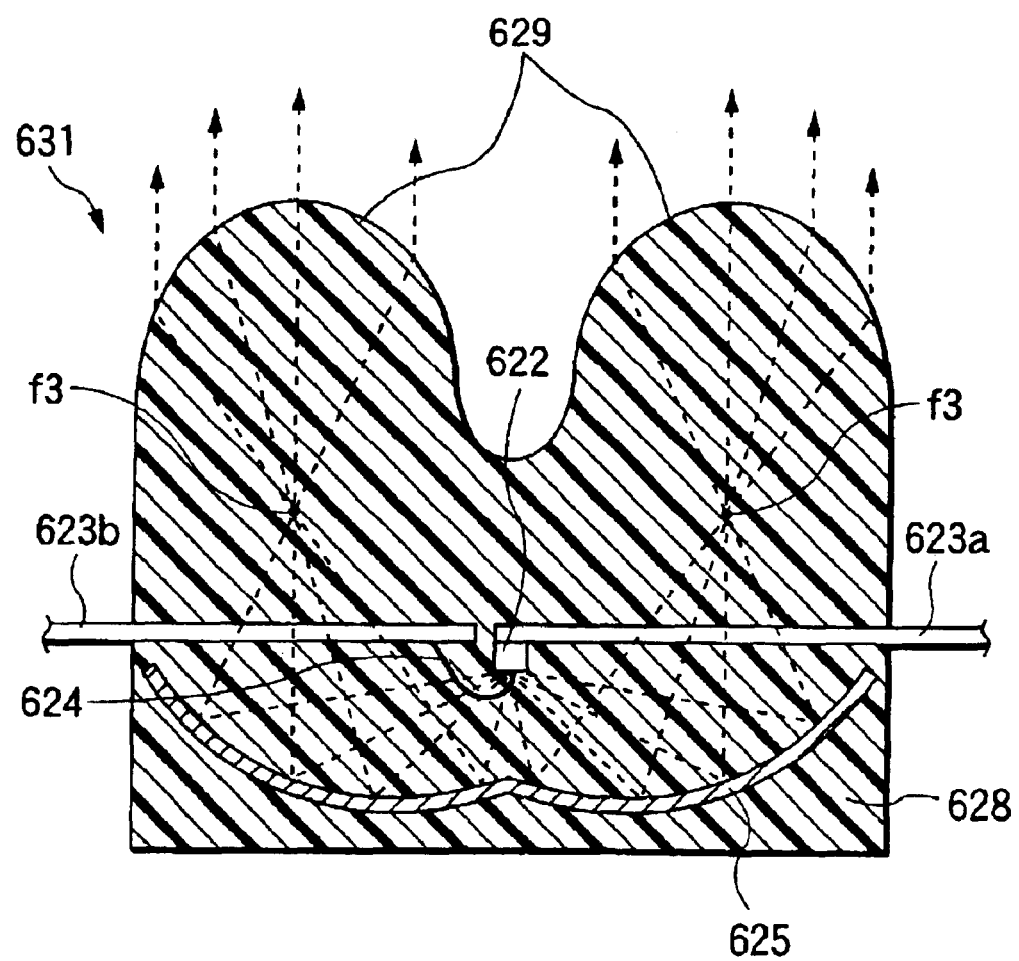
FIG. 51 is a cross sectional view showing an overall construction of a reflection-type light emitting diode which constitutes a 17th embodiment of the invention.

A 17th embodiment of the invention will be described with reference to FIG. 51. As shown, a reflection-type LED 631 of the embodiment, a light emitting element 622, leads 623a, 623b, and 624, and a reflecting mirror 625 are similar to the corresponding one in the 16th embodiment in their configuration and structure. The reflection-type LED 631 of the embodiment is different from that 621 of the 16th embodiment in a configuration of a radiation surface 629, which is formed on the rear side of the light emitting element 622 in a sealing process by transparent epoxy resin 628.

A cross section of the radiation surface 629 forms a part of an ellipse which includes the point f3 as one of the focal points. Accordingly, the rays of the LED light that are reflected by the reflecting mirror 625 and pass through the point f3 are refracted by the radiation surface 629 and radiated therefrom in parallel with the axial line of the reflection-type LED 631. In this case, the parallel rays of light radiated from the radiation surface 629 take the form of a ring. A diameter of the reflection-type LED 631 is extremely small. Accordingly, the light emitted from the LED is seen in the form of a single straight light flux.

With regard to a method of manufacturing the reflection-type LED 631, as in the 14th to 16th embodiments, the radiation surface 629 having an optically satisfactory accuracy is formed by molding the radiation surface 629 in the lower mold element of a sealing mold.

In the above-mentioned embodiments, the metal mirror formed by shaping the metal plate concave by pressing is used for the cup-like member forming the reflecting mirror. In an alternative, the reflecting mirror may be formed in a manner that a surface of a concaved substrate made of resin or ceramics is coated with a metal film by plating or vapor deposition, and subjected to mirror forming process. A configuration of the radiation surface is also not limited to the above-mentioned one. It may be flat. Also in this case, a surface of high flatness accuracy can be formed by engraving it in the low mold element of the mold. A corrugated radiation surface which increases the light distribution angle only in the horizontal direction may be formed at high accuracy.

As described above, a reflection-type LED (601, 611, 621, 631) of each of the above-mentioned embodiments comprises: a light emitting element (602, 612, 622); leads (603a, 603b, 604, 613a, 613b, 614, 623a, 623b, 624) for supplying electric power to the light emitting element (602, 612, 622); a reflecting mirror (605, 615, 625) directed to a light emitting surface of the light emitting element (602, 612, 622); a radiation surface (607, 617, 627, 629) located on the rear side of the light emitting element (602, 612, 622); and transparent material (606, 616, 626, 628); wherein the reflecting mirror (605, 615, 625) is formed with a cup-like member, the light emitting element (602, 612, 622), part of the leads (603a, 603b, 604, 613a, 613b, 614, 623a, 623b, 624), and the reflecting mirror (605., 615, 625) are sealed with the transparent material (606, 616, 626, 628), and the radiation surface (607, 617, 627, 629) is formed in the lower mold element of a mold.

In the reflection-type light emitting diode (601, 611, 621, 631), light emitted from the light emitting surface of the light emitting element (602, 612, 622) is reflected by the reflecting mirror (605, 615, 625) formed with a cup-like member. Accordingly, a portion at which an optical surface must be formed in the resin encapsulating process is only the radiation surface (607, 617, 627, 629) located on the rear side of the light emitting element (602, 612, 622). Therefore, the lower mold element of a sealing mold is shaped like a convex lens of the radiation surface (607, 617, 627, 629), and the leads (603a, 603b, 604, 613a, 613b, 614, 623a, 623b, 624) and the reflecting mirror (605, 615, 625) are all nipped between the upper and lower mold elements of the mold. In this state, resin is molded with the radiation surface (607, 617, 627, 629) engraved in the lower mold element. Since the optical characteristic of the upper mold element is determined by the reflecting mirror (605, 615, 625), there is no need of forming an optical surface for the upper mold element. And specially strict configuration and surface state are not required for it. Thus, the reflecting mirror (605, 615, 625) formed with a cup-like member is used. Accordingly, one-piece molding including the radiation surface (607, 617, 627, 629) can be carried out in an optical level, by using resin. As a result, the reflection-type LED having a radiation surface configured as desired, which is practical and can be manufactured on the mass production basis, is provided.

In the above-mentioned embodiments 14th to 17th, in the reflection-type light emitting diode (601, 611, 621, 631), the radiation surface (607, 617, 627, 629) is convex. A reflection-type LED having a radiation surface configured as desired is produced by engraving the radiation surface engraved in the lower mold element and carrying out a resin molding using the lower mold element thus engraved. Accordingly, the radiation surface (607, 617, 627, 629) can be formed convex. With this, light emitted from the reflection-type light emitting diode (601, 611, 621, 631) is converged by a convex lens action of the radiation surface (607, 617, 627, 629). Thus, the reflection-type LED having a converging action is practically realized.

In the 14th to 17th embodiments, in the reflection-type light emitting diode (601, 611, 621, 631), the reflecting mirror (605, 615, 625) is formed by shaping a metal plate concave or by plating the metal plate. Therefore, it is resistive to a temperature variation. Because of this, it never happens that the reflecting mirror is creased by temperature change, so that the mirror loses its function, although such a problem often arises in the reflecting mirror formed by vapor depositing metallic material on the resin surface. Therefore, it may be applied to are flow furnace for surface mounting. Accordingly, it may be used as one of surface mounting parts without any restriction, so that it is suitable for such an application that a number of reflection-type LEDs are mounted.

In the reflection-type LED 601 of the 14th embodiment, the reflecting mirror 605 takes a form defined by a paraboloid of revolution. The light emitting element 602 is located at the focal point of the paraboloid of revolution. Light emitted from the light emitting element 602 is reflected by the reflecting mirror 605. At this time, the rays of light reflected by the mirror are parallel to the axis of the paraboloid of revolution. A diameter of a flux of the parallel rays of light is substantially equal to that of the reflecting mirror 605, and at a height of the leads 603a, 603b, 604 larger than that of the light flux, which is formed by a reflecting mirror having another surface configuration in the transparent epoxy resin 606. As a result, reduction of a quantity of radiated light, which is due to the light shielding in the light emitting element 602 and the leads 603a, 603b, 604 is lessened. Accordingly, a high external radiation density is secured at the focal point.

In the 15th to 17th embodiments, in the reflection-type light emitting diode (611, 621, 631), the light that is reflected by the reflecting mirror (615, 625) while not directing the light to the periphery of the light emitting element (612, 622). Accordingly, if the reflection-type LED (611, 621, 631) is reduced in size and an area ratio of the light shielding portion (light emitting element (612, 622)) to the radiation surface (617, 627, 629) is increased, light reflected by the reflecting mirror (615, 625) does not reach the light emitting element (612, 622) and radiated outside. As a result, the resultant reflection-type LED is capable of keeping the external radiation efficiency at a high level, even if its size is reduced.

As seen from the foregoing description, a reflection-type light emitting diode comprises: a light emitting element; leads for supplying electric power to the light emitting element; a reflecting mirror directed to a light emitting surface of the light emitting element; a radiation surface located on the rear side of the light emitting element; and transparent material; wherein the reflecting mirror is formed with a cup-like member, the light emitting element, part of the leads, and the reflecting mirror are sealed with the transparent material, and a light distribution control surface is formed on the radiation surface.

In the reflection-type light emitting diode, light emitted from the light emitting surface of the light emitting element is reflected by the reflecting mirror formed with a cup-like member. Accordingly, a portion at which an optical surface must be formed in the resin encapsulating process is only the radiation surface located on the rear side of the light emitting element. Accordingly, the light that is reflected by the reflecting mirror is subjected to a light distribution control based a configuration of the light distribution control surface, and then radiated outside from the radiation surface. Thus, by using the reflecting mirror formed with a cup-like member, the reflection-type LED having a radiation surface configured as desired, which is practical and can be manufactured on the mass production basis, is provided.

The radiation surface is formed in the lower mold element of the sealing mold. Accordingly, a portion at which an optical surface must be formed in the resin encapsulating process is only the radiation surface located on the rear side of the light emitting element. Therefore, the lower mold element of a sealing mold is shaped like a convex lens of the radiation surface, and the leads and the reflecting mirror are all nipped between the upper and lower mold elements of the mold. In this state, resin is molded with the radiation surface engraved in the lower mold element. By so done, the residual bubble problem will be solved. Since the optical characteristic of the upper mold element is determined by the reflecting mirror, there is no need of forming an optical surface for the upper mold element. And specially strict configuration and surface state are not required for it. Therefore, the resin sealing can be carried out by potting molding process, not using such molding process as the transfer molding particularly.

Thus, the reflecting mirror which is formed with a cup-like member, is used. Accordingly, one-piece molding including the radiation surface can be carried out in an optical level, by using resin. As a result, the reflection-type LED having a radiation surface configured as desired, which is practical and can be manufactured on the mass production basis, is provided.

Further, the radiation surface may be convex. A reflection-type LED having a radiation surface configured as desired is provided. Accordingly, the radiation surface can be formed convex. With this, light emitted from the reflection-type light emitting diode is converged by a convex lens action of the radiation surface. Thus, the reflection-type LED having a converging action is practically realized.

The reflecting mirror is formed by shaping a metal plate concave or by plating the metal plate. Therefore, it is resistive to a temperature variation. Because of this, it never happens that the reflecting mirror is creased by temperature change, so that the mirror loses its function, although such a problem often arises in the reflecting mirror formed by vapor depositing metallic material on the resin surface. Therefore, it may be applied to a reflow furnace for surface mounting. Accordingly, it may be used as one of surface mounting parts without any restriction, so that it is suitable for such an application that a number of reflection-type LEDs are mounted.

The reflecting mirror may be constructed such that it reflects light that is emitted from the light emitting element while not directing the light to and near the light emitting element, and then radiates it outside.

If the reflection-type LED is reduced in size and an area ratio of the light shielding portion (light emitting element to the radiation surface is increased, light reflected by the reflecting mirror does not reach the light emitting element and radiated outside. As a result, the resultant reflection-type LED is capable of keeping the external radiation efficiency at a high level, even if its size is reduced.

The reflecting mirror converges light on an annular part. Accordingly, the radiation surface may be shaped like a ring when viewed from top, with a depression formed in the central portion.

Light reflected by the reflecting mirror is converged on a ring-like part while not directed to the periphery of the light emitting element, and it is not interrupted by the light emitting element. Since the radiation surface is shaped like a ring when viewed from top, with a depression formed in the central portion, the light thus converted is radiated outside from the annular part on the radiation surface. Accordingly, a high external radiation efficiency is secured. If the reflection-type LED is reduced in size and an area ratio of the light shielding portion (light emitting element to the radiation surface is increased, light reflected is converged on a ring-like part while being apart from the periphery of the light emitting element. As a result, the resultant reflection-type LED is capable of keeping the external radiation efficiency at a high level, even if its size is reduced.

Figure 52A:
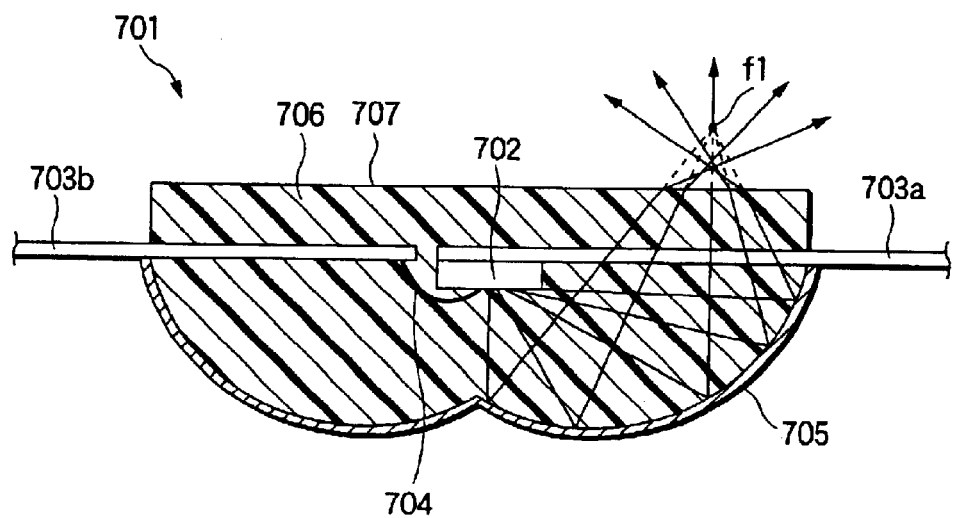
FIG. 52A is a cross sectional view showing an overall construction of a reflection-type light emitting diode which constitutes a 18th embodiment of the invention.

FIG. 52 shows a reflection-type light emitting diode 701 which constitutes a 18th embodiment of the invention. As shown, in the reflection-type light emitting diode 701, electric power is supplied to a light emitting element 702 by way of leads 703a and 703b. The light emitting element 702 is mounted on the lead 703a of those leads. The other lead 703b and the light emitting element 702 are electrically connected by a wire 704 in a wire bonding manner. A lead portion thus arranged is encapsulated with transparent epoxy resin 706 by molding. As the result of the molding, a surface of the molded product, which is closer to the light emitting surface of the light emitting element 702, is configured into a reflecting surface, while a rear side or surface of the molded product is configured into a radiation surface (flat surface) 707. A reflecting mirror 705 is formed by vapor depositing metallic material on the reflecting surface.

Figure 52B:
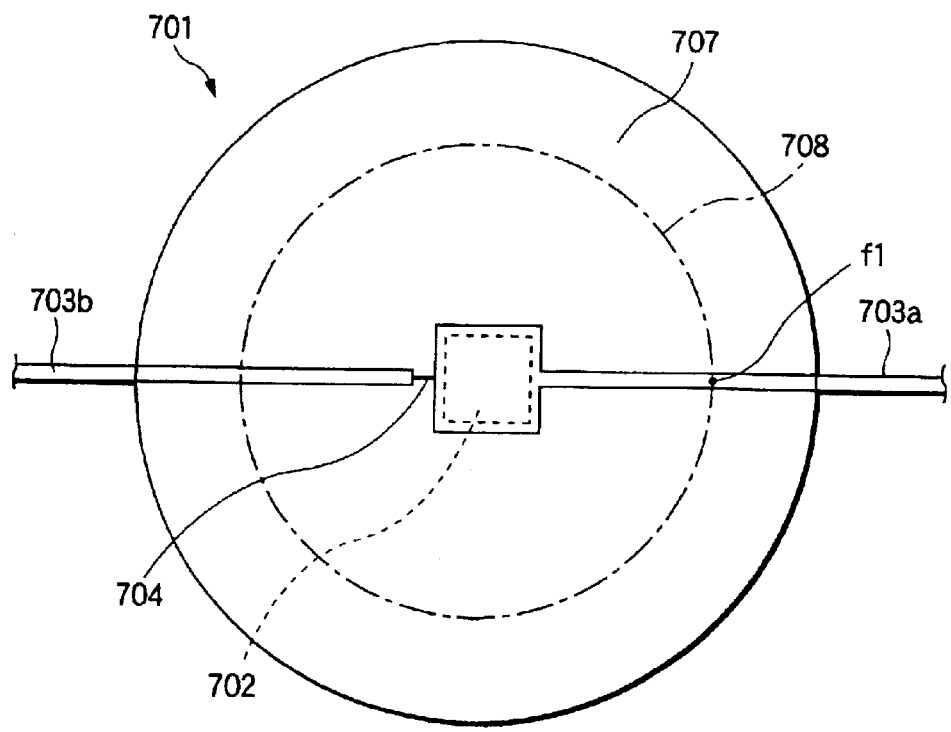
FIG. 52B is a plan view showing a light converging in the reflection-type light emitting diode of FIG. 52A.

The reflecting surface is configured like an axially symmetrical shape developed when a part of an ellipse whose first focal point is a position of the light emitting element 702 and second focal point is a point f1 located outside the transparent epoxy resin body 706, is revolved about the axial line of the reflection-type LED 701. Therefore, the reflecting surface is smooth and continuous except the center thereof. In the reflection-type light emitting diode 701 thus constructed, light emitted from the light emitting element 902, as shown in FIG. 52B, is converged on a circular part 708 which is centered at the axis of the reflection-type light emitting diode 701 and passes through the point f1. Actually, the light is slightly refracted by the radiation surface 707. Therefore, a slight amount of light is converged on the circular part 708, while most of light emitted from the light emitting element 702 passes through the vicinity of the circular part 708.

Light that is emitted from the light emitting element 702 and reflected by the reflecting mirror 705 is reflected in such a direction as not to direct the light to the periphery of the light emitting element 702. In a plane including the leads 703a and 703b, the light is converged on an annular area not including the light emitting element 702. After converged, the light is radiated outside. Therefore, even when the reflection-type light emitting diode 701 is reduced in size, and an area ratio of the light emitting element 702 of a light shielding portion (light emitting element 702 and the leads 703a and 703b) to the radiation surface 707 is increased, the light is not interrupted by the light emitting element 702. The light is interrupted at only two locations where the two leads 703a and 703b intersect the circular part. 708. In this respect, the reflection-type light emitting diode capable of keeping the external radiation efficiency high even if its size is reduced is provided. The reflecting surface is smooth and continuous except the center thereof. Therefore, the radiation light has a smooth and continuous light distribution. Also when a reflecting mirror 705 is formed by resin molding, the resultant reflecting mirror 705 formed is excellent in surface coarseness. Accordingly, the reflection-type light emitting diode having such a reflecting mirror 705 and being practical is provided.

Figure 53:
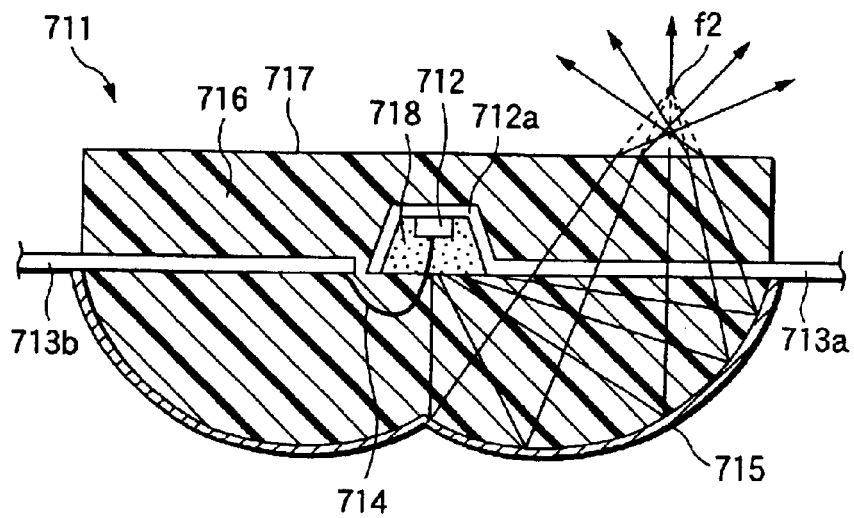
FIG. 53 is a cross sectional view showing an overall construction of a reflection-type light emitting diode which constitutes a 19th embodiment of the invention.

A 19th embodiment of the invention will be described with reference to FIG. 53. As shown in FIG. 53, in a reflection-type light emitting diode 711, a pair of leads 713*a* and 713*b* are used for supplying electric power to a light emitting element 712. Of those leads, the lead 713*a* has a cup-shaped end 712*a*, and the light emitting element 712 is mounted on the cup-shaped end thereof. A space around the light emitting element 712 within the cup-shaped end 712*a* is filled with a mixture of fluorescent material 718 and transparent epoxy resin.

A lead portion where the lead 713*b* and the light emitting element 712 are electrically connected by a wire 714 in a bonding manner, is encapsulated with transparent epoxy resin 716 by molding. As the result of the molding, a surface of the molded product, which is closer to the light emitting surface of the light emitting element 712, is configured into a reflecting surface, while a rear side or surface of the molded product is configured into a radiation surface (flat surface) 717. A reflecting mirror 715 is formed by vapor depositing metallic material on the reflecting surface.

The reflecting surface is configured like an axially symmetrical shape developed when a part of an ellipse whose first focal point is a position of the cup-shaped end 712*a* with the light emitting element 712 mounted thereon and second focal point is a point f1 located outside the transparent epoxy resin body 716, is revolved about the axial line of the reflection-type LED 711.

The light emitting element 712 is an ultraviolet (UV) responding emitting element, and emits white fluorescence when receives radiation of UV. Accordingly, the underside of the cup-shaped end 712*a* of the reflection-type light emitting diode 711 emits white fluorescence toward the reflecting mirror 715.

In the reflection-type light emitting diode 711 thus constructed, the area ratio of the light shielding portion increases with the presence of the cup-shaped end 712*a* filled with the fluorescent material 718. Light that is emitted from the cup-shaped end 712*a* and reflected by the reflecting mirror 715 is converged on a circle that is centered at the axis of the reflection-type light emitting diode 711 and passes through the point f2. Actually, the light is slightly refracted by the radiation surface 717. Therefore, a slight amount of light is converged on the circle, while most of light emitted from the cup-shaped end 712*a* passes through the vicinity of the circle.

Light that is emitted from the cup-shaped end 712*a* and reflected by the reflecting mirror 715 is reflected in such a direction as not to direct the light to the periphery of the cup-shaped end 712*a*. The light is not interrupted by the cup-shaped end 712*a*. In this respect, the reflection-type LED capable of keeping the external radiation efficiency high even if the fluorescent material 718 is used.

In the embodiment, the light emitting element 712 as an ultraviolet (UV) responding emitting element emits white fluorescence when receives radiation of UV. In the invention, the combination of the light emitting element and the fluorescent material is not limited to the above-mentioned one. An example of such is that the light emitting element 712 is a blue light emitting element, and the fluorescent material 718 receives blue light and emits yellow fluorescence.

Figure 54:
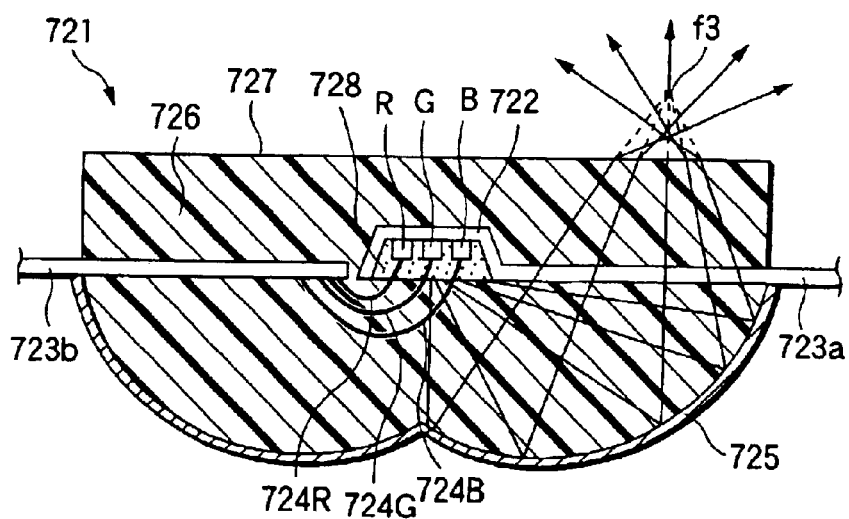
FIG. 54 is a cross sectional view showing an overall construction of a reflection-type light emitting diode which constitutes a 20th embodiment of the invention.

A 20th embodiment of the invention will be described with reference to FIG. 54. As shown in FIG. 54, in a reflection-type light emitting diode 721, a pair of leads 723*a* and 723*b* are used for supplying electric power to three light emitting elements R, G and B. Of those leads, the lead 723*a* has a cup-shaped end 722, and the red, green and blue light emitting element R., G and B mounted on the cup-shaped end thereof. A space around the light emitting elements within the cup-shaped end 722 is filled with a mixture of diffusion material 728 and transparent epoxy resin. The diffusion material 728 is generally silica fine particles, and is used for diffusing and mixing color lights emitted from the light emitting element R, G and B.

The lead 723*b* is divided into three parts, which are electrically connected, in a wire bonding manner, to the three light emitting element R, G and B by three wires 724*r*, 724G and 724B, respectively. A lead portion thus arranged is encapsulated with transparent epoxy resin 726 by molding. As the result of the molding, a surface of the molded product, which is closer to the light emitting element R, G and B, is configured into a reflecting surface, while a rear side or surface of the molded product is configured into a radiation surface (flat surface) 727. A reflecting mirror 725 is formed by vapor depositing metallic material on the reflecting surface.

The three light emitting element R, G and B are electrically connected independently. Therefore, electric power supplied to the light emitting element R, G and B may be controlled independently. Accordingly, luminance levels of the light emitting element R, G and B are variously controlled and mixed by the diffusion material 728. As a result, light of a variety of colors is emitted.

The reflecting surface is configured like an axially symmetrical shape developed when a part of an ellipse whose first focal point is a position of the cup-shaped end 722 with the light emitting element R, G and B mounted thereon, and second focal point is a point f3 located outside the transparent epoxy resin body 726, is revolved about the axial line of the reflection-type LED 721.

In the reflection-type light emitting diode 721 thus constructed, the area ratio of the light shielding portion increases with the presence of the cup-shaped end 722 filled with the diffusion material 728. Light that is emitted from the cup-shaped end 722 and reflected by the reflecting mirror 725 is converged on a circle that is centered at the axis of the reflection-type light emitting diode 721 and passes through the point f3. Actually, the light is slightly refracted by the radiation surface 727. Therefore, a slight amount of light is converged on the circle, while most of light emitted from the cup-shaped end 722 passes through the vicinity of the circle.

Light that is emitted from the cup-shaped-end 722 and reflected by the reflecting mirror 725 is reflected in such a direction as not to direct the light to the periphery of the cup-shaped end 722. The light is not interrupted, by the cup-shaped end 722. In this respect, the reflection-type LED capable of keeping the external radiation efficiency high even if the light emitting element R, G and B is used.

In the 20th embodiment, the three light emitting element of three primary colors R, G and B are used for the plurality of light emitting elements. Various other color combinations, such as the combination of two colors, the combination of those R, G and B colors with yellow, violet and others, may be used. In some cases, two or more number of light emitting elements emitting same colors may be arrayed side by side.

A 21st embodiment of the invention will be described with reference to FIG. 55. Difference of a reflection-type LED 731 of the embodiment from that of each of the 18th to 20th embodiments resides in a configuration of a reflecting mirror 735.

Figure 55:
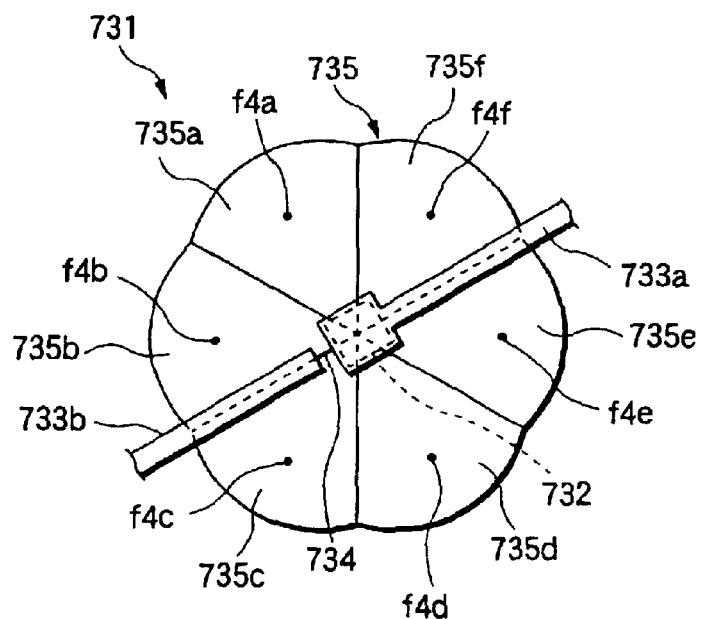
FIG. 55 is a cross sectional view showing an overall construction of a reflection-type light emitting diode which constitutes a 21st embodiment of the invention.

As shown in FIG. 55, in the reflection-type light emitting diode 731, electric power is supplied to a light emitting element 732 by way of leads 733a and 733b. The light emitting element 732 is mounted on the lead 733a of those leads. The other lead 733b and the light emitting element 732 are electrically connected by a wire 734 in a wire bonding manner. A lead portion thus arranged is encapsulated with transparent epoxy resin by molding. As the result of the molding, a surface of the molded product, which is closer to the light emitting surface of the light emitting element 732, is configured into a reflecting surface, while a rear side or surface of the molded product is configured into a radiation surface. A reflecting mirror 735 is formed by vapor depositing metallic material on the reflecting surface.

The reflecting surface consists of parts of six spheroidal surfaces whose first focal points are each at a position of the light emitting element 732 and second focal points are points f4a to f4f within transparent epoxy resin 706. In the reflection-type light emitting diode 731 thus constructed, light that is emitted from the light emitting element 732 and reflected by the reflecting mirror 735a is converged on the point f4a. Light that is reflected by the reflecting mirror 735b is converged on the point f4b; light that is reflected by the reflecting mirror 735c is converged on the point f4c; light that is reflected by the reflecting mirror 735d is converged on the point f4d; light that is reflected by the reflecting mirror 735e is converged on the point f4e; and light that is reflected by the reflecting mirror 735f is converged on the point f4f.

Thus, light emitted from the light emitting element 732 is converged on the six separate points f4a to f4f. Accordingly, the light is converged on the points, which are located out of the periphery of the light emitting element 732 and the vicinity of the two leads 733a and 733b as well. Most of light emitted from the light emitting element 732 is radiated outside from the radiation surface without any interruption. Therefore, the reflection-type light emitting diode capable of keeping the external radiation efficiency high even if its size is reduced is provided.

A 22nd embodiment of the invention will be described with reference to FIG. 56. Difference of the 22nd embodiment from each of the 18th to 21st embodiments resides in that the reflecting mirror is formed by shaping a metal plate by pressing.

Figure 56:
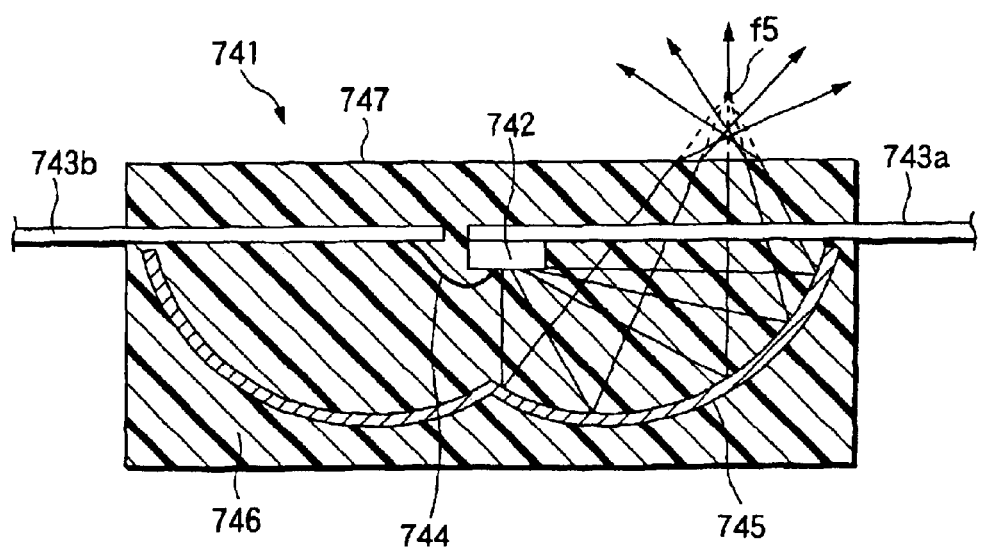
FIG. 56 is a cross sectional view showing an overall construction of a reflection-type light emitting diode which constitutes a 22nd embodiment of the invention.

As shown in FIG. 56, in the reflection-type light emitting diode 741, electric power is supplied to a light emitting element 742 by way of leads 743a and 743b. The light emitting element 742 is mounted on the lead 743a of those leads. The other lead 743b and the light emitting element 742 are electrically connected by a wire 744 in a wire bonding manner. A reflecting mirror 745 is mounted on a lead portion constructed as last mentioned. The reflecting mirror 745 is formed by concaving a copper alloy plate by pressing and plating the concave surface with silver. The resultant structure is encapsulated with cylindrical transparent epoxy resin 746 by molding. As the result of the molding, a surface of the molded product, which is closer to the light emitting surface of the light emitting element 742, is configured into a reflecting surface, while a rear side or surface of the molded product is configured into a radiation surface (flat surface) 747.

The reflecting surface, as in the 18th to 20th embodiments, is configured like an axially symmetrical shape developed when a part of an ellipse whose first focal point is a position of the light emitting element 742 and second focal point is a point f5 located outside the transparent epoxy resin body 746, is revolved about the axial line of the reflection-type LED 741. Therefore, the reflecting surface is smooth and continuous except the center thereof.

In the reflection-type light emitting diode 741 thus constructed, light that is emitted from the light emitting element 902 and reflected by the reflecting mirror 745 is converged on a circle which-is centered at the axis of the reflection-type light emitting diode 741 and passes through the point f5. Actually, the light is slightly refracted by the radiation surface 747. Therefore, a slight amount of light is converged on the circle, while most of light emitted from the light emitting element 742 passes through the vicinity of the circle.

Light that is emitted from the light emitting element 742 and reflected by the reflecting mirror 745 is reflected in such a direction as not to direct the light to the periphery of the light emitting element 742, and then radiated outside. Therefore, even when the reflection-type light emitting diode 741 is reduced in size, and an area ratio of the light emitting element 742 of a light shielding portion (light emitting element 742 and the leads 743a and 743b) to the radiation surface 747 is increased, the light is not interrupted by the light emitting element 742. In this respect, the reflection-type light emitting diode capable of keeping the external radiation efficiency high even if its size is reduced is provided. Therefore, the radiation light has a smooth and continuous light distribution. Also when a reflecting mirror 745 is formed by shaping the metal plate by pressing, a reflection-type LED which is practical and provided with the reflecting mirror 745 being excellent in accuracy and surface coarseness is provided.

The reflecting mirror 745 is formed by shaping the copper alloy concave and plating the concave portion with silver. Therefore, it is resistive to a temperature variation. Because of this, it never happens that the reflecting mirror is creased by temperature change, so that the mirror loses its function, although such a problem often arises in the reflecting mirror formed by vapor depositing metallic material on the resin surface. Therefore, it may be applied to a reflow furnace for surface mounting. Accordingly, it may be used as one of surface mounting parts without any restriction, so that it is suitable for such an application that a number of reflection-type LEDs are mounted. Particularly, the small reflection-type LEDs are in a great demand, as surface mounting parts. Accordingly, when reduced in size, it will be used as a practical reflection-type LED.

A 23rd embodiment of the invention will be described with reference to FIG. 57. Difference of the 23rd embodiment from each of the 18th to 22nd embodiments resides in that a base for supporting the lead portion is formed of resin and a reflecting mirror is formed on the base.

Figure 57:
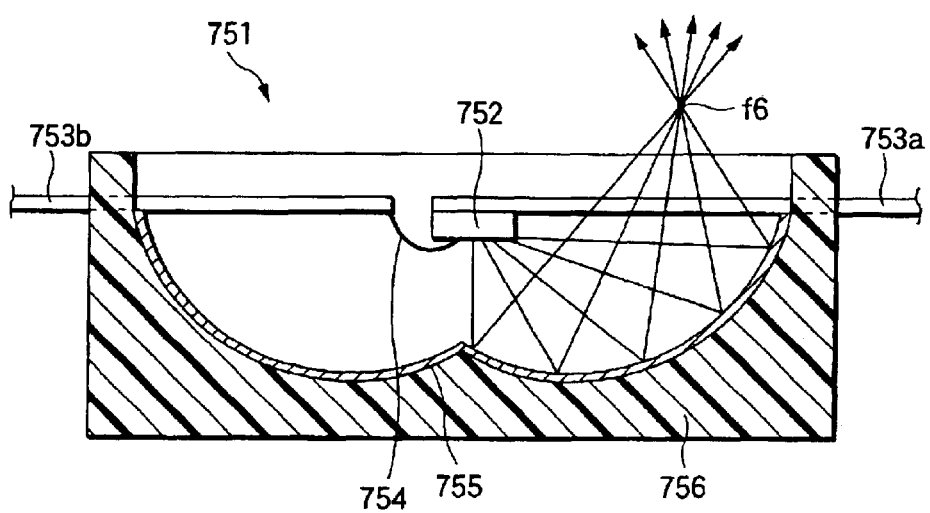
FIG. 57 is a cross sectional view showing an overall construction of a reflection-type light emitting diode which constitutes a 23rd embodiment of the invention.
Figure 58A:
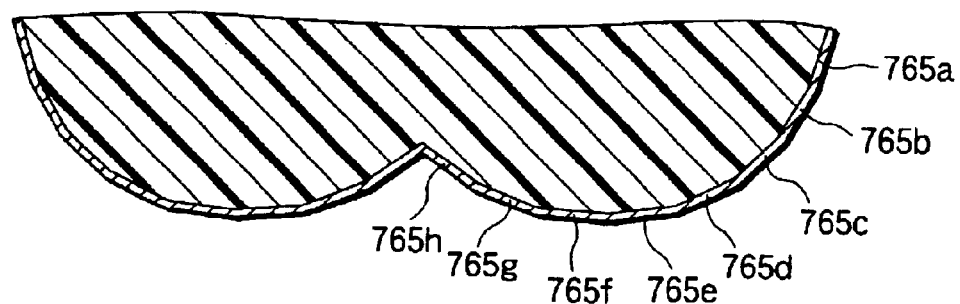
FIG. 58A is a cross sectional view showing a reflecting mirror whose surface is continuous except a center point.
Figure 58B:
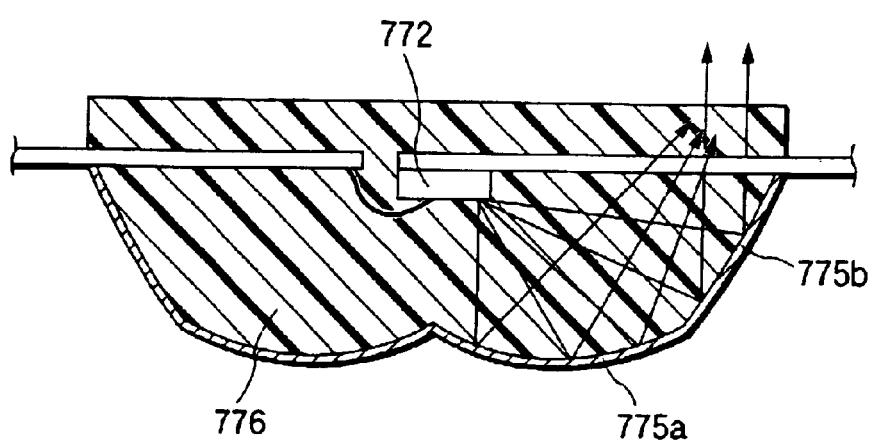
FIG. 58B is a cross sectional view showing another reflecting mirror.

As shown in FIG. 57, in a reflection-type LED 751 of the embodiment, a base 756 is formed by injection molding acryl resin. A bottom surface of the base 756 is shaped into a reflecting surface shaped as in each of the 18th to 20, and 21st embodiments, by molding. Metallic material is deposited on the reflecting surface by vapor deposition, whereby a reflecting mirror 755 is formed. Two leads 753a and 753b pass through the upper part of the base 756. A light emitting element 752 is mounted on the lead 753a, and the lead 753b and the light emitting element 752 are connected by a wire 754 in a wire bonding manner. The light emitting element 752 is positioned at one of the focal points of an elliptical surface developed when a part of an ellipse forming the reflecting surface is revolved about the axis.

In the reflection-type LED 751, light that is emitted from the light emitting element 752 and reflected by the reflecting mirror 755 is converged on a circle which centered about the axis of the reflection-type LED 751 and passes another focal point f6 of the elliptical surface. Accordingly, the light that is emitted from the light emitting element 752 and reflected by the reflecting mirror 755 is reflected in such a direction as not to direct the light to the periphery of the light emitting element 752. Then, it is radiated outside. Therefore, even when the reflection-type light emitting diode 751 is reduced in size, and an area ratio of the light emitting element 752 of a light shielding portion (light emitting element 752 and the leads 753a and 753b) to the radiation surface is increased, the light is not interrupted by the light emitting element 752. In this respect, the reflection-type light emitting diode capable of keeping the external radiation efficiency high even if its size is reduced is provided.

In the reflection-type LED 751 of the 23rd embodiment, the reflecting mirror 755 is formed, by vapor deposition, on the base 756 of acrylic resin, which is formed by injection molding. Accordingly, the resultant LED may be produced on the mass production basis, and the cost to manufacture the LED 751 is reduced. The 23rd embodiment uses acrylic resin for the base 756, but may use other resin, e.g., polycarbonate resin or the like, for the same.

In the reflection-type LED 751 of the embodiment, a radiation portion, which is in the air, is used in place of the radiation surface. Accordingly, the light emitting element 752 will be exposed to air when it is used. To avoid the deterioration of the light emitting element 752 by humidity, a glass plate is placed above the base 756 and a space therebetween is filled with dried nitrogen for sealing.

As described above, a reflection-type LED comprises: a lead portion for supplying electric power to a light emitting element; a reflecting mirror provided while being directed to a light emitting surface of the light emitting element, the reflecting mirror reflecting light emitted from the light emitting element in such a direction as not to direct the light to the periphery of the light emitting element, and then radiating the light outside; and a radiation portion located on the rear side of the light emitting element. Accordingly, even when the reflection-type light emitting diode is reduced in size, and an area ratio of the light emitting element of a light shielding portion (light emitting element and the leads) to the radiation surface is increased, the light that is reflected by the reflecting mirror is radiated outside while not reaching the periphery of the light emitting element. The reflected light is not interrupted by the light emitting element. In this respect, the reflection-type light emitting diode capable of keeping the external radiation efficiency high even if its size is reduced is provided. Further, the radiation light has a smooth and continuous light distribution. Also when a reflecting mirror is formed by resin molding or by shaping a metal plate by pressing, the resultant reflecting mirror formed is excellent in surface coarseness. Accordingly, the reflection-type light emitting diode having such a reflecting mirror and being practical is provided.

The reflection-type light emitting diode may be constructed such that the light emitting element and a part of the lead portion are sealed, and a space around the light emitting element within the reflecting mirror is filed with transparent material. With the sealing of the light emitting element, there is no chance that the light emitting element is deteriorated by humidity. With the sealing of a part of the lead portion, the wire bonding is protectively isolated from exterior, thereby providing a reliable electric connection. Since the space around the light emitting element within the reflecting mirror is filled with the transparent material, the light radiation efficiency is improved. Thus, the light emitting element and the wire bonding are improved in reliability, and the reflection-type light emitting diode of higher external radiation efficiency is provided.

The reflecting mirror may be arranged so as to converge light from the light emitting element on an annular part in a plane containing the lead portion. Since the light is converged on an annular part on the plane containing the lead portion, the light may be converged on a portion around the light emitting element, not directly on the light emitting element. The light is interrupted at only two locations of the lead portion. Most of the remaining light is radiated from the radiation portion, resulting in providing high external radiation efficiency.

The reflecting mirror may be arranged so as to converge light from the light emitting element on a number of points in a plane containing the lead portion. Since the light from the light emitting element is converged on a number of points in a plane containing the lead portion, the light is converged on a portion except the light emitting element and the lead portions as well. Therefore, most of light emitted from the light emitting element is radiated outside, the external radiation efficiency is further improved.

The reflecting mirror of 5 mm or smaller in diameter may be used. Generally, light emitting element is approximately 0.3 mm×0.3 mm in size. The end of the lead on which the light emitting element of such a size is mounted is approximately 0.5 mm×0.5 mm. In the case of the reflection-type LED in which the reflecting mirror diameter is larger than 5 mm, the undesired effect of the light shielding for the light emitting element is negligible. There is eliminated the necessity of using the invention. In other words, at 5 mm or smaller of the diameter of the reflecting mirror, the undesired effect of the light shielding for the light emitting element becomes tangible. This hinders the size reduction of the reflection-type light emitting diode. In the reflection-type light emitting diode in which the diameter of the reflecting mirror is 5 mm or smaller, it is necessary to avoid the undesired effect of the light shielding for the light emitting element in a manner that it reflects the light of the light emitting element in such a direction as not to direct the light to the periphery of the light emitting element, and radiates the light outside. Thus, also in the reflection-type light emitting diode in which the diameter of the reflecting mirror is 5 mm or smaller and the undesired effect of the light shielding for the light emitting element is clearly present, it is able to maintaining high external radiation efficiency.

A fluorescent material, which responds to light of the light emitting element to emit fluorescence, may be provided near the light emitting element. To locate the fluorescent material near the light emitting element, an end of one of the leads is shaped like a cup. The light emitting element is mounted at the central part of the cup-like portion. A space around the light emitting element within the cup-like portion may be filled with the fluorescent material. By so doing, the area ratio of a light shielding portion by the cup-like portion receiving the fluorescent material becomes large even if the LED per se is not increased in size. In this connection, in the reflection-type light emitting diode of the invention thus constructed, light reflected by the reflecting mirror is radiated outside without reaching the periphery of the light emitting element. Therefore, there is no chance that light is interrupted by the cup-like portion receiving the fluorescent material. Accordingly, the reflection-type light emitting diode capable of maintaining a high external radiation efficiency is provided.

A plurality of light emitting elements may be used. To mount those light emitting elements, an end of one of the leads is also shaped like a cup. Those light emitting elements are placed on the bottom of the cup-like portion. A space around the light emitting elements within the cup-like portion is filled with diffusion material. By so doing, the area ratio of a light shielding portion by the cup-like portion receiving the plurality of light emitting elements becomes large even if the LED per se is not increased in size. In this connection, in the reflection-type light emitting diode of the invention thus constructed, light reflected by the reflecting mirror is radiated outside without reaching the periphery of the light emitting element. Therefore, there is no chance that light is interrupted by the cup-like portion receiving the plurality of light emitting elements. Accordingly, the reflection-type light emitting diode capable of maintaining a high external radiation efficiency is provided.

For the reflecting mirror, the invention may be implemented such that the reflecting mirror is formed with transparent material by molding, and a surface is worked for mirror. Where such a reflecting mirror is used, the resultant LED may be produced on the mass production basis, and the cost to manufacture the LED is reduced in cost.

The reflecting mirror may be formed with a metal plate configured concave or a plated concave metal plate. In this case, it is resistive to a temperature variation. Because of this, it never happens that the reflecting mirror is creased by temperature change, so that the mirror loses its function, although such a problem often arises in the reflecting mirror formed by vapor depositing metallic material on the resin surface. Therefore, it may be applied to a reflow furnace for surface mounting. Accordingly, it may be used as one of surface mounting parts without any restriction, so that it is suitable for such an application that a number of reflection-type LEDs are mounted. Particularly, the small reflection-type LEDs are in a great demand, as surface mounting parts. Accordingly, when reduced in size, it will be used as a practical reflection-type LED.

Figure 59A:
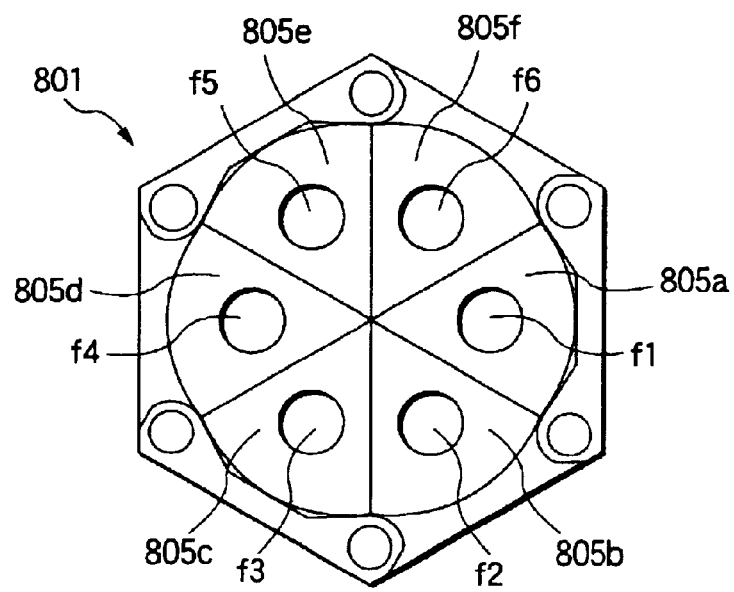
FIG. 59A is a plan view showing a light-shielding/reflection type light emitting diode which is a 24th embodiment of the invention, particularly showing relationships between a reflecting surface and radiation holes.
Figure 59B:
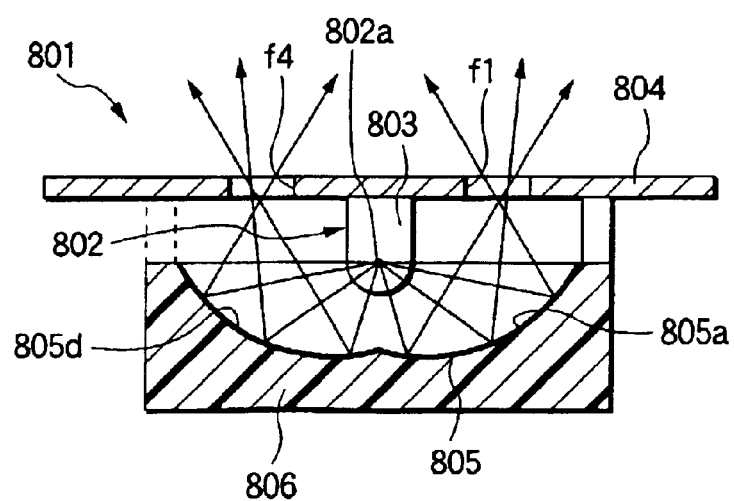
FIG. 59B is a cross sectional view showing an overall construction of the light-shielding/reflection type light emitting diode of the 24th embodiment.
Figure 60A:
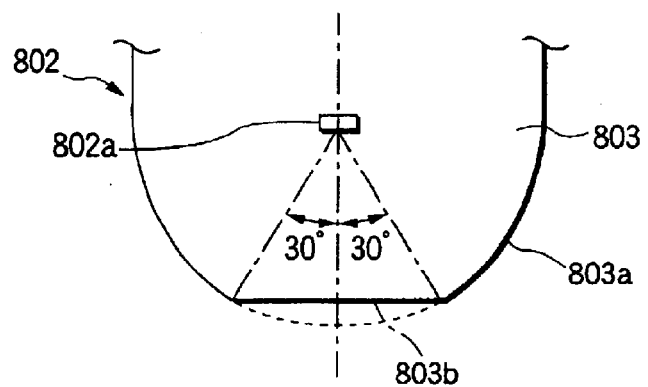
FIG. 60A is a front view showing a lens configuration in the light-shielding/reflectiion type light emitting diode of the 24th embodiment.

FIGS. 59 and 60 shows a light-shielding/reflection type light emitting diode 801 which constitutes a 24th embodiment of the invention. As shown, in the light-shielding/reflection type light emitting diode 801, a light source 802 is constructed as follows. Electric power is supplied to a light emitting element 802a by way of leads 803a and 803b. The light emitting element 802a is mounted on the lead 803a of those leads. The other lead 803b and the light emitting element 802a are electrically connected by a wire bonding manner. A lead portion thus arranged is encapsulated with transparent epoxy resin by molding, while forming a lens 803.

The light source 802 is mounted on a mounting board 804 which serves also as a light shielding member. A reflecting mirror 805, while facing the light source 802, is further mounted on the mounting board 804. Both sides of the mounting board 804 are colored black to have a light shielding function.

The reflecting mirror 805 is formed such that a concave surface of a base 806 of acrylic resin, formed by injection molding, is configured into a reflecting surface, and metal is vapor deposited on the resultant reflecting surface. The reflecting surface consists of six reflecting surfaces 805a to 805f, which are arrayed corresponding in position to six holes f1 to f6 as optical openings (apertures). Reflecting surfaces 805a to. 805f are respectively parts of spheroidal surfaces whose first focal points are each at a position of the light emitting element 802a and second focal points are the holes f1 to f6. Light that is emitted from the light source 802 and reflected by the reflecting surface 805a passes through the hole f1 and is radiated outside. The light reflected by the reflecting surface 805b passes through the hole f2; the light reflected by the reflecting surface 805c passes through the hole f3; the light reflected by the reflecting surface 805d passes through the hole f4; the light reflected by the reflecting surface 805e passes through the hole f5; and the light reflected by the reflecting surface 805f passes through the hole f6.

In the light-shielding/reflection type light emitting diode 801 thus constructed, most of light flux emitted from the light emitting element 802a is radiated through an interface of the lens 803 and reaches the reflecting mirror 805. The light having reached the spheroidal surfaces 805a to 805f passes through the hole positions f1 to f6 of the mounting board 804 and is radiated outside. At this time, a radiation angle of the radiated light is within an angle range ranging from the spheroidal surfaces 805a to 805f to the radiation holes f1 to f6. Accordingly, light is radiated outside at high efficiency and with high directivity.

Further, the light is radiated outside highly efficiently, so that the number of the light sources 802 used maybe reduced. Since one light source 802 emits six light fluxes, spatial intervals in the array of light sources 802 are increased. This feature will remarkably reduce temperature rise by heat generated. In this respect, the problem on heat generated is solved.

When the light-shielding/reflection type light emitting diode is in an off state, the light source 802 is not seen from the front. If external light enters the LED through the radiation holes f1 to f6, it reaches the inner side of the mounting board (mounting plate) 804 and is absorbed there. Accordingly, a contrast of the LED between its on- and off-states is large.

In the light-shielding/reflection type light emitting diode, if the number of light sources used is reduced and the spatial intervals in the light source array is increased, the six holes f1 to f6 are provided for one light source 802, and those sever as apparent light emitting points. Therefore, as described above, this feature also contributes to increase of the external radiation efficiency. Also when the light emitting element capable of producing a high output power will be realized in future, and the number of light sources within a predetermined area, a predetermined luminance is secured. Further, it looks attractive since those six light emitting points are used. Accordingly, it secures both the required light quantity and the attractive looking, while being used as a signal light of the energy saving type.

Figure 60B:
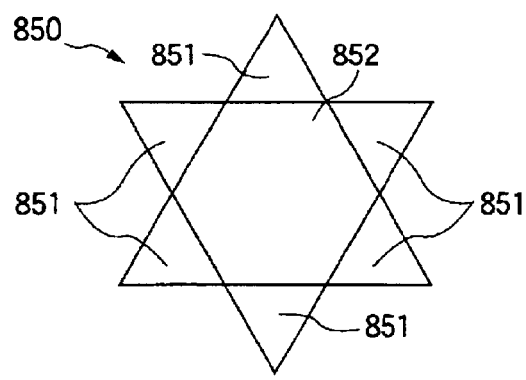
FIG. 60B is a diagram showing a radiation light pattern formed by the light-shielding/reflection type light emitting diode of the 24th embodiment.

A pattern of light radiated from the light-shielding/ reflection type light emitting diode 801, as shown in FIG. 60B, a star-like pattern 850 in which two regular triangles are superimposed one on the other in a state that those triangles are angularly shifted from each other at an angular interval of 60°. The "radiation light pattern" means a light pattern which is projected on a light shielding plate, which is located in the direction in which the light-shielding/ reflection type light emitting diode 801 emits light. In the star-like pattern 850, six top ends 851 are formed by light reflected from the central portions of the six reflecting surfaces 5a to 5f of the reflecting mirror 805. When the top end of the optical control surface (surface of the lens 803) of the light source 802 takes the form of a half-sphere with its center at which the light emitting element 802a is located, as indicated by a broken line and a solid line 803a, light is not refracted by the surface of the lens 803, and is radiated also right under the light emitting element 802a because of its light distribution characteristic of the light emitting element it self. Accordingly, the quantity of light reflected at the central portion of the reflecting mirror 805 is large. As a result, the six top ends 851 of the star-like pattern 850 is bright.

Where the light-shielding/reflection type light emitting diode 801 is applied to the signal light, the star-like pattern 850 in which light expands outward is not a desirable pattern. A desirable pattern is a circular light pattern in which light concentrates on the center. This may be achieved in a manner that a brightness of the central portion of the reflecting mirror 805 is set to be as high as possible, while a brightness of the six top ends 851 is set to be as low as possible. To this end, in the light-shielding/reflection type light emitting diode 801 of the 24th embodiment, a flat face 803b is formed at the top end of the lens 803 of the light source 802. The flat face 803b is perpendicular to the center line of the light emitting element 802a within a range of 30° with respect to the center line. With provision of the flat face 803b, the rays of light that are emitted downward from the light emitting element 802a, except the light rays proceeding on along the center line, are refracted outward. As a result, the quantity of light reflected by the central portion of the reflecting mirror 805 is remarkably reduced, and the six top ends 851 of the star-like pattern 850 are dark. Accordingly, the radiation light pattern can be made to close to the desired light pattern.

Figure 61:
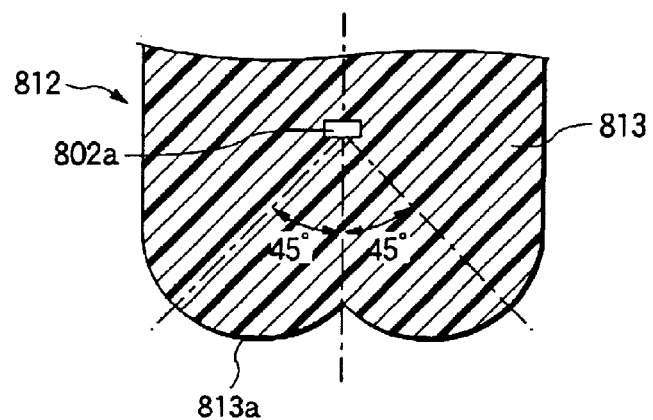
FIG. 61 is a cross sectional view showing a light source of a light-shielding/reflection type light emitting diode, which constitutes a 25th embodiment of the invention.

A 25th embodiment of the invention will be described with reference to FIG. 61. FIG. 61 is a partial, longitudinal cross sectional view showing a light source which is a light-shielding/reflection type light emitting diode forming the 25th embodiment of the invention. In the 25th embodiment, a light shielding plate (mounting board) 804, a reflecting mirror 805, and a base 806 are substantially the same as the corresponding ones in structure and configuration in the 24th embodiment. Difference of the 25th embodiment from the 24th embodiment resides in a lens configuration of the light source.

As shown FIG. 61, a lens 813 of a light source 812 of the 25th embodiment is configured to have a surface 813a, which is developed by revolving a line inclined at 45° with respect to the center axis of the light emitting element 802a in a plane including the center axis, about the center axis. The surface of the lens is shaped like a ring when viewed from top, with a depression formed in the central portion. The light emitting element 802a is encapsulated with transparent epoxy resin, and the lens 813 is formed thereon. Accordingly, a light distribution of the light source 812 is controlled by it. Light that is emitted from the light emitting element 802a in the center axial direction is refracted outward, and the light distribution is profiled so as to have a peak in the direction inclined at 45° with respect to the center axis. That is, an optical control surface 813a of the lens 813 made of transparent material converges light on an annular part, which is centered at the center axis of the light source 812.

Accordingly, light is little radiated onto the central portion of the reflecting mirror 805. As a result, the six top ends 851 of the star-like pattern 850 shown in FIG. 60B are darker. Thus, a radiation light pattern produced by the light-shielding/reflection type light emitting diode of the 25th embodiment is made close to the desired one.

Figure 62A:
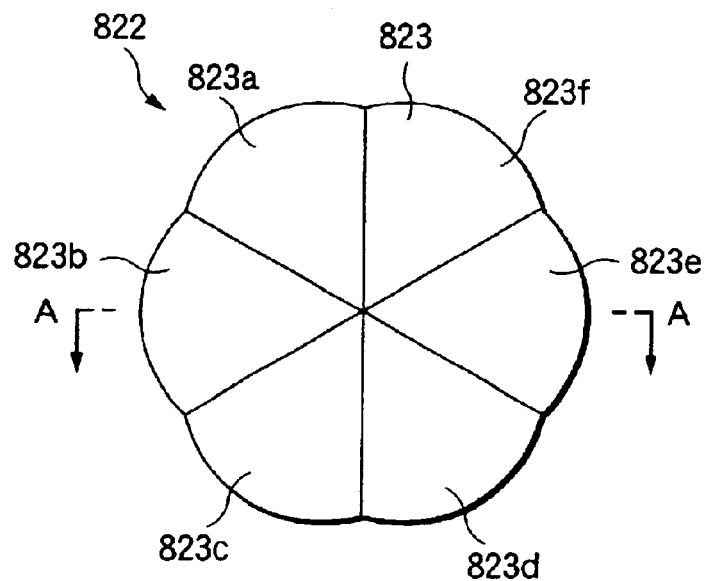
FIG. 62A is a bottom view showing a light source of a light-shielding/reflection type light emitting diode, which is the 26th embodiment.
Figure 62B:
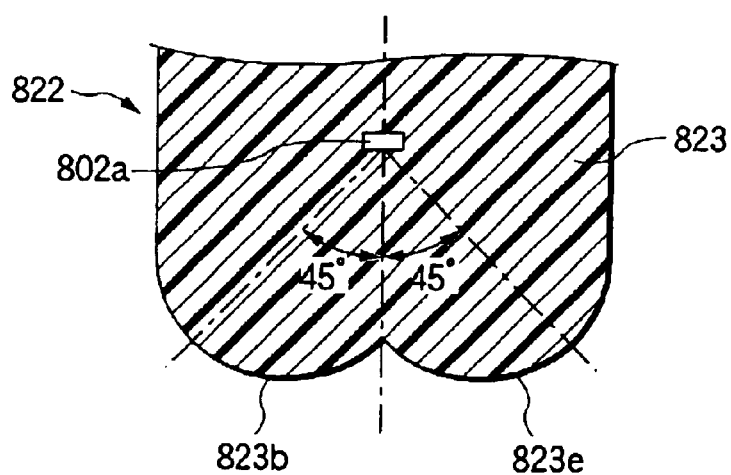
FIG. 62B is a partial longitudinal view taken along line A—A in FIG. 62A.

A 26th embodiment of the invention will be described with reference to FIG. 62. FIG. 62A is a bottom view showing a light source of a light-shielding/reflection type light emitting diode, which is the 26th embodiment. FIG. 62B is a partial longitudinal view taken along line A—A in FIG. 62A. In the 26th embodiment, a light shielding plate (mounting board) 804, a reflecting mirror 805, and a base 806 are substantially the same as the corresponding ones in structure and configuration in the 24th and 25th embodiments. Difference of the 26th embodiment from the 24th and 25th embodiments resides in a lens configuration of the light source.

As shown in FIG. 62A, a lens 823 of a light source 822 of the 26th embodiment is configured to have a reflecting surface consisting of six spheroidal surfaces 823a to 823f. A cross section of each surface, as shown in FIG. 62B, is configured such that light is converged in the direction slanted 45° with respect to the center axis. A light emitting element 802a is encapsulated with transparent epoxy resin, while forming a lens 823. In the lens 823, each of the surfaces 823a to 823f converges light in the direction of 45° with respect to the center axis of the light emitting element 802a. In other words, light is converged on six points when the lens is used.

Light emitted from the light source 822 reaches the central portion of each reflecting surfaces 805a to 805f of the reflecting mirror 805, and is reflected there at, and then is radiated through the corresponding one of the radiation holes f1 to f6. As a result, the star-like pattern of radiation light disappears, and a more desirable radiation light pattern is presented.

A 27th embodiment of the invention will be described with reference to FIGS. 63 to 66.

The 27th embodiment is different from the 24th to 27th embodiments in that a reflecting surface of a reflecting mirror is a spheroidal surface with respect to the center axis of the light emitting element.

Figure 63A:
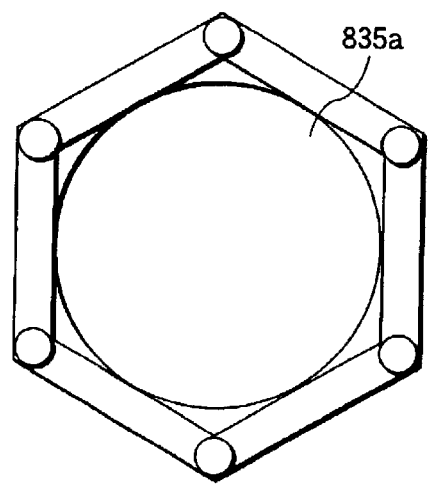
FIG. 63A is a plan view showing a reflecting mirror portion of a light-shielding/reflection type light emitting diode, which is a 27th embodiment of the invention.
Figure 63C:
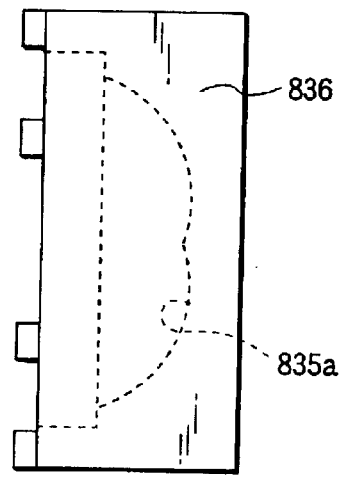
FIG. 63C is a side view showing the light-shielding/reflection type light emitting diode of FIG. 63A.
Figure 63B:
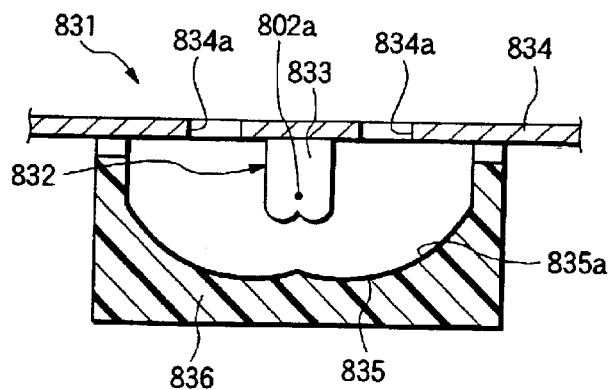
FIG. 63B is a cross sectional view showing an overall construction of the light-shielding/reflection type light emitting diode of FIG. 63A.

As shown in FIG. 63, in the light-shielding/reflection type light emitting diode 831, a light source 832 is constructed as follows. Electric power is supplied to a light emitting element 802a by way of leads. The light emitting element 802a is mounted on one of those leads. The other lead and the light emitting element 802a are electrically connected by wire bonding. A lead portion thus arranged is encapsulated with transparent epoxy resin by molding, while forming a lens 833.

The light source 832 is mounted on a mounting board 834 which serves also as a light shielding member. A reflecting mirror 835, while facing the light source 832, is further mounted on the mounting board 834. Both sides of the mounting board 834 are colored black to have a light shielding function.

The reflecting mirror 835 is formed such that a concave surface of a base 836 of acrylic resin, formed by injection molding, is configured into a reflecting surface, and metal is vapor deposited on the resultant reflecting surface. The reflecting surface of the reflecting mirror 835 is configured like an axially symmetrical shape developed when a part of an ellipse whose first focal is a position of the light emitting element 802a and second focal points are each a point in each of annular holes 834a bored in the mounting board 834, is revolved about the axial line of the reflection-type LED 831. Accordingly, light that is emitted from the light source 832 and reflected by the reflecting mirror 835 is converged on an annular part configured along the annular-holes 834a, and the converged one is radiated outside as it is.

Figure 64:
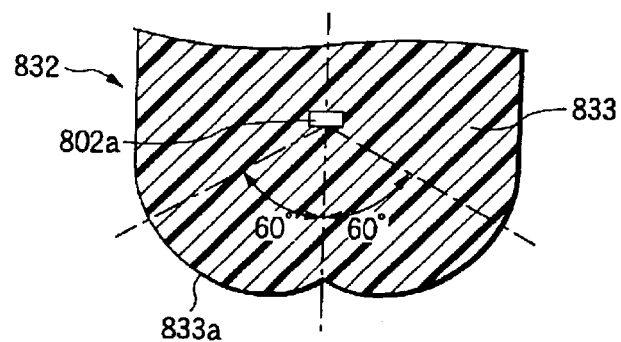
FIG. 64 is a cross sectional view showing a lens portion of a light source of a light-shielding/reflection type light emitting diode, which is the 27th embodiment.

As shown FIG. 64, a lens 833 of a light source 832 is configured to have a surface 833a, which is developed by revolving a line inclined at 60° with respect to the center axis of the light emitting element 802a in a plane including the center axis, about the center axis. The surface of the lens is shaped like a ring when viewed from top, with a depression formed in the central portion. The light emitting element 802a is encapsulated with transparent epoxy resin, and the lens 813 is formed thereon. Accordingly, a light distribution of the light source 832 is controlled by it. Light that is emitted from the light emitting element 802a in the center axial direction is refracted outward, and the light distribution is profiled so as to have a peak in the direction inclined at 60° with respect to the center axis. That is, an optical control surface 833a of the lens 833 made of transparent material converges most light flux emitted from the light emitting element 802a on an annular part.

Accordingly, light is little radiated onto the central portion of the reflecting mirror 835. Accordingly, light radiated from the annular holes 834a is not diverged outward, but directed mainly to the center axis of the light-shielding/reflection type light emitting diode 831. In this way, the amount of light reflected outward is reduced, and a desired radiation light pattern in which light is converged on the central portion is presented.

Figure 65A:
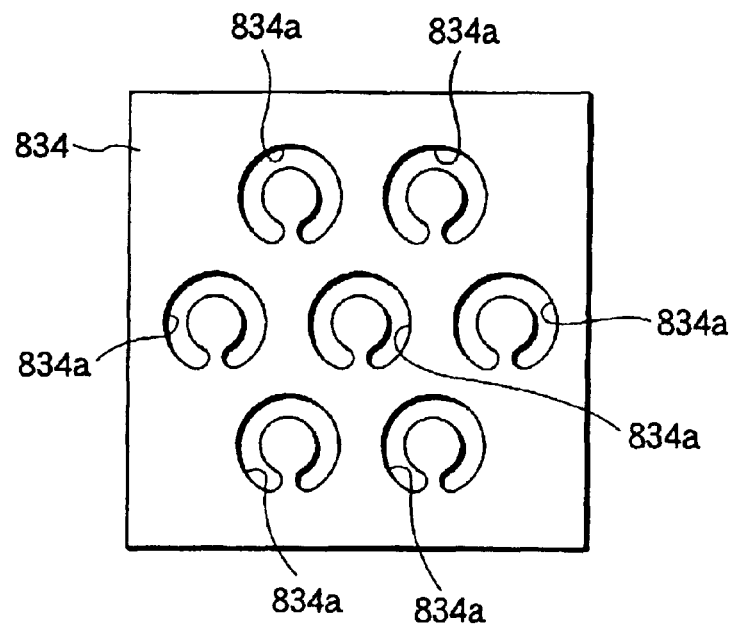
FIG. 65A is a plan view showing a light shielding member of the light-shielding/reflection type light emitting diode of the 27th embodiment.
Figure 65B:
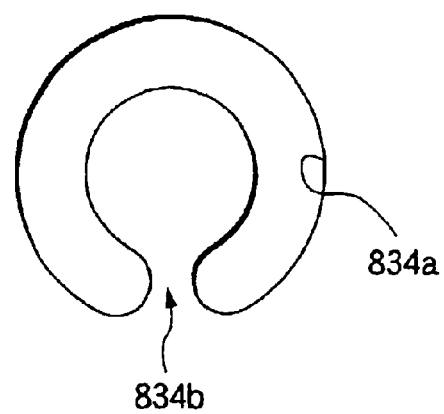
FIG. 65B is a plan view showing the detail of one optical opening in the light shielding member.

In the 27th embodiment, as shown in FIG. 65A, seven holes 834a, annular in shape, are bored in the mounting board 834 which serves also as a light shielding member. Seven light-shielding/reflection type light emitting diodes 831 are provided on the rear side of the mounting board 834 at positions corresponding to the annular holes 834a. FIG. 65B typically shows one annular hole 834a in an enlarged fashion. Light is interrupted by the mounting board 834 at a portion 834b which separates the annular hole. However, when viewed from the front side, the annular holes is seen as if the portion 834b emits light since light emitted from the light emitting element 802a is radiated while being controlled in light distribution by the lens 833 and the reflecting mirror 835. That is, it is seen as if a perfect ring of light is radiated.

Thus, in the light-shielding/reflection type light emitting diodes 831 of the 27th embodiment, the light source 832 has a structure capable of increasing an apparent light source, and the amount of light radiated outward is reduced while light is converged on the central portion. Therefore, a luminous intensity at the center axis is increased. This implies that the number of the light sources 832 may be reduced while not impairing the good appearance. For this reason, the light-shielding/reflection type light emitting diode of the embodiment will find various applications including signal lights of the energy saving type.

A view of light presented when the light-shielding/reflection type light emitting diode of each of the 24th to 27th embodiments thus far described will be described with reference to FIG. 66. FIGS. 66A to 66c show signal lights each using 20 light sources. In the signal light of FIG. 66A, conventional light-shielding/reflection type light emitting diodes (light sources) are merely arrayed. In the signal light of FIG. 66B, light-shielding/reflection type light emitting diodes (801, 811, 821) of any of the 24th to 26th embodiments is arrayed. In the signal light of FIG. 66C, the light-shielding/reflection type light emitting diodes of the 27th embodiment are arrayed.

Figure 66A:
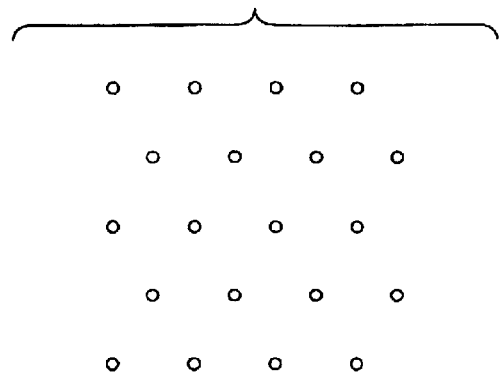
FIG. 66A is a diagram for explaining a conventional signal light when viewed from the front.
Figure 66B:
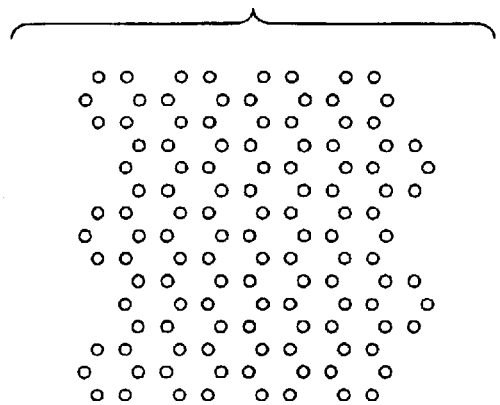
FIG. 66B is a diagram for explaining a state of lighting of a signal light which is constructed by using light-shielding/reflection type light emitting diode of any of the 24th to 26th embodiments.
Figure 66C:
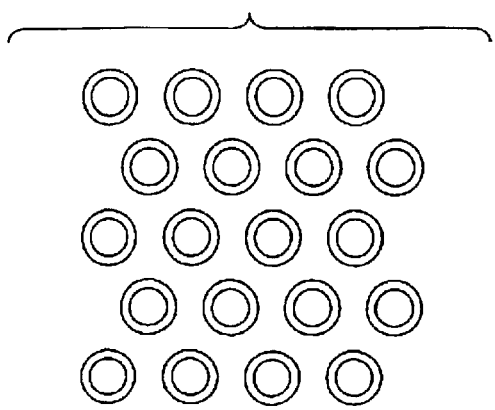
FIG. 66C is a diagram for explaining a state of lighting of a signal light which is constructed by using light-shielding/reflection type light emitting diode of the 27th embodiment.

In the case of the FIG. 66A where the lens-type LEDs are merely arrayed, the LEDs are arrayed coarsely. Accordingly, the signal light looks unattractive. In the case of FIG. 66B in which the light-shielding/reflection type light emitting diodes (801, 811, 821) are arrayed, one light source consists of six light emitting points. Accordingly, it looks nice and its luminance is high. In the case of FIG. 66C in which the light-shielding/reflection type light emitting diodes 831 are arrayed, light is emitted like rings and hence its appearance is extremely excellent. The luminance is also high. Thus, the light-shielding/reflection type light emitting diodes 801, 811, 821, 831 of the 24th to 27th embodiments have each a radiation characteristic and a light distribution characteristic, which are suitable for the signal light.

Figure 67A:
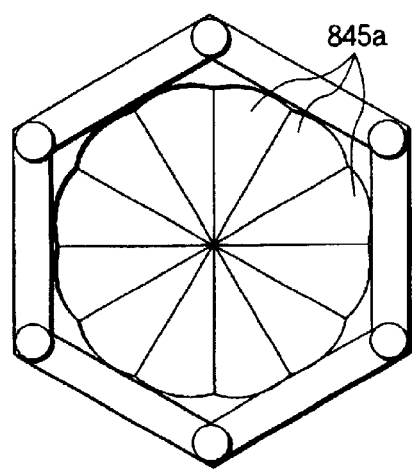
FIG. 67A is a plan view showing a reflecting mirror portion of a light-shielding/reflection type light emitting diode according to the 28th embodiment.
Figure 67C:
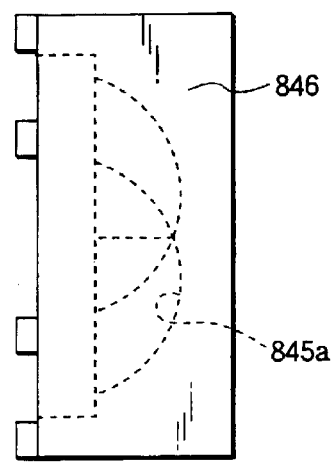
FIG. 67C is a side view of the light-shielding/reflection type light emitting diode of FIG. 67A.
Figure 67B:
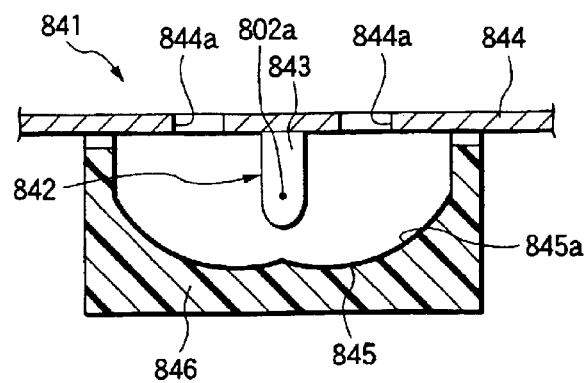
FIG. 67B is a cross sectional view showing an overall construction of the light-shielding/reflection type light emitting diode of FIG. 67A.

A 28th embodiment of the invention will be described with reference to FIG. 67. FIG. 67A is a plan view showing a reflecting mirror portion of a light-shielding/reflection type light emitting diode according to the 28th embodiment. FIG. 67B is a cross sectional view showing an overall construction of the light-shielding/reflection type light emitting diode of FIG. 67A. FIG. 67C is a side view of the light-shielding/reflection type light emitting diode of FIG. 67A.

As shown in FIG. 67, in the light-shielding/reflection type light emitting diode 841, a light source 842 is constructed as follows. Electric power is supplied to a light emitting element 802a by way of leads. The light emitting element 802a is mounted on one of those leads. The other lead and the light emitting element 802a are electrically connected by wire bonding. A lead portion thus arranged is encapsulated with transparent epoxy resin by molding, while forming a lens 843.

The light source 842 is mounted on a mounting board 844 which serves also as a light shielding member. A reflecting mirror 845, while facing the light source 842, is further mounted on the mounting board 834. Both sides of the mounting board 844 are colored black to have a light shielding function.

The reflecting mirror 845 is formed such that a concave surface of a base 846 of acrylic resin, formed by injection molding, is configured into a reflecting surface, and metal is vapor deposited on the resultant reflecting surface. The reflecting surface of the reflecting mirror 845 is configured to consist of 12 number of reflecting surfaces 845a, which correspond in position to holes 844a as 12 number of optical openings, bored in the mounting board 844. Each of the reflecting surfaces 845a consists of a part of a spheroidal surface whose first focal point is located at a position of the reflecting surfaces 845a, and second focal point is located at a position of the corresponding one of the 12 number of the holes 844a those reflecting surfaces 845a are combined to form a reflecting surface of the reflecting mirror 845.

The lens 843 of the light source 842 is configured like a converging lens shaped like a spheroidal surface in which its top end is converged in the axial direction. The top end of the lens is not flat while the top end of the lens 803 in the already described embodiment is flat. Accordingly, light that is emitted from the light source 802a is converged by the lens 843, while at the same time, it is radiated also to the central portion of the reflecting mirror 845. As a result, a radiation light pattern of the light-shielding/reflection type light emitting diode 841 of the 28th embodiment is a star-like pattern with 12 number of aristae. Since the top end of the lens 843 is configured like a converging lens, a large amount of light is radiated toward the central portion of the reflecting mirror 845. Therefore, the twelve aristae of the star-like pattern is bright.

Accordingly, the light-shielding/reflection type light emitting diode 841 of the 28th embodiment is suitable for a display for projecting a star-like pattern on a screen rather than the signal like, unlike those LEDs of the 24th to 27th embodiments.

In the light-shielding/reflection type light emitting diode 841 of the embodiment will find many other applications than the light source if the optical control surface of the lens of the light source is so varied.

In each above-mentioned embodiment, the reflecting mirror is formed such that a concave surface of the base (806, 836, 846) of acrylic resin, formed by injection molding, is configured into a reflecting surface, and metal is vapor deposited on the resultant reflecting surface. The reflecting mirror may be formed by shaping a metal plate concave by pressing or by plating a concave surface of a metal mirror. The base may formed of polycarbonate resin, in place of acrylic resin.

In each embodiment mentioned above, the optical openings onto which the reflecting light is radiated are through holes. If required, those through holes may be filled with transparent material. By so done, dust proof performance is secured. In an alternative, an optical element, such as a lens, maybe placed in each through hole.

The reflecting surface may take any other configuration than the above-mentioned ones. The reflecting surface may be configured so that light is radiated in the form of two rings coaxially arrayed.

As seen from the foregoing description, the light-shielding/reflection type light emitting diode of the invention comprises: a light source encapsulated with transparent material with an optical control surface formed thereon; a reflecting mirror, provided facing said light source, for converging light emitted from said light source on at least two points; and an optical unit member with optical openings which allow the converged light to pass therethrough.

In the light-shielding/reflection type light emitting diode thus constructed, light that is emitted from the light source and converged by the optical control surface is converged, by the reflecting mirror, on at least two points, and the converged light is radiated through the optical openings of the light shielding member. Accordingly, most of light emitted from the light source is radiated through the optical openings. This accrues to high external radiation efficiency. One light source has at least two light emitting points. Accordingly, the number of light sources may be reduced correspondingly. Spatial intervals among the light sources are increased, so that temperature rise by the heat generated is suppressed. If external light enters the LED through the optical openings, it is reflected to the light source by the reflecting-mirror, and is absorbed by the light shielding member. As a result, no external light having entered the LED is returned outside. This results in providing a high contract between the on- and off-states. Light rays emission from at least two light emitting point are radiated from the optical openings, so that the radiation light looks nice, not sparsely.

Thus, the external radiation efficiency of the light-shielding/reflection type light emitting diode is high and the LED is not heated to high temperature. The contract between the on- and off-states is high. The signal light, which is constructed using the light-shielding/reflection type light emitting diodes, looks attractive.

In the light-shielding/reflection type light emitting diode thus constructed, the light shielding member includes a plurality of optical openings, and a reflecting surface of the reflecting mirror is defined by a field of sets of a plurality of spheroidal surfaces each having focal points located at the light source and the optical opening.

Light that is emitted from the light source and reflected by a reflecting surface of a part of a spheroidal surface is radiated from the corresponding optical openings. Accordingly, a high external radiation efficiency is obtained. Further, light is radiated from a plurality of optical openings by using a single light source. Accordingly, the number of light sources may be reduced correspondingly. Spatial intervals among the light sources are increased, so that temperature rise by the heat generated is suppressed. If external light enters the LED through the optical openings, it is reflected to the light source by the reflecting mirror, and is absorbed by the light shielding member. As a result, no external light having entered the LED is returned outside. This results in providing a high contract between the on- and off-states. The plurality of optical openings are arrayed such that those are located at the vertices of a polygon, which is centered at the light source. This makes the look of the LED more attractive.

Thus, the external radiation efficiency of the light-shielding/reflection type light emitting diode is high and the LED is not heated to high temperature. The contract between the on- and off-states is high. The signal light, which is constructed using the light-shielding/reflection type light emitting diodes, looks attractive.

The light shielding member includes annular optical openings. A reflecting surface of the reflecting mirror is configured as a surface developed by revolving a part of an ellipse which focal points are located at the positions of the light source and the optical openings about the center axis.

Light that is emitted from the light source and reflected by the reflecting mirror having such a reflecting surface is converged on an annular part configured along the annular optical openings arrayed. Accordingly, light emitted from the light-shielding/reflection type light emitting diode takes the form of a ring, and it looks attractive.

An optical control surface made of the transparent material converges light from the light source on an annular part.

In the light-shielding/reflection type light emitting diode, the reflecting light must be made to pass through the optical openings formed in the light shielding member. Then, some limitation is put on the design of the light distribution. In one embodiment of the light-shielding/reflection type light emitting diode, a reflecting surface of the reflecting mirror is defined by a field of sets of a plurality of spheroidal surfaces each having focal points located at the light source and the optical opening. The reflecting mirror is defined by a field of sets of a plurality of spheroidal surfaces. Accordingly, the radiation light pattern takes the form a star-like pattern with aristae whose number is equal to the number of the spheroidal surfaces. The star-like patter in which light radially outward expends to form the aristae of light is not desirable for a light emitting body which requires the largest amount of light to be converged on the central portion. The aristae of the star-like pattern consist of light reflected by the central portion of the reflecting mirror.

In the optical control surface which is made of transparent material and converges light from the light source on an annular part, no light is present on the central portion of the reflecting mirror. As a result, the aristae of the star-like pattern is dark, while light is converged on the central portion. Accordingly, a desired light pattern is formed.

Thus, the optical control surface made of transparent material converges light from the light source on an annular part. As a result, in the light-shielding/reflection type light emitting diode in which some limitation is present in designing the light distribution, a desired radiation light pattern may be formed.

Figure 68:
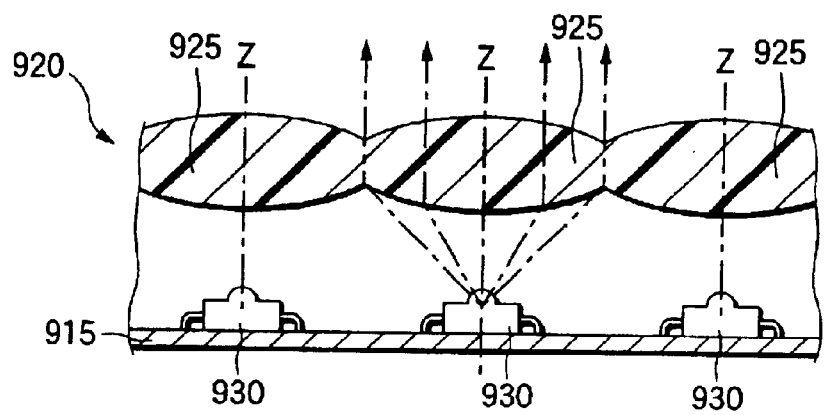
FIG. 68 is a longitudinal sectional view showing a light source device which is a 29th embodiment of the invention (taken along line I—I in FIG. 69)
Figure 69:
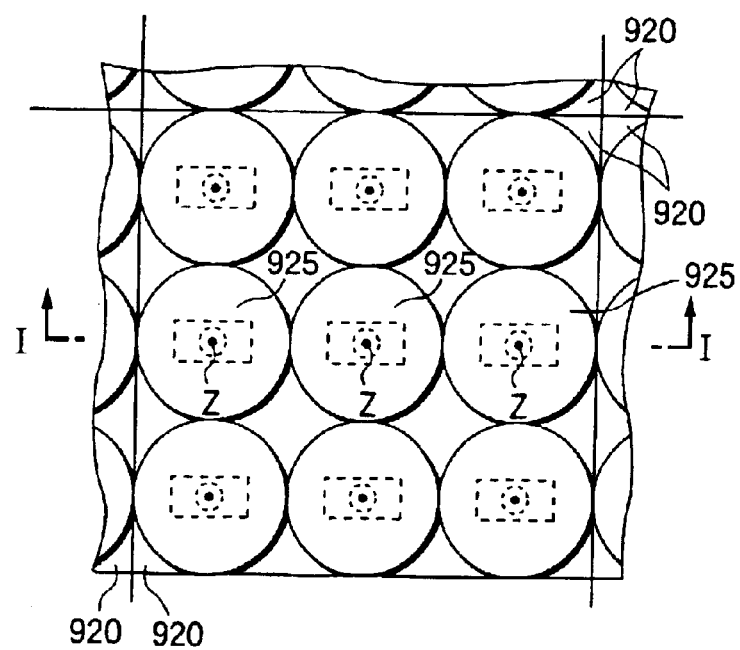
FIG. 69 is a plan view showing a part of one of optical unit members in the light source device of the 29th embodiment.

FIGS. 68 and 69 show a light source device which may be used for an illumination light source, and is a 29th embodiment of the invention. The light source device is made up of a single board 915, and optical unit members 920 as a plurality of optical element groups. The optical unit members 920 are located a predetermined distance apart from a plurality of light emitting diodes (LEDs) 930 mounted on the board 915 in the light radiation direction in which the LEDs emit light. A plurality of light transmission lenses (outer lenses) 925 as optical means are fabricated into one unit member. This unit member is the optical unit member 920.

As shown in FIG. 68, a plurality of LEDs 930 are horizontally arrayed on the board 915 while being spaced from each other by a predetermined distance. An axial line of each LED 930 is denoted as Z. The outer lenses 925 are arrayed in a matrix fashion in the optical unit member 920.

The axial line Z is located at each matrix point of the matrix.

Figure 70:
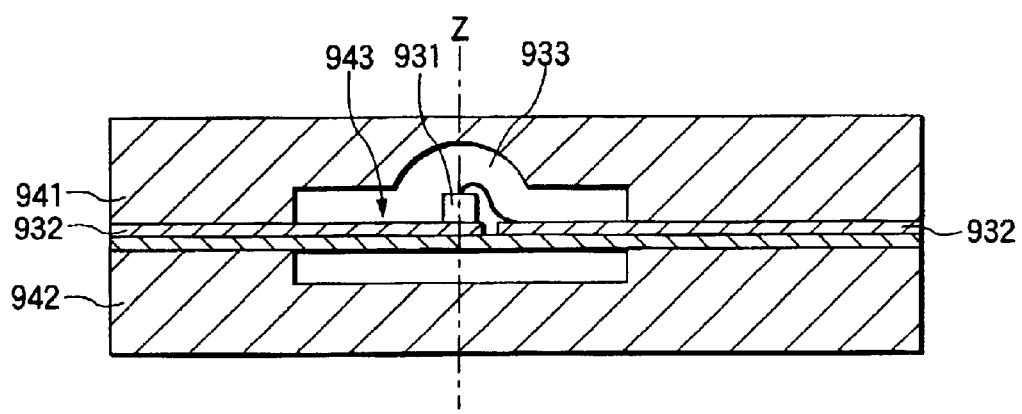
FIG. 70 is a cross sectional view showing a part of a transfer mold.

The LEDs 930 are of the lens-type and manufactured by a transfer molding process. In the transfer molding process, as shown in FIG. 70, a mount of a semiconductor light emitting element 931 and a lead after wired bonded or a lead frame 933 are placed in a cavity 943 (shaping chamber), which is formed between upper and lower mold elements 941 and 942. Then, liquid state transparent material (e.g., transparent epoxy resin) 933 is injected into the cavity, and thermally hardened. As a result, a light emitting element (LED) in which the light emitting element 931 is encapsulated within the transparent material 933. The liquid state transparent material may be injected into the cavity 943 along the lead frame 932.

The LED 930 manufactured by the FIG. 70 process is such that a pair of leads 932, which are electrically connected to the light emitting element 931 encapsulated within he light emitting element 931, extend to the right and left (in the direction perpendicular to the axial line Z). The transparent material covering the light emitting element 931 functions as a kind of converging lens.

The LEDs 930 are surface mounted on a surface (a power feeding pattern (not shown) is formed in advance) of the board 915 by use of a cream solder or the like. The "surface mount" means the following sequential operations: to heap up cream solder on a power feeding pattern exposed on the board 915, to bury the leads 932 derived from each LED 930 in the cream solder, and to heat the whole board 915 in a reflow furnace to harden the solder, whereby the leads 932 is electrically connected to the power feeding pattern, and the LED 930 is fastened to the board 915.

As shown in FIG. 69, each of the optical unit members 920 is square when viewed from top. Those optical unit members 920 thus shaped are arrayed vertically and horizontally. The shape and area of the thus arrayed optical unit members 920 are substantially equal to those of the single board 915. In other words, the optical unit member 920 is designed such that when a predetermined number of the optical unit members 920 are combined in a predetermined array, the resultant array of the optical unit members corresponds to the board 915 in shape and size. In the embodiment, one optical unit member 920 consists of a total of nine outer lenses 925, which are arrayed in a matrix of 3 columns and 3 rows. Within a square area of the board 915 corresponding to one optical unit member 920, nine LEDs 930 are contained which are arrayed in a matrix of 3×3. The LEDs 930 on the board 915 are positioned relative to the outer lenses 925 in one-to-one correspondence.

Each outer lens 925 takes the form of a concave lens which refracts light rays emitted from the corresponding LED 930 into parallel rays parallel to the axial line Z. A light distribution of light rays transmitted through the outer lens may be controlled by appropriately varying the concave profile and the optical characteristics of the outer lens 925, as a matter of course. To render the converging effect of the outer lens 925 effective and to secure a satisfactory mounting number of density on the board 915, it is preferable that an area of the outer lens 925 is selected to be at least four times as large as a radiation area of the corresponding LED 930.

The 29th embodiment has the following effects.

1) In the LED 930 manufactured by the transfer molding process, a positional relationship between the light emitting element 931 and a half-sphere lens portion made of transparent material covering it is high in accuracy. In other words, the center axis of the lens portion of the LED 930 is exactly coincident with the center axis of a radiation light ray emitted from the light emitting element 931. For this reason, the LED 930 per se is excellent in light distribution characteristic.

2) In the LED 930 manufactured by the transfer molding process, the leads 932 extend in a direction substantially perpendicular to the axial line Z of the LED 930. Accordingly, it is easy to surface mount the LEDs on the board 915, and hence the LEDs may be automatically mounted at high density by use of an automatic mounting machine. For this reason, an arraying accuracy of the LEDs 930 on the board 915 is increased, so that a light distribution characteristic of the light source device is improved as a whole.

3) Light emitted from the light emitting element 931 of each LED 930 is radiated outside through two steps of light distribution controls, a distribution control by the outer lens 925 and a distribution control by the corresponding outer lens 925. Accordingly, there is no need of excessively increasing the directivity of the half-spherical lens portion. Generally, when the directivity of the lens-type LED per se for light rays is excessively increased, there is a tendency of reducing the external radiation efficiency of one LED. In this connection, in the embodiment, there is no need of excessively increasing the light directivity of the LED 930, and the light distribution control of the LED may be supplemented with the outer lens 925. Therefore, the external radiation efficiency of the whole light source device is improved. Further, since the distribution control in the embodiment is carried out in two steps, it is easy to profile the distribution characteristic of the light source device in curve as desired.

4) The light distribution control of the LED may be supplemented with the outer lens 925, as just mentioned. Therefore, the LEDs may be manufactured as small separate resin products. Those LEDs are separately mounted on the board 915. Accordingly, thermal expansion and compression of the resin of the LED, which take place in the heating of them within the reflow furnace and the subsequent cooling, may be suppressed to be small. Therefore, in the LEDs 930 thus produced, there is less danger that the bonding wires are disconnected through the thermal expansion and compression of the resin.

5) The LEDs 930 are surface mounted on the board 915. With this feature, the LEDs may automatically be mounted by using the automatic mounting machine, with the increased number of the LEDs mounted per unit area. Further, the mounted LEDs may be uniformized in mounting height and angle with respect to the board 915. Additionally, one optical unit member 920 contains nine outer lenses 925 corresponding to nine LEDs 930 mounted on the board 915. An array of the optical unit members 920 is confronted with one board 915. In other words, relative positions of the outer lenses 925 provided in the optical unit member 920 are fixed in advance every optical unit member. Therefore, if those optical unit members are accurately arrayed, the LEDs 930 on the board 915 are accurately positioned relative to the outer lenses 925 of the optical unit members 920 arrayed in one-to-one correspondence. As a result, light rays emitted from each LED 930 may be distribution controlled as desired by the corresponding outer lens 925, and the optical characteristic of the whole light source device may be approximated to the theoretical one.

As described above, the LEDs 930 are surface mounted on the board 915, and further nine outer lenses 925 are fabricated into one optical unit member 920. By the synergy effect of those features, the distribution characteristic of the light source device is improved and an effective mass production of the light source devices (the work time reduction and labor saving) is attained.

Figure 71:
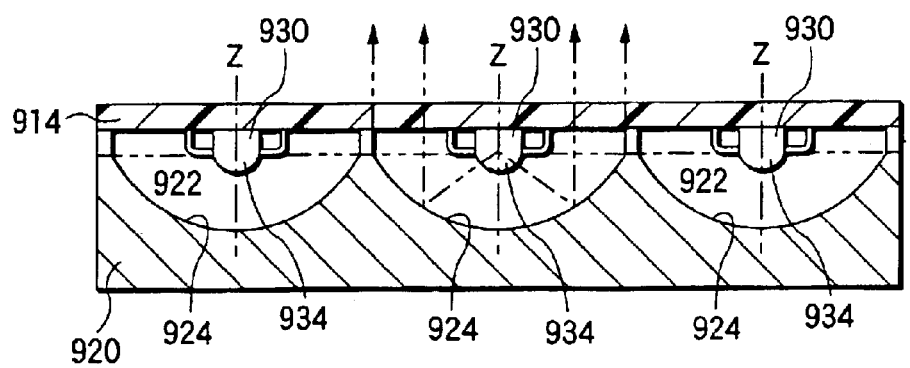
FIG. 71 is a cross sectional view showing a light source device which is 30th embodiment of the invention, the view corresponding to the FIG. 68 view.

FIG. 71 shows a light source device which may be used for an illumination light source, and is a 30th embodiment of the invention. The light source device is made up of a single transparent board 914, and a plurality of optical unit members 920 which are located a predetermined distance apart from the transparent board 914. Each optical unit member 920 is a unit member containing a plurality of reflecting concave surfaces 924 as optical means.

A power feeding pattern (not shown) is printed on the underside (confronted with the optical unit member 920) of the transparent board 914 made of transparent material by screen printing. As in the 29th embodiment, the LEDs 930 are arrayed in a matrix fashion so that the axial line Z of each LED is at a matrix point of the matrix.

The LEDs 930 used in the embodiment are manufactured by the transfer molding process. Each LED 930 includes a half-spherical light emitting portion 934. A semiconductor light emitting element (not shown) is positioned at the center of the light emitting portion 934. Rays of light emitted from the light emitting element are incident on the surface of the light emitting portion 934 at right angles. Accordingly, when the right rays are radiated outside from the half-spherical surface, those are not refracted.

Also in the embodiment, each optical unit member 920 is square as viewed from front, an array of the optical unit members 920 is separated from the single transparent board 914 by a predetermined distance. Difference of this embodiment from the 29th embodiment resides in that a plurality of reflecting concave surfaces 924 are formed in each optical unit member 920, which the reflecting concave surfaces 924 serve as optical means, which are positioned relative to the LEDs 930 on the transparent board 914 in one-to-one correspondence.

One optical unit member 920 contains nine reflecting concave surfaces 924 arrayed in a matrix of 3×3. Each reflecting concave surface 924 is defined in configuration by a spheroidal surface, which is developed by revolving an elliptical line whose focal point is at the light emitting center of the corresponding LED 930 about the axial line Z of the LED 930. With the thus configured reflecting concave surface, when light emitted from the LED 930 located at the focal point of the spheroidal surface is reflected by the reflecting concave surface 924, the reflected light rays are parallel to the axial line Z and directed to the transparent board 914. The reflecting light distribution may be varied by using a reflecting surface so configured. The reflecting concave surface 924 maybe formed by mirror finishing a metal surface or forming a metal film by physical or chemical vapor deposition process.

A distance between the transparent board 914 and the array of the optical unit members 920 is selected such that the light emitting portion 934 of each LED 930 is located within a concave portion 922 whose inner wall forms the reflecting concave surface 924. With this, light laterally (horizontally) emitted from each LED 930 is also received by the reflecting concave-surface 924, thereby making the light radiate outside.

The 30th embodiment has the following effects.

1) As in the 29th embodiment, the transfer molding process is used for manufacturing the LEDs 930. Accordingly, the distribution control of the LED per se is improved. The surface mounting of the LEDs by using the automatic mounting machine is possible. An efficient mass production of the LEDs is realized while improving the distribution characteristic of the whole light source device.

2) A distance between the transparent board 914 and the array of the optical unit members 920 is selected such that the light emitting portion 934 of each LED 930 is located within a concave portion 922 of the optical unit member 920. Therefore, most of light emitted from the LED 930 is reflected by the reflecting concave surface 924 and radiated outside. Accordingly, the external radiation efficiency of the light source device is improved. Incidentally, in the embodiment, the LEDs 930 are surface mounted on the transparent board 914. This makes it easy to arrange the transparent board 914 and the array of the optical unit members 920 close to each other.

Figure 72:
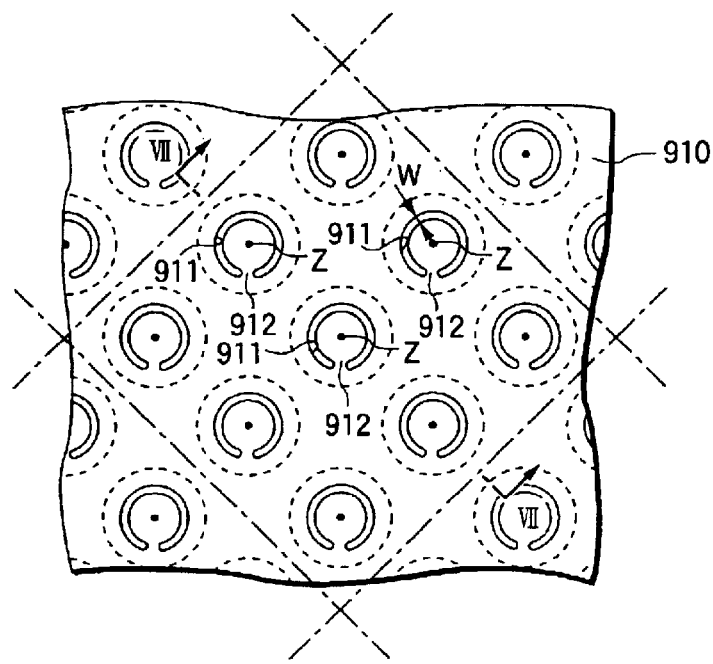
FIG. 72 is a plan view showing a part of a board used in the light source device of the 31th embodiment.
Figure 73:
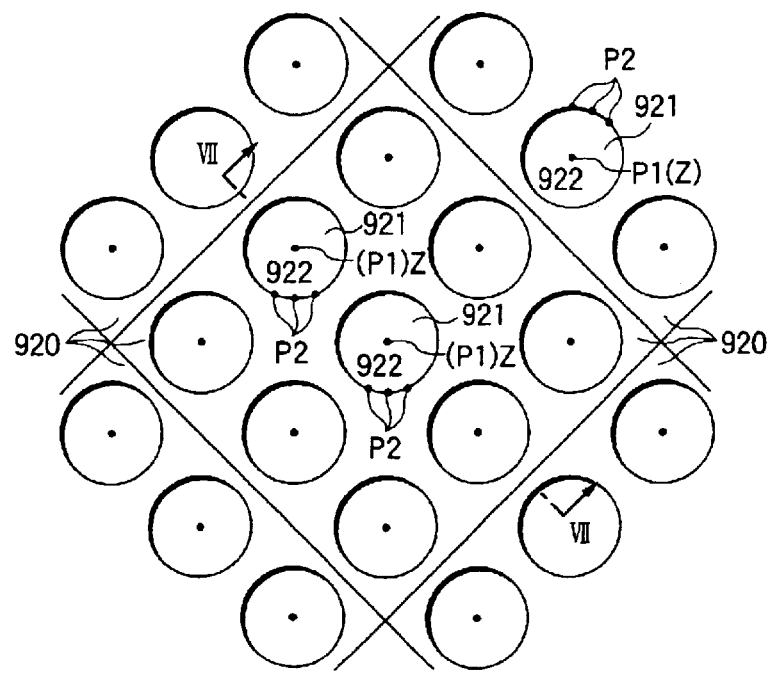
FIG. 73 is a plan view showing apart of an array of optical unit members used in the light source device of the 31th embodiment.
Figure 74:
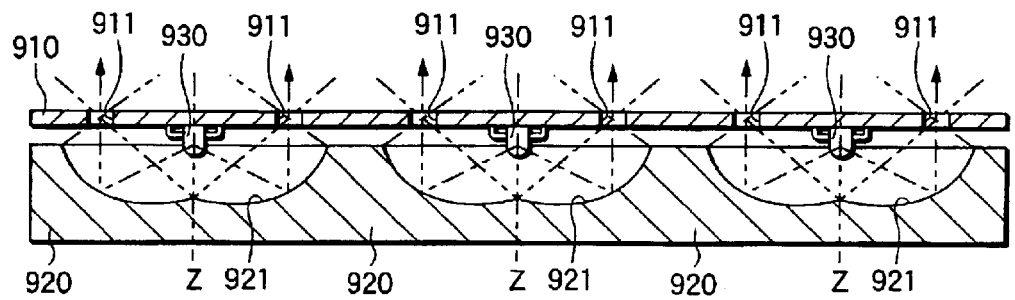
FIG. 74 is a cross sectional view taken along line VII—VII in FIGS. 72 and 73.

FIGS. 72 to 76 show a light source device which may be used for an illumination light source, and is a 31st embodiment of the invention. As shown in FIGS. 72 through 74, the light source device is made up of a single board 910, and a plurality of optical unit members 920 which are located a predetermined distance apart from the single board 910. Each optical unit member 920 is a unit member containing a plurality of reflecting concave surfaces 921 as optical means.

Figure 75:
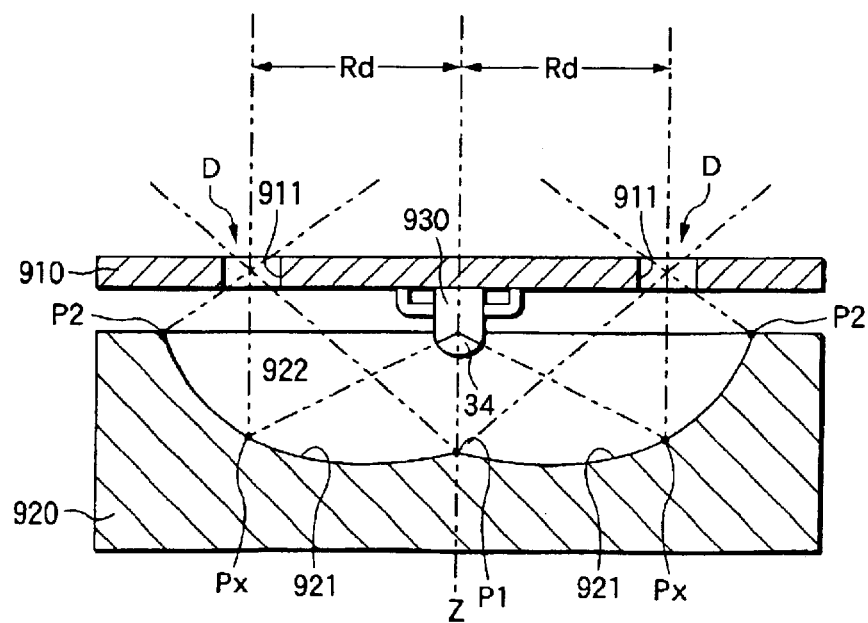
FIG. 75 is an enlarged, cross sectional view showing a part of the FIG. 74 structure.

A power feeding pattern (not shown) is printed on the underside (rear side) of the single board 910 by screen printing. A plurality of LEDs 930 are surface mounted on the power feeding pattern. As shown in FIGS. 72 and 73, the LEDs are arrayed in a matrix fashion so that the axial line Z of each LED is at a matrix point of the matrix. Also in the embodiment, the LEDs 930 are manufactured by the transfer molding process. As shown in FIG. 75, each LED has a half-spherical emitting portion 934 as of the 30th embodiment.

As shown in FIG. 73, each of the optical unit members 920 is square when viewed from top. Those optical unit members 920 thus shaped are arrayed vertically and horizontally. The shape and area of the thus arrayed optical unit members 920 are substantially equal to those of the single board 910. In other words, the optical unit member 920 is designed such that when a predetermined number of the optical unit members 920 are combined in a predetermined array, the resultant array of the optical unit members corresponds to the board 910 in shape and size.

As shown in FIGS. 72 and 73, a total of nine LEDs 930 are located on the single board 910 which is confronted with the optical unit member 920. Those nine LEDs 930 are arrayed into a matrix of 3 (rows)×3 (columns) within a square area (indicated by a one-dot chain line in FIG. 72), which is confronted with the single board 910. A total of nine outer lenses 921 are formed in the upper side (opposed to the single board 910) of the optical unit member 920, while corresponding to the nine LEDs 930 under control of the optical unit member 920.

FIG. 75 shows one reflecting concave surface 921, an LED 930 associated therewith, and the single board 910. As shown in FIG. 75, an annular reflecting concave surface 921, which is developed about the axial line Z of the associated LED 930, is formed in the optical unit member 920. The reflecting concave surface 921 is three dimensionally configured to be a spheroidal surface, which is developed by revolving an elliptical arc (i.e., a curve ranging from a center point P1 to an outer edge point P2) about the axial line Z in a cross section of the reflecting concave surface, which is depicted about the axial line Z. The elliptical arc has a first focal point at the LED 930 and a second focal point at a converging area D in the cross section. In other words, a field of sets of curves each ranging between the points P and P1 forms one three dimensional reflecting concave surface 921. The reflecting concave surface 921 has a solid angle of about $2\pi$ (strad) with respect to the LED 930.

A distance between the single board 910 and the array of the optical unit members 920 is selected such that the light emitting portion 934 of each LED 930 is located within a concave portion 922 whose inner wall forms the reflecting concave surface 0.921. Thus, the light emitting portion 934 is completely within the concave portion 922. Accordingly, most of light emitted from the light emitting element that is located at the center of the light emitting portion 934 reaches the reflecting concave surface 921 and is reflected there.

The reflecting concave surface 921 takes a three dimensional form, which is developed by revolving about the axial line Z an elliptical arc whose first focal point is at the position of the LED 930 and second focal point is at the position of the converging area D in a cross section of the reflecting concave surface, which is depicted about the axial line Z. As shown in FIG. 75, if light is reflected at any point on the curve ranging from the center point P1 to the outer edge point P2 of the reflecting concave surface 921, light is converged on the ring-like converging area D (with the radius Rd) about the axial line Z.

A plurality of optical openings (apertures) 911 each of which has a width W and is set along an arc (of the radius Rd) developed about the axial line Z of the reflecting concave surface 921 are formed in the single board 910. The radius Rd of the arc used as a reference for forming the optical opening 911 is substantially equal to the radius Rd of the annular converging area D. Then, the distance between the single board 910 and the array of the optical unit members 920 is selected so that the annular converging area D is completely within the arcuate optical opening 911 (viz., the optical openings 911 and the annular converging area D substantially overlap).

The single board 910 is made of light shielding material, and the portion of the single board except the optical openings serves as a light shielding portion or a light shielding plate portion. Both sides of the single board 910 are colored black. The black light shielding portion or a light shielding plate portion absorbs light incident thereon or greatly absorbs it and scatter reflects it.

The annular optical opening 911 is not perfect in its annularity. That is, the optical opening 911 includes a coupling part 912 which couples a portion of the light shielding portion which is located on the inner side of the optical opening 911 with another portion of the shielding plate portion which is located on the outer side of the optical opening. The coupling part 912 serves as a support member for supporting the inner portion of the light shielding portion on the outer portion light shielding plate portion. The rear side of the coupling part 912 provides a wire path for the power feeding pattern for electrically connecting the LED 930 to the power supply.

Figure 76:
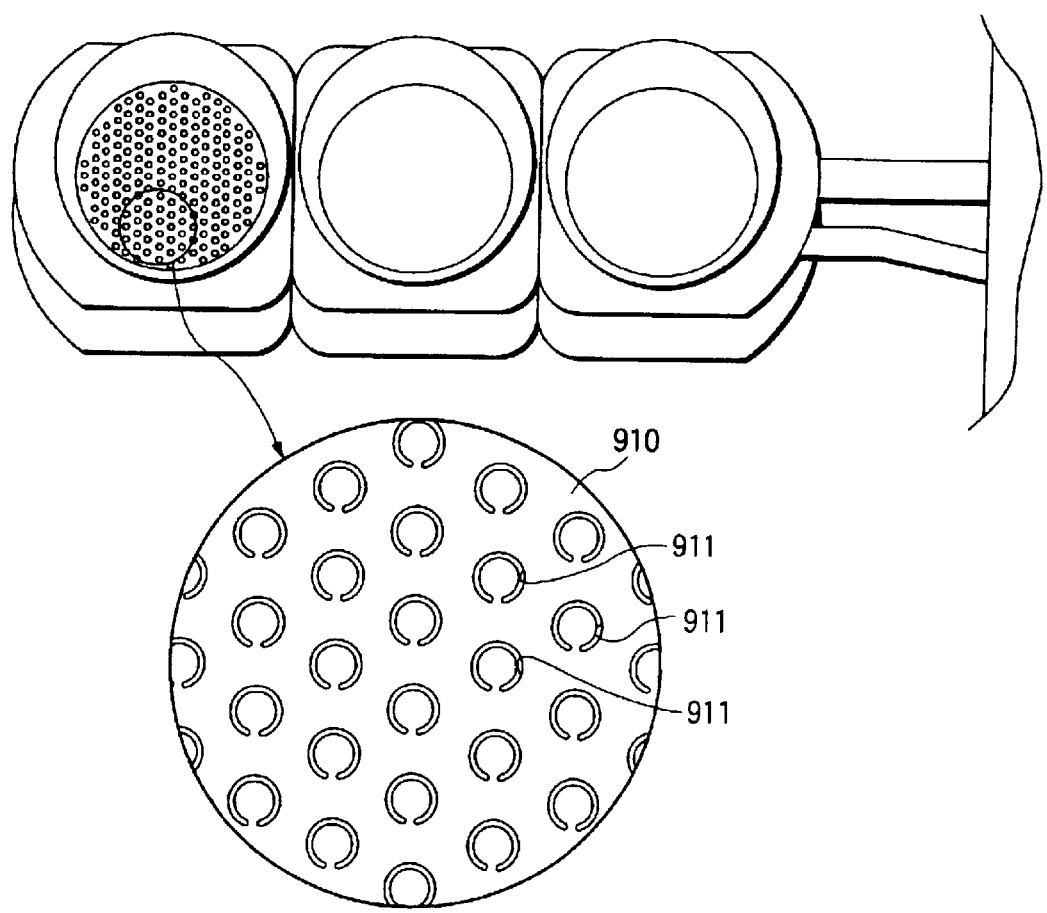
FIG. 76 is a front view showing a signal into which light source devices of the 31st embodiment are incorporated.
Figure 77:
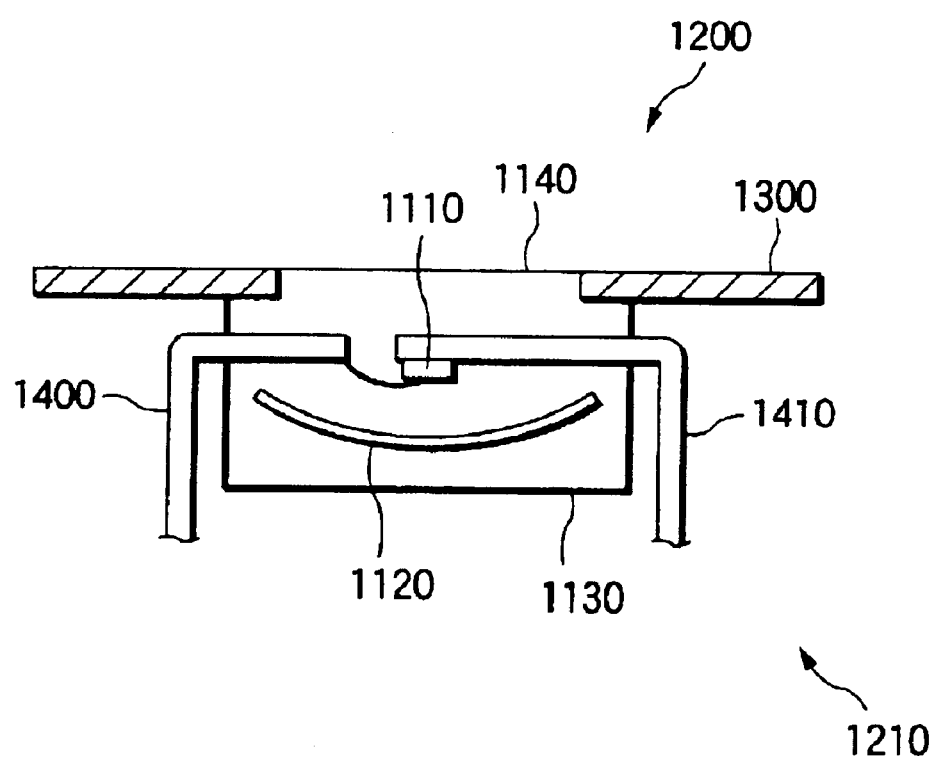
FIG. 77 is a view showing a conventional light source device using a reflection-type LED.

The light source device thus constructed is utilized for three signal lights, which are combined into a signal, as shown in FIG. 76. When the signal light is turned on, light emitted from each LED 930 is reflected by the associated reflecting concave surface 921 and converged on the annular converging area D set within each optical opening 911. The converged light passes through the converging area D and is projected outside while diverging in the direction of an prolongation of each optical path. When microscopically viewing this, each arcuate optical opening is seen in the form of a ring colored with a color of light emitted from the LED 930. When viewed from a position distant from the signal light, the whole of the front side of the signal light is seen as a circle of the same color as of light emitted from the LED 930.

In an off state of the signal light, the whole of its front side is seen distinctly black. The reason for this is that external light (e.g., afternoon sun) is irradiated on the surface of single board 910, but most of the external light is absorbed or attenuated by the single board 910. Even if part of the external light is incident on the reflecting concave surface 921 through the optical openings 911 of the single board 910, the incident light is reflected by the reflecting concave surface 921 and directed toward the LEDs 930, and further scatter reflected thereon. Most of the incident light progressively repeats its reflection within the light source device and reaches the reverse side, colored black, of the single board 910 where it is absorbed or greatly attenuated. There is extremely less chance that external light having entered the light source device goes out of device through the optical opening 911, while keeping its energy when it entered there. For this reason, dark noise is not actualized even in its off-state. Accordingly, a contrast of the signal light between the on- and off-states is high.

As in the 29th and 30th embodiments, the transfer molding process is used for manufacturing the LEDs 930. Accordingly, the distribution control of the LED per se is improved. The surface mounting of the LEDs by using the automatic mounting machine is possible. An efficient mass production of the LEDs is realized while improving the distribution characteristic of the whole light source device.

The array of the LEDs 930 and the configuration of the reflecting concave surface 921 are employed in the invention. Accordingly, most of light emitted from the LED 930 is received and reflected by the reflecting concave surface 921. The reflecting light is projected outside through the converging area D and the optical openings 911, without any interruption of it during its traveling course. Thus, most of light emitted from the LED 930 is fully utilized and the external radiation efficiency is extremely high. Generally, where the semiconductor light emitting element, such as an LED, is used, the small quantity of light emitted by it is frequently problematic. However, the external radiation efficiency of the light source device is satisfactorily high, and then sufficiently compensates for the small quantity of light from the LED light source.

As described above, the external radiation efficiency of the light source device is satisfactorily high. Accordingly, if the LEDs 930 used are small in size, there is no chance that the apparent luminance decreases. For this reason, the LED may be reduced to be smaller than a conventional general LED of 5 mm in diameter, manufactured by potting molding.

Generally, when the LED manufactured by the transfer molding is bonded to the board by cream solder, and put in the reflow furnace where it is thermally hardened, the wire in the LED is likely to be disconnected by thermal expansion/compression of the resin by its thermal hysteresis, if the diameter of the LED is 5 mm or longer. In this connection, in the embodiment, the LED 930 may be reduced in size. Accordingly, the LED 930 of 5 mm or smaller in diameter, manufactured by the transfer molding may be used.

The above-mentioned embodiments may be modified in the following way.

The number of optical means in the optical unit member 920 is not limited to nine, but an appropriate number of optical means may be provided in the optical unit member 920. A matrix array of the optical means may take any size of matrix, while the matrix is 3×3.

In the embodiments mentioned above, the board (910, 914, 915) consists of a single board. If required, it may consist of a plurality of segmental boards. In this case, the shape and size of the segmental board is preferably selected to be equal to those of the optical unit member 920.

The optical unit member 920 (and/or the segmental board) is not only square when viewed from top, but also be hexagonal or shaped like a diamond. To secure a regular array of the optical unit members, it preferably takes a polygonal shape.

The LED 930 used in the 30th and 31st embodiments may be modified to a lens-type LED which is able to deflect light emitted from a light emitting element in a specific direction. Further, the LED 930 may be used while being bared, without encapsulating it with transparent material, e.g., transparent resin.

The optical openings 911 of the single board 910 in the 31st embodiment may be filled with transparent solid material, while not remaining bored. The light shielding portion and the light shielding plate portion may be formed in a manner that the board 910 is formed with a transparent plate (e.g., glass plate), and an opaque light shielding layer is printed thereon, and the remaining annular or arcuate optical openings 911 are filled with transparent material.

In the 31st embodiment, the concave surface of the lens face 21 is smooth and continuous. However, it is not essential that each surface is smooth so long as the surface is capable of converging rays of light on a specific converging area D. A great number of minute planar surfaces which are minutely slanted may be arrayed to as to form reflecting concave surfaces optically equivalent to those mentioned above. It should be understood that such reflecting concave surface is involved in the meaning of "reflecting concave surface" used in the present specification.

1) The reflecting concave surfaces 921 and 924 may be each formed along a curved surface, which is developed by revolving about the axial line Z a part of a curve resembling the elliptical arc, such as an elliptical line, cycloidal line, or a spiral line.

2) Concave portions whose inner walls form reflecting concave surfaces are formed in the optical unit member. In this case, the light emitting portion of each LED is located within each concave portion.

3) The present invention may be implemented into a light source unit which forms a light source device comprises: aboard on which a plurality of light emitting diodes are surface mounted; and an optical means array being arrayed in the light radiation direction in which the light emitting elements surface mounted on the board emit light; wherein a plurality of optical means, which correspond to the light emitting diodes, are fabricated into the optical means array.

As seen from the foregoing description, the LEDs are surface mounted on the board, and further optical means, which correspond to the light emitting diodes, are fabricated into one optical unit member. By the synergy effect of those features, the distribution characteristic of the light source device is improved or stabilized, and a productivity in producing the light source devices is improved.

In the forgoing, several embodiments have been individually described, however, these embodiments can be combined to the possible extent.

Further, although the invention has been described in its preferred form with a certain degree of particularity, it is understood that the present disclosure of the preferred form can be arrangement of parts without departing from the spirit and the scope of the invention as hereinafter claimed.

What is claimed is:

1. A light source device, comprising:
    a light shielding member having at least one annular-shaped aperture;
    a light source adjacent to said light shielding member; and
    a reflecting member having at least one reflecting surface, said light source being disposed between said light shielding member and said reflecting member,
    wherein said reflecting member comprises a shape for reflecting light emitted from said light source such that said light is converged on an annular converging area which is substantially formed in said annular-shaped aperture, and
    wherein said light shielding member comprises a light-shielding plate having inner and outer portions which are separated by said at least one annular-shaped aperture, said light source being mounted at a center of said inner portion.

2. The light source device according to claim 1, wherein a light-emitting face of said light source is located at about a mid-point between said light shielding plate and said reflecting member.

3. The light source device according to claim 1, wherein said at least one reflecting surface comprises concave reflecting surfaces having a solid angle of about $2\pi$ steradians with respect to said light source.

4. The light source device according to claim 1, wherein a light-emitting face of said light source is disposed within a concave portion of said reflecting member.

5. The light source device according to claim 1, wherein said light source comprise a light-emitting diode (LED) having a light-emitting element and half-sphere shaped resin body covering said light-emitting element.

6. The light source device according to claim 5, wherein rays of said light emitted from said light-emitting element are incident on a surface of said half-sphere shaped resin body at substantially right angles.

7. The light source device according to claim 5, wherein said at least one reflecting surface defines a concave portion of said reflecting member, said half-sphere shaped resin body being disposed within said concave portion.

8. The light source device according to claim 1, wherein said annular-shaped aperture has a predetermined width and is formed along an arc having a radius which is equal to a radius of said annular converging area.

9. The light source device according to claim 8, wherein a cross-sectional area of said at least one annular-shaped aperture is larger than a cross-sectional area of said annular converging area such that light converged on said annular converging area is projected outside while converging without any interruption by an inner wall of said at least one annular-shaped aperture.

10. The light source device according to claim 1, wherein said light shielding plate further comprises a coupling part which couples said inner portion and said outer portion.

11. A signal light device comprising:
    a support plate; and
    a plurality of light source devices according to claim 1, formed on said support plate.

12. The signal light device according to claim 11, further
    a cup-shaped base, said support plate being vertically disposed on a front portion of said base; and
    a transparent cover lens, said support plate being disposed between said cup-shaped base and said transparent cover lens.

13. The signal light device according to claim 11, wherein said light shielding plate comprises a black surface such that, in an off state, said signal light device appears black.

14. The signal light device according to claim 11, wherein in an on state, said signal light device appears as a circle of light having a color which is a same color of light emitted from said light source devices, an intensity of said light circle being uniform over its area.

15. A signaling device comprising a plurality of signal light devices according to claim 11.

16. The signal light device according to claim 11, wherein said device maximizes an external radiation efficiency.

17. The signal light device according to claim 11, wherein when said signal light device is viewed from about 10 meters, said plurality of light source devices do not appear as separate light spots.

18. The signal light device according to claim 11, wherein a mounting density of said plurality of light source devices is sufficiently small to prevent an accumulation of heat in said signal light device.

19. The signal light device according to claim 11, wherein said light shielding plate prevents damage to said at least one reflecting surface.

20. The signal light device according to claim 11, wherein said light source comprise a light-emitting diode (LED) having a light-emitting element and a resin body covering said light-emitting element, and wherein said light shielding plate shields said resin body from sunlight.

21. The signal light device according to claim 12, wherein external light passing through said cover lens and incident on said at least one reflecting surface, is reflected toward said light source and scatter-reflected thereon.

22. The signal light device according to claim 12, wherein said cup-shaped base and said plurality of light sources are integrally formed.

23. The light source device according to claim 1, wherein said light source comprise a light-emitting diode (LED) having a light-emitting element and an ellipsoidal shaped resin body covering said light-emitting element, said resin body converging light from said light-emitting element in a vertically downward direction.

24. The light source device according to claim 1, wherein said light source comprise a light-emitting diode (LED) having a light-emitting element and an elliptical shaped resin body covering said light-emitting element, said resin body converging light from said light-emitting element in a peripheral direction.

25. The light source device according to claim 1, wherein said at least one reflecting surface has a solid angle of about 1 π it steradians to 2.5 π it steradians as a whole with respect to said light source.

26. The light source device according to claim 1, wherein said at least one reflecting surface has a solid angle of about 1.5 π it steradians to 2.5 π it steradians as a whole with respect to said light source.

27. The light source device according to claim 1, wherein said at least one reflecting surface defines a elliptical-shaped concave portion of said reflecting member.

28. The light source device according to claim 1, wherein said at least one reflecting surface defines a half-sphere shaped concave portion of said reflecting member.

29. The light source device according to claim 1, wherein said at least one annular-shaped aperture is filled with a transparent material comprising one of transparent glass and transparent resin.

30. The light source device according to claim 29, wherein said transparent material comprises a plurality of grooves formed in a predetermined direction on a side of said transparent material opposed to said reflecting member.

31. The light source device according to claim 30, wherein said plurality of grooves serves as a plurality of prisms for distributing said light reflected from said at least one reflecting surface.

32. The light source device according to claim 1, wherein said light shielding plate further comprises a plurality of coupling parts which couple said inner portion and said outer portion.

33. The light source device according to claim 1, wherein said annular converging area substantially overlaps said at least one annular-shaped aperture.

34. The light source device according to claim 1, wherein said an annular converging area is formed in said annular-shaped aperture.

35. The light source device according to claim 1, wherein said at least one reflecting surface comprises a plurality of reflecting surfaces.

36. The light source device according to claim 10, wherein said at least one annular-shaped aperture is continuous from one side of said coupling part to another side of said coupling part.

37. The light source device according to claim 1, further comprising:
  a base, said reflecting member being formed in said base; and
  at least one support pole for connecting said light-shielding plate to said base,
  wherein a distance between said light-shielding plate and said base is selected such that said annular converging area is substantially formed in said annular-shaped aperture.

38. The light source device according to claim 1, wherein said at least one annular-shaped aperture is formed in said light-shielding plate about an axis which intersects said center of said inner portion of said light-shielding plate, and
  wherein said light source comprises a light-emitting diode which is mounted to a support bar which extends in a direction of said axis.

39. The light source device according to claim 1, wherein said inner portion comprises a light-shielding portion formed between said center of said inner portion and said at least one annular-shaped aperture.

40. A light source device, comprising:
  a light shielding member having at least one annular-shaped aperture;
  a light source adjacent to said light shielding member; and
  a reflecting member having at least one reflecting surface, said light source being disposed between said light shielding member and said reflecting member,
  wherein said reflecting member reflects light emitted from said light source such that said light has an annular converging area which substantially overlaps said annular-shaped aperture, and
  wherein said at least one annular-shaped aperture comprises an inner annular-shaped aperture and an outer annular-shaped aperture.

41. The light source device according to claim 40, wherein light emitted from said light source has an inner converging area corresponding to said inner annular-shaped aperture, and an outer converging area corresponding to said outer annular-shaped aperture.

42. A signal light device comprising:
  a support plate; and
  a plurality of light source devices formed on said support plate, said light source devices comprising:
    a light shielding member having at least one annular-shaped aperture;

a light source adjacent to said light shielding member; and a reflecting member having at least one reflecting surface, said light source being disposed between said light shielding member and said reflecting member, wherein said reflecting member comprises a shape for reflecting light emitted from said light source such that said light is converged on an annular converging area which is substantially formed in said annular-shaped aperture, and wherein said light shielding member comprises a light-shielding plate having inner and outer portions which are separated by said at least one annular-shaped aperture, said light source being mounted at a center of said inner portion.

* * * * *